US012532463B2

(12) United States Patent
Kai et al.

(10) Patent No.: US 12,532,463 B2
(45) Date of Patent: Jan. 20, 2026

(54) THREE-DIMENSIONAL MEMORY DEVICE WITH SEPARATED SOURCE LINES AND METHOD OF MAKING THE SAME

(71) Applicant: SANDISK TECHNOLOGIES LLC, Addison, TX (US)

(72) Inventors: James Kai, Santa Clara, CA (US); Johann Alsmeier, San Jose, CA (US); Lito De La Rama, San Jose, CA (US); Masaaki Higashitani, Cupertino, CA (US); Koichi Matsuno, Fremont, CA (US); Marika Gunji-Yoneoka, Sunnyvale, CA (US); Makoto Koto, Yokkaichi (JP); Hisakazu Otoi, Yokkaichi (JP); Masanori Tsutsumi, Yokkaichi (JP)

(73) Assignee: Sandisk Technologies, Inc., Milpitas, CA (US)

( * ) Notice: Subject to any disclaimer, the term of this patent is extended or adjusted under 35 U.S.C. 154(b) by 11 days.

(21) Appl. No.: 18/425,996

(22) Filed: Jan. 29, 2024

(65) Prior Publication Data

US 2024/0172431 A1 May 23, 2024

Related U.S. Application Data

(63) Continuation-in-part of application No. 16/951,325, filed on Nov. 18, 2020, now Pat. No. 11,889,684.

(51) Int. Cl.
*H10B 41/27* (2023.01)
*G11C 7/18* (2006.01)
(Continued)

(52) U.S. Cl.
CPC ............... *H10B 41/27* (2023.02); *G11C 7/18* (2013.01); *G11C 8/14* (2013.01); *H10B 41/10* (2023.02);
(Continued)

(58) Field of Classification Search
CPC ........... H01L 27/11273; H01L 27/1128; H01L 27/11514; H01L 27/11551;
(Continued)

(56) References Cited

U.S. PATENT DOCUMENTS 9,768,185 B2 9/2017 Akutsu et al.
10,147,732 B1 12/2018 Hu et al.
(Continued)

FOREIGN PATENT DOCUMENTS

CN 109314147 A 2/2019

OTHER PUBLICATIONS

Endoh et al., "Novel Ultra High Density Memory with a Stacked-Surrounding Gate Transistor (S-SGT) Structured Cell," IEDM Proc. (2001) 33-36.
(Continued)

*Primary Examiner* — Amar Movva
(74) *Attorney, Agent, or Firm* — THE MARBURY LAW GROUP PLLC

(57) ABSTRACT

A three-dimensional memory device includes an alternating stack of insulating layers and electrically conductive layers located over a plurality of source layers, where the electrically conductive layers include word lines and source-side select gate electrodes which are located between the plurality of source layers and the word lines in a vertical direction, groups of memory openings vertically extending through the alternating stack, and groups of memory opening fill structures located in the groups of memory openings. The plurality of source layers are laterally spaced apart and electrically isolated from each other, and each respective one of the plurality of source layers contacts at least one respective group of the groups of memory opening fill structures.

9 Claims, 122 Drawing Sheets

(51) Int. Cl.

| | |
|---|---|
| ***G11C 8/14*** | (2006.01) |
| ***H10B 41/10*** | (2023.01) |
| ***H10B 41/35*** | (2023.01) |
| ***H10B 43/10*** | (2023.01) |
| ***H10B 43/27*** | (2023.01) |
| ***H10B 43/35*** | (2023.01) |
| ***H10D 62/10*** | (2025.01) |

(52) U.S. Cl.
CPC ............. *H10B 41/35* (2023.02); *H10B 43/10* (2023.02); *H10B 43/27* (2023.02); *H10B 43/35* (2023.02); *H10D 62/116* (2025.01)

(58) Field of Classification Search
CPC ......... H01L 27/11553; H01L 27/11556; H01L 27/11578; H01L 27/1158; H01L 27/11582; H01L 27/11597; H01L 29/0653; H10B 20/40; H10B 20/50; H10B 53/20; H10B 41/20; H10B 41/23; H10B 41/27; H10B 43/20; H10B 43/23; H10B 43/27; H10B 51/20; G11C 7/18; G11C 8/14
See application file for complete search history.

(56) References Cited

U.S. PATENT DOCUMENTS

| | | | |
|---|---|---|---|
| 10,629,616 | B1 | 4/2020 | Kai et al. |
| 11,195,781 | B2 | 12/2021 | Okina et al. |
| 11,201,107 | B2 | 12/2021 | Okina et al. |
| 11,361,816 | B2 | 6/2022 | Cui et al. |
| 11,393,836 | B2 | 7/2022 | Tsutsumi et al. |
| 11,482,539 | B2 | 10/2022 | Sharangpani et al. |
| 2004/0032759 | A1 | 2/2004 | Chow et al. |
| 2006/0033146 | A1 | 2/2006 | Wang |
| 2006/0198200 | A1 | 9/2006 | Ogura et al. |
| 2006/0226474 | A1 | 10/2006 | Ho et al. |
| 2007/0001213 | A1 | 1/2007 | Om et al. |
| 2008/0112231 | A1 | 5/2008 | Shum |
| 2008/0128757 | A1 | 6/2008 | Chae et al. |
| 2009/0158226 | A1 | 6/2009 | Ho et al. |
| 2012/0223382 | A1 | 9/2012 | Joo et al. |
| 2013/0320424 | A1 | 12/2013 | Lee et al. |
| 2014/0048890 | A1 | 2/2014 | Lee et al. |
| 2016/0071926 | A1 | 3/2016 | Kitazaki et al. |
| 2017/0358593 | A1 | 12/2017 | Yu et al. |
| 2018/0097009 | A1 | 4/2018 | Zhang et al. |
| 2019/0067316 | A1 | 2/2019 | Oh et al. |
| 2019/0088589 | A1 | 3/2019 | Zhu et al. |
| 2019/0115362 | A1 | 4/2019 | Choi |
| 2019/0164983 | A1 * | 5/2019 | Hu ......................... H10B 41/35 |
| 2019/0244892 | A1 | 8/2019 | Zhu et al. |
| 2020/0227318 | A1 | 7/2020 | Kawasaki et al. |
| 2022/0157841 | A1 | 5/2022 | Tsutsumi et al. |
| 2022/0157842 | A1 | 5/2022 | Tsutsumi et al. |

OTHER PUBLICATIONS

Goda, A., "3D NAND Cell Operations and Technology Requirements," 2014 IMW 3D NAND Tutorial.

Komori, Y. et al., "Disturbless Flash Memory due to High Boost Efficiency on BiCS Structure and Optimal Memory Film Stack for Ultra High Density Storage Device," 2008 IEEE International Electron Devices Meeting, DOI:10.1109/IEDM.2008.4796831Corpus ID: 6480548.

Notification of Transmittal of the International Search Report and the Written Opinion of the International Searching Authority for International Patent Application No. PCT/US2021/036437, mailed on Nov. 23, 2021, 11 pages.

* cited by examiner

| | Read | Program | Erase |
|---|---|---|---|
| | **Sel/UnSel** | **Sel/UnSel** | **Sel/UnSel** |
| BL | $V_{BL}/V_{BL}$ | 0V/0V | $V_{ERA}/V_{ERA}$ |
| SGD | $V_{SG}/0V$ | $V_{SG}/V_{SS}$ | $V_{SG}/0V$ |
| Un-Sel WL | $V_{READ}/V_{READ}$ | $V_{PASS}/V_{PASS}$ | $V_{SS}/V_{SS}$ |
| Sel WL | $V_{CGRV}/V_{CGRV}$ | $V_{VPGM}/V_{VPGM}$ | $V_{SS}/V_{SS}$ |
| SGS | $V_{SG}/V_{SG}$ | $V_{SG}/V_{SG}$ | $V_{SG}/V_{SG}$ |
| Sel block SL | $CelSrc/V_{READ}$ | $0V/V_{PASS}$ | $V_{ERA}/V<V_{ERA}$ |
| Un-Sel block SL | Float | Float | Float |

FIG. 67C

| | Read | Program | Erase |
|---|---|---|---|
| | **Sel/UnSel** | **Sel/UnSel** | **Sel/UnSel** |
| BL | $V_{BL}/V_{BL}$ | 0V/0V | $V_{ERA}/V_{ERA}$ |
| SGD | $V_{SG}/0V$ | $V_{SG}/V_{SS}$ | $V_{SG}/0V$ |
| Un-Sel WL | $V_{READ}/V_{READ}$ | $V_{PASS}/V_{PASS}$ | $V_{SS}/V_{SS}$ |
| Sel WL | $V_{CGRV}/V_{CGRV}$ | $V_{VPGM}/V_{VPGM}$ | $V_{SS}/V_{SS}$ |
| SGS | $V_{SG}/V_{SG}$ | $V_{SG}/V_{SG}$ | $V_{SG}/V_{SG}$ |
| Sel block SL | CelSrc/$V_{READ}$ | 0V/$V_{PASS}$ | $V_{ERA}/V<V_{ERA}$ |
| Un-Sel block SL | ½ CelSrc/ Float | ½ CelSrc/ Float | ½ CelSrc/ Float |

FIG. 68C

| | Read | Program | Erase |
|---|---|---|---|
| | Sel/UnSel | Sel/UnSel | Sel/UnSel |
| BL | $V_{BL}/V_{BL}$ | 0V/0V | $V_{ERA}/V_{ERA}$ |
| SGD | $V_{SG}$/0V | $V_{SG}/V_{SS}$ | $V_{SG}$/0V |
| Un-Sel WL | $V_{READ}/V_{READ}$ | $V_{PASS}/V_{PASS}$ | $V_{SS}/V_{SS}$ |
| Sel WL | $V_{CGRV}/V_{CGRV}$ | $V_{VPGM}/V_{VPGM}$ | $V_{SS}/V_{SS}$ |
| SGS | $V_{SG}$/Float | $V_{SG}$/Float | $V_{SG}$/Float |
| Sel block SL | CelSrc/$V_{READ}$ | 0V/$V_{PASS}$ | $V_{ERA}/V<V_{ERA}$ |
| Un-Sel block SL | Float | Float | Float |

FIG. 69F

| | Read | Program | Erase |
|---|---|---|---|
| | Sel/UnSel | Sel/UnSel | Sel/UnSel |
| BL | $V_{BL}/V_{BL}$ | 0V/0V | $V_{ERA}/V_{ERA}$ |
| SGD | $V_{SG}$/0V | $V_{SG}/V_{SS}$ | $V_{SG}$/0V |
| Un-Sel WL | $V_{READ}/V_{READ}$ | $V_{PASS}/V_{PASS}$ | $V_{SS}/V_{SS}$ |
| Sel WL | $V_{CGRV}/V_{CGRV}$ | $V_{VPGM}/V_{VPGM}$ | $V_{SS}/V_{SS}$ |
| SGS | $V_{SG}$/Float | $V_{SG}$/Float | $V_{SG}$/Float |
| Sel block SL | CelSrc/$V_{READ}$ | 0V/$V_{PASS}$ | $V_{ERA}/V<V_{ERA}$ |
| Un-Sel block SL | Float | Float | Float |

FIG. 70D

THREE-DIMENSIONAL MEMORY DEVICE WITH SEPARATED SOURCE LINES AND METHOD OF MAKING THE SAME

RELATED APPLICATIONS

This application is a continuation-in-part (CIP) application of U.S. application Ser. No. 16/951,325 filed on Nov. 18, 2020, the entire contents of which are incorporated herein by reference.

FIELD

The present disclosure relates generally to the field of semiconductor devices, and particular to a three-dimensional memory device including separated source lines and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device includes an alternating stack of insulating layers and electrically conductive layers located over a plurality of source layers, where the electrically conductive layers include word lines and source-side select gate electrodes which are located between the plurality of source layers and the word lines in a vertical direction, groups of memory openings vertically extending through the alternating stack, and groups of memory opening fill structures located in the groups of memory openings. Each of the memory opening fill structures includes a respective vertical stack of memory elements, a respective vertical semiconductor channel having a first end that contacts a respective one of the plurality of source layers, and a respective drain region contacting a second end of the respective vertical semiconductor channel. The plurality of source layers are laterally spaced apart and electrically isolated from each other, and each respective one of the plurality of source layers contacts at least one respective group of the groups of memory opening fill structures.

According to another aspect of the present disclosure, a method of forming a three-dimensional memory device is provided. The method comprises: forming an alternating stack of insulating layers and spacer material layers over a substrate, wherein the spacer material layers are formed as, or are subsequently replaced with, electrically conductive layers; forming groups of memory openings through the alternating stack; forming groups of memory opening fill structures in the memory openings, wherein each of the group of memory opening fill structures includes a respective vertical stack of memory elements, a respective vertical semiconductor channel, and a respective drain region; forming a first trench and a second trench through the alternating stack such that the groups of memory opening fill structures are located between the first trench and the second trench; forming a first backside trench fill structure and a second backside trench fill structure in the first trench and in the second trench, respectively; removing the substrate, wherein a first end surface of the alternating stack and first end surfaces of the groups of memory opening fill structures are exposed; forming a source-level material layer on the first end surface of the alternating stack and on the first end surfaces of the groups of memory opening fill structures; and patterning the source-level material layer such that at least one cut is formed though the source-level material layer within an area between the first backside trench fill structure and the second backside trench fill structure.

According to an aspect of the present disclosure, a three-dimensional memory device is provided, which comprises: an alternating stack of insulating layers and electrically conductive layers located over at least one source layer and located between a pair of backside trench fill structures; groups of memory openings vertically extending through the alternating stack; and groups of memory opening fill structures located in the groups of memory openings, wherein each of the memory opening fill structures includes a respective vertical stack of memory elements, a respective vertical semiconductor channel having a first end that contacts the at least one source layer, and a respective drain region contacting a second end of the respective vertical semiconductor channel; wherein the electrically conductive layers comprise: word lines continuously laterally extending between, and contacting, each of the pair of the backside trench fill structures; and a plurality of source-side select gate electrodes located between the at least one source layer and the word lines in a vertical direction, and located between the pair of backside trench fill structures in a horizontal direction, wherein the plurality of source-side select gate electrodes are laterally spaced apart by source-select-level dielectric isolation structures.

According to another aspect of the present disclosure, a method of forming a three-dimensional memory device is provided, which comprises: forming an alternating stack of insulating layers and spacer material layers over a substrate, wherein the spacer material layers are formed as, or are subsequently replaced with, electrically conductive layers; forming groups of memory openings through the alternating stack; forming groups of memory opening fill structures in the memory openings, wherein each of the group of memory opening fill structures includes a respective vertical stack of memory elements, a respective vertical semiconductor channel, and a respective drain region; forming a source-level material layer by thinning the substrate or by replacing the substrate with at least one conductive material layer, wherein each group of memory opening fill structures contacts a respective one of the plurality of source layers; and forming a plurality of source-side select gate electrodes by forming source-side trenches through a first subset of the electrically conductive layers prior to or after formation of the source-level material layer, wherein the source-side trenches do not divide a second subset of the electrically conductive layers.

According to yet another aspect of the present disclosure, a three-dimensional memory device is provided, which comprises: an alternating stack of insulating layers and electrically conductive layers located over a plurality of source layers, wherein the alternating stack is located between a pair of backside trench fill structures; groups of memory openings vertically extending through the alternating stack; and groups of memory opening fill structures located in the groups of memory openings, wherein each of the memory opening fill structures includes a respective vertical stack of memory elements, a respective vertical semiconductor channel having a first end that contacts a respective one of the plurality of source layers, and a respective drain region contacting a second end of the respective vertical semiconductor channel, wherein: the plurality of source layers are laterally spaced apart and electrically isolated from each other; and each group of memory opening fill structures contacts a respective one of the plurality of source layers.

According to still another aspect of the present disclosure, a method of forming a three-dimensional memory device, comprising: forming an alternating stack of insulating layers and spacer material layers over a substrate, wherein the spacer material layers are formed as, or are subsequently replaced with, electrically conductive layers; forming groups of memory openings through the alternating stack; forming groups of memory opening fill structures in the memory openings, wherein each of the group of memory opening fill structures includes a respective vertical stack of memory elements and a respective vertical semiconductor channel; forming a source-level material layer by thinning the substrate, by removing the substrate, or by replacing the substrate with at least one electrically conductive material layer; and forming a plurality of source layers by patterning the source-level material layer, wherein the plurality of source layers are laterally spaced apart and electrically isolated from each other, wherein each group of memory opening fill structures contacts a respective one of the plurality of source layers.

BRIEF DESCRIPTION OF THE DRAWINGS

FIG. 67C is a table of voltages applied to the structure of FIG. 67A during reading, programming and erasing.

FIG. 68C is a table of voltages applied to the structure of FIG. 68A during reading, programming and erasing.

FIG. 69F is a table of voltages applied to the structure of FIG. 69D during reading, programming and erasing.

FIG. 70D is a table of voltages applied to the structure of FIG. 70B during reading, programming and erasing.

DETAILED DESCRIPTION

Figure 1A:
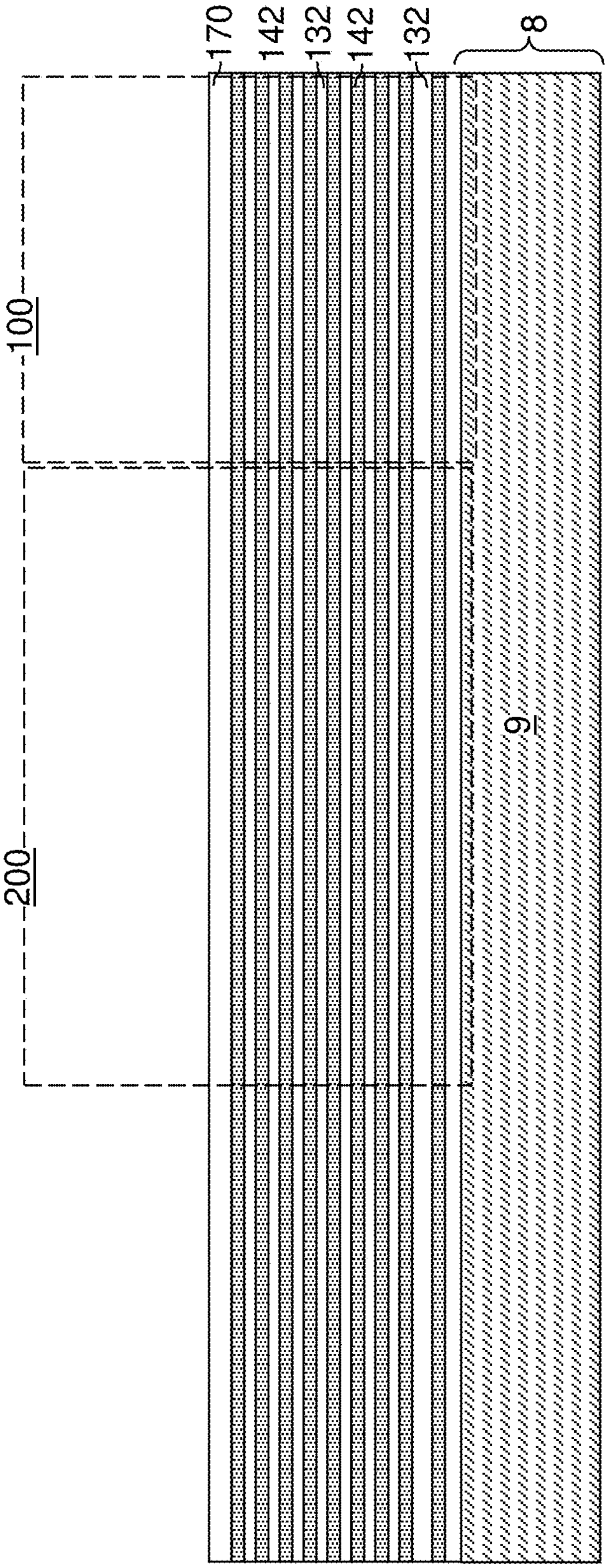
FIG. 1A is a vertical cross-sectional view of a first exemplary structure after formation of a first vertically alternating sequence of first-tier insulating layers and first-tier sacrificial material layers according to the first embodiment of the present disclosure.

As discussed above, the embodiments of the present disclosure are directed to a three-dimensional memory device containing separated source lines and/or separated source-side select lines, and methods of making the same, the various aspects of which are described herein in detail.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

Generally, a semiconductor package (or a "package") refers to a unit semiconductor device that can be attached to a circuit board through a set of pins or solder balls. A semiconductor package may include a semiconductor chip (or a "chip") or a plurality of semiconductor chips that are bonded thereamongst, for example, by flip-chip bonding or another chip-to-chip bonding. A package or a chip may include a single semiconductor die (or a "die") or a plurality of semiconductor dies. A die is the smallest unit that can independently execute external commands or report status. Typically, a package or a chip with multiple dies is capable of simultaneously executing as many number of external commands as the total number of planes therein. Each die includes one or more planes. Identical concurrent operations can be executed in each plane within a same die, although there may be some restrictions. In case a die is a memory die, i.e., a die including memory elements, concurrent read operations, concurrent write operations, or concurrent erase operations can be performed in each plane within a same memory die. In a memory die, each plane contains a number of memory blocks (or "blocks"), which are the smallest unit that can be erased by in a single erase operation. Each memory block contains a number of pages, which are the smallest units that can be selected for programming. A page is also the smallest unit that can be selected to a read operation.

Figure 1B:
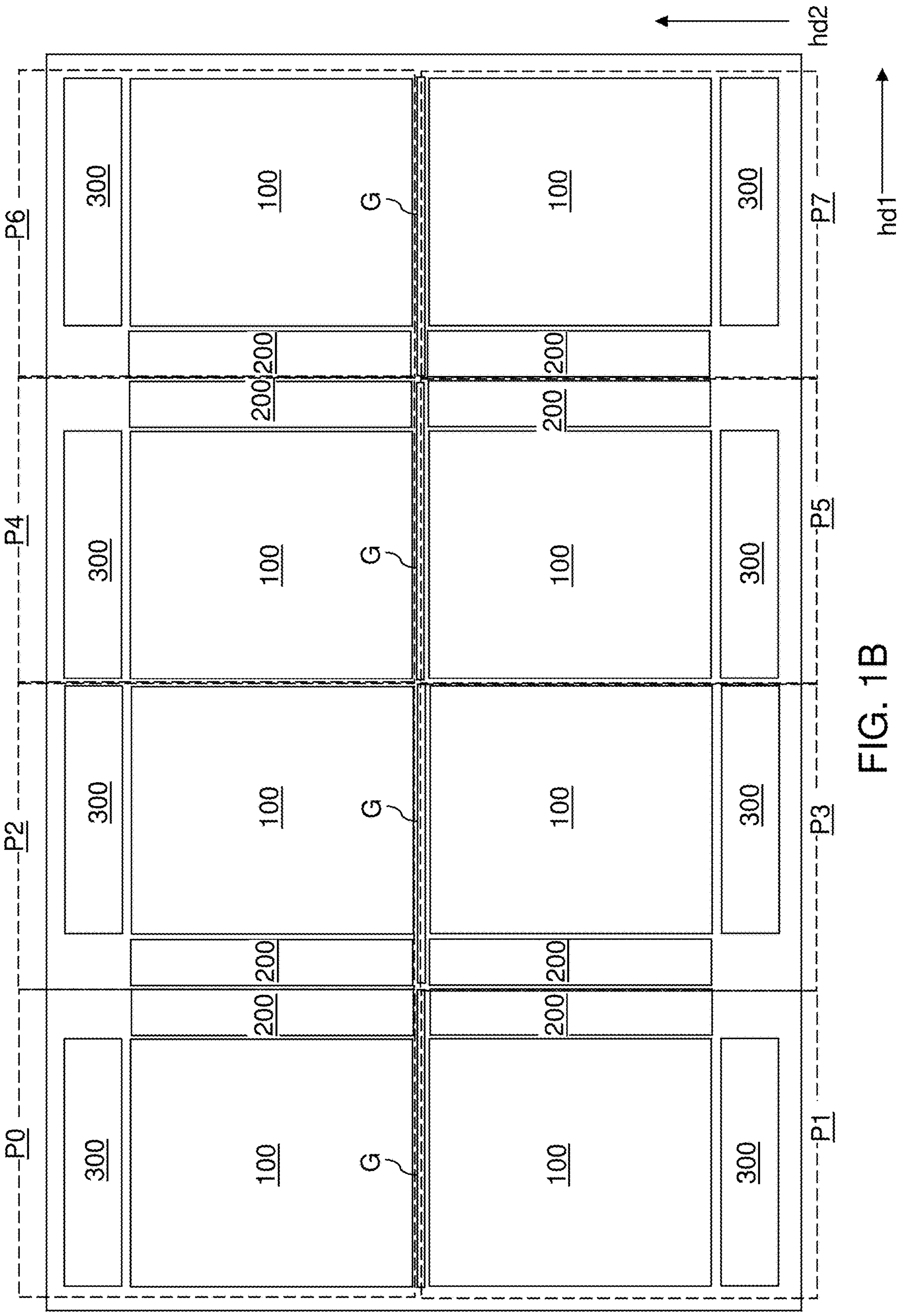
FIG. 1B illustrates a layout of a semiconductor die within the first exemplary structure of FIG. 1A in a plan view.

Referring to FIGS. 1A and 1B, a first exemplary structure according to a first embodiment of the present disclosure is illustrated. The first exemplary structure includes a substrate 8 containing a substrate semiconductor layer 9 at least at an upper portion thereof. In one embodiment, the substrate semiconductor layer 9 may be a single crystalline semiconductor material layer or a doped well in a semiconductor substrate, such as a silicon wafer. In another embodiment, the substrate 8 may include a substrate semiconductor layer (not shown) with semiconductor devices (not shown) thereupon, and lower-level dielectric material layers (not shown) embedding lower-level metal interconnect structures (not shown) and located above the semiconductor devices. In this case, the substrate semiconductor layer 9 may be formed over the lower-level dielectric material layers. The substrate semiconductor layer 9 may have a doping of a second conductivity type, which may be p-type or n-type, which is the opposite of a first conductivity type to be employed for doping of vertical semiconductor channels to be subsequently formed. The substrate semiconductor layer 9 may include a single crystalline semiconductor material or a polycrystalline semiconductor material (such as polysilicon or a polycrystalline silicon-germanium alloy).

As used herein, a "semiconducting material" refers to a material having electrical conductivity in the range from $1.0\times10^{-6}$ S/cm to $1.0\times10^{5}$ S/cm. As used herein, a "semiconductor material" refers to a material having electrical conductivity in the range from $1.0\times10^{-6}$ S/cm to $1.0\times10^{5}$ S/cm in the absence of electrical dopants therein, and is capable of producing a doped material having electrical conductivity in a range from 1.0 S/cm to $1.0\times10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0\times10^5$ S/cm. As used herein, an "insulator material" or a "dielectric material" refers to a material having electrical conductivity less than $1.0\times10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0\times10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0\times10^{-6}$ S/cm to $1.0\times10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

A vertically alternating sequence of first material layers and second material layers is subsequently formed. Each first material layer can include a first material, and each second material layer can include a second material that is different from the first material. In case at least another vertically alternating sequence of material layers is subsequently formed over the vertically alternating sequence of the first material layers and the second material layers, the vertically alternating sequence is herein referred to as a first vertically alternating sequence. The level of the first vertically alternating sequence is herein referred to as a first-tier level, and the level of the vertically alternating sequence to be subsequently formed immediately above the first-tier level is herein referred to as a second-tier level, etc.

The first vertically alternating sequence can include first-tier insulating layers 132 as the first material layers, and first-tier sacrificial material layers 142 as the second material layers. In one embodiment, each first-tier insulating layer 132 can include a first insulating material, and each first-tier sacrificial material layer 142 can include a first sacrificial material. An alternating plurality of first-tier insulating layers 132 and first-tier sacrificial material layers 142 is formed over the substrate semiconductor layer 9. As used herein, a "sacrificial material" refers to a material that is removed during a subsequent processing step.

The first vertically alternating sequence (132, 142) can include first-tier insulating layers 132 composed of the first material, and first-tier sacrificial material layers 142 composed of the second material, which is different from the first material. The first material of the first-tier insulating layers 132 can be at least one insulating material. Insulating materials that can be employed for the first-tier insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first-tier insulating layers 132 can be silicon oxide.

The second material of the first-tier sacrificial material layers 142 is a sacrificial material that can be removed selective to the first material of the first-tier insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first-tier sacrificial material layers 142 may comprise an insulating material, a semiconductor material, or a conductive material. The second material of the first-tier sacrificial material layers 142 can be subsequently replaced with electrically conductive electrodes which can function, for example, as control gate electrodes of a vertical NAND device. In one embodiment, the first-tier sacrificial material layers 142 can be material layers that comprise silicon nitride.

In one embodiment, the first-tier insulating layers 132 can include silicon oxide, and sacrificial material layers can include silicon nitride sacrificial material layers. The first material of the first-tier insulating layers 132 can be deposited, for example, by chemical vapor deposition (CVD). For example, if silicon oxide is employed for the first-tier insulating layers 132, tetraethylorthosilicate (TEOS) can be employed as the precursor material for the CVD process. The second material of the first-tier sacrificial material layers 142 can be formed, for example, CVD or atomic layer deposition (ALD).

The thicknesses of the first-tier insulating layers 132 and the first-tier sacrificial material layers 142 can be in a range from 20 nm to 50 nm, although lesser and greater thicknesses can be employed for each first-tier insulating layer 132 and for each first-tier sacrificial material layer 142. The number of repetitions of the pairs of a first-tier insulating layer 132 and a first-tier sacrificial material layer 142 can be in a range from 2 to 1,024, and typically from 8 to 256, although a greater number of repetitions can also be employed. In one embodiment, each first-tier sacrificial material layer 142 in the first vertically alternating sequence (132, 142) can have a uniform thickness that is substantially invariant within each respective first-tier sacrificial material layer 142. Each layer within the first vertically alternating sequence (132, 142) can be a continuous material layer without any opening therethrough. As such, the first vertically alternating sequence (132, 142) can include a vertically alternating sequence of continuous insulating layers and continuous sacrificial material layers.

A first insulating cap layer 170 is subsequently formed over the stack (132, 142). The first insulating cap layer 170 includes a dielectric material, which can be any dielectric material that can be employed for the first-tier insulating layers 132. In one embodiment, the first insulating cap layer 170 includes the same dielectric material as the first-tier insulating layers 132. The thickness of the first insulating cap layer 170 can be in a range from 20 nm to 300 nm, although lesser and greater thicknesses can also be employed.

Generally, the substrate semiconductor layer 9 and the material layers thereupon can be employed to form a memory die. The memory die may include a plurality of planes (P0-P7). The exemplary layout illustrated in FIG. 1B includes eight planes (P0-P7), which can be independently operated within a memory die. Each plane (P0-P7) can include a respective three-dimensional memory array containing plural blocks upon completion of the memory die. Each plane (P0-P7) can include a respective memory array region 100, a respective contact region 200, and a respective peripheral region 300. A gap region G can be provided between neighboring pairs of planes (P0-P7). In one embodiment, the gap region G can laterally extend along a first horizontal direction (i.e., word line direction) hd1, and neighboring pairs of planes (P0 and P1; P2 and P3; P4 and P5; P6 and P7) that neighbor along the second horizontal direction (e.g., bit line direction) hd2 can be laterally spaced apart by the gap region G along a second horizontal direction hd2 that is perpendicular to the first horizontal direction hd1. According to an aspect of the present disclosure, the width of each gap region G can be the same as the width of a respective backside trench to be subsequently formed between adjacent blocks in the same memory plane. In an illustrative example, the width of each gap region G may be in a range from 300 nm to 3,000 nm, although lesser and greater widths may also be employed. Neighboring pairs of planes (P0 and P2; P4 and P6; P1 and P3; P5 and P7) that neighbor along the first horizontal direction hd1 can be laterally spaced apart by the respective contact region 200.

Figure 2:
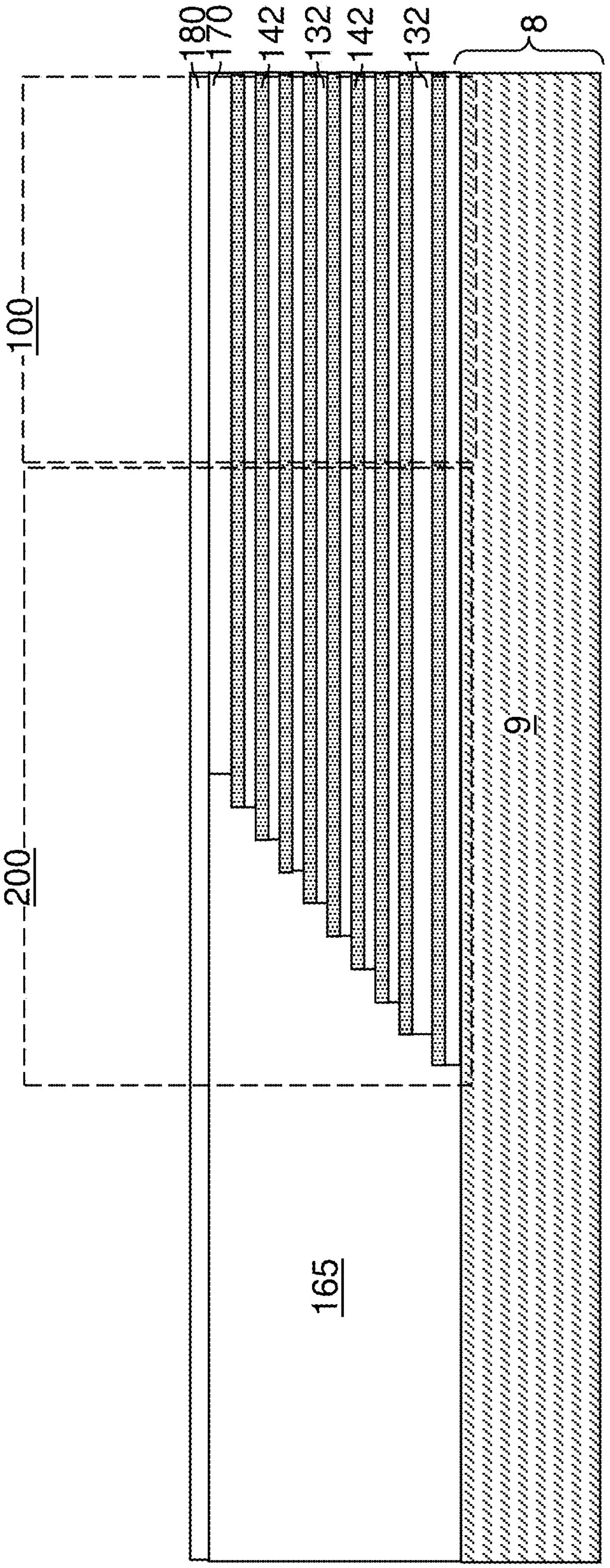
FIG. 2 is a vertical cross-sectional view of the first exemplary structure after patterning of first stepped surfaces on the first vertically alternating sequence and formation of a first retro-stepped dielectric material portion according to an embodiment of the present disclosure.

Referring to FIG. 2, the first insulating cap layer 170 and the first vertically alternating sequence (132, 142) can be patterned to form first stepped surfaces in the contact region 200. The contact region 200 can include a respective first stepped area in which the first stepped surfaces are formed, and a second stepped area in which additional stepped surfaces are to be subsequently formed in a second-tier structure (to be subsequently formed over a first-tier structure) and/or additional tier structures. The first stepped surfaces can be formed, for example, by forming a mask layer with an opening therein, etching a cavity within the levels of the first insulating cap layer 170, and iteratively expanding the etched area and vertically recessing the cavity by etching each pair of a first-tier insulating layer 132 and a first-tier sacrificial material layer 142 located directly underneath the bottom surface of the etched cavity within the etched area. The first stepped surfaces continuously extend from a bottommost layer within the first vertically alternating sequence (132, 142) to a topmost layer within the first vertically alternating sequence (132, 142). The cavity overlying the first stepped surfaces is herein referred to as a first stepped cavity.

A dielectric material, such as a silicate glass, can be deposited in the first stepped cavity. The dielectric material is subsequently planarized to provide a planar surface within a horizontal plane including a top surface of the first insulating cap layer. A continuous remaining portion of the dielectric material overlying the first stepped surfaces and filling the first stepped cavity is herein referred to as a first retro-stepped dielectric material portion 165, which comprises, and can consist of, the first silicate glass material. As used herein, a "retro-stepped" element refers to an element that has stepped surfaces and a horizontal cross-sectional area that increases monotonically as a function of a vertical distance from a top surface of a substrate on which the element is present. The first vertically alternating sequence (132, 142) and the first retro-stepped dielectric material portion 165 collectively constitute a first-tier structure, which is an in-process structure that is subsequently modified.

An inter-tier dielectric layer 180 may be optionally deposited over the first-tier structure (132, 142, 165, 170). The inter-tier dielectric layer 180 includes a dielectric material such as a silicate glass material. The thickness of the inter-tier dielectric layer 180 can be in a range from 30 nm to 300 nm, although lesser and greater thicknesses can also be employed. In one embodiment, the inter-tier dielectric layer 180 can include a silicate glass that provides a greater etch rate in hydrofluoric acid than undoped silicate glass. For example, the inter-tier dielectric layer 180 can include borosilicate glass.

The combination of all material portions formed over the top surface of the substrate semiconductor layer 9 and underneath the inter-tier dielectric layer 180 constitutes a first-tier structure (132, 142, 165). The first-tier structure (132, 142, 165) comprises a first vertically alternating sequence of first-tier insulating layers 132 and first-tier sacrificial material layers 142 and a first retro-stepped dielectric material portion 165 overlying, and contacting, first stepped surfaces of the first vertically alternating sequence (132, 142). The first stepped surfaces continuously extend from a bottommost layer within the first vertically alternating sequence (132, 142) to a topmost layer within the first vertically alternating sequence (132, 142) and contacts vertical surfaces and horizontal bottom surfaces of the first retro-stepped dielectric material portion 165.

Figure 3A:
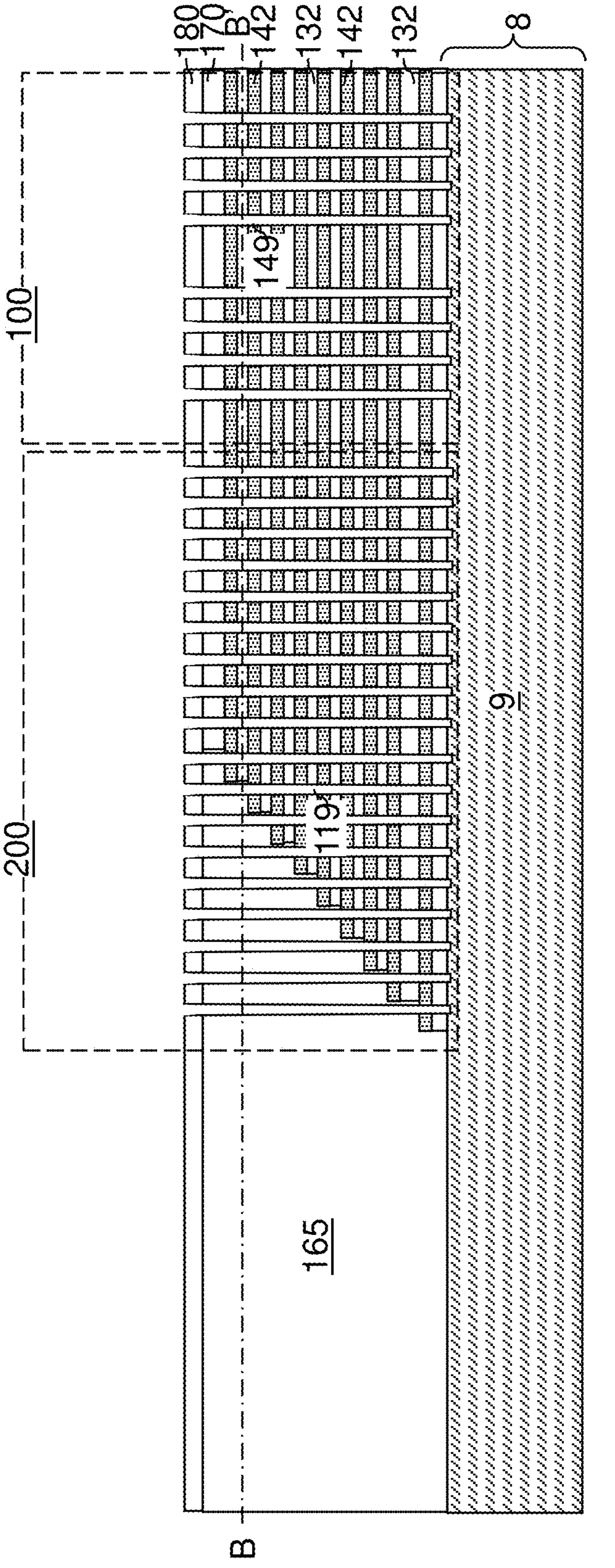
FIG. 3A is a vertical cross-sectional view of the first exemplary structure after formation of first-tier memory openings and first-tier support openings according to an embodiment of the present disclosure.
Figure 3B:
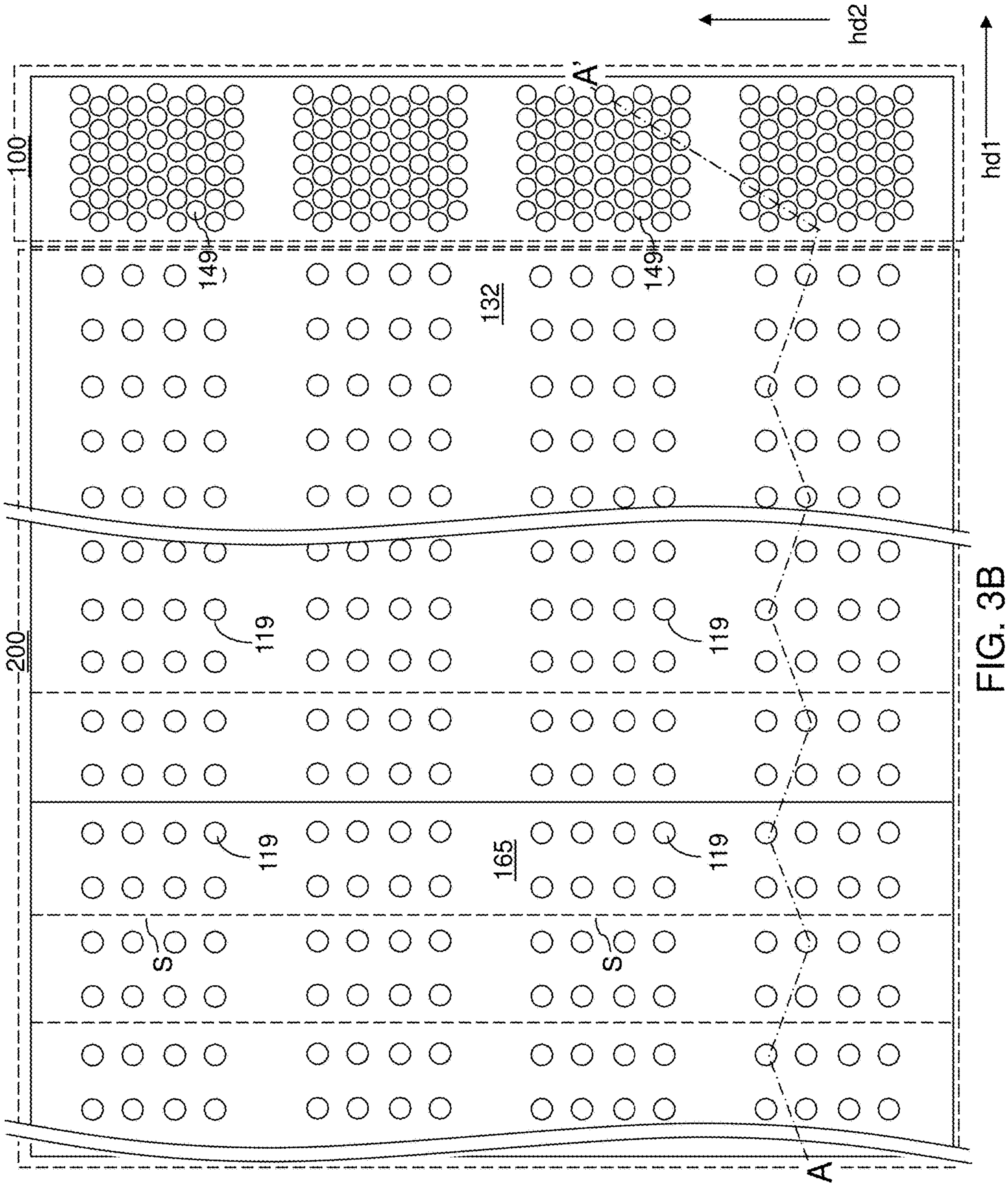
FIG. 3B is a horizontal cross-sectional view of the first exemplary structure along the horizontal plane B-B' in FIG. 3A. The hinged vertical plane A-A' corresponds to the plane of the vertical cross-sectional view of FIG. 3A.

Referring to FIGS. 3A and 3B, first-tier memory openings 149 and first-tier support openings 119 can be formed. Locations of steps S in the first vertically alternating sequence (132, 142) are illustrated as dotted lines in FIG. 3B. The first-tier memory openings 149 and the first-tier support openings 119 extend through the first vertically alternating sequence (132, 142) at least to a top surface of the substrate semiconductor layer 9. The first-tier memory openings 149 can be formed in the memory array region 100 at locations at which memory stack structures including vertical stacks of memory elements are to be subsequently formed. The first-tier support openings 119 can be formed in the contact region 200. The first-tier support openings 119 can be formed within a first area of the first stepped surfaces at which the first retro-stepped dielectric material portion 165 contacts the first vertically alternating sequence (132, 142) and within a second area of the contact region 200 in which second stepped surfaces of a second vertically alternating sequence are to be subsequently formed. The second area of the contact region 200 is located between the first area of the word line contact region and the memory array region 100.

For example, a lithographic material stack (not shown) including at least a photoresist layer can be formed over the first insulating cap layer 170 (and the optional inter-tier dielectric layer 180, if present), and can be lithographically patterned to form openings within the lithographic material stack. The pattern in the lithographic material stack can be transferred through the first insulating cap layer 170 (and the optional inter-tier dielectric layer 180), and through the entirety of the first vertically alternating sequence (132, 142) by at least one anisotropic etch that employs the patterned lithographic material stack as an etch mask. Portions of the first insulating cap layer 170 (and the optional inter-tier dielectric layer 180), and the first vertically alternating sequence (132, 142) underlying the openings in the patterned lithographic material stack are etched to form the first-tier memory openings 149 and the first-tier support openings 119. In other words, the transfer of the pattern in the patterned lithographic material stack through the first insulating cap layer 170 and the first vertically alternating sequence (132, 142) forms the first-tier memory openings 149 and the first-tier support openings 119.

In one embodiment, the chemistry of the anisotropic etch process employed to etch through the materials of the first vertically alternating sequence (132, 142) can alternate to optimize etching of the first and second materials in the first vertically alternating sequence (132, 142). The anisotropic etch can be, for example, a series of reactive ion etches or a single etch (e.g., $CF_4/O_2/Ar$ etch). The sidewalls of the first-tier memory openings 149 and the support openings 119. Subsequently, the patterned lithographic material stack can be subsequently removed, for example, by ashing.

Generally, groups of first-tier memory openings 149 can be formed through the first vertically alternating sequence (132, 142). Each group of first-tier memory openings 149 can be formed within a rectangular area (e.g., area of a memory block) that laterally extends along a first horizontal direction (e.g., word line direction) hd1. Each group of first-tier memory openings 149 can include a plurality of rows of first-tier memory openings 149. Each row of first-tier memory openings 149 can laterally extend along the first horizontal direction hd1. Rows of first-tier memory openings 149 can be laterally spaced apart from each other along the second horizontal direction (e.g., bit line direction) hd2.

Optionally, the portions of the first-tier memory openings 149 and the first-tier support openings 119 at the level of the inter-tier dielectric layer 180 can be laterally expanded by an isotropic etch. For example, if the inter-tier dielectric layer 180 comprises a dielectric material (such as borosilicate glass) having a greater etch rate than the first-tier insulating layers 132 (that can include undoped silicate glass), an isotropic etch (such as a wet etch employing HF) can be employed to expand the lateral dimensions of the first-tier memory openings at the level of the inter-tier dielectric layer 180.

Figure 4:
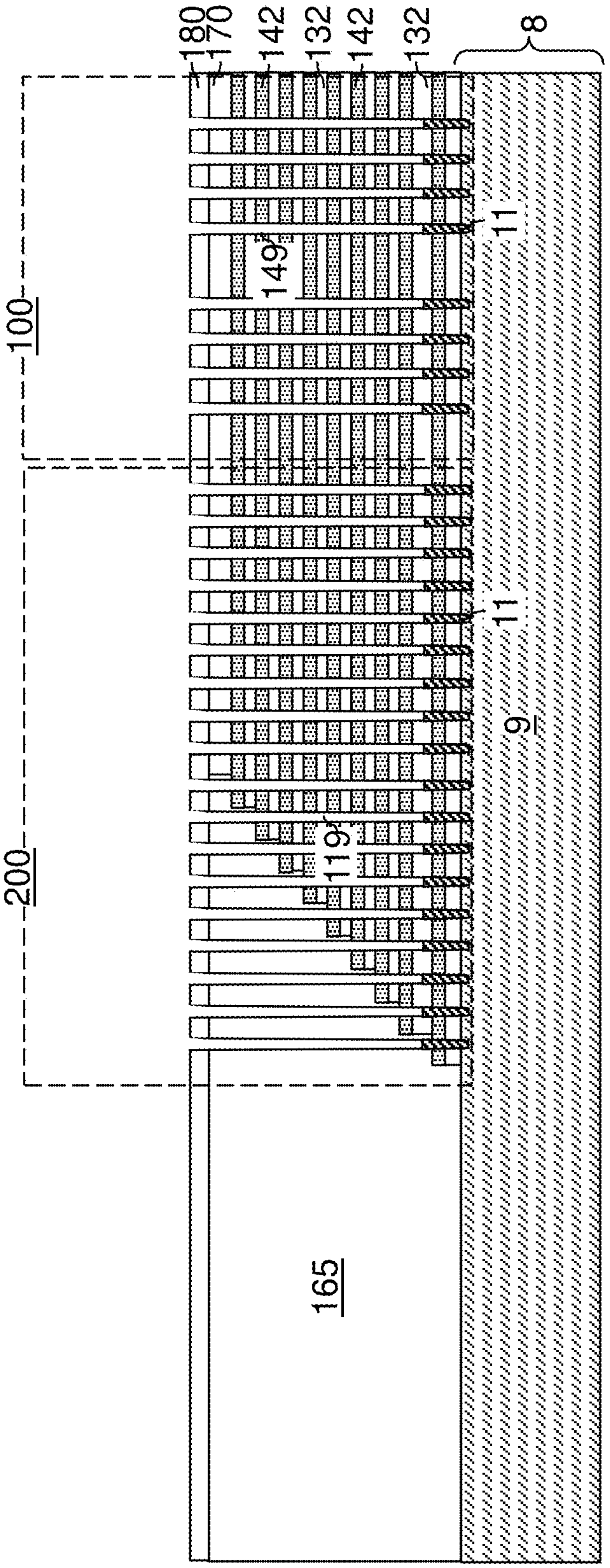
FIG. 4 is a vertical cross-sectional view of the first exemplary structure after formation of an optional pedestal channel portion in each of the first-tier memory openings and first-tier support openings according to an embodiment of the present disclosure.

Referring to FIG. 4, pedestal channel portions 11 may be optionally formed at the bottom of each of the first-tier memory openings 149 and the first-tier support openings 119. The pedestal channel portions 11 may be formed by a selective semiconductor deposition process that deposits a doped semiconductor material having a doping of a first conductivity type. If the pedestal channel portions 11 are formed, top surfaces of the pedestal channel portions 11 can be formed at, or above, the horizontal plane including the top surface of the bottommost first-tier sacrificial material layer 142 and the horizontal plane including the bottom surface of the first-tier sacrificial material layer 42 that is most proximal to the bottommost first-tier sacrificial material layer 142 (i.e., the second-from-the-bottom second-tier sacrificial material layer 142).

Figure 5A:
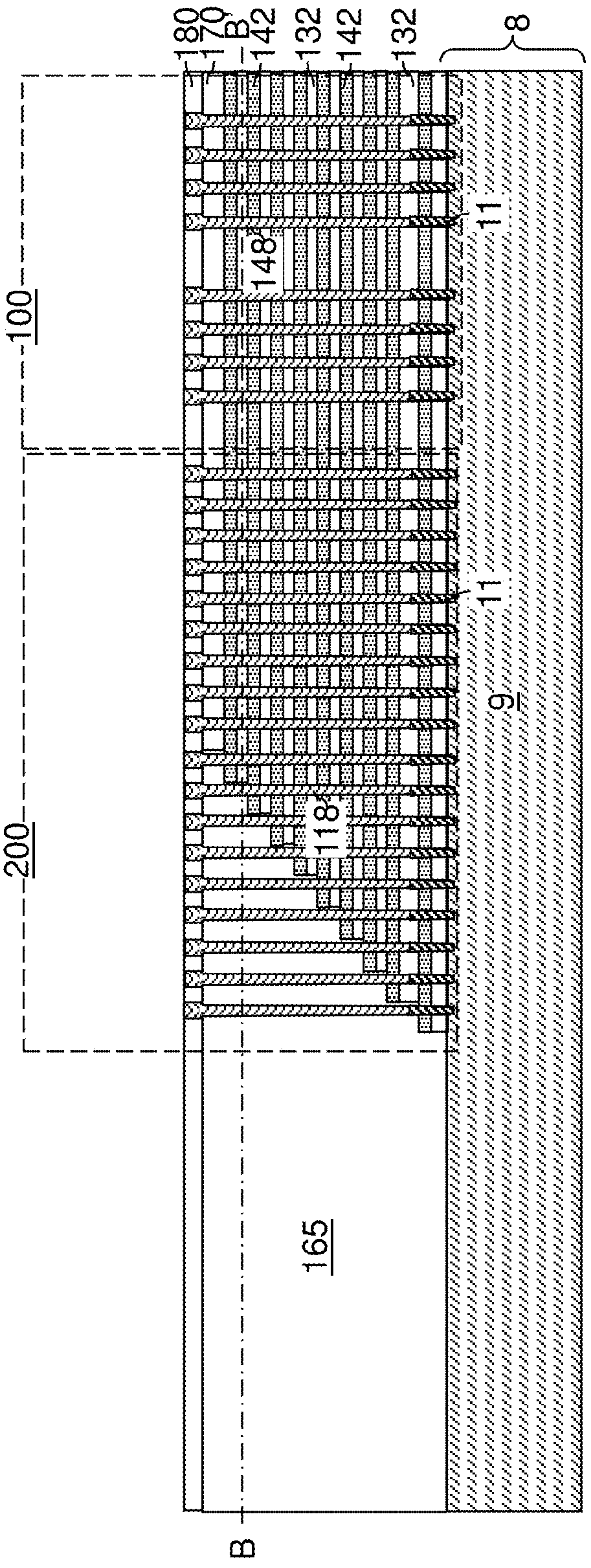
FIG. 5A is a vertical cross-sectional view of the first exemplary structure after formation of first-tier sacrificial memory opening fill structures and first-tier sacrificial support structures according to an embodiment of the present disclosure.
Figure 5B:
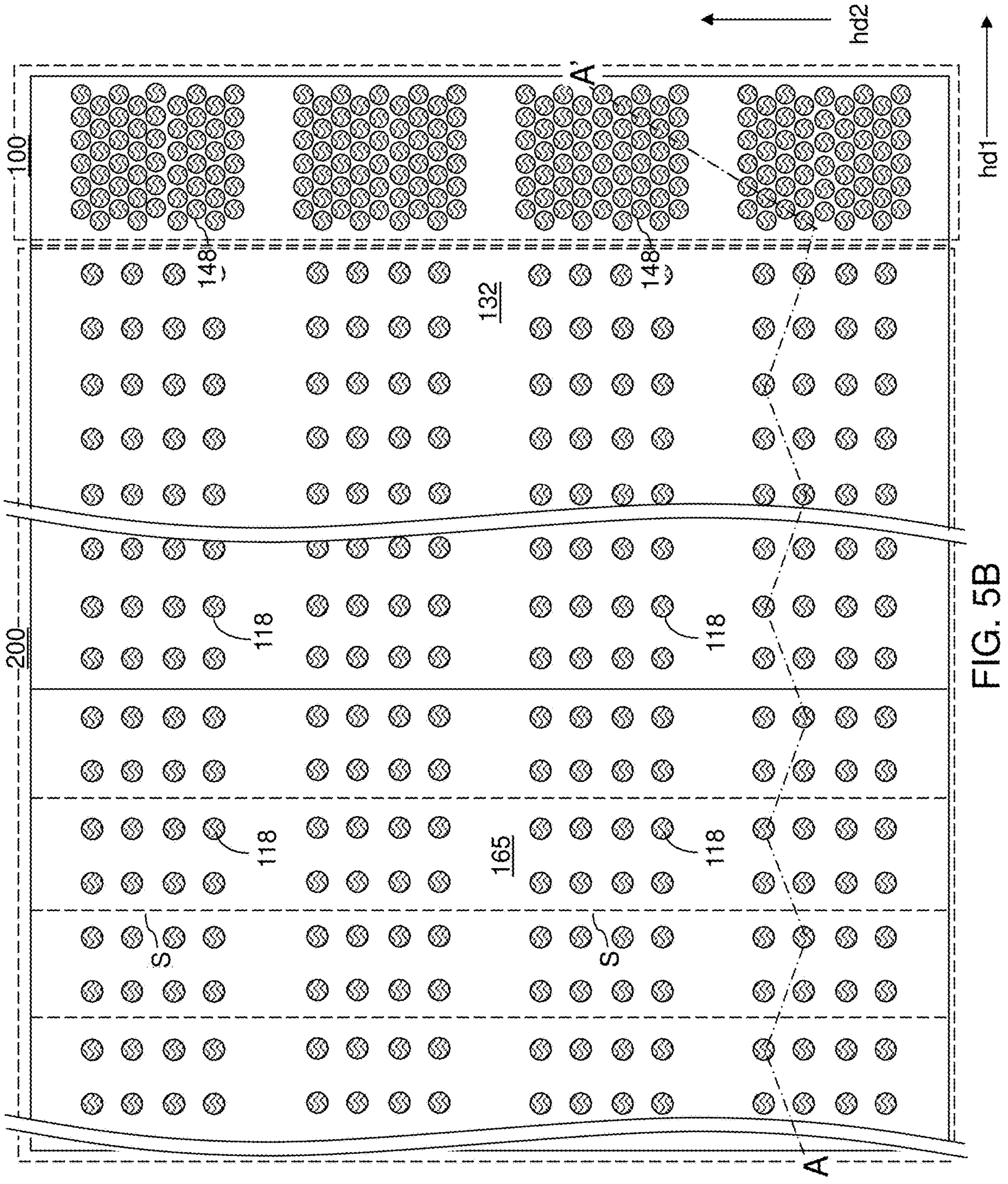
FIG. 5B is a horizontal cross-sectional view of the first exemplary structure along the horizontal plane B-B' in FIG. 5A. The hinged vertical plane A-A' corresponds to the plane of the vertical cross-sectional view of FIG. 5A.

Referring to FIGS. 5A and 5B, first-tier sacrificial memory opening fill structures 148 can be formed in the first-tier memory openings 149, and first-tier sacrificial support structures 118 can be formed in the first-tier support openings 119. For example, a fill material layer including a fill material is deposited in the first-tier memory openings 149 and the first-tier support openings 119.

Figure 6:
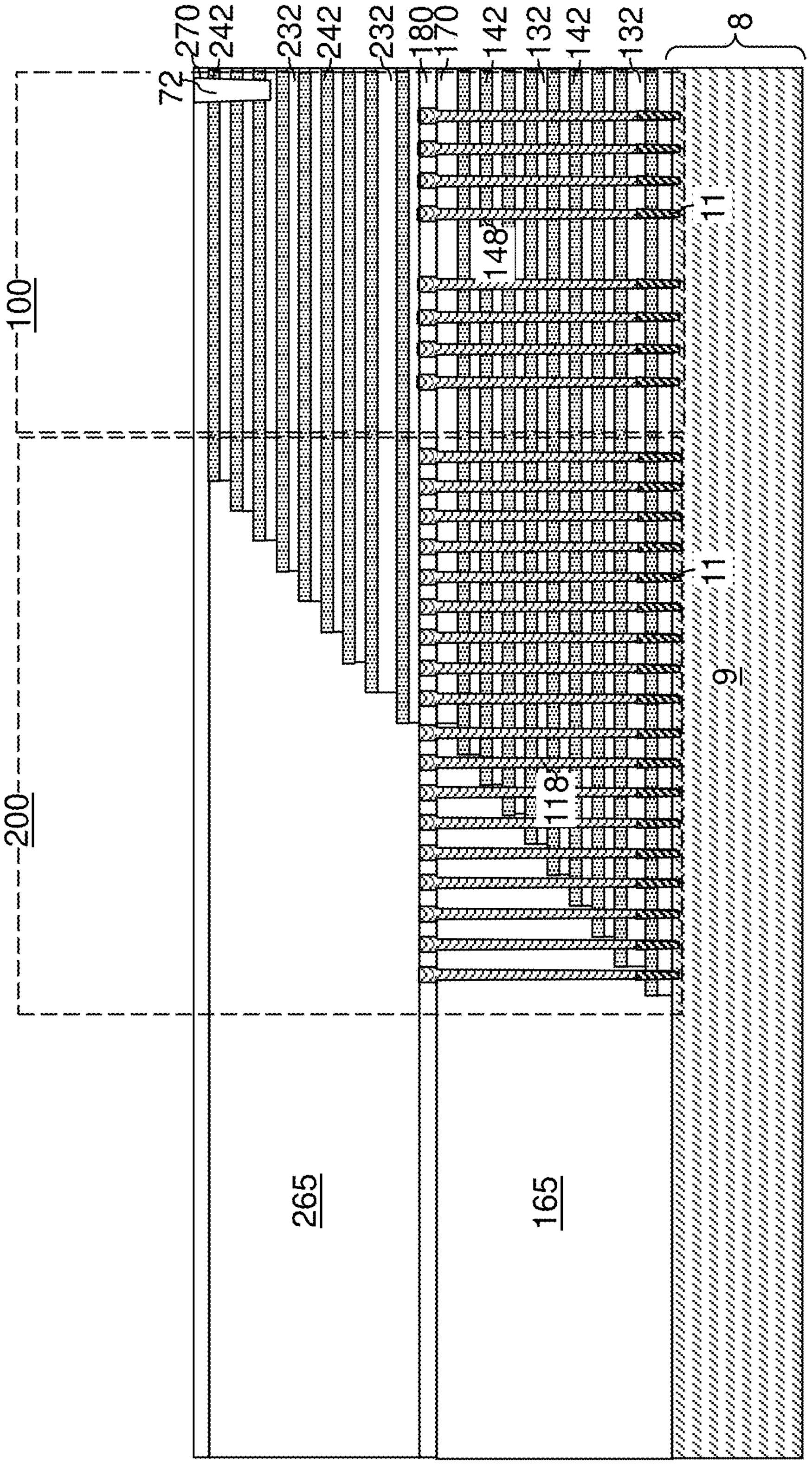
FIG. 6 is a vertical cross-sectional view of the first exemplary structure after formation of a second vertically alternating sequence of second-tier insulating layers and second-tier sacrificial material layers, a second-tier retro-stepped dielectric material portion, and a second insulating cap layer according to an embodiment of the present disclosure.

Referring to FIG. 6, a second-tier structure can be formed over the first-tier structure (132, 142, 170, 148, 118). The second-tier structure can include an additional vertically alternating sequence of insulating layers and sacrificial material layers, which can be sacrificial material layers. For example, a second vertically alternating sequence (232, 242) of material layers can be subsequently formed on the top surface of the first vertically alternating sequence (132, 142). The second stack (232, 242) includes an alternating plurality of third material layers and fourth material layers. Each third material layer can include a third material, and each fourth material layer can include a fourth material that is different from the third material. In one embodiment, the third material can be the same as the first material of the first-tier insulating layer 132, and the fourth material can be the same as the second material of the first-tier sacrificial material layers 142.

In one embodiment, the third material layers can be second-tier insulating layers 232 and the fourth material layers can be second-tier sacrificial material layers 242 that provide vertical spacing between each vertically neighboring pair of the second-tier insulating layers 232. In one embodiment, the third material layers and the fourth material layers can be second-tier insulating layers 232 and second-tier sacrificial material layers 242, respectively.

The third material of the second-tier insulating layers 232 may be at least one insulating material. The fourth material of the second-tier sacrificial material layers 242 may be a sacrificial material that can be removed selective to the third material of the second-tier insulating layers 232. The second-tier sacrificial material layers 242 may comprise an insulating material, a semiconductor material, or a conductive material. The fourth material of the second-tier sacrificial material layers 242 can be subsequently replaced with electrically conductive electrodes which can function, for example, as control gate electrodes of a vertical NAND device.

In one embodiment, each second-tier insulating layer 232 can include a second insulating material, and each second-tier sacrificial material layer 242 can include a second sacrificial material. In this case, the second stack (232, 242) can include an alternating plurality of second-tier insulating layers 232 and second-tier sacrificial material layers 242. The third material of the second-tier insulating layers 232 can be deposited, for example, by chemical vapor deposition (CVD). The fourth material of the second-tier sacrificial material layers 242 can be formed, for example, CVD or atomic layer deposition (ALD).

The third material of the second-tier insulating layers 232 can be at least one insulating material. Insulating materials that can be employed for the second-tier insulating layers 232 can be any material that can be employed for the first-tier insulating layers 132. The fourth material of the second-tier sacrificial material layers 242 is a sacrificial material that can be removed selective to the third material of the second-tier insulating layers 232. Sacrificial materials that can be employed for the second-tier sacrificial material layers 242 can be any material that can be employed for the first-tier sacrificial material layers 142. In one embodiment, the second insulating material can be the same as the first insulating material, and the second sacrificial material can be the same as the first sacrificial material.

The thicknesses of the second-tier insulating layers 232 and the second-tier sacrificial material layers 242 can be in a range from 20 nm to 50 nm, although lesser and greater thicknesses can be employed for each second-tier insulating layer 232 and for each second-tier sacrificial material layer 242. The number of repetitions of the pairs of a second-tier insulating layer 232 and a second-tier sacrificial material layer 242 can be in a range from 2 to 1,024, and typically from 8 to 256, although a greater number of repetitions can also be employed. In one embodiment, each second-tier sacrificial material layer 242 in the second stack (232, 242) can have a uniform thickness that is substantially invariant within each respective second-tier sacrificial material layer 242.

The second vertically alternating sequence (232, 242) can be patterned to form second stepped surfaces in the second stepped area within the contact region 200. The second stepped area is more proximal to the memory array region 100 than the first stepped area including the first stepped surfaces is to the memory array region. The second stepped surfaces can be formed, for example, by forming a mask layer with an opening therein, etching a cavity within a topmost second-tier sacrificial material layer 242 and a topmost second-tier insulating layer 232, and iteratively expanding the etched area and vertically recessing the cavity by etching each pair of a first-tier insulating layer 132 and a first-tier sacrificial material layer 142 located directly underneath the bottom surface of the etched cavity within the etched area. The second stepped surfaces continuously extend from a bottommost layer within the second vertically alternating sequence (232, 242) to a topmost layer within the first vertically alternating sequence (132, 142). The cavity overlying the second stepped surfaces is herein referred to as a first stepped cavity.

A dielectric material such as silicon oxide can be deposited over the second stepped surfaces. Portions of the dielectric material that overlie the second vertically alternating sequence (232, 242) can be removed by a planarization process such as a chemical mechanical planarization (CMP) process. A continuous remaining portion of the dielectric material overlying the second stepped surfaces and filling the second stepped cavity is herein referred to as a second retro-stepped dielectric material portion 265. The second vertically alternating sequence (232, 242) and the second retro-stepped dielectric material portion 265 collectively constitute a second-tier structure, which is an in-process structure that is subsequently modified. The second stepped surfaces continuously extend from a bottommost layer within the second vertically alternating sequence (232, 242) to a topmost layer within the second vertically alternating sequence (232, 242) and contacts vertical surfaces and horizontal bottom surfaces of the second retro-stepped dielectric material portion 265.

A second insulating cap layer 270 can be subsequently formed over the second vertically alternating sequence (232, 242). The second insulating cap layer 270 includes a dielectric material that is different from the material of the second-tier sacrificial material layers 242. In one embodiment, the second insulating cap layer 270 can include silicon oxide.

Optionally, drain-select-level dielectric isolation structures 72 can be formed through a subset of layers in an upper portion of the second vertically alternating sequence (232, 242). The second-tier sacrificial material layers 242 that are cut by the drain-select-level dielectric isolation structures 72 correspond to the levels in which drain-select-level electrically conductive layers are subsequently formed. The drain-select-level dielectric isolation structures 72 include a dielectric material such as silicon oxide.

Generally, a subset of the spacer material layers (such as a distal subset of the second-tier sacrificial material layers 246 that is most distal from the substrate including the substrate semiconductor layer 9) can be divided by forming drain-select-level trenches after formation of the groups of memory opening fill structures 58. The drain-select-level dielectric isolation structures 72 can be formed by depositing the dielectric material in the drain-select-level trenches. The drain-select-level dielectric isolation structures 72 can laterally extend along the first horizontal direction hd1.

Figure 7A:
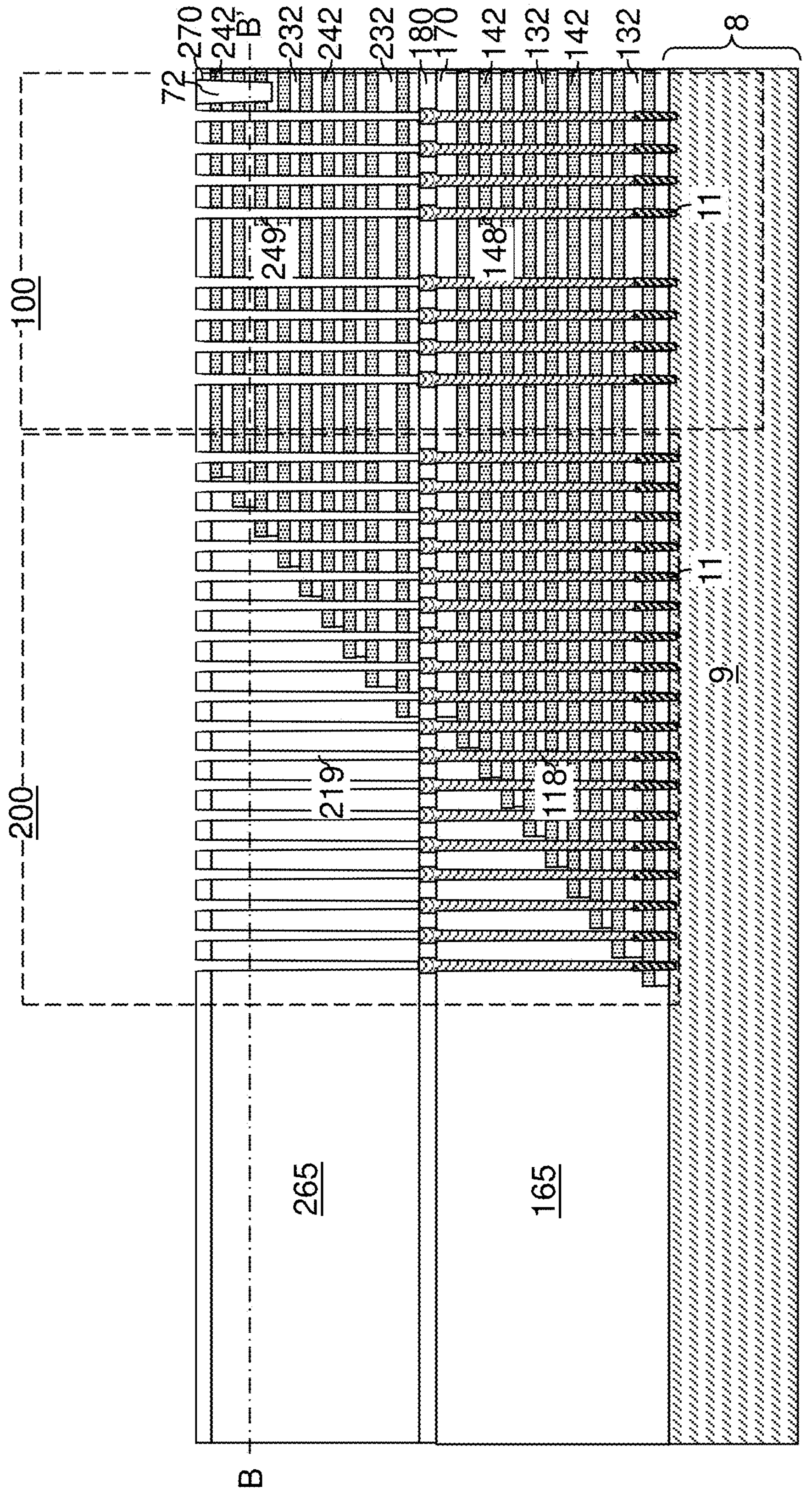
FIG. 7A is a vertical cross-sectional view of the first exemplary structure after formation of second-tier memory openings and second-tier support openings according to an embodiment of the present disclosure.
Figure 7B:
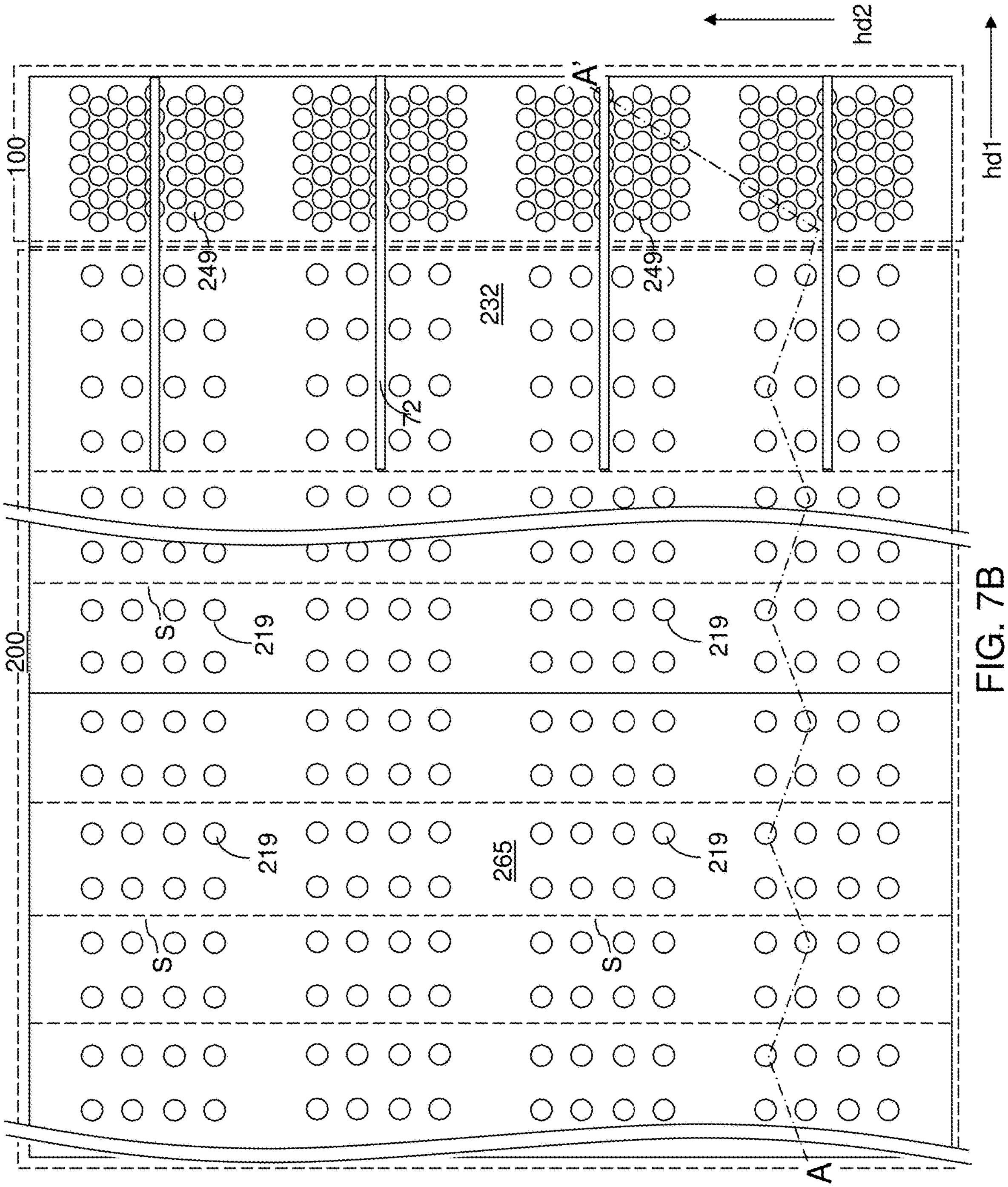
FIG. 7B is a horizontal cross-sectional view of the first exemplary structure along the horizontal plane B-B' in FIG. 7A. The hinged vertical plane A-A' corresponds to the plane of the vertical cross-sectional view of FIG. 7A.
Figure 7C:
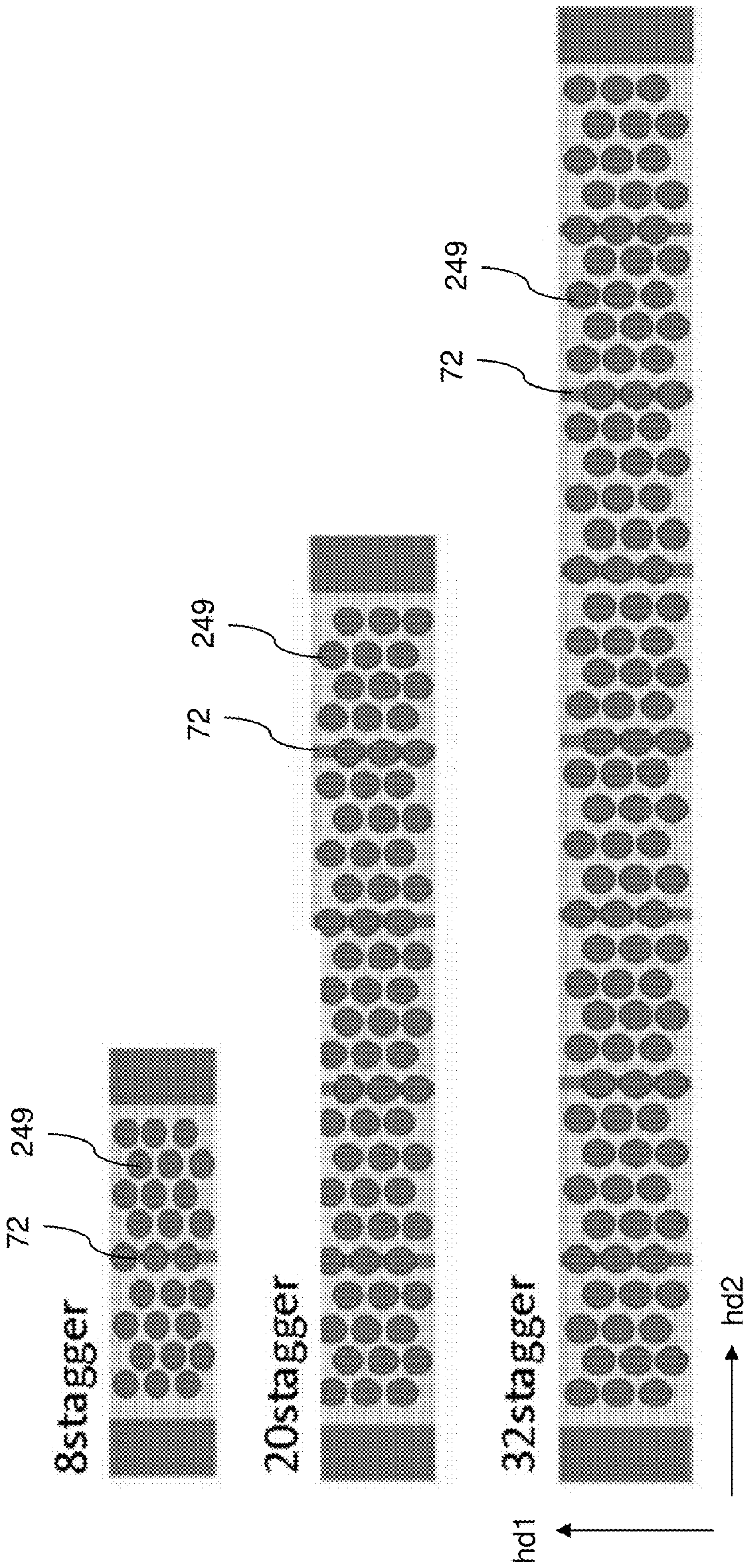
FIG. 7C illustrates horizontal cross-sectional views of various configurations for arrangement of second-tier memory openings according to an embodiment of the present disclosure.

Referring to FIGS. 7A-7C, second-tier memory openings 249 and second tier support openings 219 extending through the second-tier structure (232, 242, 270, 265) are formed in areas overlying the sacrificial memory opening fill portions 148. A photoresist layer can be applied over the second-tier structure (232, 242, 270, 265), and can be lithographically patterned to form a same pattern as the pattern of the sacrificial memory opening fill portions 148 and the first-tier sacrificial support structures 118, i.e., the pattern of the first-tier memory openings 149 and the first-tier support openings 119. An anisotropic etch can be performed to transfer the pattern of the lithographically patterned photoresist layer through the second-tier structure (232, 242, 270, 265). In one embodiment, the chemistry of the anisotropic etch process employed to etch through the materials of the second vertically alternating sequence (232, 242) can alternate to optimize etching of the alternating material layers in the second vertically alternating sequence (232, 242). The anisotropic etch can be, for example, a series of reactive ion etches. The patterned lithographic material stack can be removed, for example, by ashing after the anisotropic etch process.

A top surface of an underlying sacrificial memory opening fill portion 148 can be physically exposed at the bottom of each second-tier memory opening 249. A top surface of an underlying first-tier sacrificial support structure 118 can be physically exposed at the bottom of each second-tier support opening 219.

Generally, groups of second-tier memory openings 249 can be formed through the second vertically alternating sequence (232, 242). Each group of second-tier memory openings 249 can be formed within a rectangular area (e.g., memory block area) that laterally extends along the first horizontal direction hd1. Each group of second-tier memory openings 249 can include a plurality of rows of second-tier memory openings 249. Each row of second-tier memory openings 249 can laterally extend along the first horizontal direction hd1. Rows of second-tier memory openings 249 can be laterally spaced apart from each other along the second horizontal direction (e.g., bit line direction) hd2. The number of rows within each group of second tier-memory openings 249 (e.g., in a memory string unit) depends on the total number of drain-select-level dielectric isolation structures 72 per group of second-tier memory openings 249. In one embodiment, the drain-select-level dielectric isolation structures 72 are formed such that the area of each drain-select-level dielectric isolation structure 72 overlaps with a row of second-tier memory openings 249. FIG. 7C illustrates examples in which the total number of rows of drain-select-level dielectric isolation structures 72 within each memory block (i.e., within each group of second-tier memory openings 249) is 1, 4 or 7, which results in memory blocks having 8, 20 or 32 staggered rows, respectively, of second-tier memory openings 249. In these memory blocks, there will be 2, 5 or 8 drain-side select lines, respectively, formed in a drain-select line level, which results in 2, 5 or 8 memory string units, respectively in each memory block. As can be seen in FIG. 7C, the memory block size increases with the increased number of staggered rows of second-tier memory openings 249.

Figure 8:
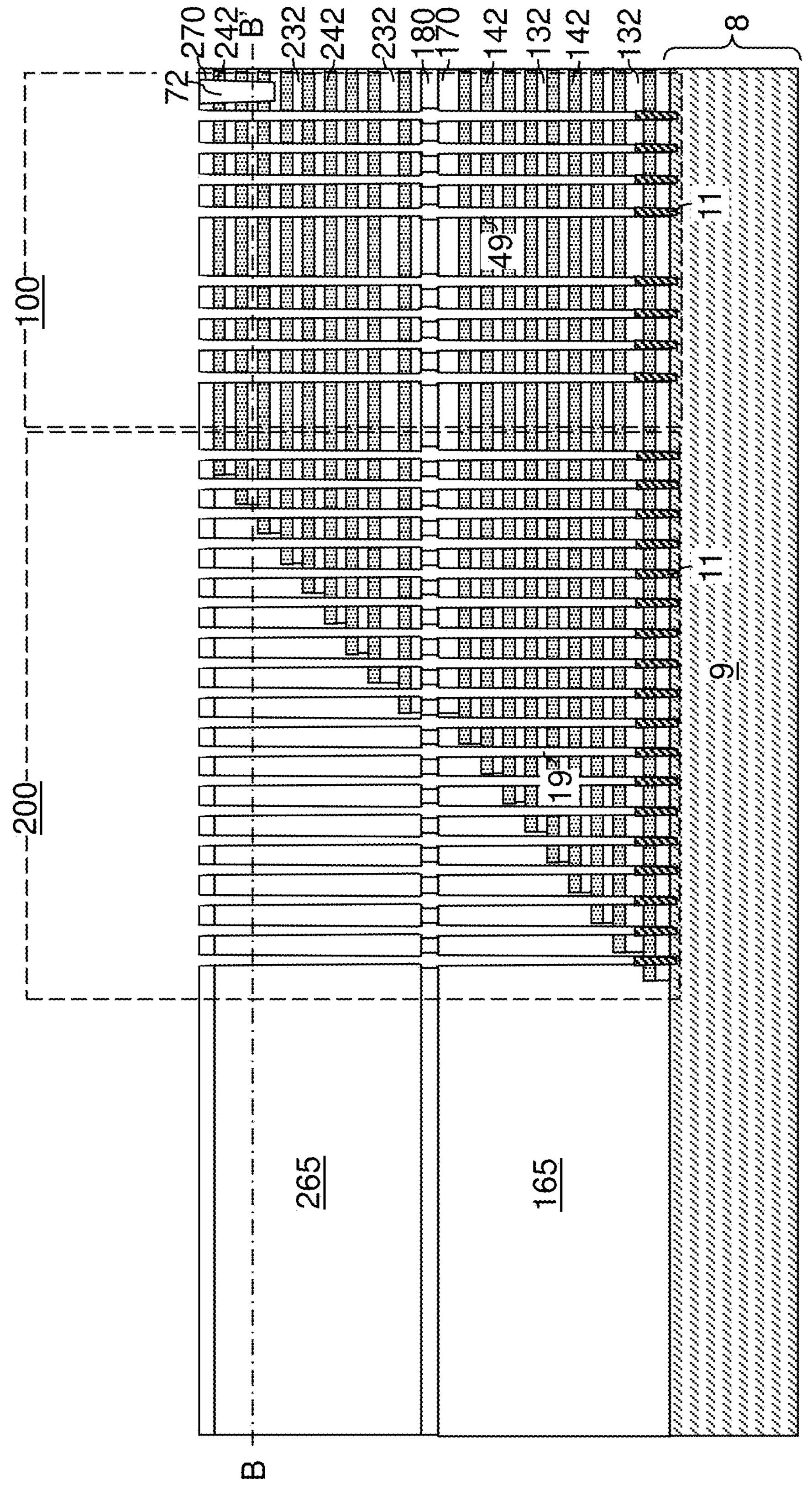
FIG. 8 is a vertical cross-sectional view of the first exemplary structure after formation of inter-tier memory openings and inter-tier support openings according to an embodiment of the present disclosure.

Referring to FIG. 8, an etch process can be performed after the top surfaces of the sacrificial memory opening fill portions 148 and the first-tier sacrificial support structures 118 are physically exposed. The etch process removes the sacrificial material of the sacrificial memory opening fill portions 148 and the first-tier sacrificial support structures 118 selective to the materials of the second vertically alternating sequence (232, 242) and the first vertically alternating sequence (132, 142) (e.g., $C_4F_8/O_2/Ar$ etch). The etch process may include an anisotropic etch process or an isotropic etch process.

Upon removal of the sacrificial memory opening fill portions 148, each vertically adjoining pair of a second-tier memory opening 249 and a first-tier memory opening 149 forms a continuous cavity that extends through the first vertically alternating sequence (132, 142) and the second vertically alternating sequence (232, 242), which is herein referred to as an inter-tier memory opening 49, or a memory opening 49. Likewise, upon removal of the first-tier sacrificial support structures 118, each vertically adjoining pair of a second-tier support opening 219 and a first-tier support opening 119 forms a continuous cavity that extends through the first vertically alternating sequence (132, 142) and the second vertically alternating sequence (232, 242), which is herein referred to as an inter-tier support opening 19, or a support opening 19. A top surface of the substrate semiconductor layer 9 can be physically exposed at the bottom of each memory opening and at the bottom of each support openings. Locations of steps S in the first vertically alternating sequence (132, 142) and the second vertically alternating sequence (232, 242) are illustrated as dotted lines.

Generally, at least one vertically alternating sequence of continuous insulating layers and continuous sacrificial material layers can be formed over a substrate. Memory openings 49 are formed through the at least one vertical alternating sequence.

FIGS. 9A-9H provide sequential cross-sectional views of a memory opening 49 or a support opening 19 during formation of a memory opening fill structure 58 or a primary support pillar structure 20. While a structural change in a memory opening 49 is illustrated in FIGS. 9A-9H, it is understood that the same structural change occurs in each memory openings 49 and in each of the support openings 19 during the same set of processing steps.

Figure 9A:
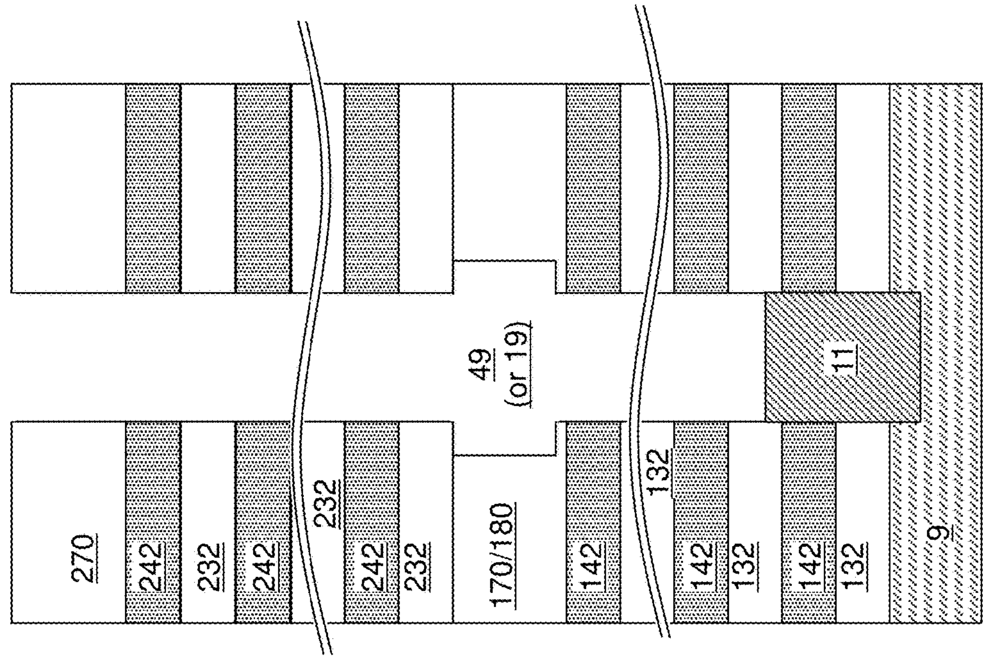
FIGS. 9A-9H are sequential vertical cross-sectional views of an inter-tier memory opening during formation of a memory opening fill structure according to an embodiment of the present disclosure.

Referring to FIG. 9A, a memory opening 49 in the exemplary device structure of FIG. 14 is illustrated. The memory opening 49 extends through the first-tier structure and the second-tier structure. Likewise, each support opening 19 extends through the first-tier structure and the second-tier structure. A pedestal channel portion 11 may, or may not, be present within each memory opening 49 and within each support opening 19. A cavity 49' is present in the unfilled portion of the memory opening 49 (or of the support opening) above the pedestal channel portion 11.

Figure 9B:
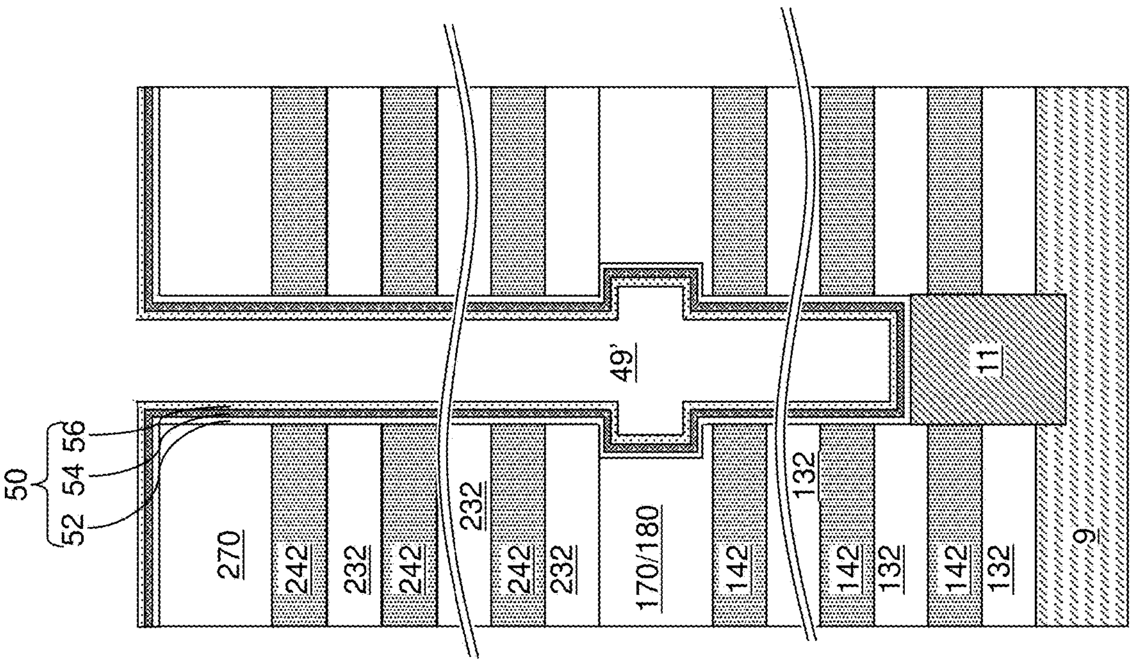

Referring to FIG. 9B, a stack of layers including a blocking dielectric layer 52, a charge storage layer 54, and a tunneling dielectric layer 56 can be sequentially deposited in the memory openings 49. The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen.

In one embodiment, the blocking dielectric layer 52 can include a dielectric metal oxide having a dielectric constant greater than 7.9, i.e., having a dielectric constant greater than the dielectric constant of silicon nitride. Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof.

The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric silicon compound, such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof.

The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers (142, 242). In one embodiment, the charge storage layer 54 includes a silicon nitride layer. In one embodiment, the sacrificial material layers (142, 242) and the insulating layers (132, 232) can have vertically coincident sidewalls, and the charge storage layer 54 can be formed as a single continuous layer.

In another embodiment, the sacrificial material layers (142, 242) can be laterally recessed with respect to the sidewalls of the insulating layers (132, 232), and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

Figure 9C:
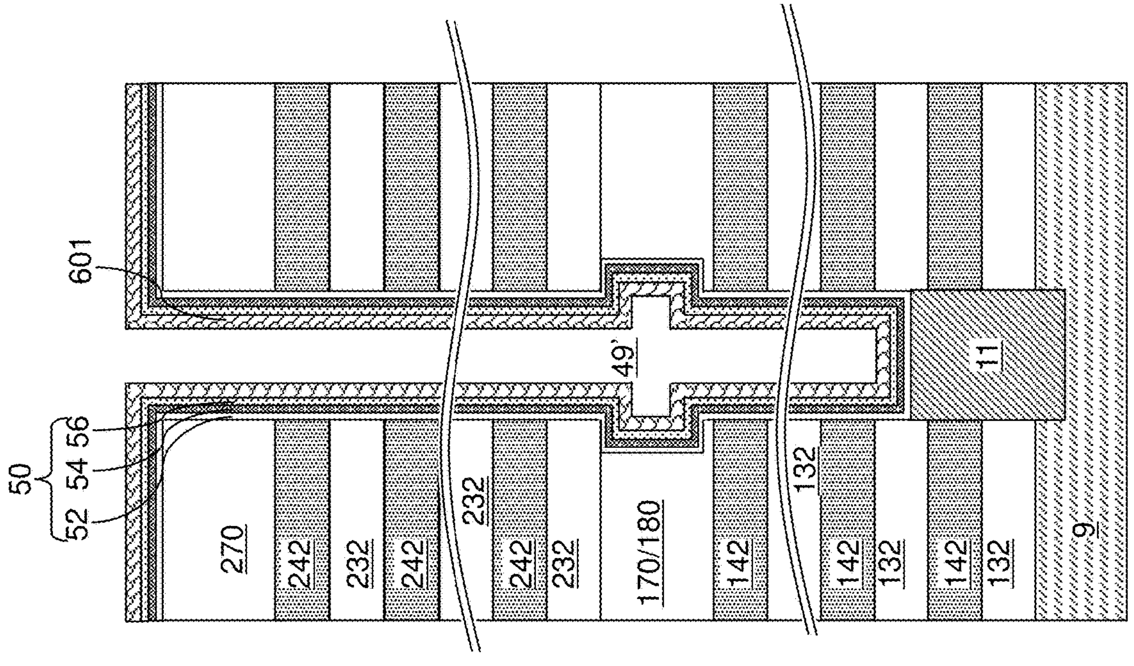

Referring to FIG. 9C, an optional first semiconductor channel layer 601 can be deposited by a conformal deposition process. The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A cavity 49' is formed in the volume of each memory opening 49 that is not filled with the deposited material layers (52, 54, 56, 601).

Figure 9D:
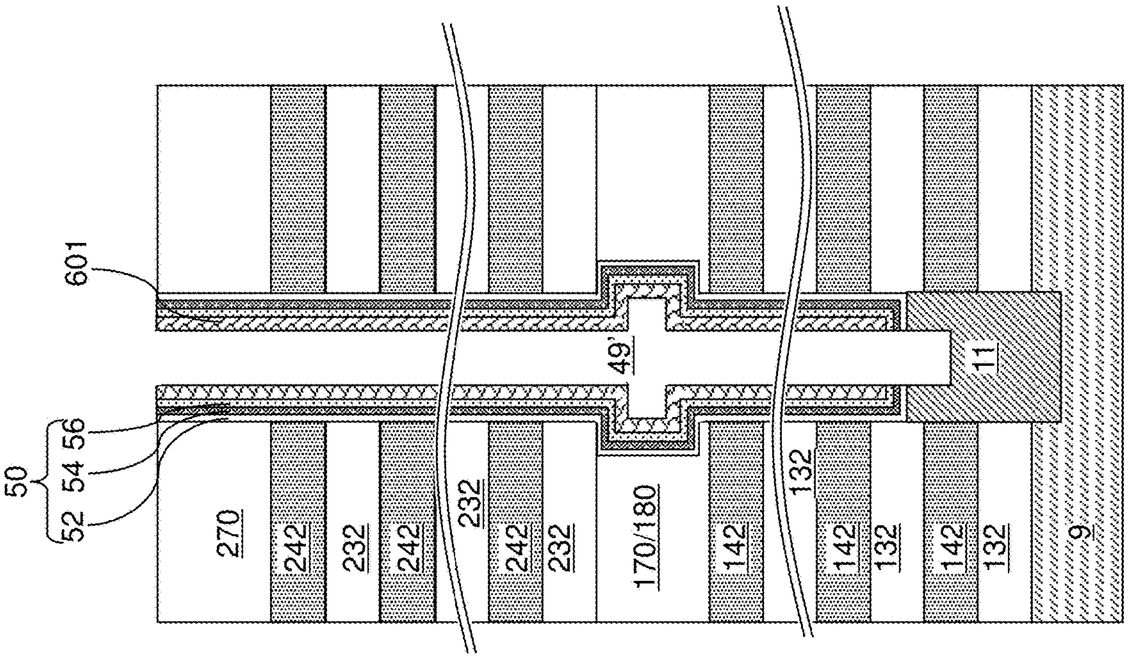

Referring to FIG. 9D, the optional first semiconductor channel layer 601, the tunneling dielectric layer 56, the charge storage layer 54, the blocking dielectric layer 52 are sequentially anisotropically etched employing at least one anisotropic etch process. The portions of the first semiconductor channel layer 601, the tunneling dielectric layer 56, the charge storage layer 54, and the blocking dielectric layer 52 located above the top surface of the second insulating cap layer 270 can be removed by the at least one anisotropic etch process. Further, the horizontal portions of the first semiconductor channel layer 601, the tunneling dielectric layer 56, the charge storage layer 54, and the blocking dielectric layer 52 at a bottom of each cavity 49' can be removed to form openings in remaining portions thereof. Each of the first semiconductor channel layer 601, the tunneling dielectric layer 56, the charge storage layer 54, and the blocking dielectric layer 52 can be etched by a respective anisotropic etch process employing a respective etch chemistry, which may, or may not, be the same for the various material layers.

Each remaining portion of the first semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers (142, 242) constitutes a charge storage region.

A surface of the pedestal channel portion 11 (or a surface of the substrate semiconductor layer 9 in case the pedestal channel portions 11 are not employed) can be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each cavity 49' can be vertically recessed so that the recessed semiconductor surface underneath the cavity 49' is vertically offset from the topmost surface of the pedestal channel portion 11 (or of the semiconductor material layer 10 in case pedestal channel portions 11 are not employed) by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (comprising portions of the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 can have vertically coincident sidewalls.

Figure 9F:
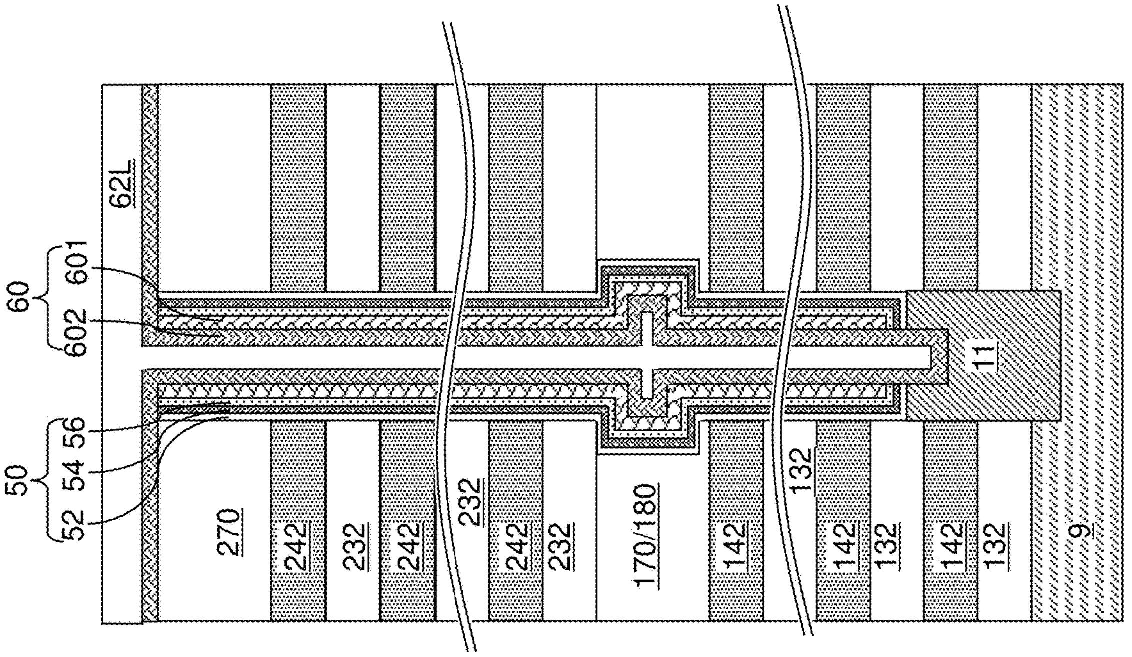
Figure 9E:
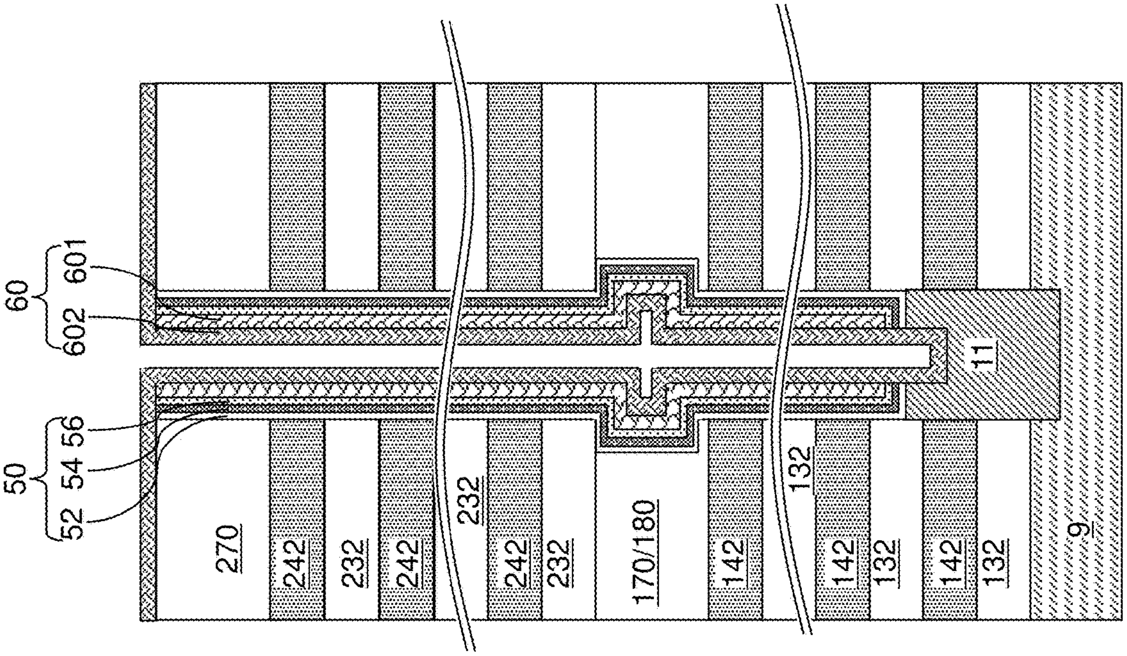

Referring to FIG. 9E, a second semiconductor channel layer 602 can be deposited directly on the semiconductor surface of the pedestal channel portion 11 or the semiconductor material layer 10 if the pedestal channel portion 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Referring to FIG. 9F, in case the cavity 49' in each memory opening is not completely filled by the second semiconductor channel layer 602, a dielectric core layer 62L can be deposited in the cavity 49' to fill any remaining portion of the cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Figure 9G:
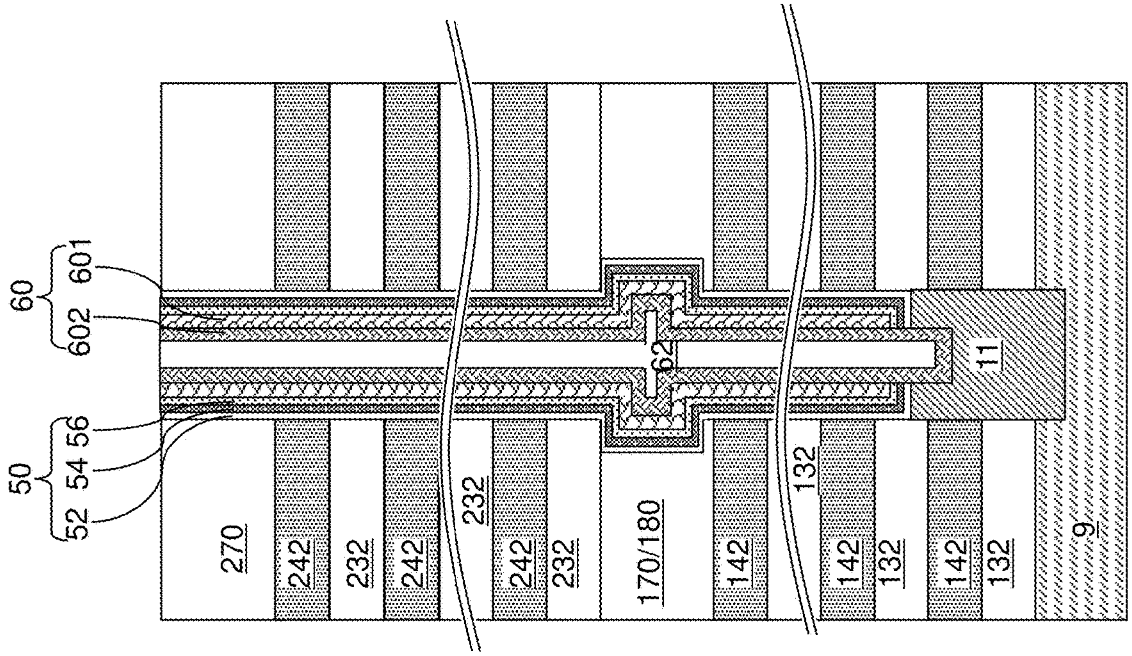

Referring to FIG. 9G, the horizontal portion of the dielectric core layer 62L can be removed, for example, by a recess etch from above the top surface of the second insulating cap layer 270. Each remaining portion of the dielectric core layer 62L constitutes a dielectric core 62. Further, the horizontal portion of the second semiconductor channel layer 602 located above the top surface of the second insulating cap layer 270 can be removed by a planarization process, which can employ a recess etch or chemical mechanical planarization (CMP). Each remaining portion of the second semiconductor channel layer 602 can be located entirety within a memory opening 49 or entirely within a support opening 19.

Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a portion of the vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Figure 9H:
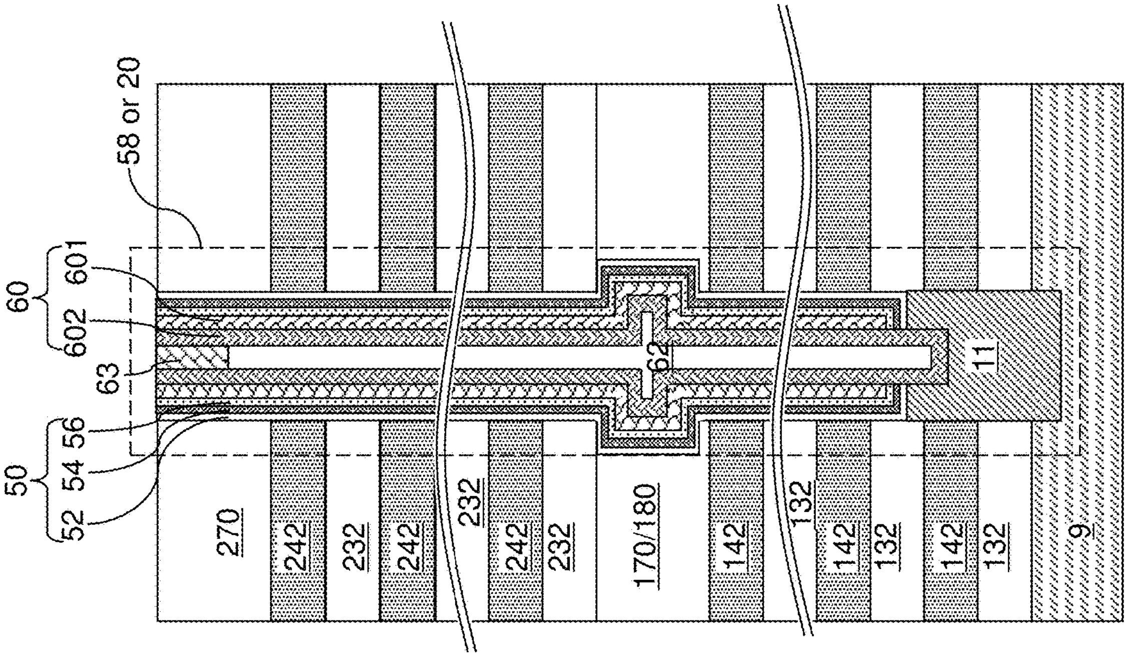

Referring to FIG. 9H, the top surface of each dielectric core 62 can be further recessed within each memory opening, for example, by a recess etch to a depth that is located between the top surface of the second insulating cap layer 270 and the bottom surface of the second insulating cap layer 270. Drain regions 63 can be formed by depositing a doped semiconductor material within each recessed region above the dielectric cores 62. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0\times10^{18}/cm^3$ to $2.0\times10^{21}/cm^3$, although lesser and greater dopant concentrations can also be employed. The doped semiconductor material can be, for example, doped polysilicon. Excess portions of the deposited semiconductor material can be removed from above the top surface of the second insulating cap layer 270, for example, by chemical mechanical planarization (CMP) or a recess etch to form the drain regions 63.

Each combination of a memory film 50 and a vertical semiconductor channel 60 (which is a vertical semiconductor channel) within a memory opening 49 constitutes a memory stack structure 55. The memory stack structure 55 is a combination of a semiconductor channel, a tunneling dielectric layer, a plurality of memory elements comprising portions of the charge storage layer 54, and an optional blocking dielectric layer 52. Each combination of a pedestal channel portion 11 (if present), a memory stack structure 55, a dielectric core 62, and a drain region 63 within a memory opening 49 constitutes a memory opening fill structure 58. Each combination of a pedestal channel portion 11 (if present), a memory film 50, a vertical semiconductor channel 60, a dielectric core 62, and a drain region 63 within each support opening 19 fills the respective support openings 19, and constitutes a primary support pillar structure 20.

The first-tier structure (132, 142, 170, 165), the second-tier structure (232, 242, 270, 265), the inter-tier dielectric layer 180, the memory opening fill structures 58, and the primary support pillar structures 20 collectively constitute a memory-level assembly. The memory-level assembly is formed over the substrate semiconductor layer 9 such that the substrate semiconductor layer 9 includes horizontal semiconductor channels electrically connected to vertical semiconductor channels 60 within the memory stack structures 55.

Figure 10A:
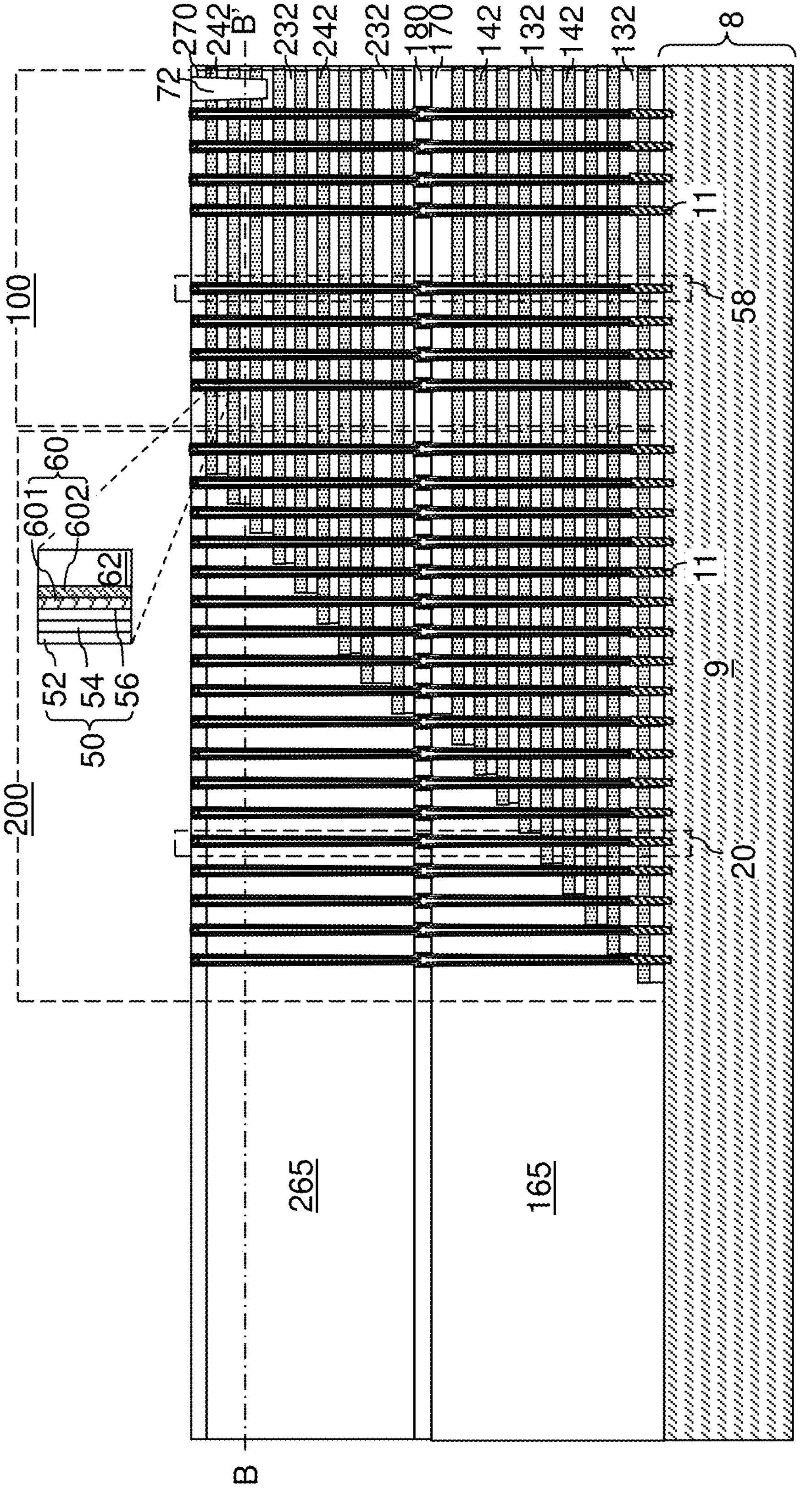
FIG. 10A is a vertical cross-sectional view of the first exemplary structure after formation of memory opening fill structures and primary support pillar structures according to an embodiment of the present disclosure.
Figure 10B:
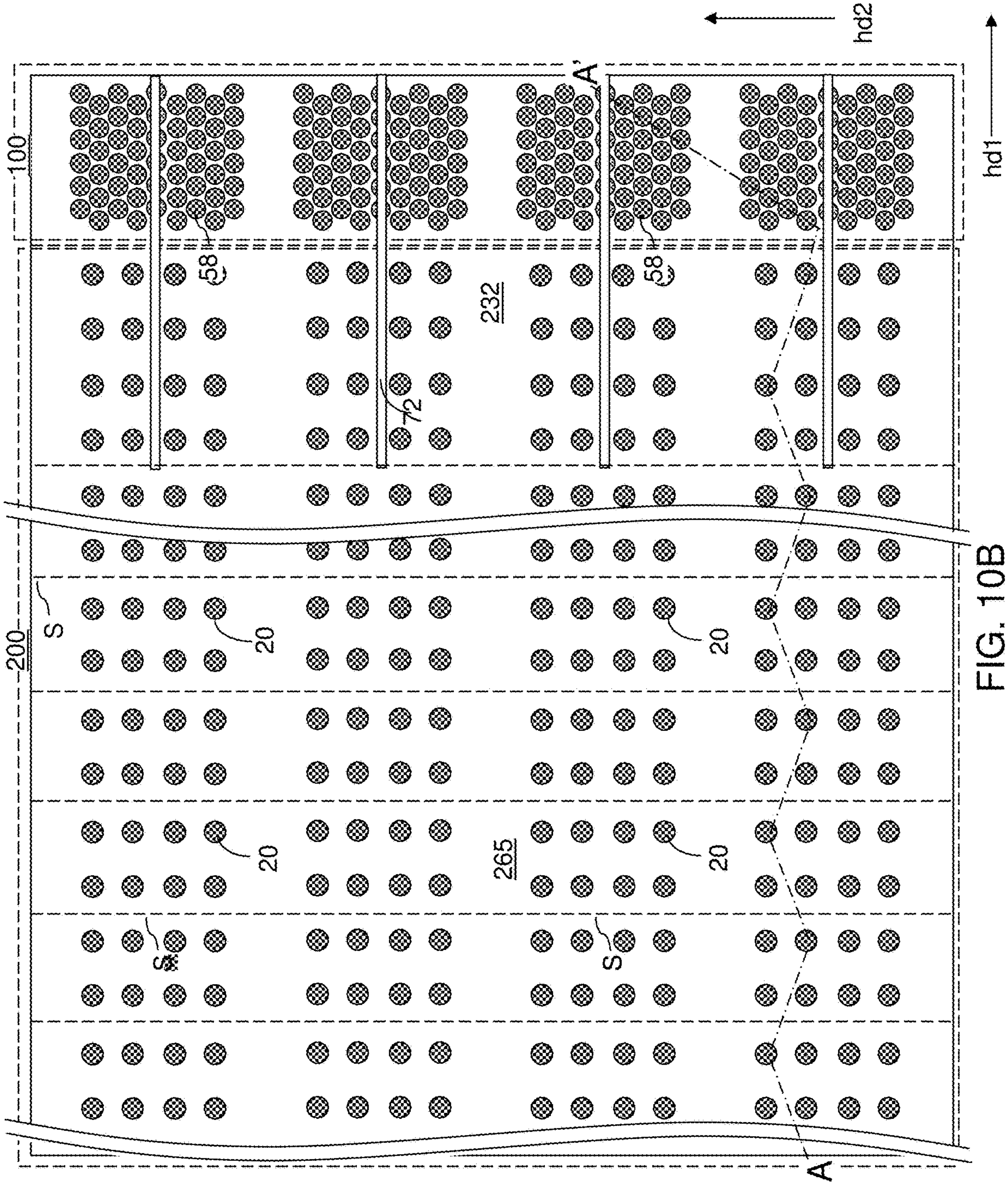
FIG. 10B is a horizontal cross-sectional view of the first exemplary structure along the horizontal plane B-B' in FIG. 10A. The hinged vertical plane A-A' corresponds to the plane of the vertical cross-sectional view of FIG. 10A.

Referring to FIGS. 10A and 10B, the first exemplary structure is illustrated after formation of a memory opening fill structure 58 within each memory opening 49 and formation of a primary support pillar structure 20 within each support opening 19. Each memory opening fill structure 58 comprises a respective vertical semiconductor channel 60.

Figure 11A:
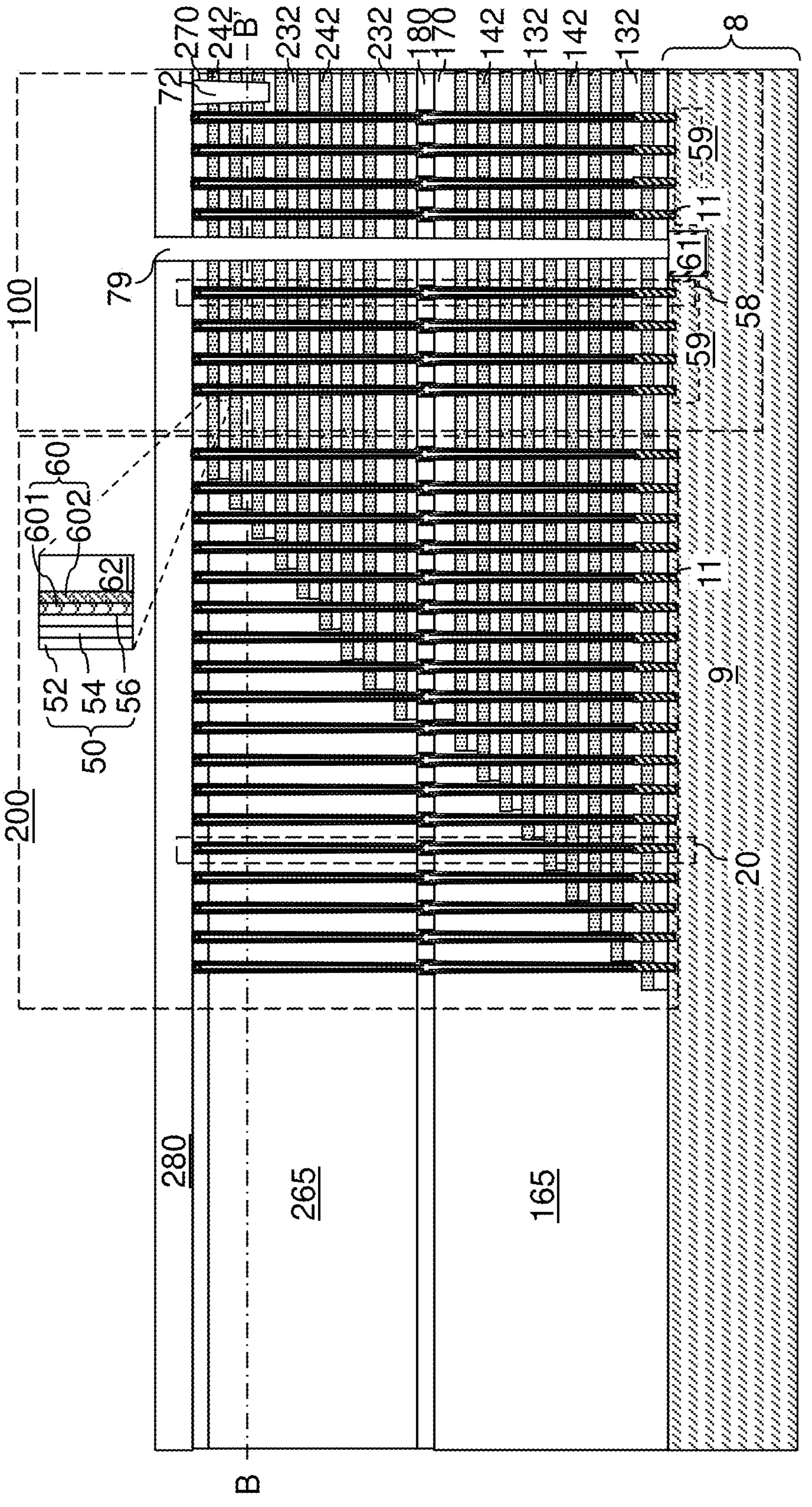
FIG. 11A is a vertical cross-sectional view of the first exemplary structure after formation of backside trenches and source regions according to an embodiment of the present disclosure.
Figure 11B:
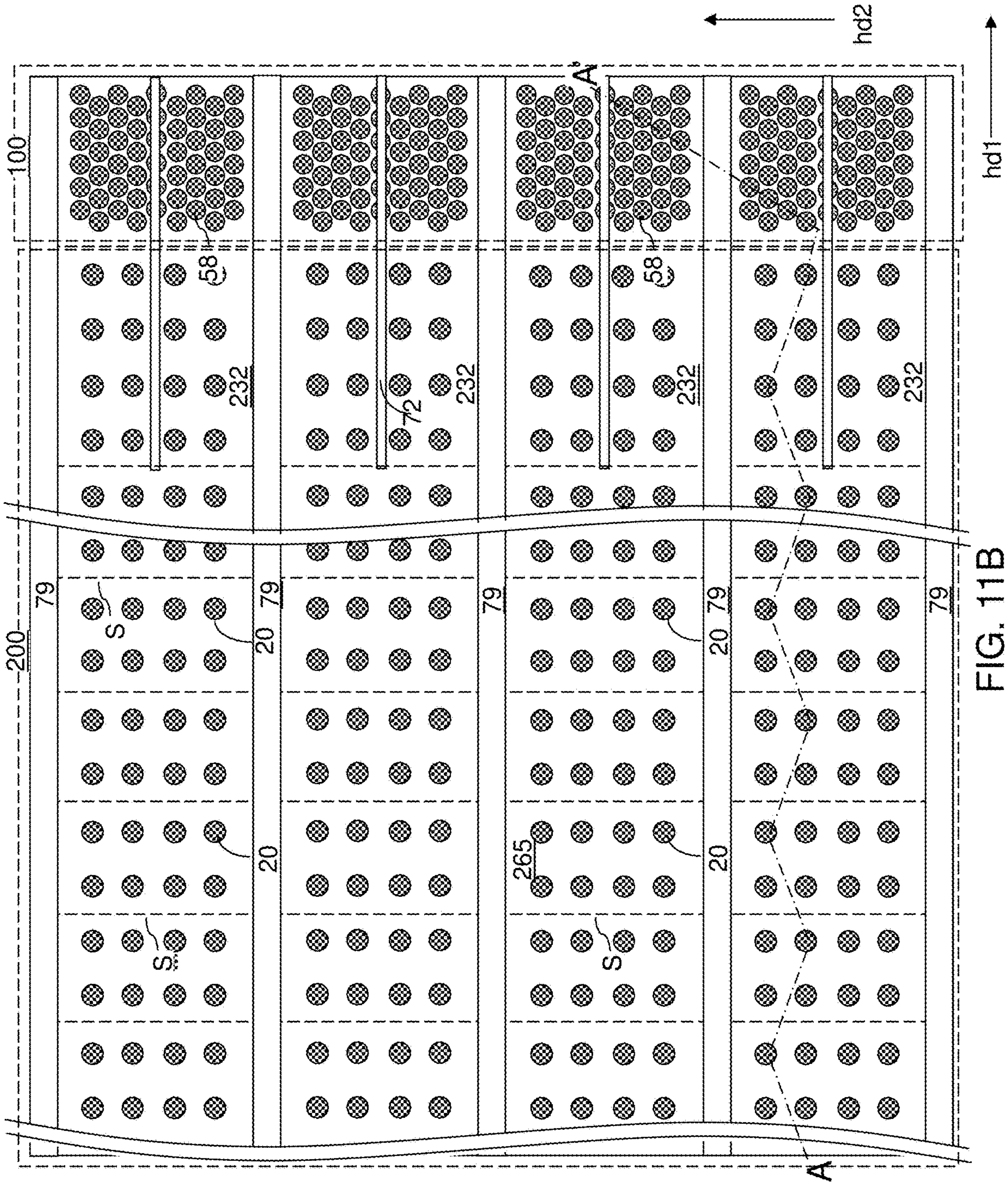
FIG. 11B is a horizontal cross-sectional view of the first exemplary structure along the horizontal plane B-B' in FIG. 11A. The hinged vertical plane A-A' corresponds to the plane of the vertical cross-sectional view of FIG. 11A.
Figure 11C:
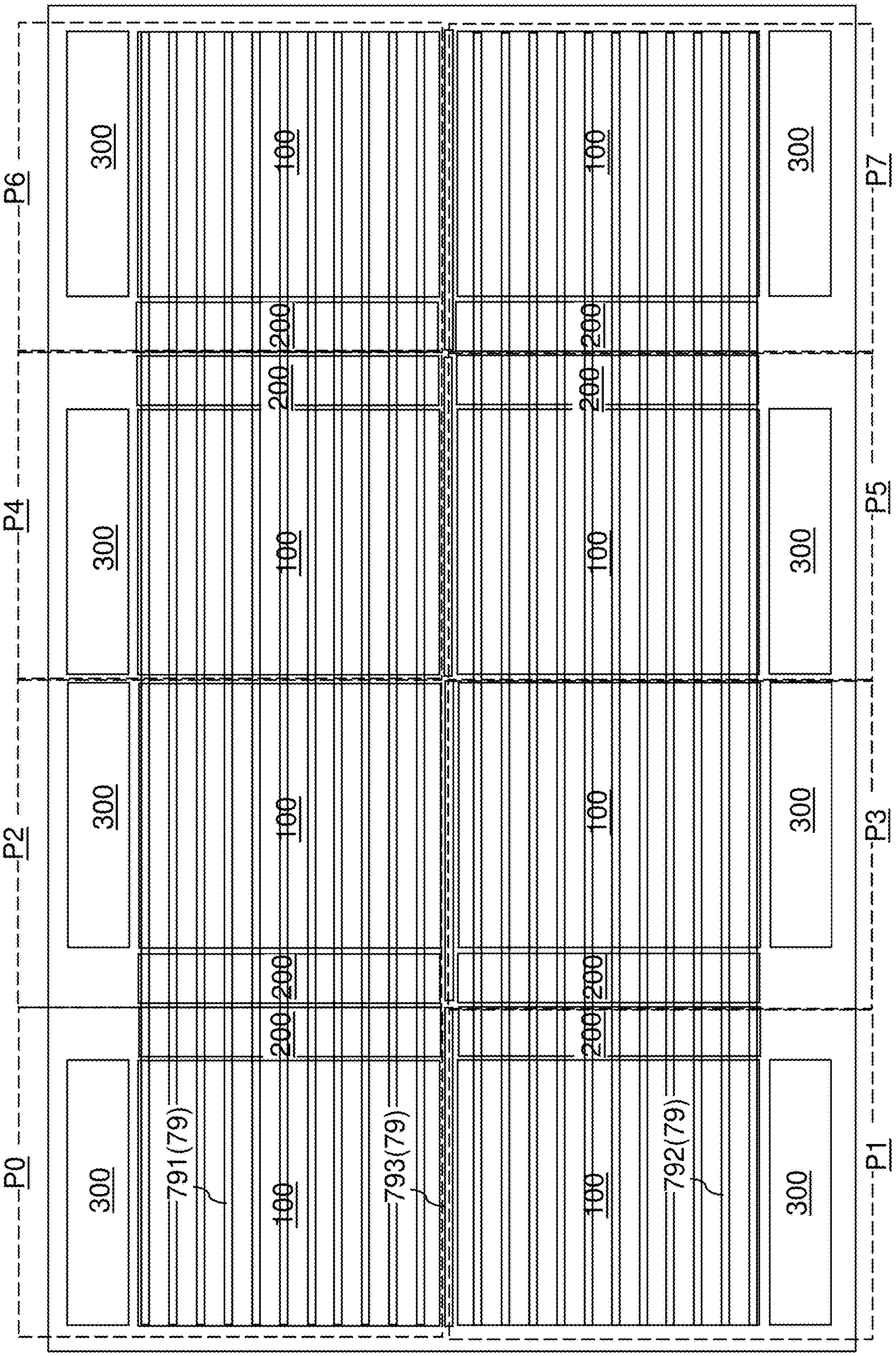
FIG. 11C illustrates a layout of the semiconductor die within the first exemplary structure of FIGS. 11A and 11B in a plan view.

Referring to FIGS. 11A-11C, a first contact-level dielectric layer 280 can be formed over the memory-level assembly. The first contact-level dielectric layer 280 is formed at a contact level through which various contact via structures are subsequently formed to the drain regions 63 and the various electrically conductive layers that replaces the sacrificial material layers (142, 242) in subsequent processing steps.

Backside trenches 79 are subsequently formed through the first contact-level dielectric layer 280 and the memory-level assembly. For example, a photoresist layer can be applied and lithographically patterned over the first contact-level dielectric layer 280 to form elongated openings that extend along a first horizontal direction hd1. An anisotropic etch is performed to transfer the pattern in the patterned photoresist layer through the first contact-level dielectric layer 280 and the memory-level assembly to a top surface of the substrate semiconductor layer 9. The photoresist layer can be subsequently removed, for example, by ashing.

The backside trenches 79 extend along the first horizontal direction hd1, and thus, are elongated along the first horizontal direction hd1. The backside trenches 79 can be laterally spaced among one another along a second horizontal direction hd2, which can be perpendicular to the first horizontal direction hd1. The backside trenches 79 can extend through the memory array region (e.g., a memory plane) 100 and the contact region 200 within each plane (P0-P7).

In one embodiment, the backside trenches 79 can laterally extend along the first horizontal direction hd1, and are laterally spaced apart along the second horizontal direction hd2. In one embodiment, the planes (P0-P7) may be arranged such that each even-numbered plane (P0, P2. P4, P6) is laterally spaced from a respective odd-numbered plane (P1, P3, P5, P7) by a respective backside trench 79, which is herein referred to as an inter-array backside trench 793. Generally, the backside trenches 79 may include first backside trenches 791 laterally extending through a respective one of the even-numbered planes (P0, P2, P4, P6), second backside trenches 792 laterally extending through a respective one of the odd-numbered planes (P1, P3, P5, P7), and inter-array backside trenches 793 formed within a respective gap region G (illustrated in FIG. 1B). The first and second backside trenches (791, 792) separate memory blocks within each respective plane. Generally, the first backside trenches 791, the second backside trenches 792, and the inter-array backside trenches 793 can be formed simultaneously by forming a patterned etch mask layer (not shown) over the at least one vertically alternating sequence continuous insulating layers (132, 232) and continuous sacrificial material layers (142, 242), and by anisotropically etching unmasked portions of the at least one vertically alternating sequence by performing an anisotropic etch process. In one embodiment, the patterned etch mask layer may be a patterned photoresist layer. In one embodiment, the first backside trenches 791, the second backside trenches 792, and the inter-array backside trenches 793 may have a same width along the second horizontal direction hd2. In one embodiment, the first backside trenches 791, the second backside trenches 792, and the inter-array backside trenches 793 may be formed as a periodic one-dimensional array that is repeated along the second horizontal direction hd2 with periodicity.

The portions of the continuous insulating layers (132, 232) that are divided by the first backside trenches 791 are herein referred to as first insulating layers (132, 232). The portions of the continuous insulating layers (132, 232) that are divided by the second backside trenches 792 are herein referred to as second insulating layers (132, 232). The portions of the continuous sacrificial material layers (142, 242) that are divided by the first backside trenches 791 are herein referred to as first sacrificial material layers (142, 242). The portions of the continuous sacrificial material layers (142, 242) that are divided by the second backside trenches 792 are herein referred to as second sacrificial material layers (142, 242).

Generally, the vertically alternating sequence of continuous insulating layers (132, 232) and continuous sacrificial material layers (142, 242) are separated into first alternating stacks of first insulating layers (132, 232) and first sacrificial material layers (142, 242) that are laterally spaced apart by the first backside trenches 791, and second alternating stacks of second insulating layers (132, 232) and second sacrificial material layers (142, 242) that are laterally spaced apart by second backside trenches 792. The first alternating stacks and the second alternating stacks are laterally spaced apart by an inter-array backside trench 793. A first subset of the memory opening fill structures 58 vertically extends through a respective one of the first alternating stacks, and a second subset of the memory opening fill structures 58 vertically extends through a respective one of the second alternating stacks.

Dopants of a second conductivity type, which is the opposite of the first conductivity type of the substrate semiconductor layer 9, can be implanted into a surface portion of the substrate semiconductor layer 9 to form a source region 61 underneath the bottom surface of each backside trench 79.

Figure 12A:
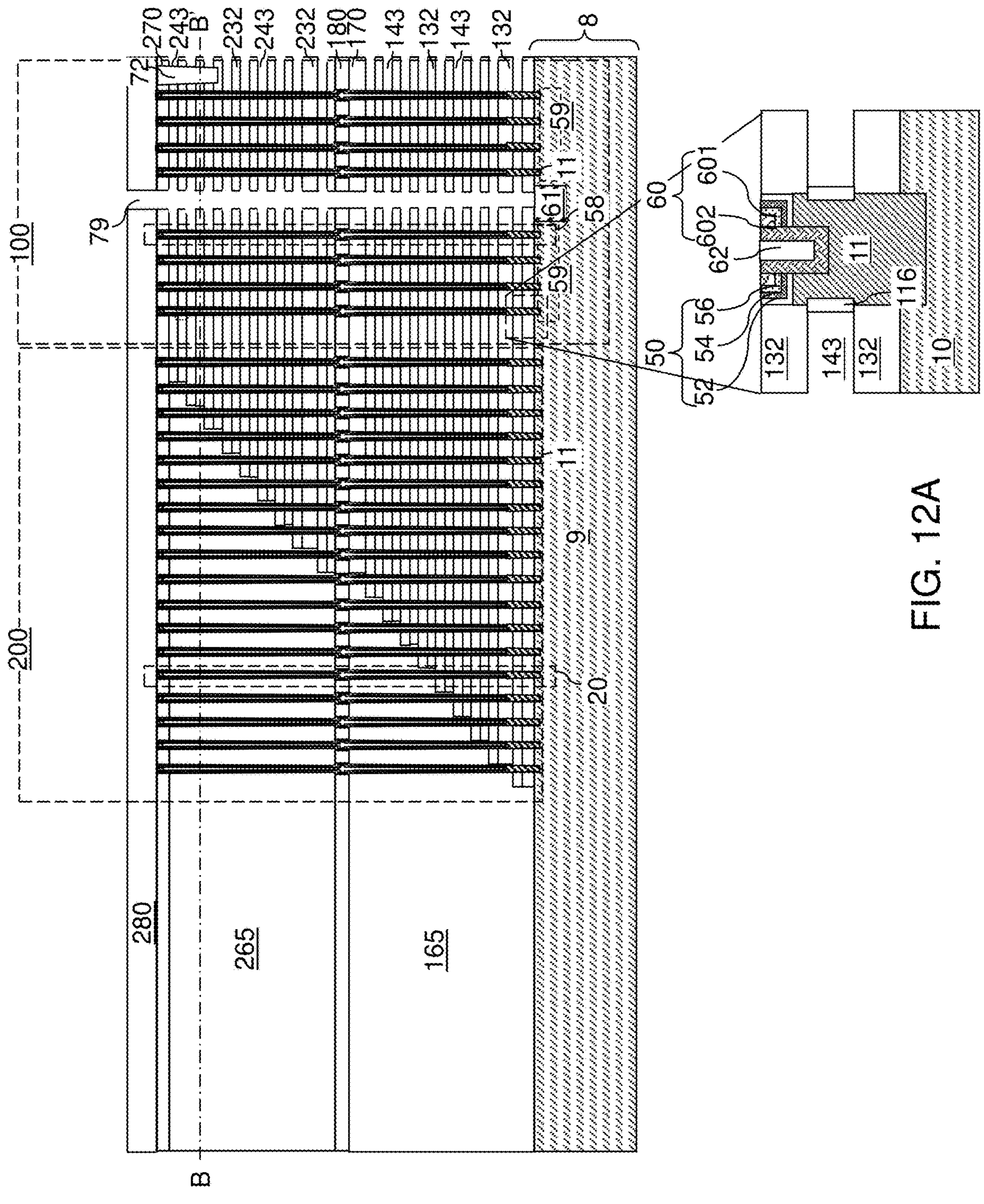
FIG. 12A is a vertical cross-sectional view of the first exemplary structure after formation of backside recesses according to an embodiment of the present disclosure.
Figure 12B:
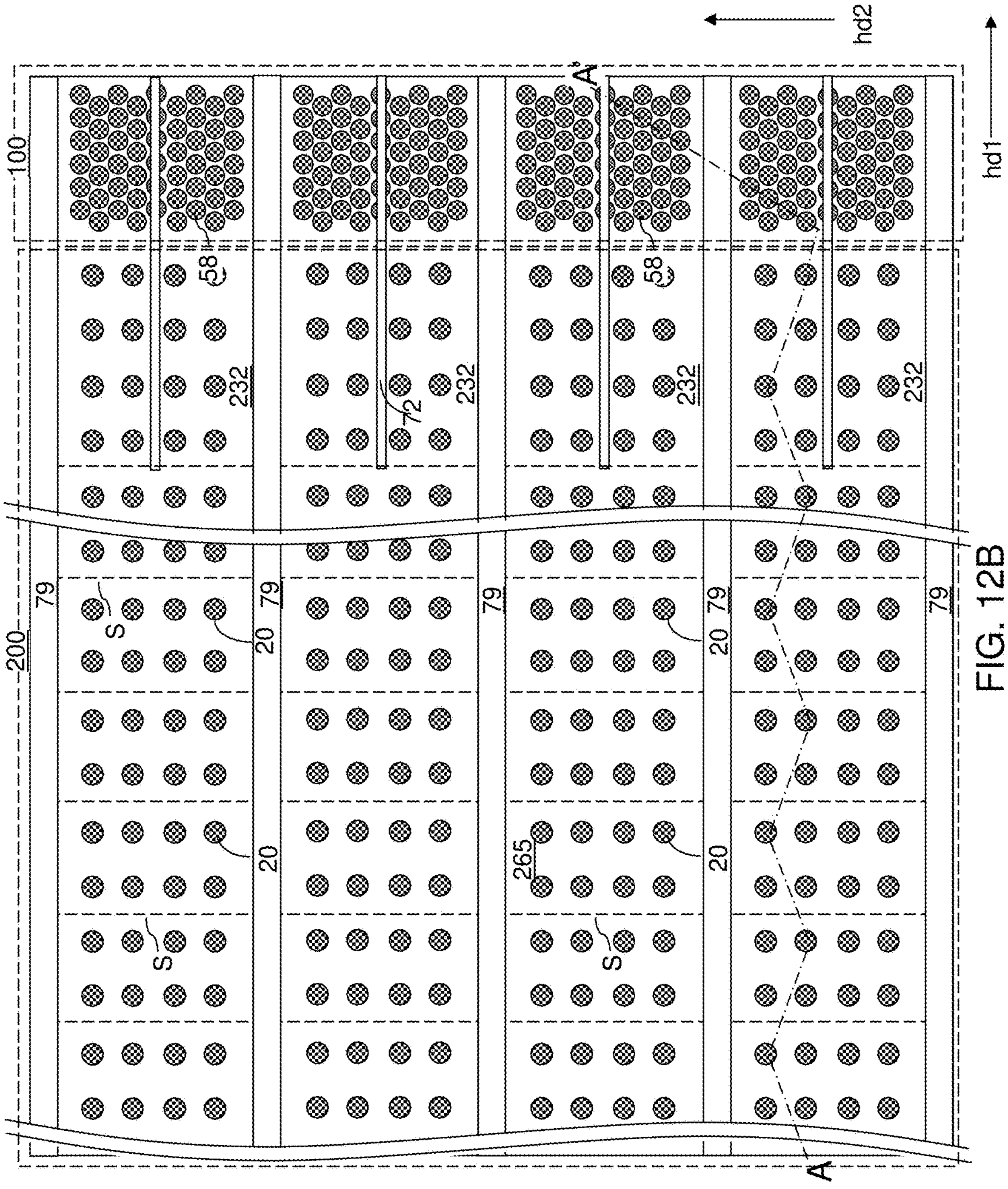
FIG. 12B is a horizontal cross-sectional view of the first exemplary structure along the horizontal plane B-B' in FIG. 12A. The hinged vertical plane A-A' corresponds to the plane of the vertical cross-sectional view of FIG. 12A.

Referring to FIGS. 12A and 12B, an etchant that selectively etches the materials of the first and second-tier sacrificial material layers (142, 242) with respect to the materials of the first and second-tier insulating layers (132, 232), the first and second insulating cap layers (170, 270), and the material of the outermost layer of the memory films 50 can be introduced into the backside trenches 79, for example, employing an isotropic etch process. First backside recesses 143 are formed in volumes from which the first-tier sacrificial material layers 142 are removed. Second backside recesses 243 are formed in volumes from which the second-tier sacrificial material layers 242 are removed. In one embodiment, the first and second-tier sacrificial material layers (142, 242) can include silicon nitride, and the materials of the first and second-tier insulating layers (132, 232), can be silicon oxide. In another embodiment, the first and second-tier sacrificial material layers (142, 242) can include a semiconductor material such as germanium or a silicon-germanium alloy, and the materials of the first and second-tier insulating layers (132, 232) can be selected from silicon oxide and silicon nitride.

The isotropic etch process can be a wet etch process employing a wet etch solution, or can be a gas phase (dry) etch process in which the etchant is introduced in a vapor phase into the backside trench 79. For example, if the first and second-tier sacrificial material layers (142, 242) include silicon nitride, the etch process can be a wet etch process in which the first exemplary structure is immersed within a wet etch tank including phosphoric acid, which etches silicon nitride selective to silicon oxide, silicon, and various other materials employed in the art. In case the sacrificial material layers (142, 242) comprise a semiconductor material, a wet etch process (which may employ a wet etchant such as a KOH solution) or a dry etch process (which may include gas phase HCl) may be employed.

Each of the first and second backside recesses (143, 243) can be a laterally extending cavity having a lateral dimension that is greater than the vertical extent of the cavity. In other words, the lateral dimension of each of the first and second backside recesses (143, 243) can be greater than the height of the respective backside recess. A plurality of first backside recesses 143 can be formed in the volumes from which the material of the first-tier sacrificial material layers 142 is removed. A plurality of second backside recesses 243 can be formed in the volumes from which the material of the second-tier sacrificial material layers 242 is removed. Each of the first and second backside recesses (143, 243) can extend substantially parallel to the top surface of the substrate, which may be a top surface of the substrate semiconductor layer 9. A backside recess (143, 243) can be vertically bounded by a top surface of an underlying insulating layer (132 or 232) and a bottom surface of an overlying insulating layer (132 or 232). In one embodiment, each of the first and second backside recesses can have a uniform height throughout.

In one embodiment, a sidewall surface of each pedestal channel portion 11 can be physically exposed at each bottommost first backside recess after removal of the first and second-tier sacrificial material layers (142, 242). Further, a top surface of the substrate semiconductor layer 9 can be physically exposed at the bottom of each backside trench 79. An annular dielectric spacer 116 can be formed around each pedestal channel portion 11 by oxidation of a physically exposed peripheral portion of the pedestal channel portions 11. Further, a semiconductor oxide portion (not shown) can be formed from each physically exposed surface portion of the substrate semiconductor layer 9 concurrently with formation of the annular dielectric spacers.

Figure 13A:
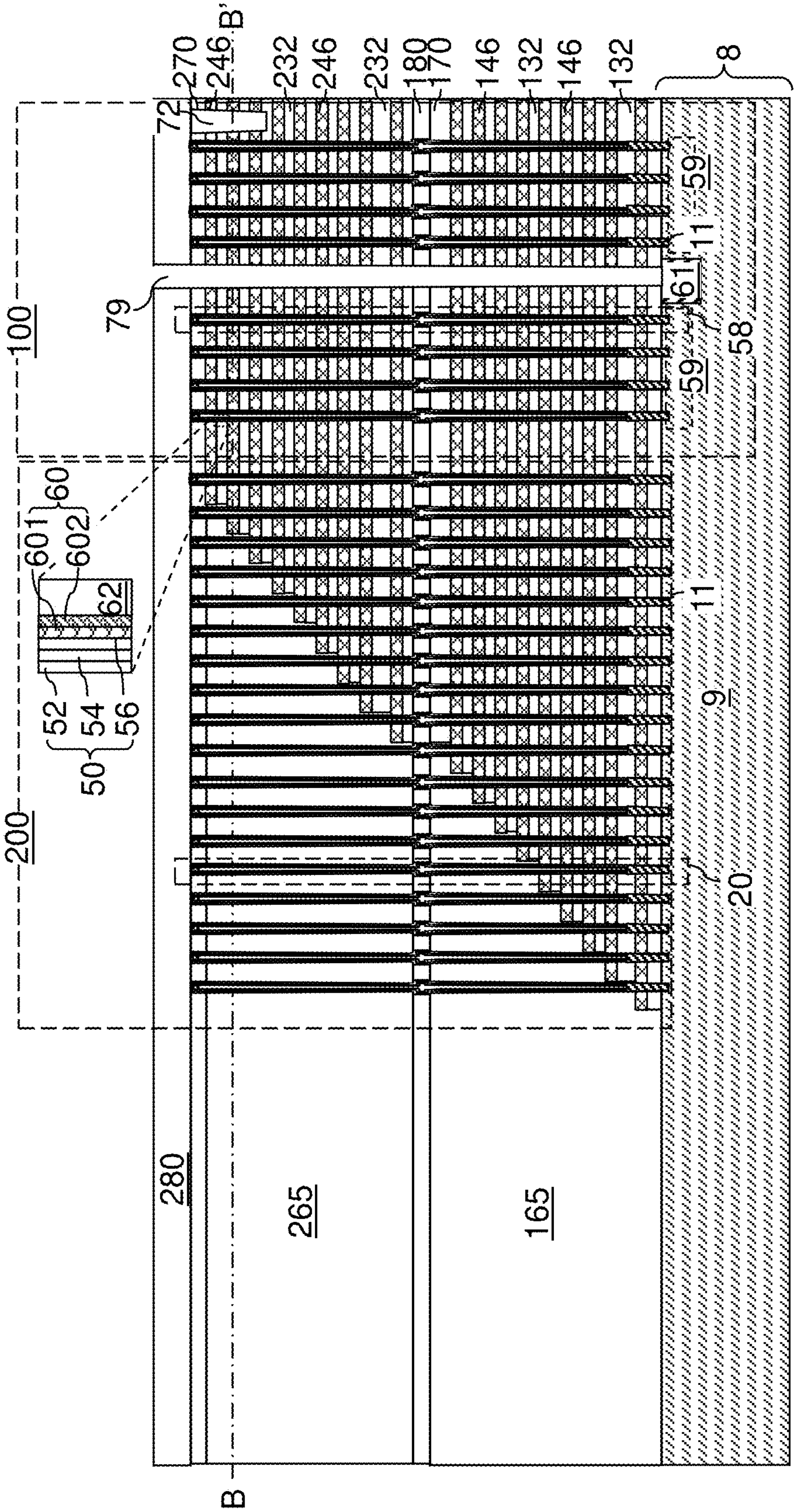
FIG. 13A is a vertical cross-sectional view of the first exemplary structure after replacement of sacrificial material layers with electrically conductive according to an embodiment of the present disclosure.
Figure 13B:
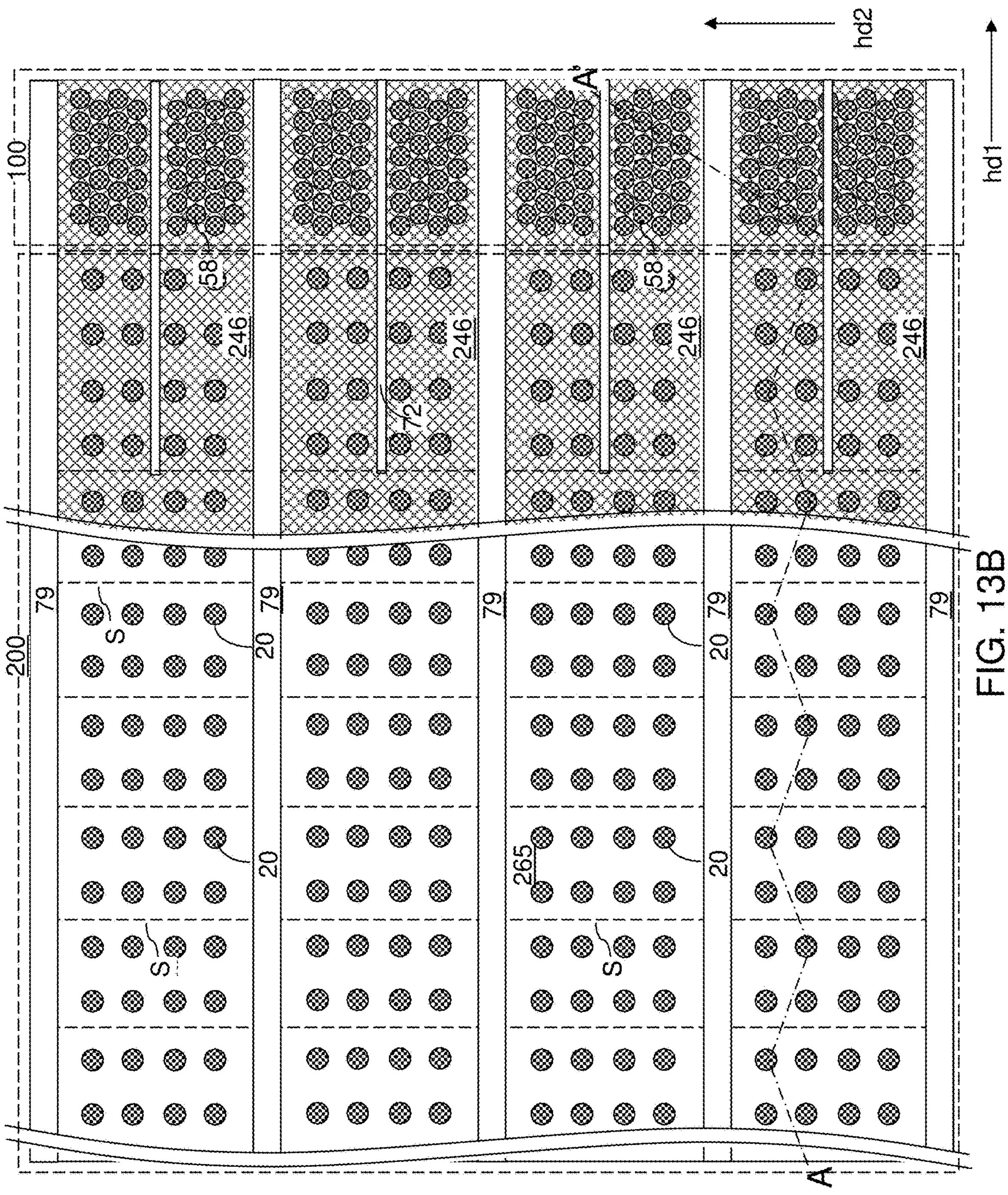
FIG. 13B is a horizontal cross-sectional view of the first exemplary structure along the horizontal plane B-B' in FIG. 13A. The hinged vertical plane A-A' corresponds to the plane of the vertical cross-sectional view of FIG. 13A.

Referring to FIGS. 13A-13B, a backside blocking dielectric layer (not shown) can be optionally deposited in the backside recesses and the backside trenches 79 and over the first contact-level dielectric layer 280. The backside blocking dielectric layer can be deposited on the physically exposed portions of the outer surfaces of the memory stack structures 55. The backside blocking dielectric layer includes a dielectric material such as a dielectric metal oxide, silicon oxide, or a combination thereof. If employed, the backside blocking dielectric layer can be formed by a conformal deposition process such as atomic layer deposition or chemical vapor deposition. The thickness of the backside blocking dielectric layer can be in a range from 1 nm to 60 nm, although lesser and greater thicknesses can also be employed.

At least one conductive material can be deposited in the plurality of backside recesses, on the sidewalls of the backside trench 79, and over the first contact-level dielectric layer 280. The at least one conductive material can include at least one metallic material, i.e., an electrically conductive material that includes at least one metallic element.

A plurality of first-tier electrically conductive layers 146 can be formed in the plurality of first backside recesses 143, a plurality of second-tier electrically conductive layers 246 can be formed in the plurality of second backside recesses 243, and a continuous metallic material layer (not shown) can be formed on the sidewalls of each backside trench 79 and over the first contact-level dielectric layer 280. Thus, the first and second-tier sacrificial material layers (142, 242) can be replaced with the first and second conductive material layers (146, 246), respectively. Specifically, each first-tier sacrificial material layer 142 can be replaced with an optional portion of the backside blocking dielectric layer and a first-tier electrically conductive layer 146, and each second-tier sacrificial material layer 242 can be replaced with an optional portion of the backside blocking dielectric layer and a second-tier electrically conductive layer 246. A backside cavity is present in the portion of each backside trench 79 that is not filled with the continuous metallic material layer.

The metallic material can be deposited by a conformal deposition method, which can be, for example, chemical vapor deposition (CVD), atomic layer deposition (ALD), electroless plating, electroplating, or a combination thereof. The metallic material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary metallic materials that can be deposited in the backside recesses include tungsten, tungsten nitride, titanium, titanium nitride, tantalum, tantalum nitride, cobalt, and ruthenium. In one embodiment, the metallic material can comprise a metal such as tungsten and/or metal nitride. In one embodiment, the metallic material for filling the backside recesses can be a combination of titanium nitride layer and a tungsten fill material. In one embodiment, the metallic material can be deposited by chemical vapor deposition or atomic layer deposition.

Residual conductive material can be removed from inside the backside trenches 79. Specifically, the deposited metallic material of the continuous metallic material layer can be etched back from the sidewalls of each backside trench 79 and from above the first contact-level dielectric layer 280, for example, by an anisotropic or isotropic etch. Each remaining portion of the deposited metallic material in the first backside recesses constitutes a first-tier electrically conductive layer 146. Each remaining portion of the deposited metallic material in the second backside recesses constitutes a second-tier electrically conductive layer 246. Each electrically conductive layer (146, 246) can be a conductive line structure.

A subset of the second-tier electrically conductive layers 246 located at the levels of the drain-select-level dielectric isolation structures 72 constitutes drain select gate electrodes. A subset of the first-tier electrically conductive layers 146 located at each level of the annular dielectric spacers (not shown) constitutes source select gate electrodes. A subset of the electrically conductive layer (146, 246) located between the drain select gate electrodes and the source select gate electrodes can function as combinations of a control gate and a word line located at the same level. The control gate electrodes within each electrically conductive layer (146, 246) are the control gate electrodes for a vertical memory device including the memory stack structure 55.

Each of the memory stack structures 55 comprises a vertical stack of memory elements located at each level of the electrically conductive layers (146, 246). A subset of the electrically conductive layers (146, 246) can comprise word lines for the memory elements. The memory-level assembly is located over the substrate semiconductor layer 9. The memory-level assembly includes at least one vertically alternating sequence (132, 146, 232, 246) and memory stack structures 55 vertically extending through the at least one vertically alternating sequence (132, 146, 232, 246). Each alternating stack (132, 146, 232, 246) includes alternating layers of respective insulating layers (132, 232) and respective electrically conductive layers (146, 246). Each alternating stack (132, 146, 232, 246) comprises a staircase region that includes terraces in which each underlying electrically conductive layer (146, 246) extends farther along the first horizontal direction hd1 than any overlying electrically conductive layer (146, 246) in the memory-level assembly. Generally, the first sacrificial material layers 142 and the second sacrificial material layers 242 can be replaced with the first electrically conductive layers 146 and the second electrically conductive layers 246, respectively.

Figure 14A:
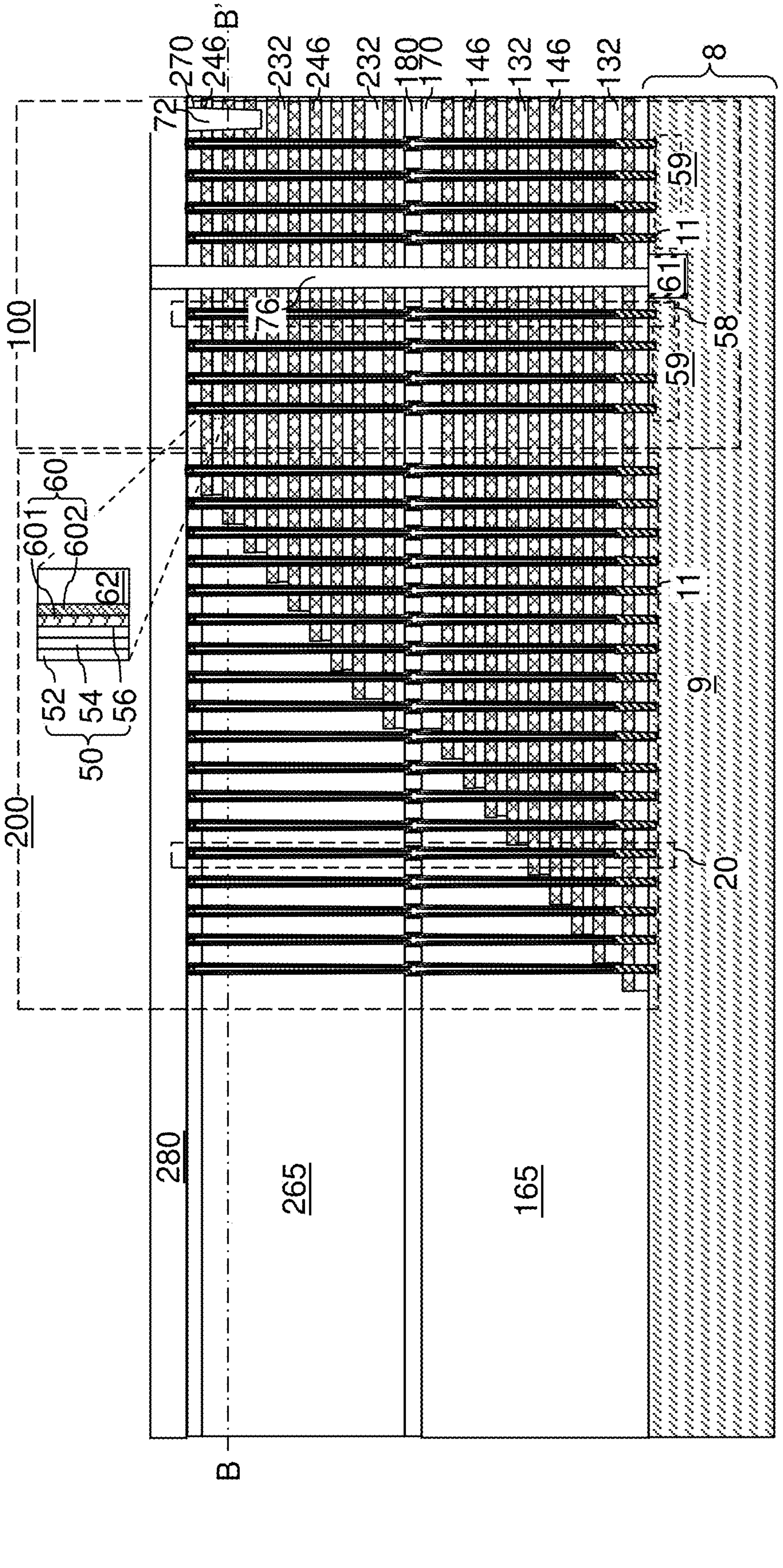
FIG. 14A is a vertical cross-sectional view of the first exemplary structure after formation of backside insulating spacers and backside via structures according to an embodiment of the present disclosure.
Figure 14B:
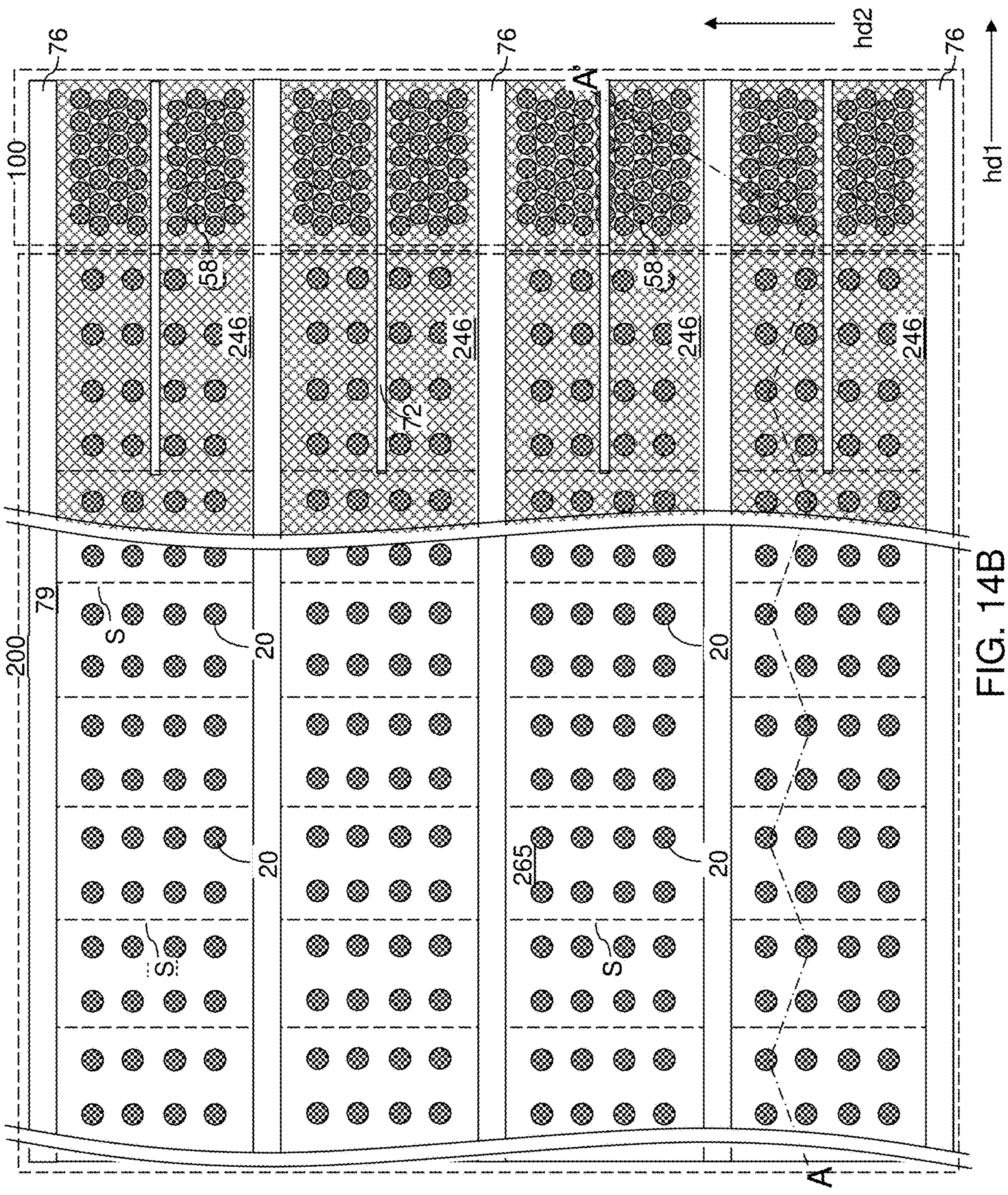
FIG. 14B is a horizontal cross-sectional view of the first exemplary structure along the horizontal plane B-B' in FIG. 14A. The hinged vertical plane A-A' corresponds to the plane of the vertical cross-sectional view of FIG. 14A.
Figure 14C:
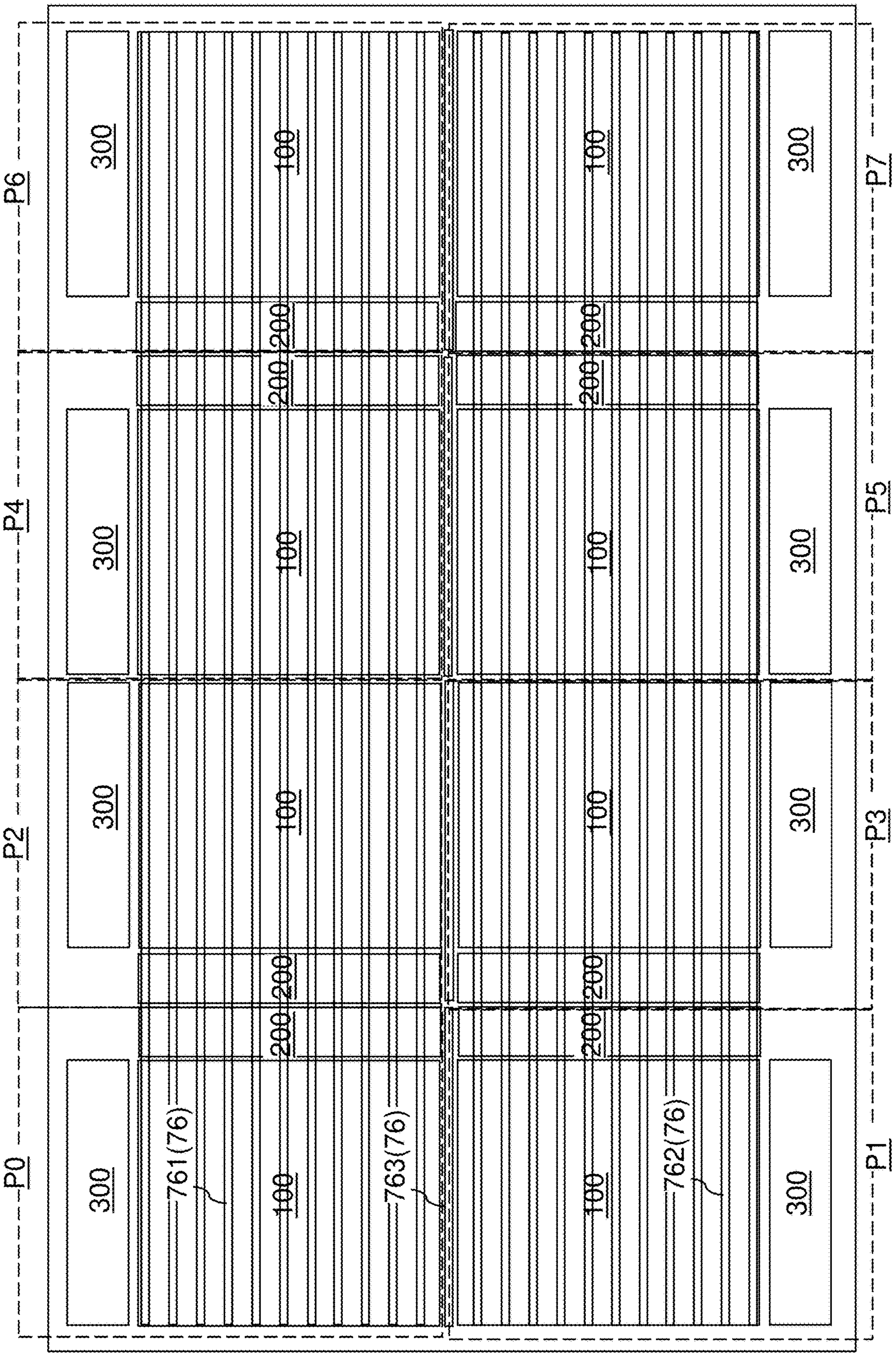
FIG. 14C illustrates a layout of the semiconductor die within the first exemplary structure of FIGS. 14A and 14B in a plan view.

Referring to FIGS. 14A-14C, a backside trench fill structure 76 can be formed in the remaining volume of each backside trench 79. In the embodiment shown in FIGS. 14A-14C and 42-44A, the backside trench fill structure 76 consists of a dielectric separator. The dielectric separated may be formed, for example, by deposition of at least one dielectric material and removal of excess portions of the deposited at least one dielectric material from above a horizontal plane including the top surface of the first contact-level dielectric layer 280 by a planarization process such as chemical mechanical planarization or a recess etch.

In an alternative embodiment illustrated in FIGS. 18A to 21, the backside trench fill structure 76 comprises a backside insulating spacer 74 and an electrically conductive local interconnect (e.g., source contact) 75. The backside insulating spacer 74 may be formed by depositing a relatively thin dielectric layer in the backside trench 79 followed by performing an anisotropic sidewall spacer etch to remove horizontal portions of the dielectric layer and leave the backside insulating spacer 74 on sidewalls of the backside trench 79. An electrically conductive material (e.g., metal, metal nitride, metal silicide or heavily doped semiconductor) is then deposited on the backside insulating spacer 74 and planarized to the top surface of the first contact-level dielectric layer 280 to form the local interconnect 75.

The backside trench fill structure 76 provide electrical isolation in all lateral directions, and are laterally elongated along the first horizontal direction hd1. As such, the backside trench fill structure 76 are laterally elongated along the first horizontal direction hd1. As used herein, a structure is “laterally elongated” if the maximum lateral dimension of the structure along a first horizontal direction is greater than the maximum lateral dimension of the structure along a second horizontal direction that is perpendicular to the first horizontal direction at least by a factor of 5.

The backside trench fill structures 76 can include first backside trench fill structures 761 filling the first backside trenches 791, second backside trench fill structures 762 filling the second backside trenches 792, and inter-array backside trench fill structures 763 filling the inter-array backside trenches 793. Generally, the first backside trench fill structures 761, the second backside trench fill structures 762, and the inter-array backside trench fill structure 762 can be formed by depositing at least a dielectric material and optionally a conductive material (such as a metallic material) within the first backside trenches 791, the second backside trenches 792, and the inter-array backside trenches 793 simultaneously. An inter-array backside insulating material portion (such as an backside insulating spacer 74) can be deposited within each inter-array backside trench 793 directly on a sidewall of one of the first alternating stacks of a first plane including a first three-dimensional memory array, and directly on a sidewall of one of the second alternating stacks of a second plane including a second three-dimensional memory array.

Figure 15A:
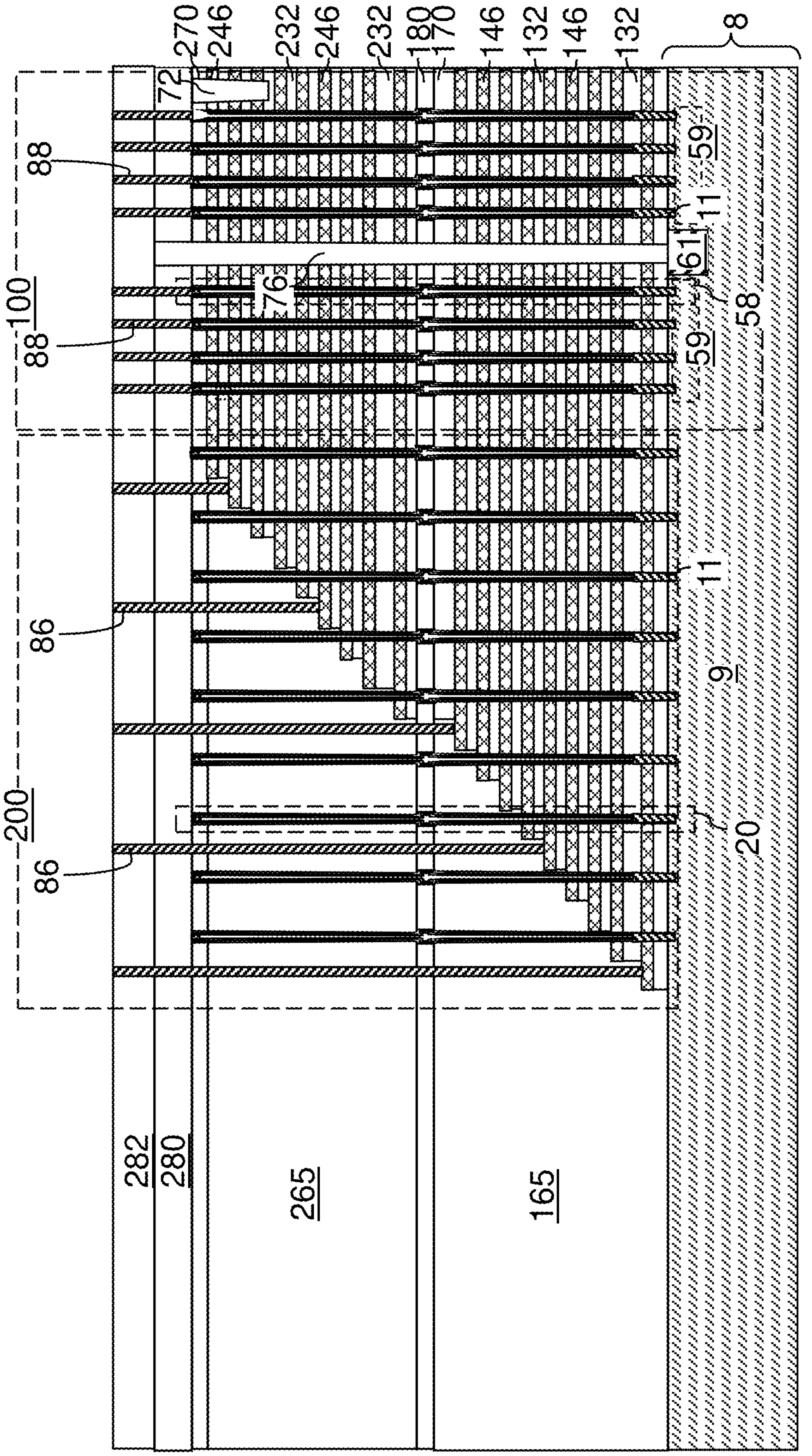
FIG. 15A is a vertical cross-sectional view of the first exemplary structure after formation of drain contact via cavities and word line contact via cavities according to an embodiment of the present disclosure.
Figure 15B:
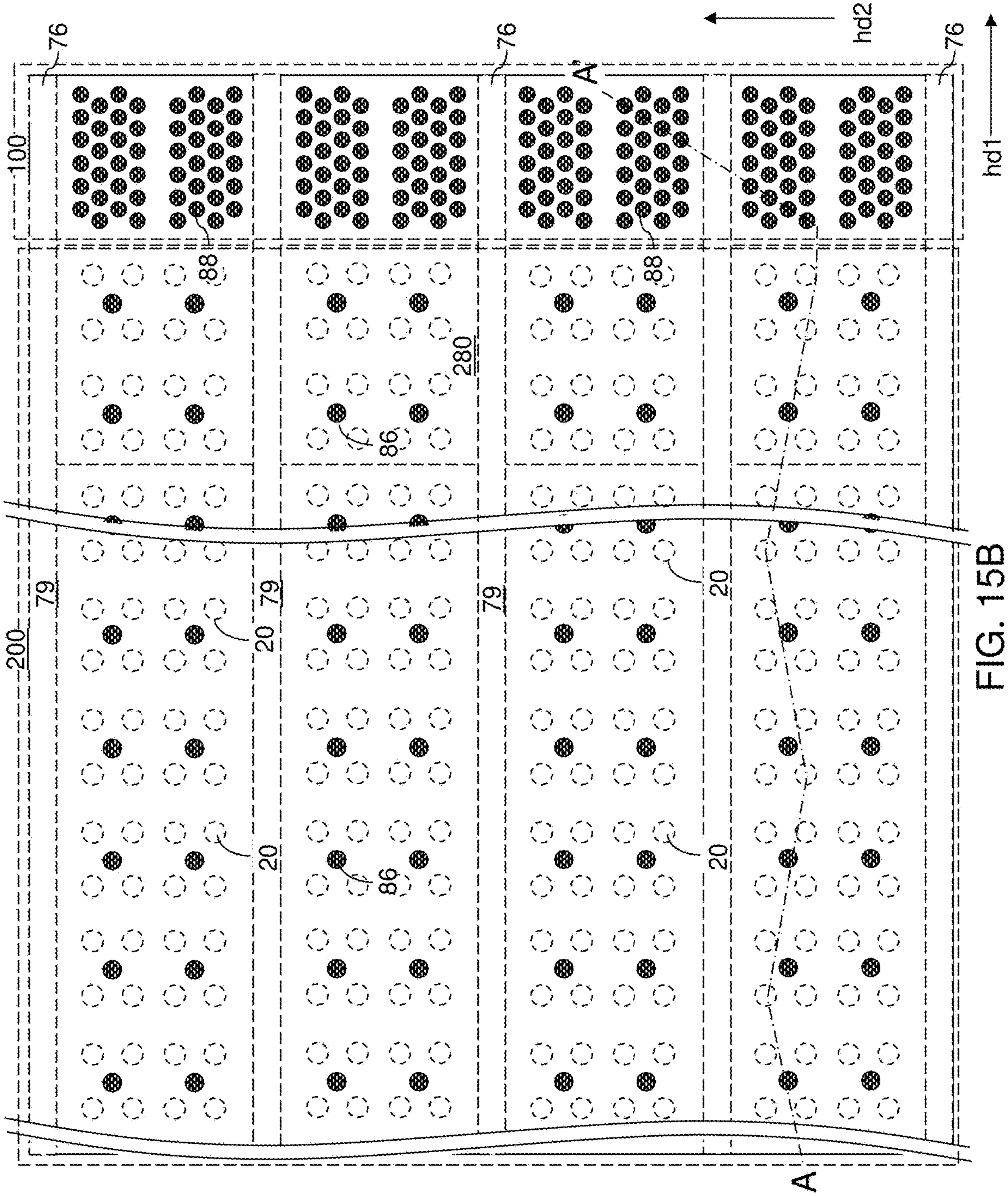
FIG. 15B is a horizontal cross-sectional view of the first exemplary structure along the horizontal plane B-B' in FIG. 15A. The hinged vertical plane A-A' corresponds to the plane of the vertical cross-sectional view of FIG. 15A.

Referring to FIGS. 15A and 15B, a second contact-level dielectric layer 282 can be optionally formed over the first contact-level dielectric layer 280. The second contact-level dielectric layer 282 includes a dielectric material such as silicon oxide or silicon nitride. The thickness of the second contact-level dielectric layer 282 can be in a range from 30 nm to 300 nm, although lesser and greater thicknesses can also be employed.

A photoresist layer (not shown) can be applied over the second contact-level dielectric layer 282, and can be lithographically patterned to form openings at locations at which various contact via structures are to be subsequently formed. The openings in the photoresist layer include word line contact openings that overlie horizontal surfaces of the first and second stepped surfaces in the contact region 200. Further, the openings in the photoresist layer include drain contact openings that overlie top surfaces of the memory stack structures 55.

A reactive ion etch process is performed to transfer the pattern of the openings in the photoresist layer through underlying dielectric material layers. Contact via cavities are formed through underlying dielectric material portions (282, 280, 270, 265, 165). The contact via cavities include drain contact via cavities that are formed through the second contact-level dielectric layer 282, the first contact-level dielectric layer 280, and the second insulating cap layer 270 above top surfaces of the drain regions 63 within the memory stack structures 55. Top surfaces of the drain regions 63 are physically exposed at the bottom of the drain contact via cavities. The contact via cavities further include word line contact via cavities that are formed through the second contact-level dielectric layer 282, the first contact-level dielectric layer 280, the second insulating cap layer 270, and the second and first retro-stepped dielectric material portions (165, 265) by the anisotropic etch process. Top surfaces of the first and second-tier electrically conductive layers (146, 246) are physically exposed at bottom regions of the word line contact via cavities.

At least one conductive material can be deposited in the contact via cavities. Excess portions of the at least one conductive material can be removed from above a horizontal plane including the top surface of the second contact-level dielectric layer 282 by a planarization process such as a recess etch process or a chemical mechanical planarization (CMP) process. Each remaining portion of the at least one conductive material in the word line contact via cavities constitutes a layer contact via structure 86, and each remaining portion of the at least one conductive material in the drain contact via cavities constitutes a drain contact via structure 88.

First contact via structures 86 within a first subset of the layer contact via structures 86 vertically extend through the second retro-stepped dielectric material portion 265 and the first retro-stepped dielectric material portion 165 and contact a top surface of a respective one of the first-tier electrically conductive layers 146. Second contact via structures 86 within a second subset of the layer contact via structures 86 vertically extend through the second retro-stepped dielectric material portion 265 and contact a top surface of a respective one of the second-tier electrically conductive layers 246.

Referring to FIGS. 16A-16D, at least one upper interconnect level dielectric layer 284 can be formed over the contact-level dielectric layers (280, 282). Various upper interconnect level metal structures can be formed in the at least one upper interconnect level dielectric layer 284. For example, the various upper interconnect level metal structures can include line-level metal interconnect structures (96, 98). The line-level metal interconnect structures (96, 98) can include bit lines 98 that contact a respective one of the drain contact via structures 88 and extend along the second horizontal direction (e.g., bit line direction) hd2 and perpendicular to the first horizontal direction (e.g., word line direction) hd1. It is noted that only two subsets of the bit lines 98 are illustrated within each plane (P0-P7), and some bit lines 98 are schematically indicated as dotted lines between two sets of bit lines 98 within each plane (P0-P7). Further, the line-level metal interconnect structures (96, 98) can include upper metal line structures 96 that contact a top surface of a respective one of the layer contact via structures 86 and/or another contact via structure (not shown) that vertically extend through the retro-stepped dielectric material portions (165, 265) or other dielectric material portions (not shown). Additional metal interconnect structures (not shown) and additional dielectric material layers (not shown) may be formed to provide electrical interconnection among the various components of a three-dimensional memory device in the first exemplary structure.

Figure 16A:
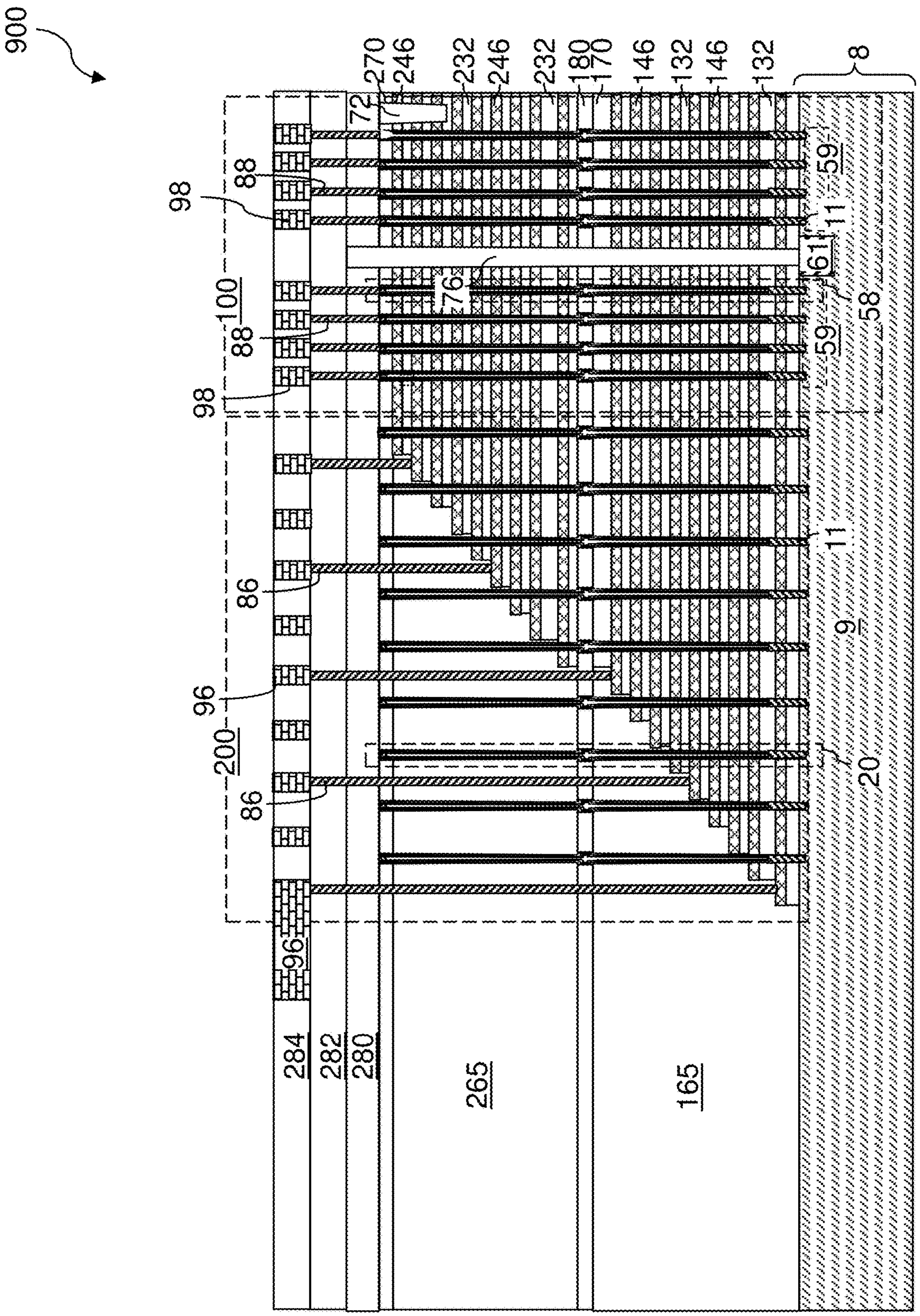
FIG. 16A is a vertical cross-sectional view of the first exemplary structure after formation of bit-line-level metal interconnect structures according to an embodiment of the present disclosure.
Figure 16B:
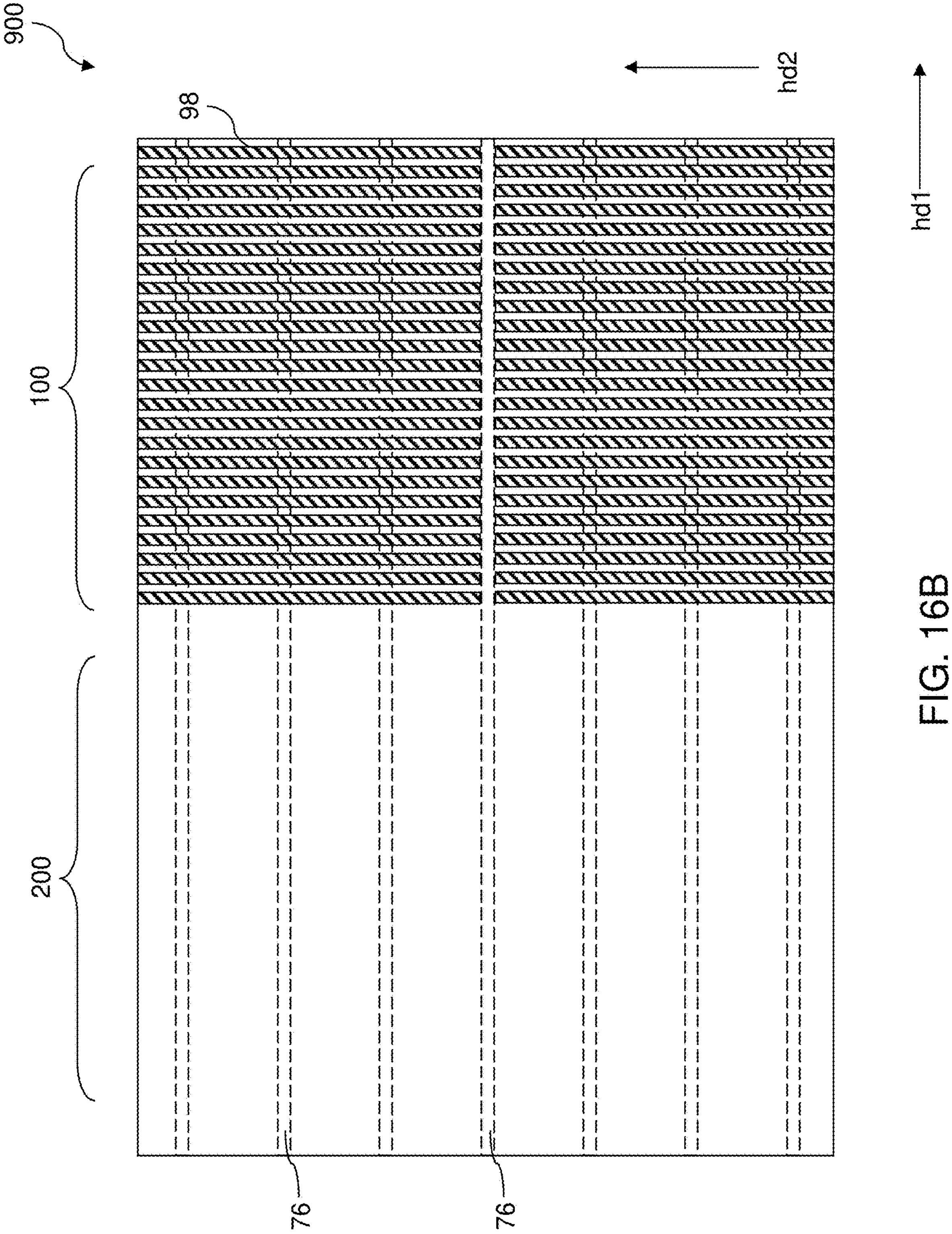
FIG. 16B is a top-down view of the area of the first exemplary structure of FIG. 16A.
Figure 16C:
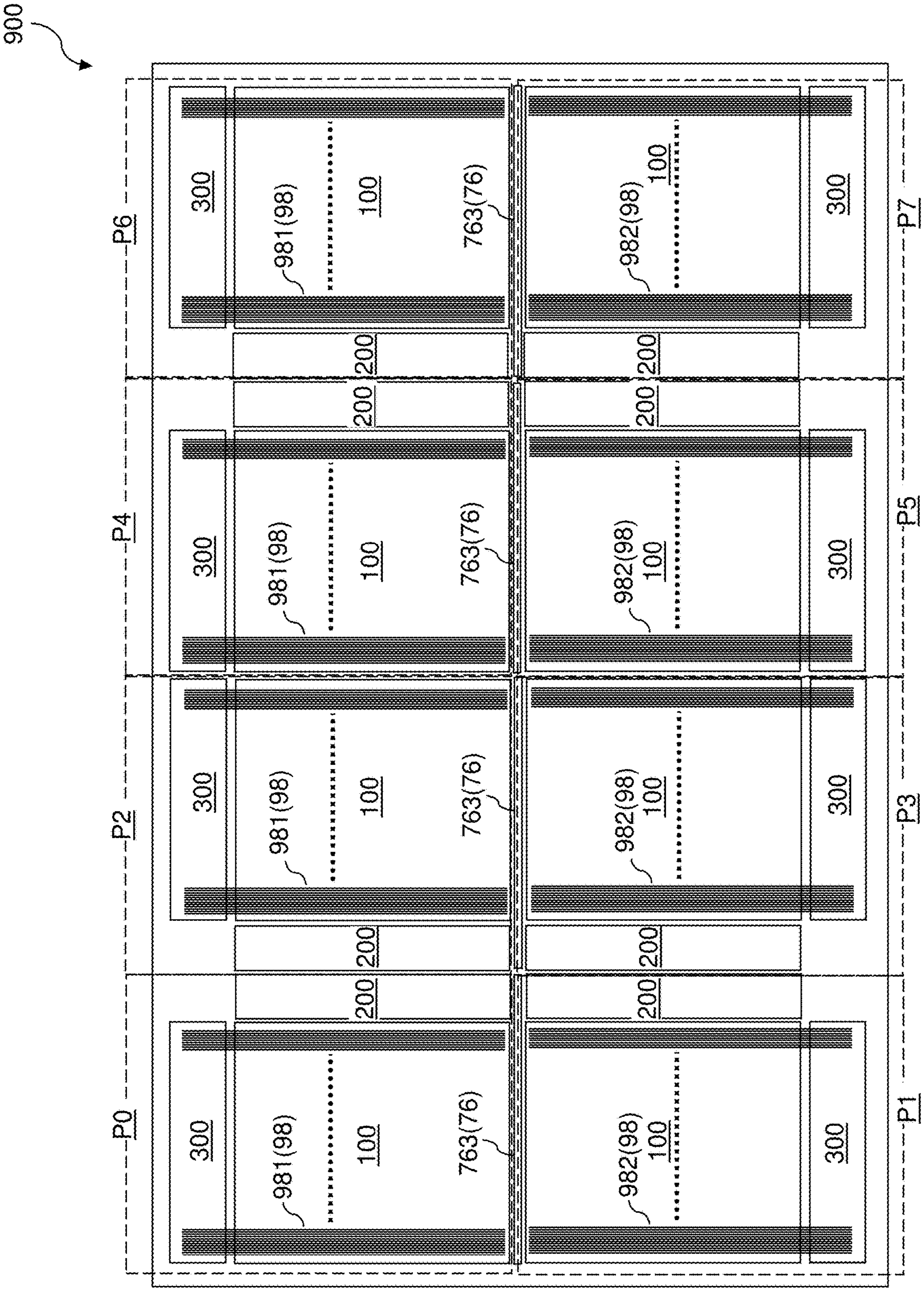
FIGS. 16C and 16D illustrate alternative bit line layouts of a semiconductor die within the first exemplary structure of FIGS. 16A and 16B in a plan view.

In one embodiment shown in FIG. 16C, the bit lines 98 include first bit lines 981 formed within even-numbered planes (P0. P2, P4, P6) and second bit lines 98 formed within odd-numbered planes (P1, P3, P5, P7). Generally, the first bit lines 981 and the second bit lines 982 can be formed over the first alternating stacks of first insulating layers (132, 232) and first electrically conductive layers (146, 246) within each even-numbered plane (P0, P2, P4, P6), and over the second alternating stacks of second insulating layers (132, 232) and second electrically conductive layers (146, 246) within each odd-numbered plane (P1, P3, P5, P7). The first bit lines 981 are electrically connected to a respective subset of the first vertical semiconductor channels 60 within a respective first three-dimensional memory array in a respective one of the even-numbered planes (P0, P2, P4, P6), and are electrically isolated from the second vertical semiconductor channels 60 within any other three-dimensional memory array. The second bit lines 982 are electrically connected to a respective subset of the second vertical semiconductor channels 60 within a respective second three-dimensional memory array in a respective one of the odd-numbered planes (P1, P3, P5, P7), and are electrically isolated from the first vertical semiconductor channels 60 within any other three-dimensional memory array.

Figure 16D:
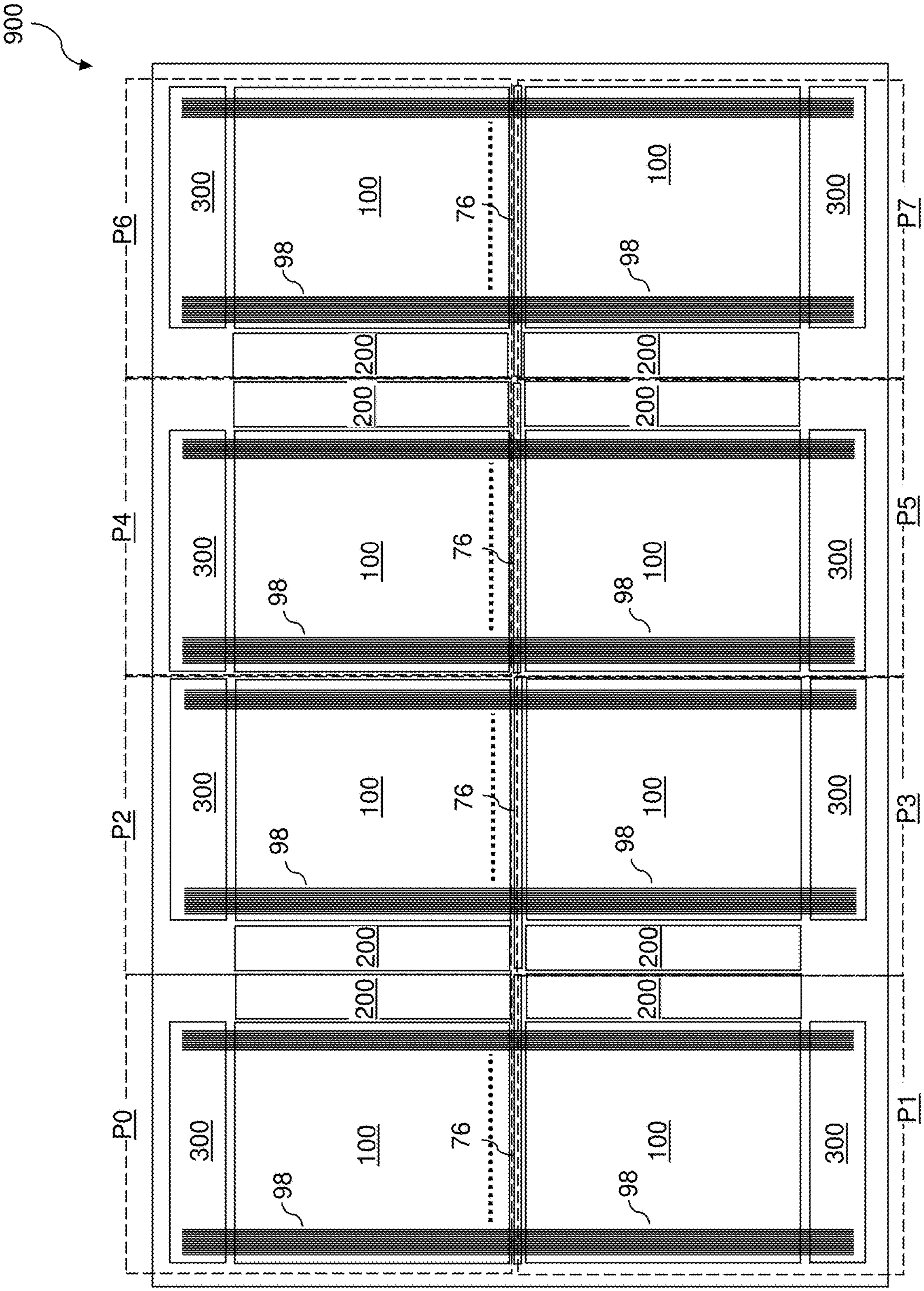

In an alternative embodiment, the bit lines 98 may extend across both the even and odd numbered planes, as shown in FIG. 16D. Each bit line 98 can be formed over the alternating stacks of insulating layers (132, 232) and electrically conductive layers (146, 246) within one even-numbered plane (P0, P2, P4, P6) and one odd-numbered plane (P1, P3, P5, P7). The bit lines 98 are electrically connected to vertical semiconductor channels 60 in a respective one of the even-numbered planes (P0, P2, P4, P6), and in a respective one of the odd-numbered planes (P1, P3, P5, P7).

Figure 17A:
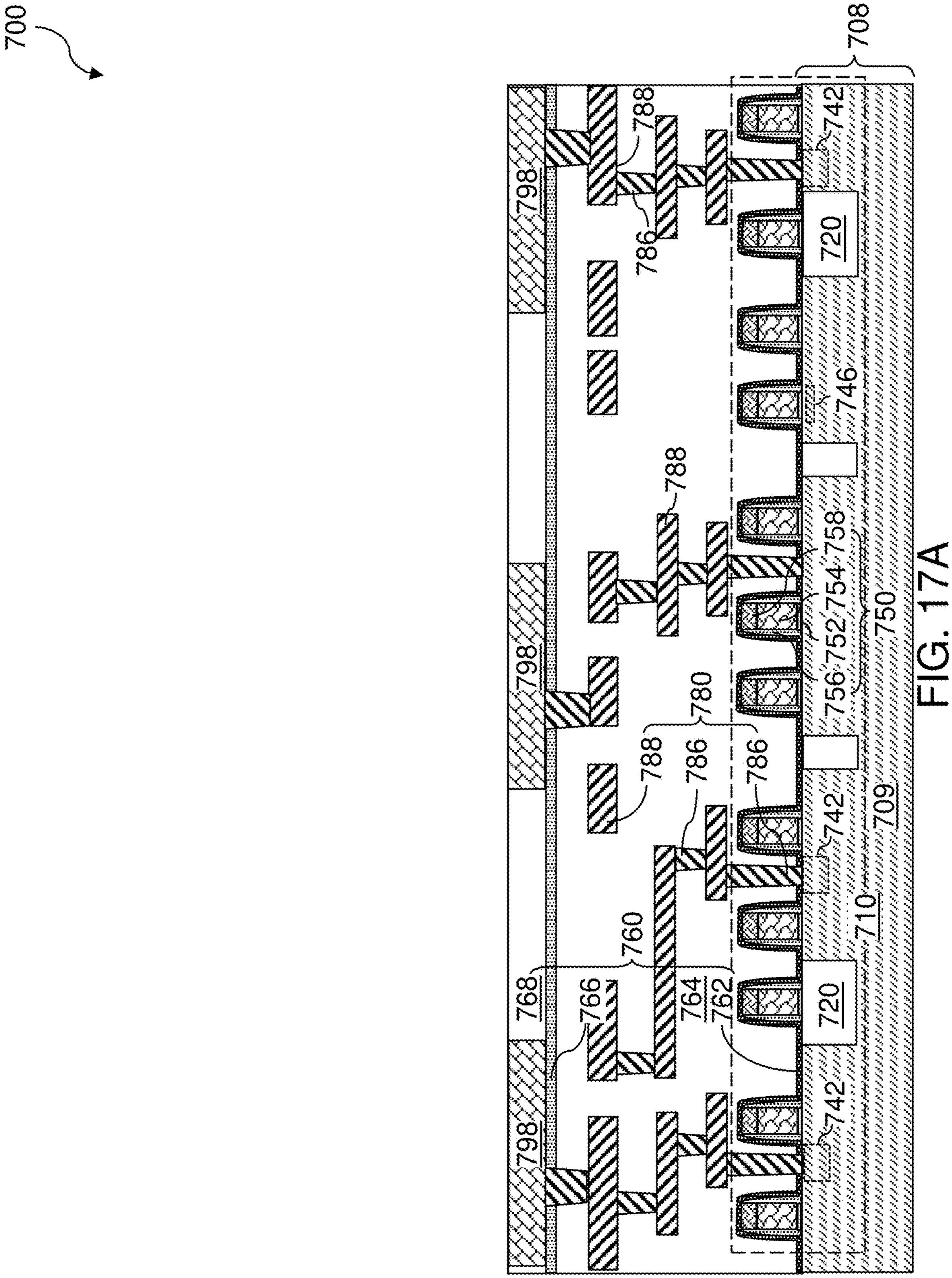
FIG. 17A is a vertical cross-sectional view of a logic die according to the first embodiment of the present disclosure.
Figure 17B:
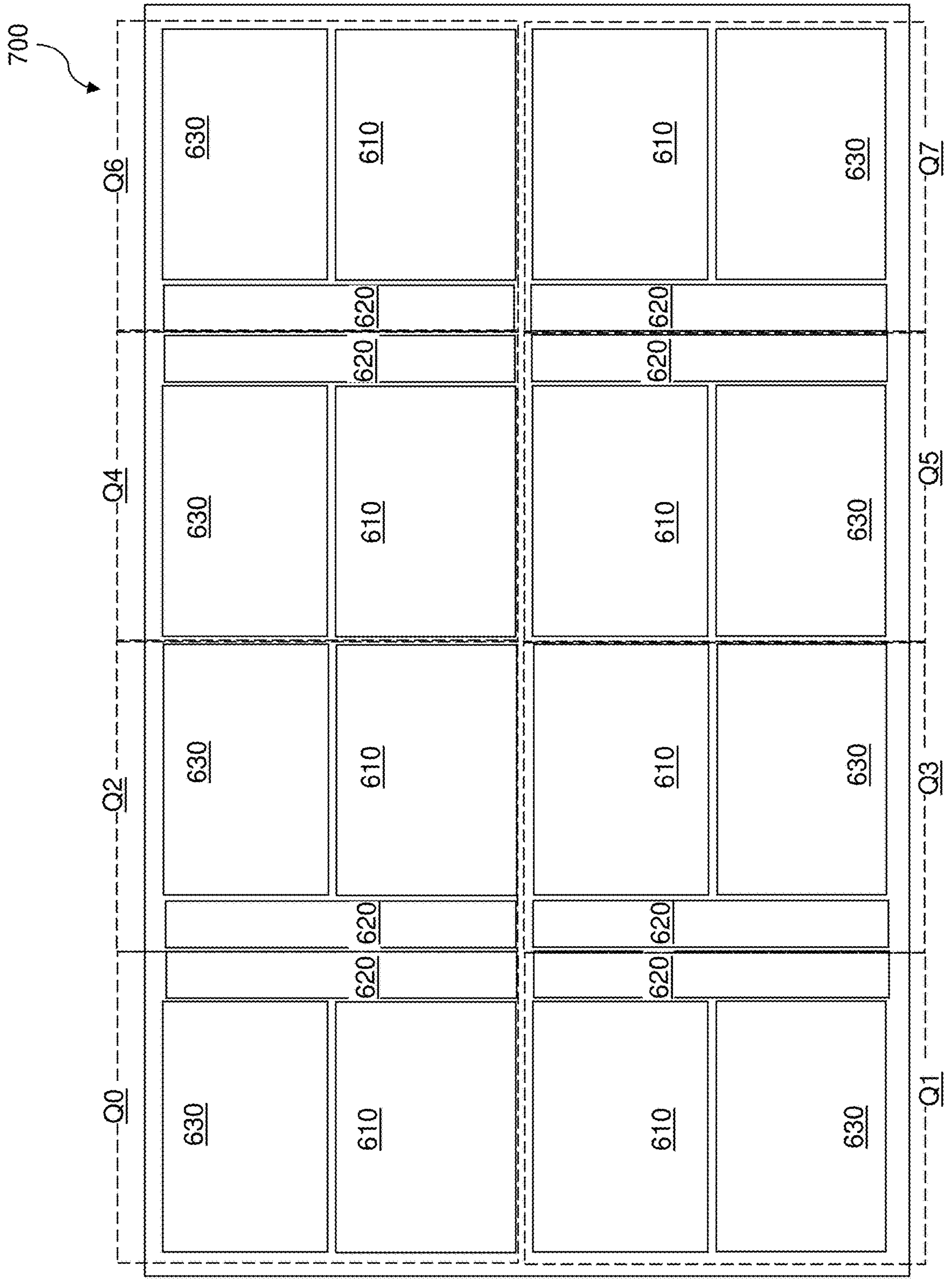
FIG. 17B illustrates a layout of the logic die of FIG. 17A in a plan view.

Referring to FIGS. 17A and 17B, a logic die 700 according to an embodiment of the present disclosure is illustrated. The logic die 700 can include a logic-die substrate 708 and a peripheral circuit 710 formed thereupon. The logic-die substrate 708 includes a logic-die substrate semiconductor layer 709 at least at an upper portion thereof. Shallow trench isolation structures 720 may be formed in an upper portion of the logic-die substrate semiconductor layer 709 to provide electrical isolation from other semiconductor devices. The peripheral circuit 710 may include, for example, field effect transistors including respective transistor active regions 742 (i.e., source regions and drain regions), channel regions 746, and gate structures 750. The field effect transistors may be arranged in a CMOS configuration. Each gate structure 750 may include, for example, a gate dielectric 752, a gate electrode 754, a dielectric gate spacer 756 and a gate cap dielectric 758.

The logic die 700 can have multiple plane peripheral (i.e., driver or control) circuit (Q0-Q7), each of which can have the same area as a corresponding plane (P0-P7) of the semiconductor die illustrated in FIGS. 16C-16D. The logic die 700 may be one of a plurality of logic dies 700 provided over a semiconductor wafer. Each plane peripheral circuit (Q0-Q7) of the logic die 700 includes a peripheral circuit 710 configured to operate a respective three-dimensional memory array within one of the planes (P0-P7) of the semiconductor die illustrated in FIGS. 16C-16D. In one embodiment, each plane peripheral circuit (Q0-Q7) of the logic die 700 may include a word line driver circuit 620 that includes word line switching transistors, a bit line driver circuit 630 that includes sense amplifiers, and miscellaneous peripheral circuits 610 that are employed for operation of a respective three-dimensional memory array in the respective plane to be subsequently electrically connected thereto.

Dielectric material layers are formed over the semiconductor devices, which are herein referred to as dielectric material layers 760. The dielectric material layers 760 may include, for example, a dielectric liner 762 (such as a silicon nitride liner that blocks diffusion of mobile ions and/or apply appropriate stress to underlying structures), interconnect dielectric layers 764 that overlie the dielectric liner 762, a silicon nitride layer (e.g., hydrogen diffusion barrier) 766 that overlies the interconnect dielectric layers 764, and a bonding-pad-level dielectric layer 768.

The dielectric material layers 760 function as a matrix for metal interconnect structures 780 that provide electrical connection between the peripheral circuit 710 and logic-side bonding pads 798. The logic-side bonding pads 798 are embedded within the bonding-pad-level dielectric layer 768. Each dielectric material layer within the interconnect dielectric layers 764 may include any of doped silicate glass, undoped silicate glass, organosilicate glass, silicon nitride, silicon oxynitride, and dielectric metal oxides (such as aluminum oxide). In one embodiment, the interconnect dielectric layers 764 may comprise, or consist essentially of, dielectric material layers having dielectric constants that do not exceed the dielectric constant of undoped silicate glass (silicon oxide) of 3.9. The metal interconnect structures 780 are formed within the dielectric layer stack of the lower-level dielectric material layers 760. The metal interconnect structures 780 may include various metal via structures 786 and various metal line structures 788.

Generally, the logic die 700 includes a support circuitry configured to control operation of the memory die 900 containing the three-dimensional memory arrays within the planes (P0-P7) of FIGS. 16A-16D. The logic-side bonding pads 798 can have a mirror image pattern of a pattern of the memory-side bonding pads 998 shown in FIGS. 18A and 18B.

Figure 18A:
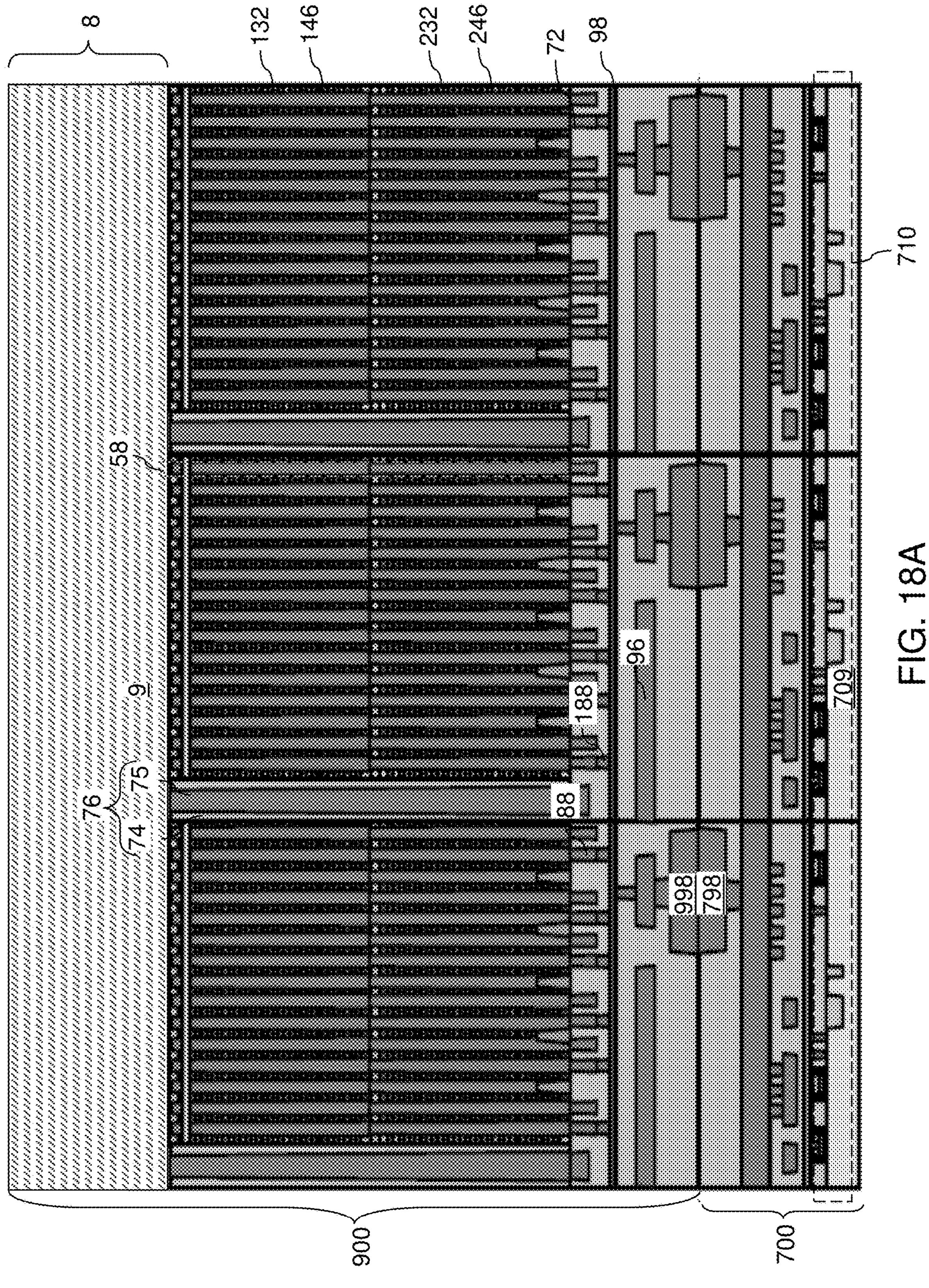
FIGS. 18A and 18B are vertical cross-sectional views of the first exemplary structure after bonding the semiconductor die to the logic die according to the first embodiment of the present disclosure.
Figure 18B:
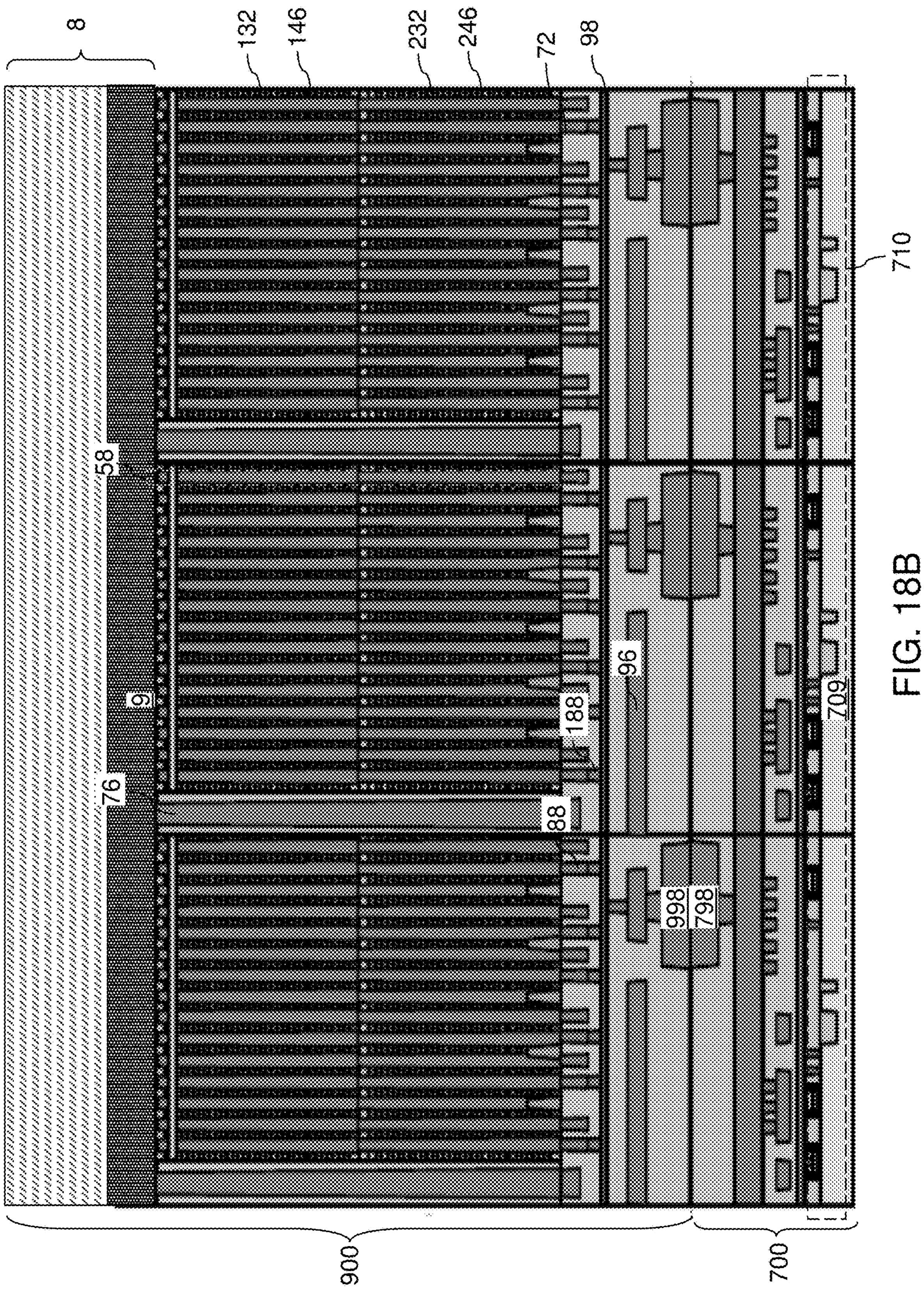

Referring to FIGS. 18A and 18B, the logic die 700 can be bonded to the memory die 900 of FIGS. 16A-16D. In FIG. 18A, the substrate semiconductor layer 9 comprises a doped top portion of a semiconductor (e.g., silicon) substrate 8, such as a doped well in a silicon substrate. In FIG. 18B, the substrate semiconductor layer 9 comprises a buried source line (e.g., a heavily doped polysilicon layer) located between the substrate (e.g., silicon wafer) 8 and the first-tier alternating stack (132, 146).

For example, wafer-to-wafer bonding can be employed to bond a first wafer including a plurality of instances of the semiconductor die of FIGS. 16A-16D to a second wafer including a plurality of instances of the logic die 700. The logic-side bonding pads 798 are bonded to a respective one of the memory-side bonding pads 998 through metal-to-metal bonding. In case the bonding-pad-level dielectric layer 768 and the topmost dielectric layer 968 of the memory die 900 include silicon oxide, oxide-to-oxide bonding may be used in addition to, or in lieu of, metal-to-metal bonding.

Generally, the logic-side bonding pads 798 can be bonded to a respective one of the memory-side bonding pads 998. The logic die 700 includes a support circuitry (i.e., a peripheral circuit) configured to control operation of the three-dimensional memory device within the memory die 900. If the configuration of FIG. 16C is used, then an optional cut region CR shown in FIG. 23 can be provided at a bit line level between first bit lines 981 and second bit lines 982 of a neighboring pair of adjacent even and odd planes. Alternatively, if the configuration of FIG. 16D is used, then the cut region is omitted and each bit line 98 extends continuously over adjacent odd and even planes, as shown in FIGS. 18A and 18B. The lateral spacing between the neighboring pair of planes that employ different sets of bit lines 98 can be the same as the width of a backside trench fill structure 76.

Generally, the bit lines 98 may contact a respective subset of the drain contact via structures 88 directly, or may be electrically connected to a respective subset of the drain contact via structures 88 through additional connection via structures 188.

Generally, an alternating stack of insulating layers (132, 232) and spacer material layers, such as sacrificial material layers (142, 242), can be formed over a substrate. The spacer material layers may be formed as, or may be subsequently replaced with, electrically conductive layers (146, 246).

Groups of memory openings 49 can be formed through the alternating stack (132, 232). Groups of memory opening fill structures 58 can be formed in the memory openings 49. Each of the of memory opening fill structures 58 includes a memory stack structure 55, which includes a respective vertical stack of memory elements (which may comprise portions of the memory film 50 located at levels of electrically conductive layers (146, 246)) and a respective vertical semiconductor channel 60. Each of the memory opening fill structures 58 may comprise a vertical NAND string containing a vertical stack of memory elements. Alternating stacks of insulating layers (132, 132) and electrically conductive layers (146, 246) can be formed over the substrate. Backside trench fill structures 76 can be formed through the alternating stacks {(132, 146), (232, 246)}. For each alternating stack of insulating layers (132, 232) and electrically conductive layers (146, 246), a pair of backside trench fill structures 76 can be formed through the alternating stack {(132, 146), (232, 246)}.

Figure 19A:
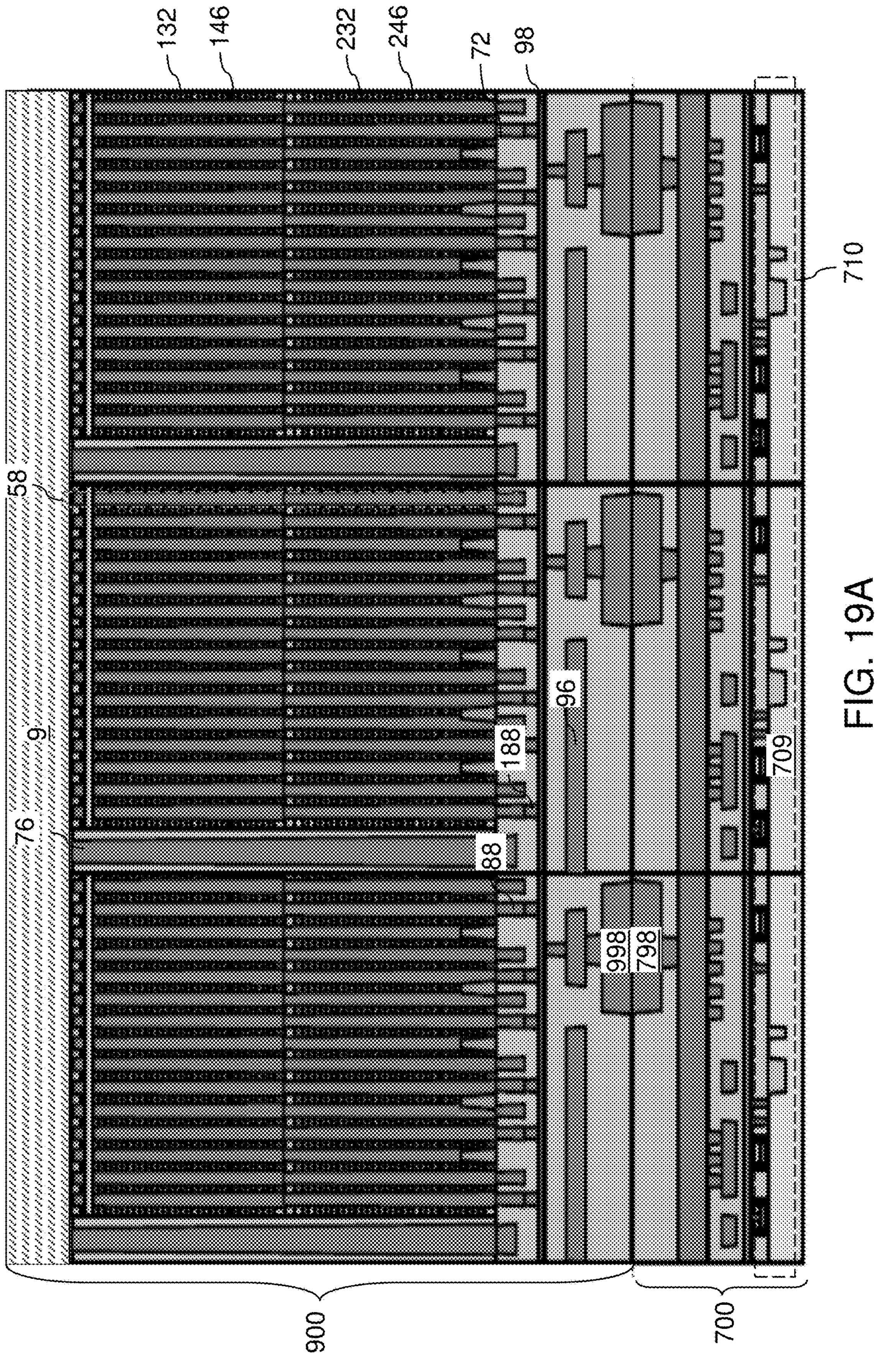
FIGS. 19A and 19B are vertical cross-sectional views of the first exemplary structure after thinning the backside of the semiconductor die according to the first embodiment of the present disclosure.
Figure 19B:
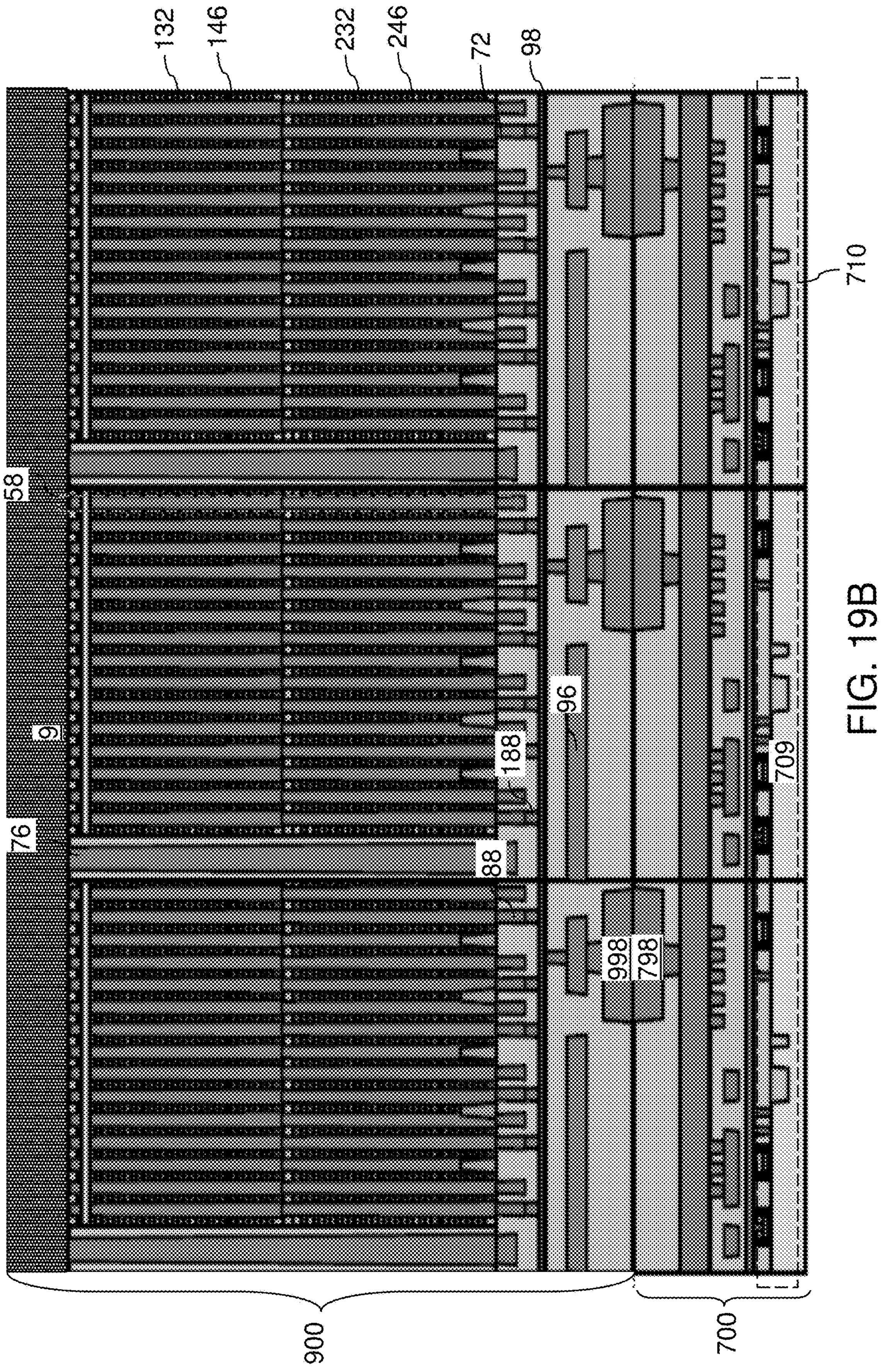

Referring to FIGS. 19A and 19B, the backside of the substrate 8 may be thinned, for example, by grinding, polishing, an anisotropic etch process, and/or an isotropic etch process. The thickness of the substrate semiconductor layer 9 (i.e., a doped well in FIG. 19A or a buried source line in FIG. 19B) after thinning may be in a range from 100 nm to 6,000 nm, although lesser and greater thicknesses may also be employed. In one embodiment shown in FIG. 19A, the substrate semiconductor layer 9 may be a single crystalline semiconductor material layer such as a single crystalline silicon layer. In another embodiment shown in FIG. 19B, the substrate semiconductor layer 9 may be a polycrystalline semiconductor material layer, such as a doped polysilicon layer. The substrate semiconductor layer 9 constitutes a source-level material layer (e.g., a source line). In one embodiment, the source-level material layer may be doped with dopants of the second conductivity type by providing dopants of the second conductivity type, for example, by ion implantation or gas phase diffusion. In an alternative embodiment, dopants of the second conductivity type may be implanted or diffused from the front side of the substrate semiconductor layer 9 prior to formation of the first-tier alternating stack of the first-tier insulating layers 132 and the first-tier sacrificial material layers 142. In another alternative embodiment shown in FIG. 19B, dopants of the second conductivity type may be provided in-situ during growth of the buried source line.

Figure 20A:
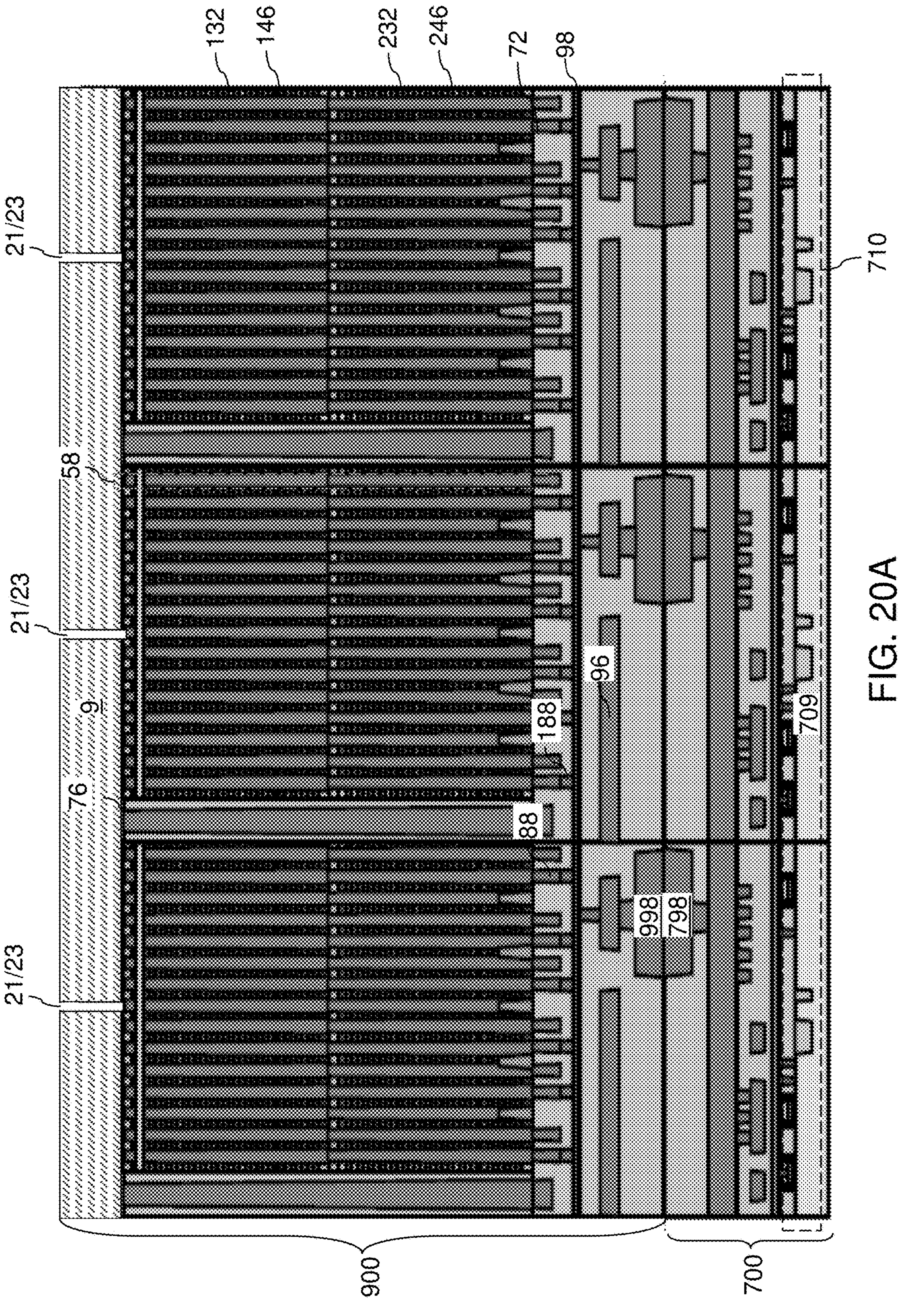
FIGS. 20A and 20B are vertical cross-sectional views of the first exemplary structure after formation of a plurality of source layers according to the first embodiment of the present disclosure.
Figure 20B:
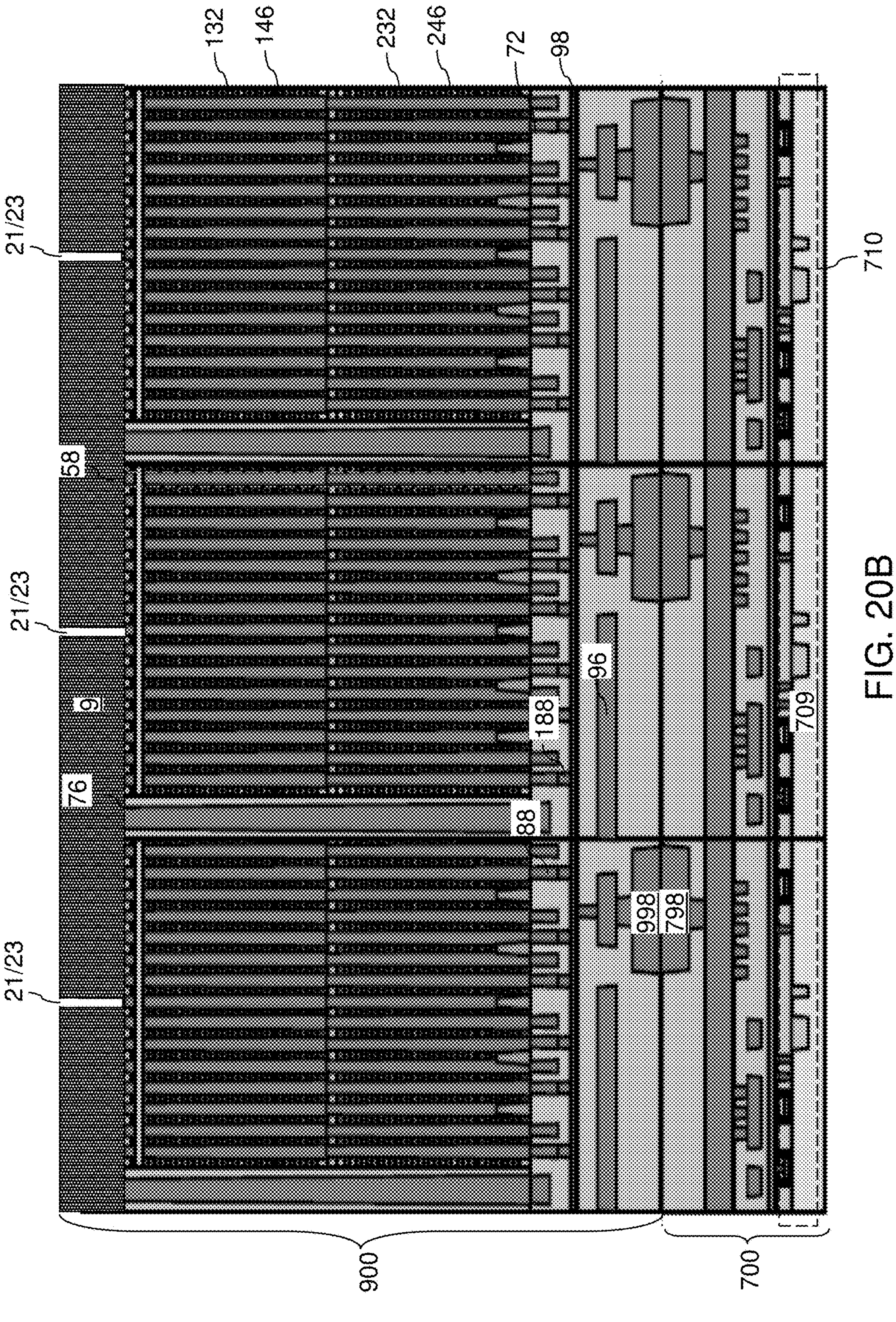

Referring to FIGS. 20A and 20B, a photoresist layer can be applied over the backside of the substrate semiconductor layer 9, and can be lithographically patterned to form line-shaped openings that laterally extend along the first horizontal direction hd1. An anisotropic etch process can be performed to divide the substrate semiconductor layer 9 into a plurality of semiconductor material layers, which function as a source region (or combination of source region and source line) for a respective group of vertical semiconductor channels 60 located within the same area (e.g., a string unit area). The plurality of semiconductor material layers are hereafter referred to as source layers 9. The thinned substrate semiconductor layer 9 having a doping of the second conductivity type functions as a source-level material layer, and a plurality of source layers 9 are formed by patterning the thinned substrate semiconductor layer 9. A plurality of source-side trenches 21 are formed through the source-level material layer, such that each neighboring pair of source layers 9 of the plurality of source layers 9 is laterally spaced from each other by a respective one of the plurality of source-side trenches 21. The plurality of source layers 9 is laterally spaced apart, and are electrically isolated from each other. Each group of memory opening fill structures 58 contacts a respective one of the plurality of source layers 9. Each neighboring pair of source layers 9 of the plurality of source layers 9 is laterally spaced from each other by a respective one of the plurality of source-side trenches 21. A dielectric material may be deposited in the source-side trenches 21 and over the source layers 9 to form source-level dielectric isolation structures 23 located in the respective trenches 21.

Figure 21:
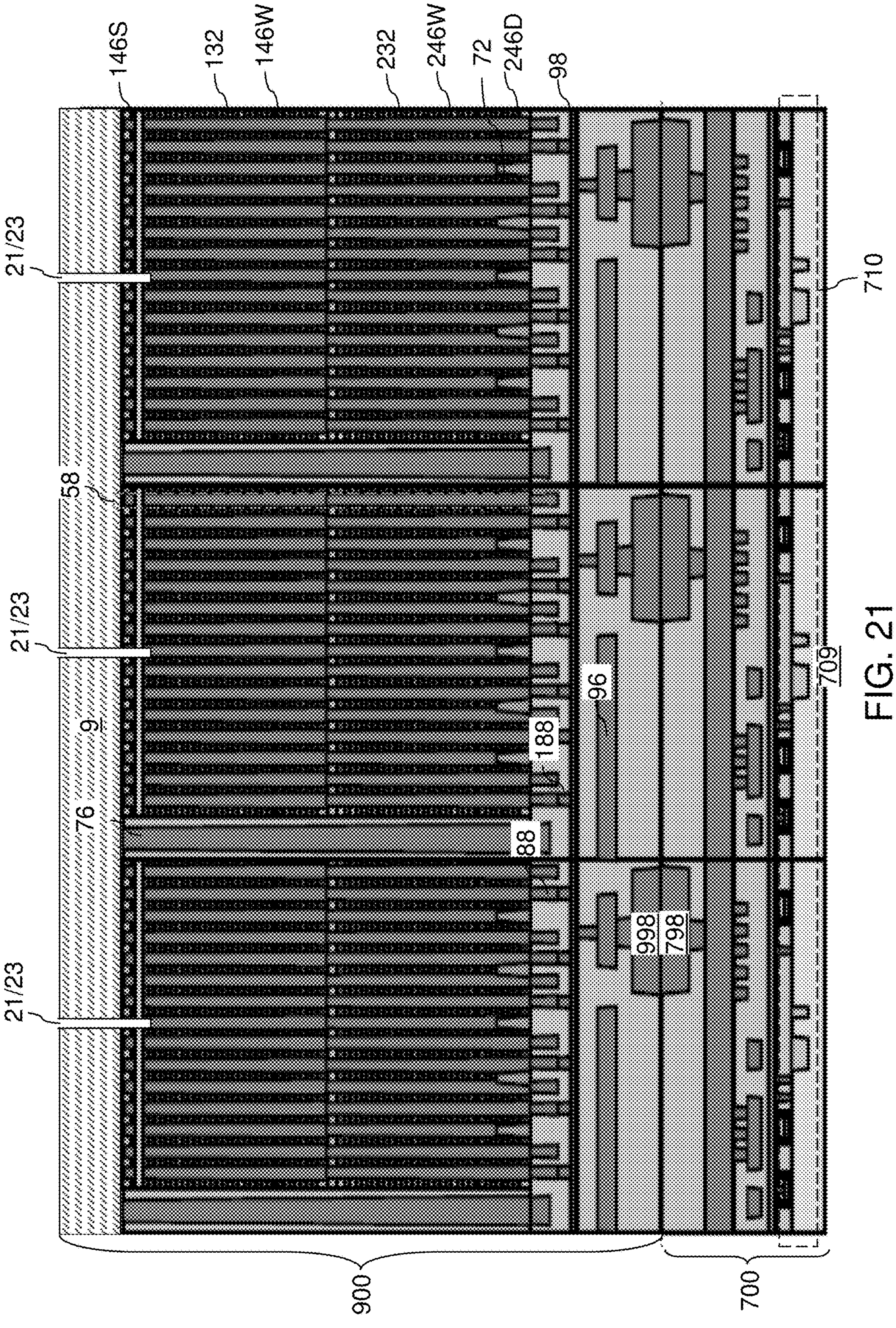
FIG. 21 is a vertical cross-sectional view of a first alternative configuration of the first exemplary structure after formation of a plurality of source layers according to the first embodiment of the present disclosure.

Referring to FIG. 21, a first alternative configuration of the first exemplary structure is illustrated after formation of a plurality of source layers 9 (e.g., of the type shown in FIG. 18A or buried source line shown in FIG. 18B). In the first alternative configuration, the plurality of source-side trenches 21 are extended through both the source-level material layer to form the source layers 9 and through at least one top most electrically conductive layer 146 underlying the source layers 9 to form separated source-side select gate electrodes (SGS) (i.e., source-side select gate lines) 146S. Each patterned first-tier electrically conductive layer 146 within the first subset of the electrically conductive layers (146, 246) can be divided into a plurality of source-side select gate electrodes 146S by forming the source-side trenches 21. The source-side trenches 21 do not divide a second subset of the electrically conductive layers which function as word lines (i.e., word lines) (146W, 246W) that laterally extend along the word line direction hd1 between a neighboring pair of backside trench fill structures 76. The source-side trenches 21 also do not divide the drain-side select gate electrodes 246D which are separated by the drain-select-level dielectric isolation structures 72. A dielectric material may be deposited in the source-side trenches 21 and over the source layers 9 to form source-level dielectric isolation structures 23 located in the respective trenches 21.

FIGS. 22A-22D illustrate an alternative configuration of a memory opening 49 during formation of a memory opening fill structure 58 according to a second embodiment of the present disclosure.

Figure 22B:
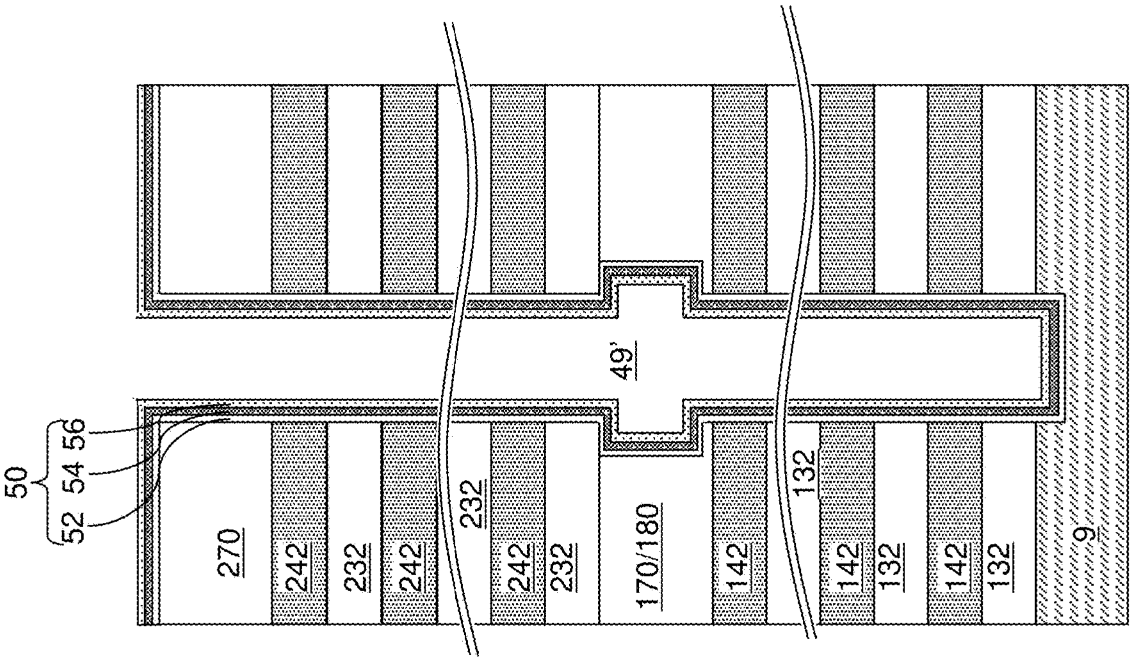
FIGS. 22A-22D are vertical cross-sectional views of an alternative configuration of a memory opening during formation of a memory opening fill structure according to a second embodiment of the present disclosure.
Figure 22A:
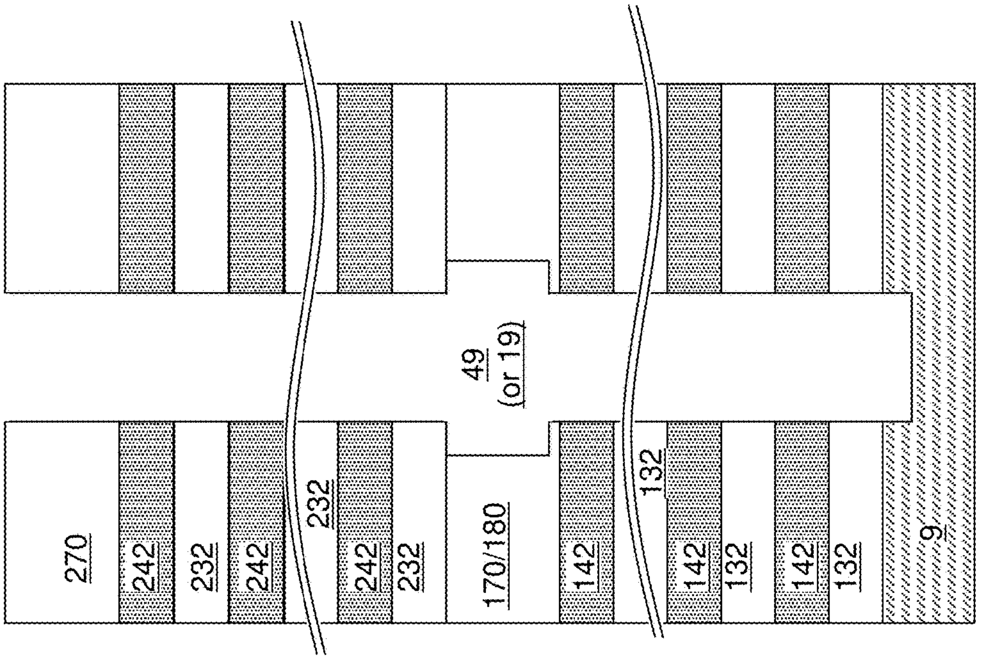

Referring to FIG. 22A, an inter-tier memory opening 49 (i.e., a memory opening 49) or an inter-tier support opening 19 is illustrated at the processing steps of FIG. 8.

Referring to FIG. 22B, a blocking dielectric layer 52, a charge storage layer 54, and a tunneling dielectric layer 56 can be deposited in the inter-tier memory opening 49 by performing the processing steps of FIG. 9B. The combination of the blocking dielectric layer 52, the charge storage layer 54, and the tunneling dielectric layer 56 constitutes a memory film 50.

Referring to FIG. 23C, a semiconductor channel layer 60L can be deposited on the memory film 50. The semiconductor channel layer 60L can be deposited in the same manner as the first semiconductor channel layer 601 or the second semiconductor channel layer 602 described above, and may have the same material composition as the first semiconductor channel layer 601 and/or the second semiconductor channel layer 602. The thickness of the semiconductor channel layer 60L can be the same as the sum of the thickness of the first semiconductor channel layer 601 or the second semiconductor channel layer 602.

Figure 22D:
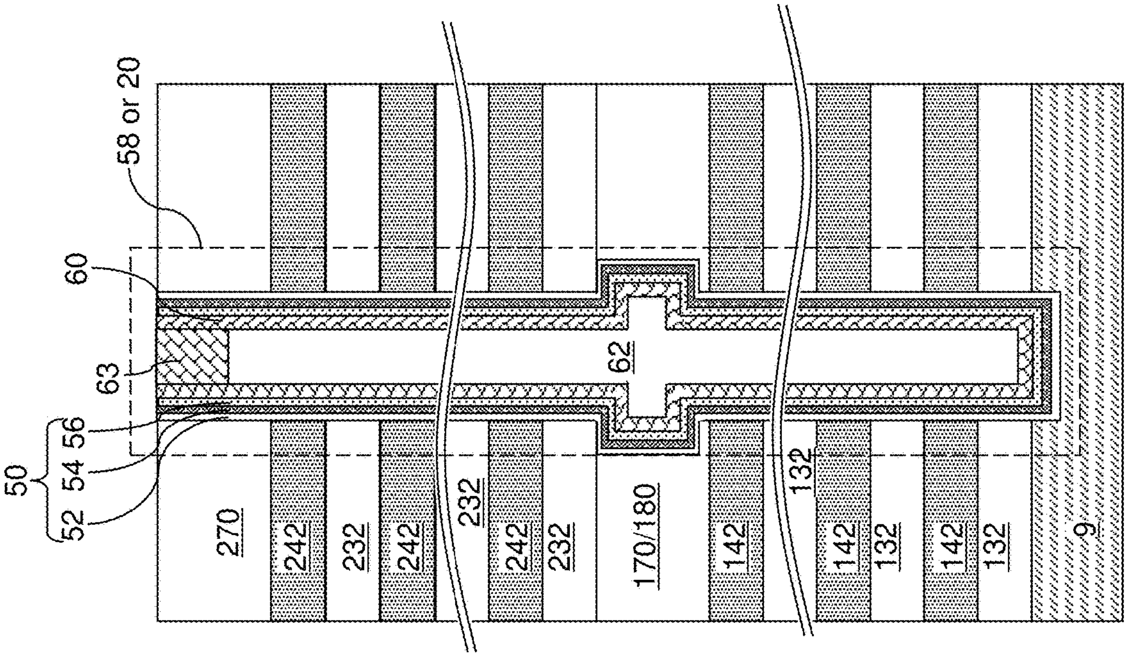
Figure 22C:
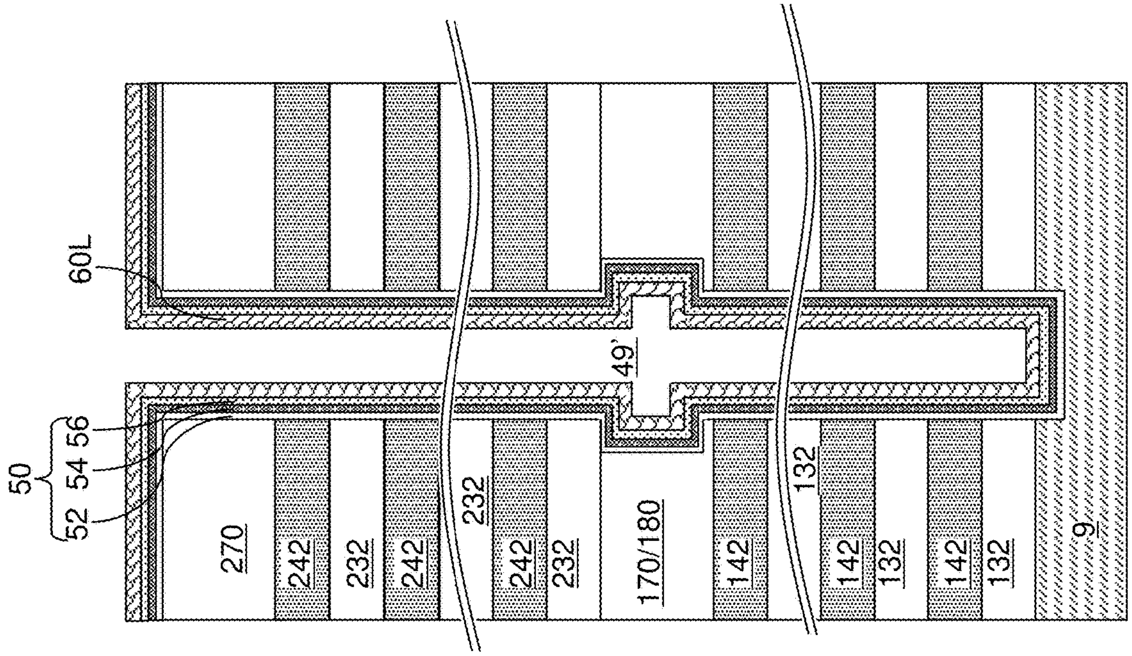

Referring to FIG. 22D, the processing steps of FIGS. 9F, 9G, and 9H can be performed to form a dielectric core 62 and a drain region 63 within each memory opening fill structure 58. Each remaining portion of the semiconductor channel layer 60L constitutes a vertical semiconductor channel 60.

Subsequently, the processing steps of FIGS. 10-18 can be performed to form a second exemplary structure including a bonded assembly of a memory die 900 and a logic die 700 according to a second embodiment of the present disclosure. Each alternating stack of insulating layers (132, 232) and electrically conductive layers (146, 246) can be laterally bounded by a pair of backside trench fill structures 76.

Figure 23:
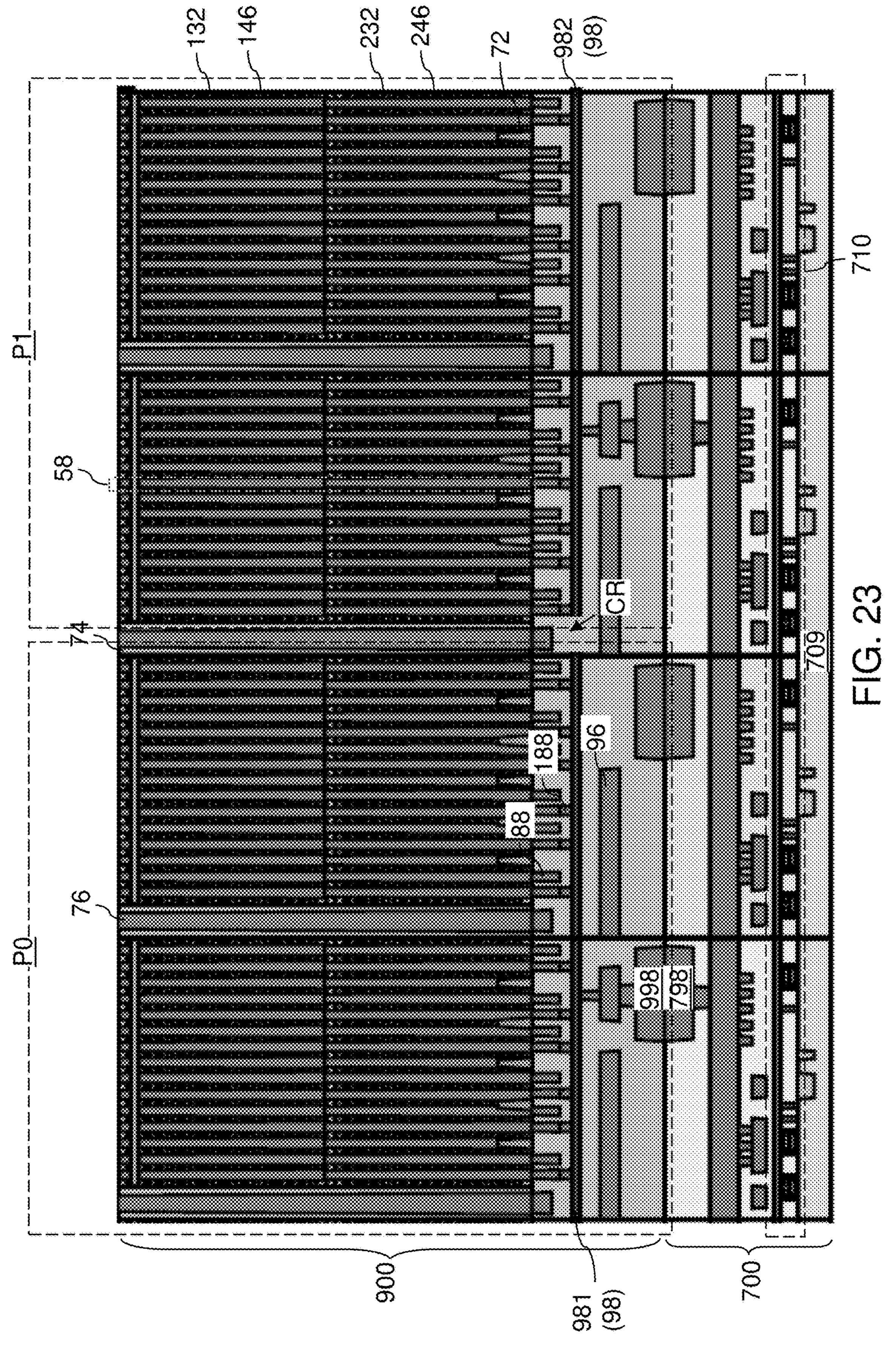
FIG. 23 is a vertical cross-sectional view of a second exemplary structure after removal of the substrate according to a second embodiment of the present disclosure.

Referring to FIG. 23, the optional cut region CR between the first and second bit lines 981 and 982 shown in FIG. 16C may be present in the memory die 900 between adjacent planes P0 and P1. Alternatively, the cut region CR may be omitted, and the continuous bit lines 98 shown in FIGS. 16D and 20 may be provided instead.

Figure 24B:
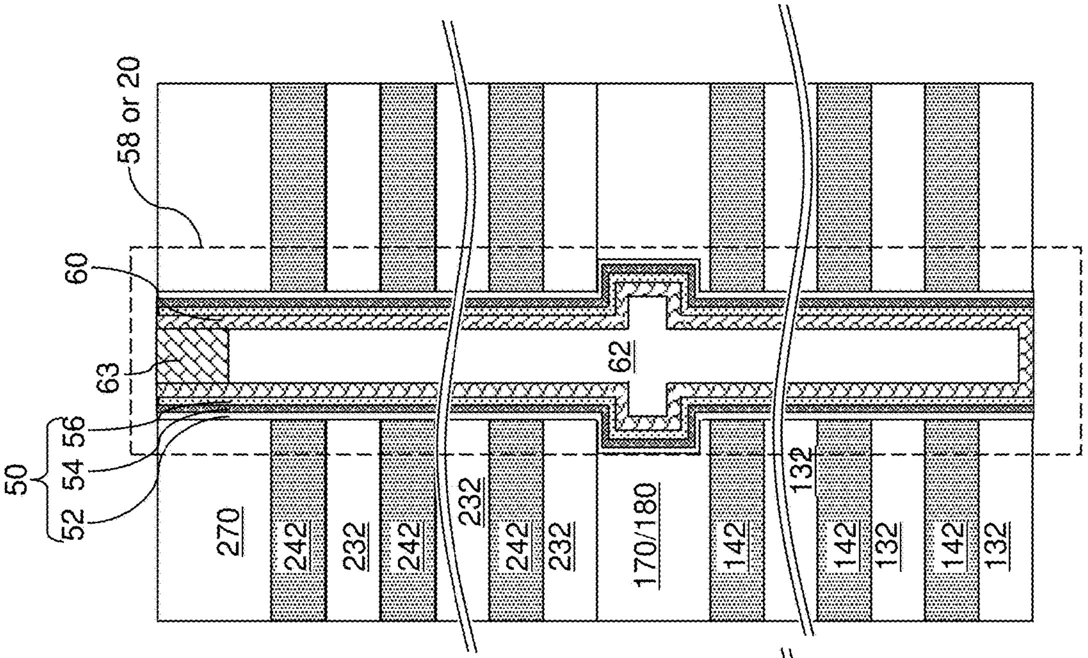
FIGS. 24A and 24B are vertical cross-sectional views of a memory opening fill structure during removal of a bottom portion of a memory film according to the second embodiment of the present disclosure.
Figure 24A:
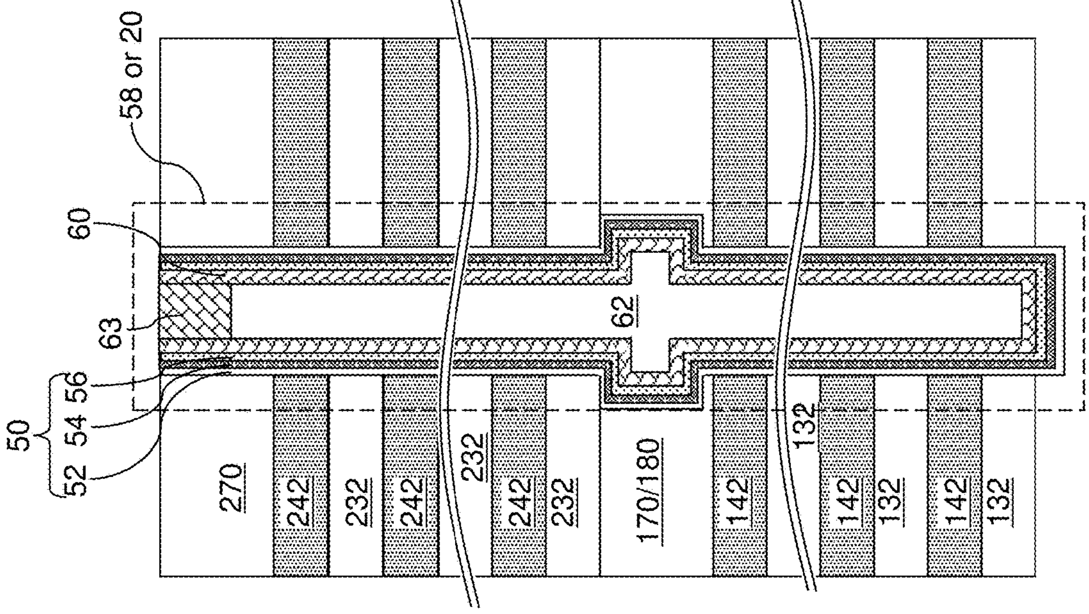

Referring to FIGS. 23 and 24A, the substrate semiconductor layer 9 can be removed from the backside of the bonded assembly, for example, by grinding, polishing, an anisotropic etch process, or an isotropic etch process. For example, the substrate semiconductor layer 9 may be thinned from the backside, for example, by grinding, and an isotropic etch process or an anisotropic etch process may be performed to remove remaining portions of the substrate semiconductor layer 9 selective to the memory films 50. For example, the isotropic etch process may include a wet etch process employing potassium hydroxide.

Referring to FIG. 24B, a sequence of isotropic etch processes can be performed to etch physically exposed portions (i.e., bottom portions) of the memory films 50. The sequence of isotropic etch processes can be selected to sequentially etch the materials of the blocking dielectric layers 52, the charge storage layers 54, and the tunneling dielectric layers 56 selective to the material of the vertical semiconductor channels 60 to expose at least the bottom portions of the vertical semiconductor channels 60.

Figure 25A:
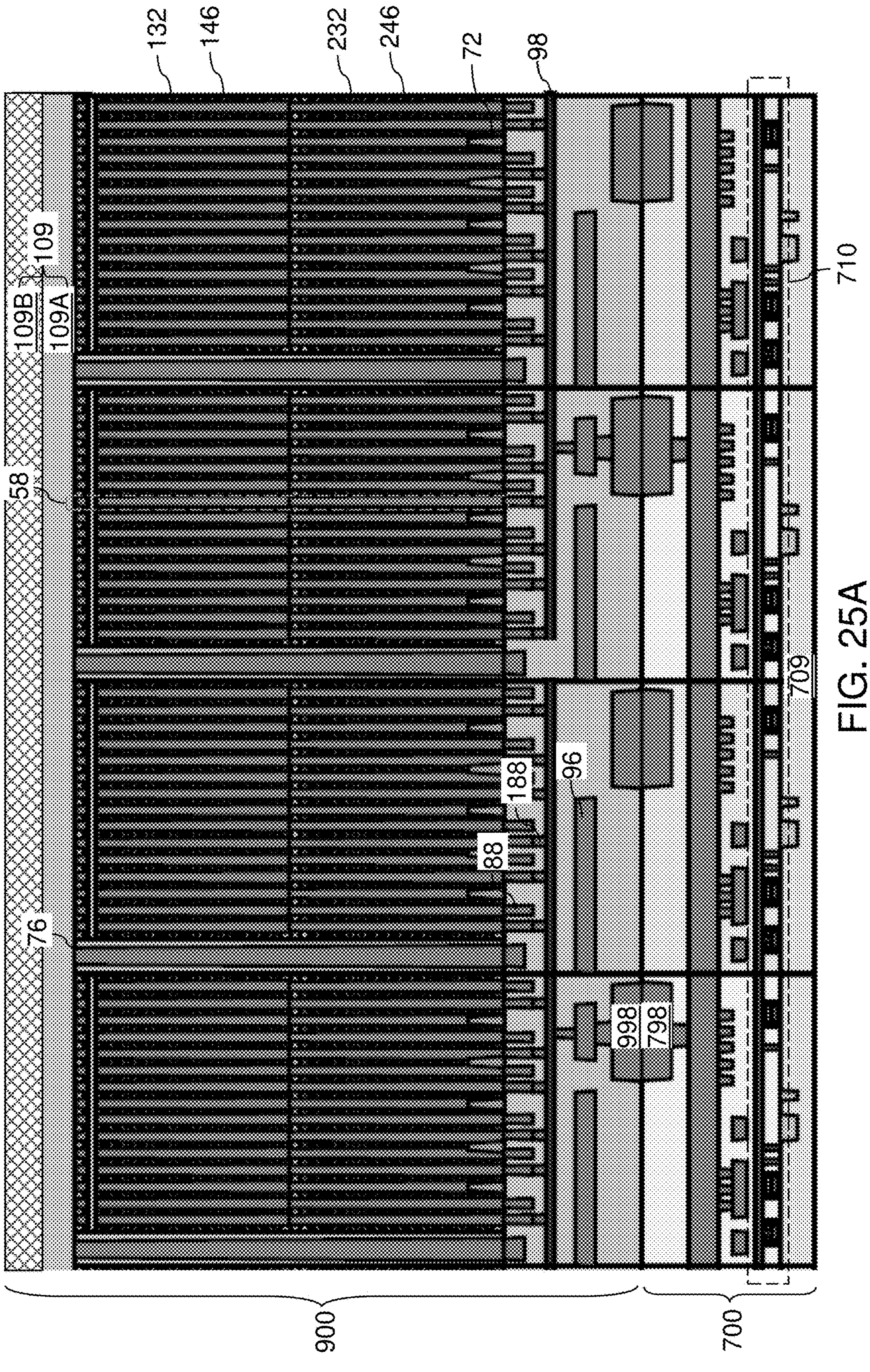
FIG. 25A is a vertical cross-sectional view of the second exemplary structure after formation of a source-level material layer according to a second embodiment of the present disclosure.
Figure 25B:
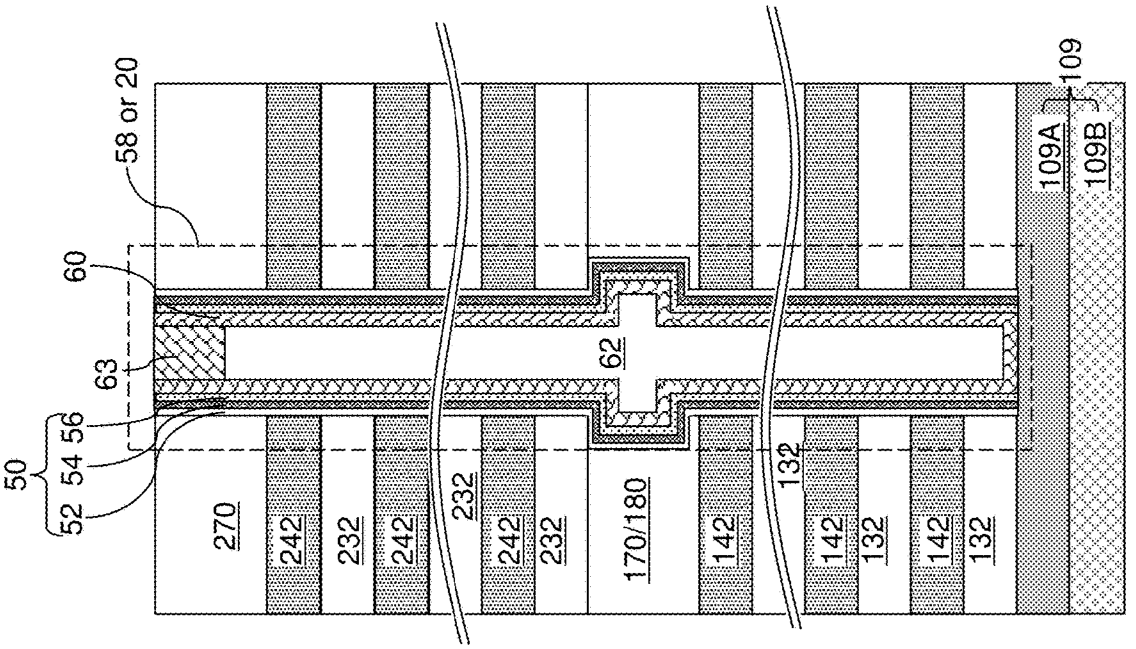
FIG. 25B is a vertical cross-sectional view of a memory opening fill structure within the second exemplary structure of FIG. 25A.

Referring to FIGS. 25A and 25B, a source-level material layer 109 can be deposited on the physically exposed end surfaces of the vertical semiconductor channels 60, which are herein referred to as proximal end surfaces. The source-level material layer 109 includes at least one electrically conductive material. In one embodiment, the source-level material layer 109 comprises a heavily doped semiconductor material, such as polysilicon. In another embodiment, the source-level material layer 109 may include a vertical stack of a heavily doped polycrystalline source semiconductor (e.g., polysilicon) layer 109A having a doping of the second conductivity type, and a metallic source layer 109B, such as a metal silicide (e.g., titanium, tungsten, cobalt or nickel silicide) or a metal (e.g., tungsten, aluminum, molybdenum, copper, etc.). Generally, the source-level material layer 109 can be formed by replacing the substrate with at least one electrically conductive material layer.

Figure 26A:
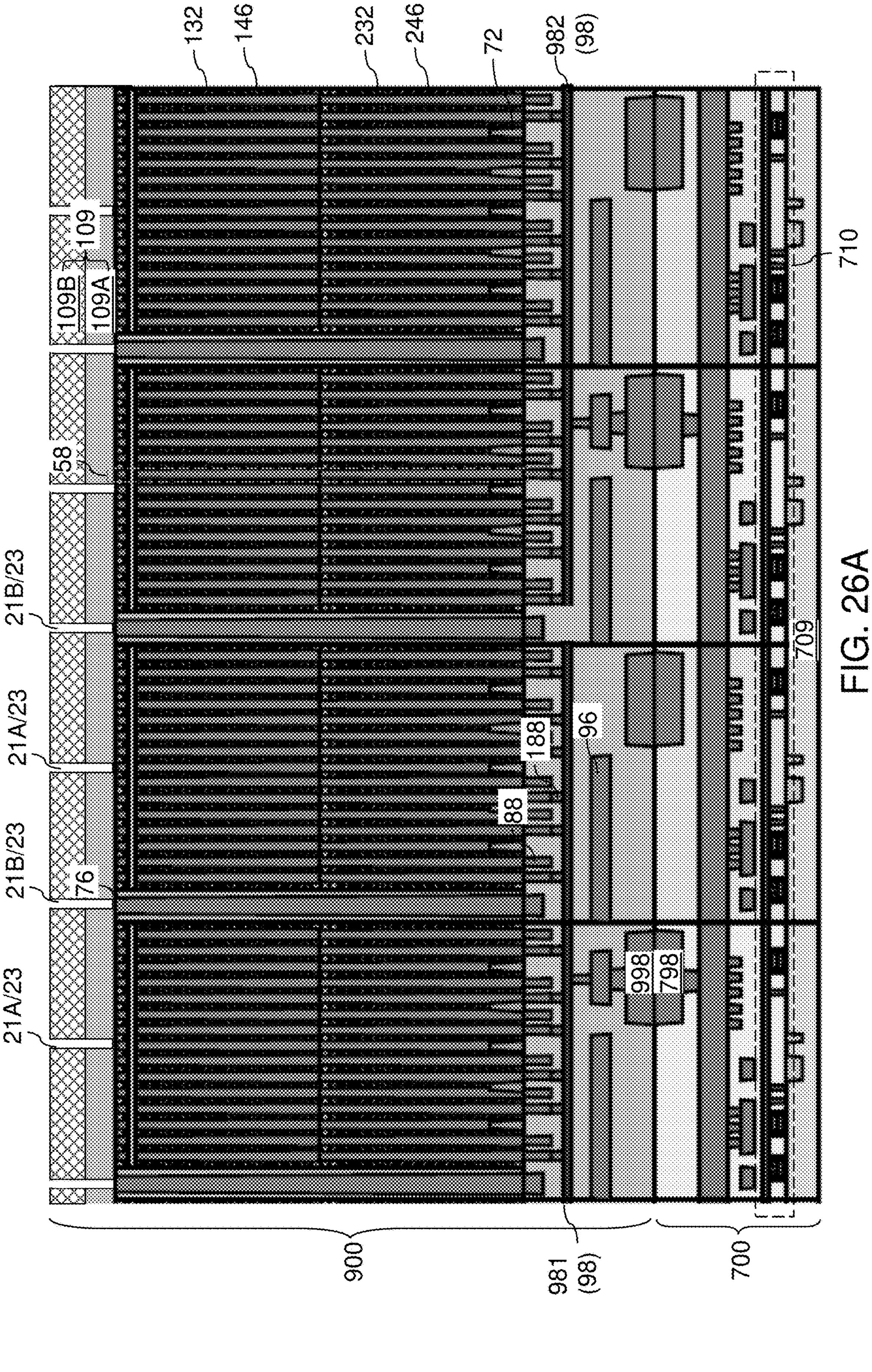
FIGS. 26A and 26B are vertical cross-sectional views of the second exemplary structure after formation of source layers according to a second embodiment of the present disclosure.
Figure 26B:
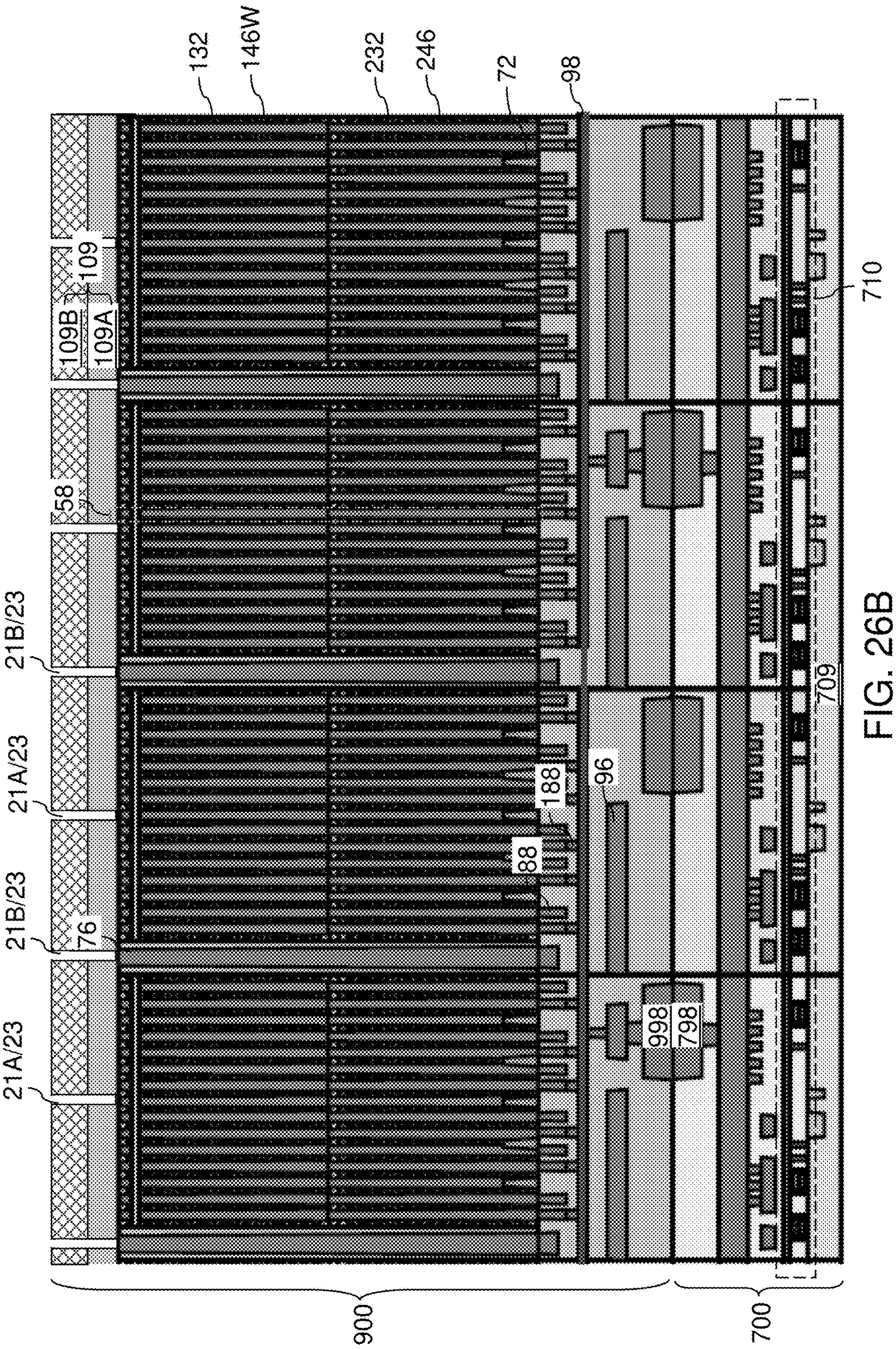

Referring to FIGS. 26A and 26B, source-side trenches 21 can be formed though the source-level material layer 109. Each of the source-side trenches 21 can laterally extend along the first horizontal direction (i.e., word line direction) hd1, and can laterally divide the source-level material layer 109 into a plurality of source structures, which are herein referred to as source lines 109. A first subset of the source-side trenches 21A extend to the proximal subset of the first electrically conductive layers 146 that proximal to the source layers 109. An optional second subset of the source-side trenches 21B vertically extends to the backside trench fill structures 76. A dielectric material may be deposited in the source-side trenches 21 and over the source layers 9 to form source-level dielectric isolation structures 23 located in the respective trenches 21. FIG. 26A illustrates the split bit line (981, 982) configuration of FIG. 16C, while FIG. 26B illustrates the continuous bit line 98 configuration of FIG. 16D.

Figure 27:
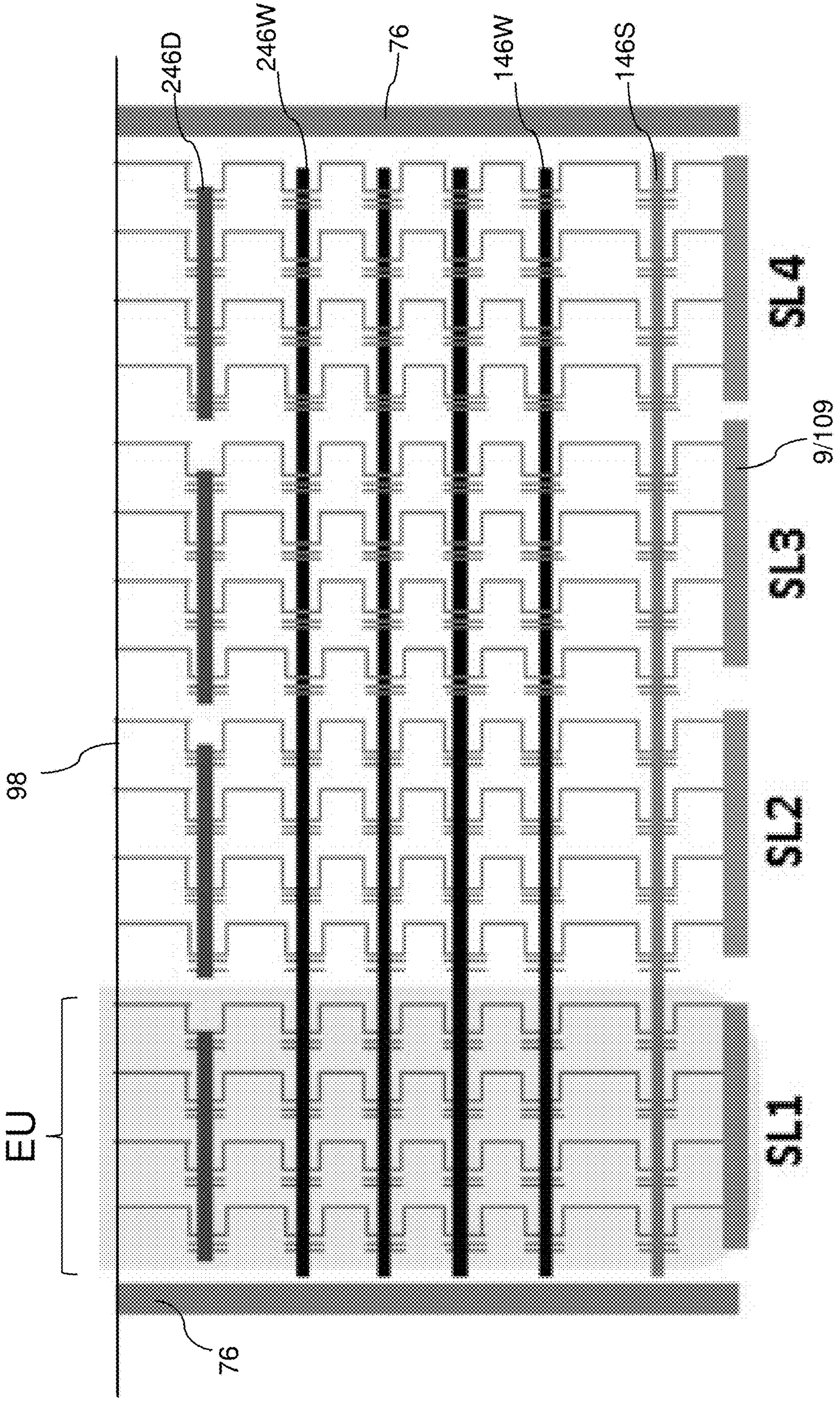
FIG. 27 is a circuit schematic of the second exemplary structure of FIGS. 26A and 26B.

Referring to FIG. 27, a circuit schematic of the second exemplary structure of FIGS. 26A and 26B is illustrated. FIG. 27 illustrates a 16 staggered row device for clarity, while FIGS. 26A and 26B illustrate the 24 staggered row device. The source lines (SL1, SL2, SL3, SL4) may comprise the source layers 109 illustrated in FIGS. 26A and 26B or the source layers 9 illustrated in FIG. 20A or 20B. By splitting a single source line into four source layers (e.g., source lines), a smaller erase unit EU having a smaller number of memory cells may be erased during an erase step (including a gate induced drain leakage (GIDL) erase step) during which the erase voltage is applied to a respective source line (e.g., SL1 in FIG. 27). Thus, the size of the functional memory block (i.e., erase unit EU) is reduced. This reduces the operational leakage current.

Referring collectively to the first exemplary structure and the second exemplary structure, a plurality of source layers (9 or 109) can be formed by patterning a source-level material layer. The plurality of source layers (9 or 109) are laterally spaced apart, and electrically isolated from each other, and each group of memory opening fill structures 58 can contact a respective one of the plurality of source layers (9 or 109). A plurality of source-side trenches 21 can be formed through the source-level material layer, wherein each neighboring pair of source layers of the plurality of source layers (9, 109) is laterally spaced from each other by a respective one of the plurality of source-side trenches 21.

Figure 28:
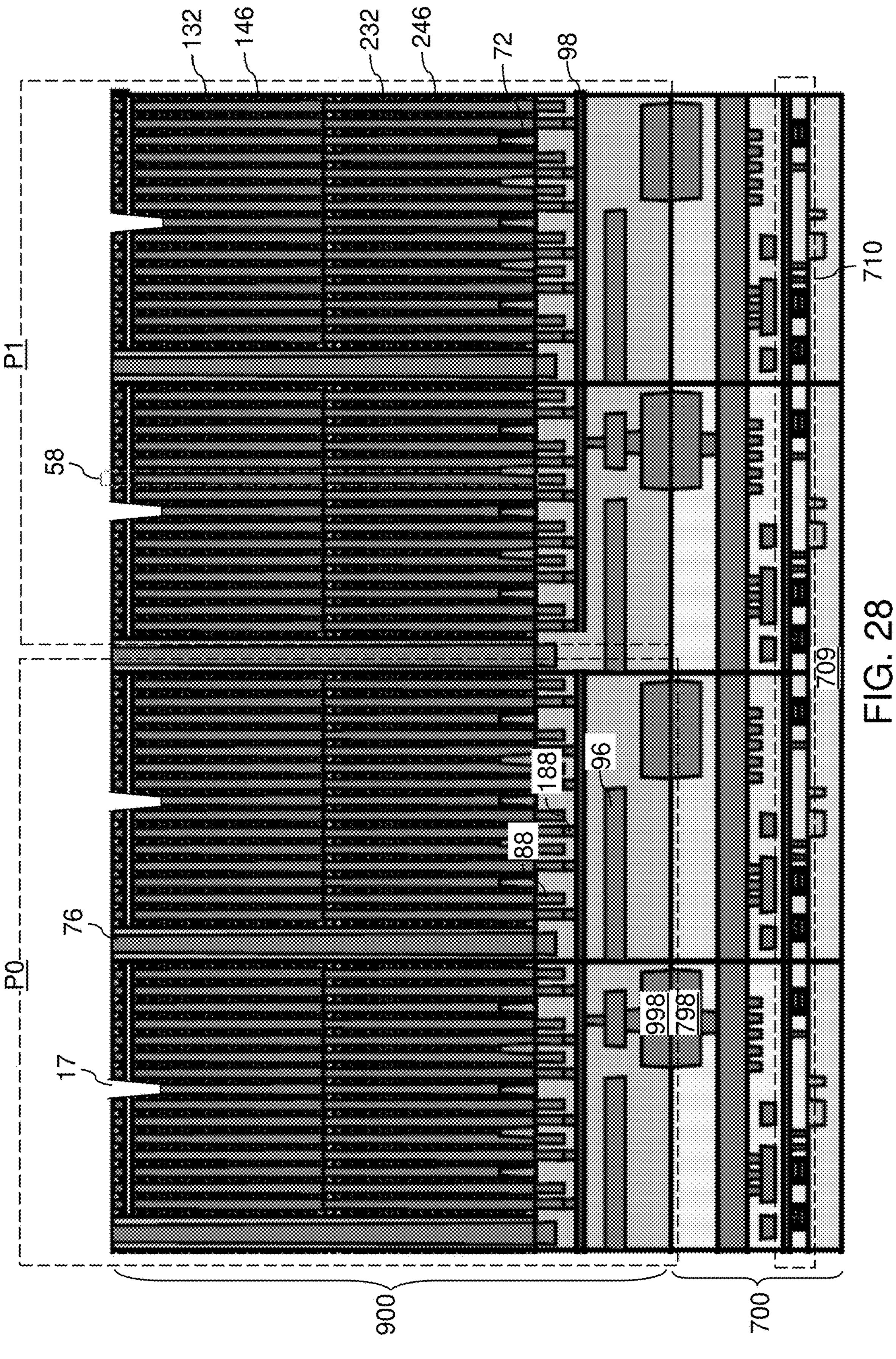
FIG. 28 is a vertical cross-sectional view of a third exemplary structure after formation of source-select-level trenches according to a third embodiment of the present disclosure.

Referring to FIG. 28, a third exemplary structure according to a third embodiment of the present disclosure is illustrated after removal of the substrate semiconductor layer 9 and after formation of source-select-level trenches 17. In this case, the source-select-level trenches 17 may be formed through the first subset of the electrically conductive layers (i.e., the source-side select gate electrodes) 146S after removal of the substrate 8 and prior to formation of the at least one conductive material layer that is subsequently employed to form source layers 109. Generally, a plurality of source-side select gate electrodes (i.e., source-select-level electrically conductive layers) 146S can be formed by forming the source-select-level trenches 17 through the plurality of source-side select gate electrodes 146S prior to, or after, formation of the source-level material layer. The source-select-level trenches 17 do not divide the word lines (146W, 246W) or the drain-side select gate electrodes 146D. The source-select-level trenches 17 are source-side trenches that vertically extend through the source-side select gate electrodes 146S, which are a subset of the electrically conductive layers (146, 246). The source-side select gate electrodes 146S can activate or deactivate a respective string group of vertical semiconductor channels 60 of NAND strings, thereby selecting or deselecting NAND string groups within the three-dimensional memory array. While a split bit line 98 configuration is shown in FIG. 28, it should be understood that the continuous bit line 98 configuration of FIG. 16D or 26B may be used instead.

Figure 29:
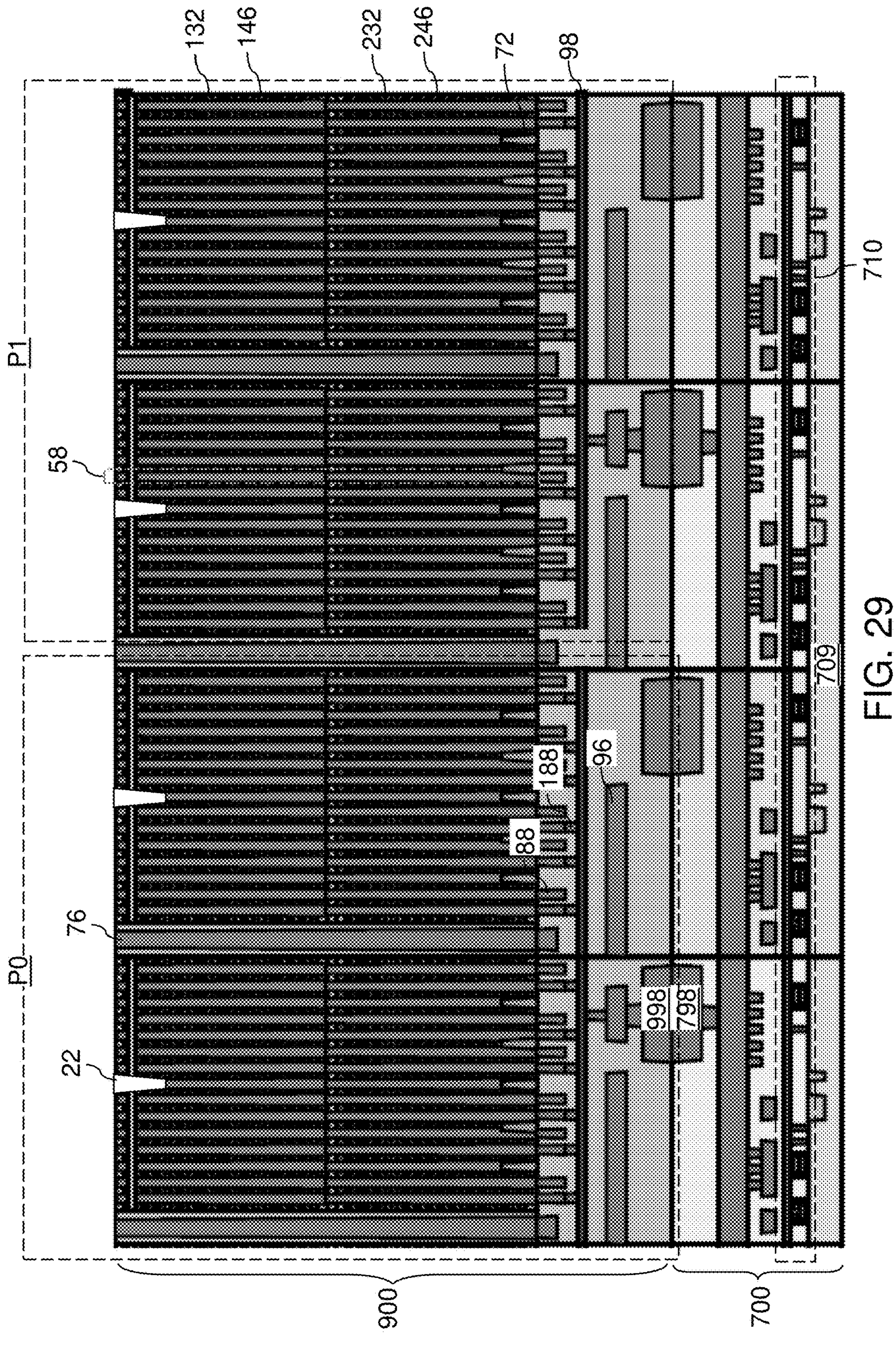
FIG. 29 is a vertical cross-sectional view of the third exemplary structure after formation of source-select-level dielectric isolation structures according to the third embodiment of the present disclosure.

Referring to FIG. 29, a dielectric material such as silicon oxide can be deposited in the source-select-level trenches 17. Excess portions of the dielectric material can be removed from above the horizontal plane including a topmost one of the insulating layers (such as a most proximal first-tier insulating layer 132) by a planarization process. Source-select-level dielectric isolation structures 22 comprising remaining portions of the dielectric material can be formed in the source-select-level trenches 17.

Figure 30:
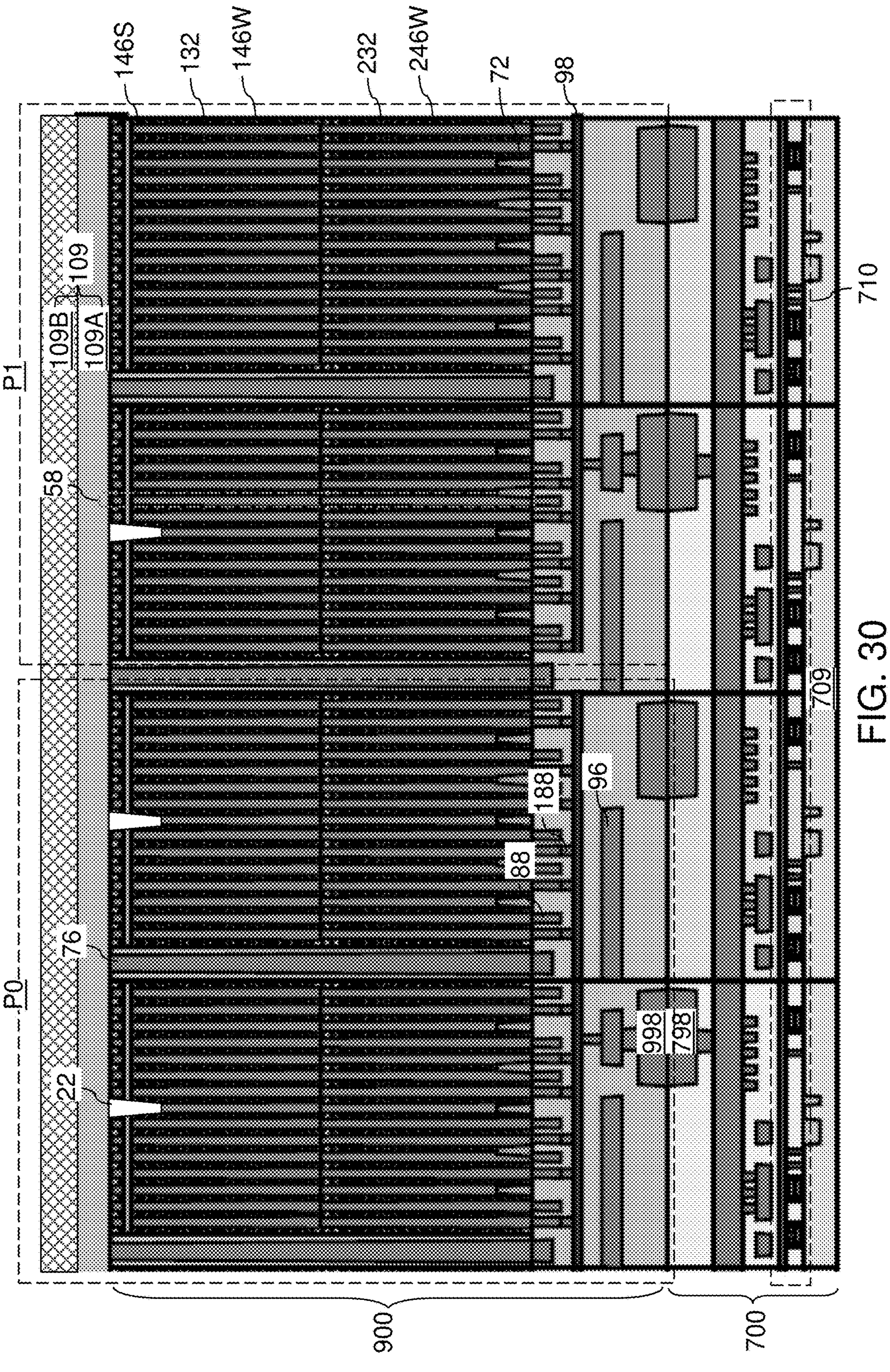
FIG. 30 is a vertical cross-sectional view of the third exemplary structure after formation of a source layer according to the third embodiment of the present disclosure.

Referring to FIG. 30, the processing steps of FIGS. 25A and 25B can be performed to form a source-level material layer 109 on the physically exposed end surfaces of the vertical semiconductor channels 60, which are herein referred to as proximal end surfaces. The source-level material layer 109 includes at least one electrically conductive material. In one embodiment, the source-level material layer 109 may include a vertical stack of a polycrystalline source semiconductor layer 109A having a doping of the second conductivity type and a metallic source layer 109B including a metallic material. Generally, the source-level material layer 109 can be formed by replacing the substrate 8 with at least one conductive material layer 109. In the third embodiment, the source-side trenches 21 of FIGS. 26A and 26B may be present or omitted.

Figure 31A:
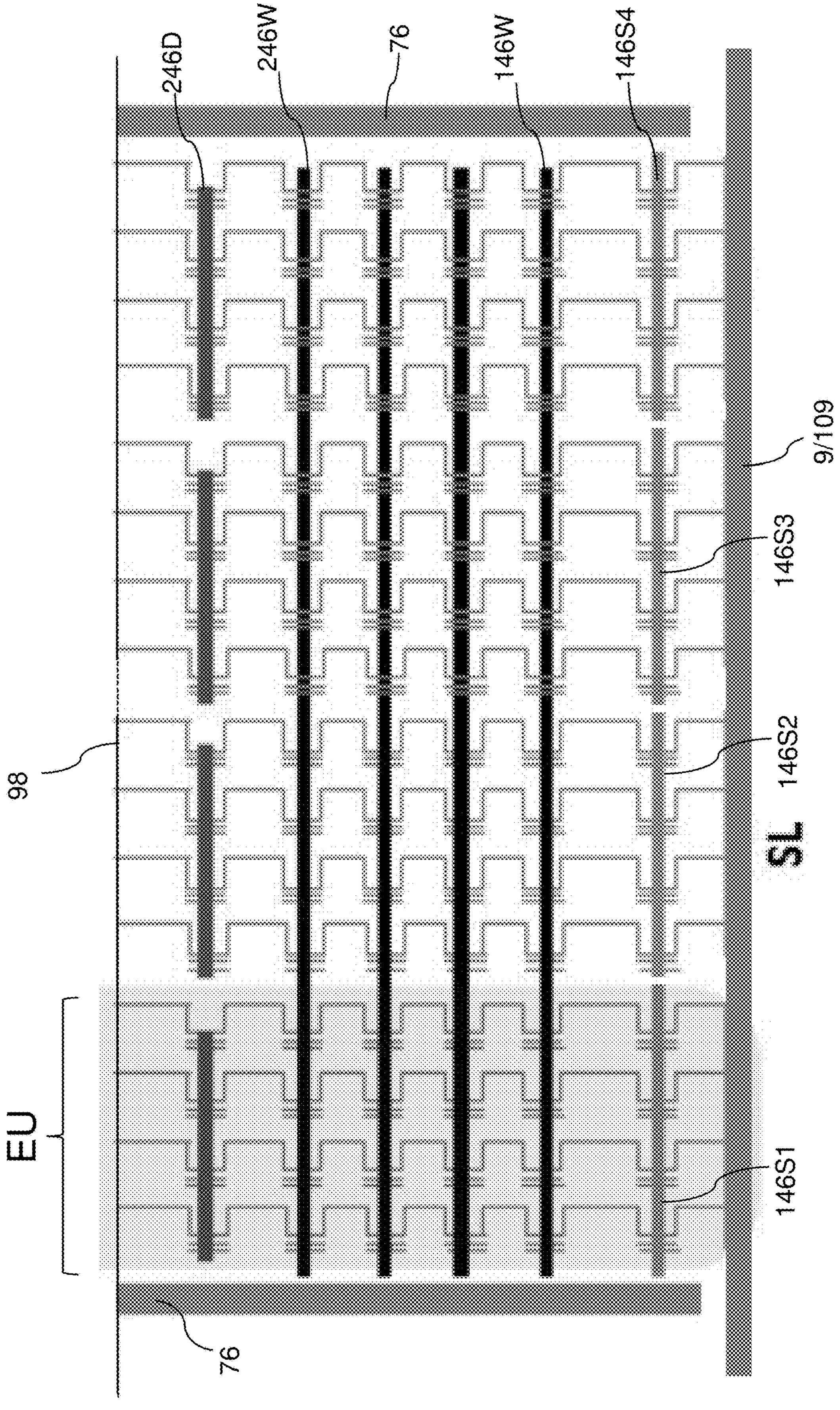
FIG. 31A is a circuit schematic of the third exemplary structure of FIG. 30.

Referring to FIG. 31A, a circuit schematic of the third exemplary structure of FIG. 30 is illustrated. Four split source-side select gate electrodes 146S1, 146S2, 146S3 and 146S4 are illustrated in FIG. 31A. However, there may be two, three or more than four split source-side select gate electrodes. The single source line SL may comprise the source layer 9 illustrated in FIG. 20A or 20B or the source layer 109 illustrated in FIG. 29. In this embodiment, a smaller erase unit EU having a smaller number of memory cells may be erased during an erase step during which the erase voltage is applied to the common source line SL. Thus, the size of the functional memory block (i.e., erase unit EU) is reduced. This reduces the operational leakage current.

Figure 31B:
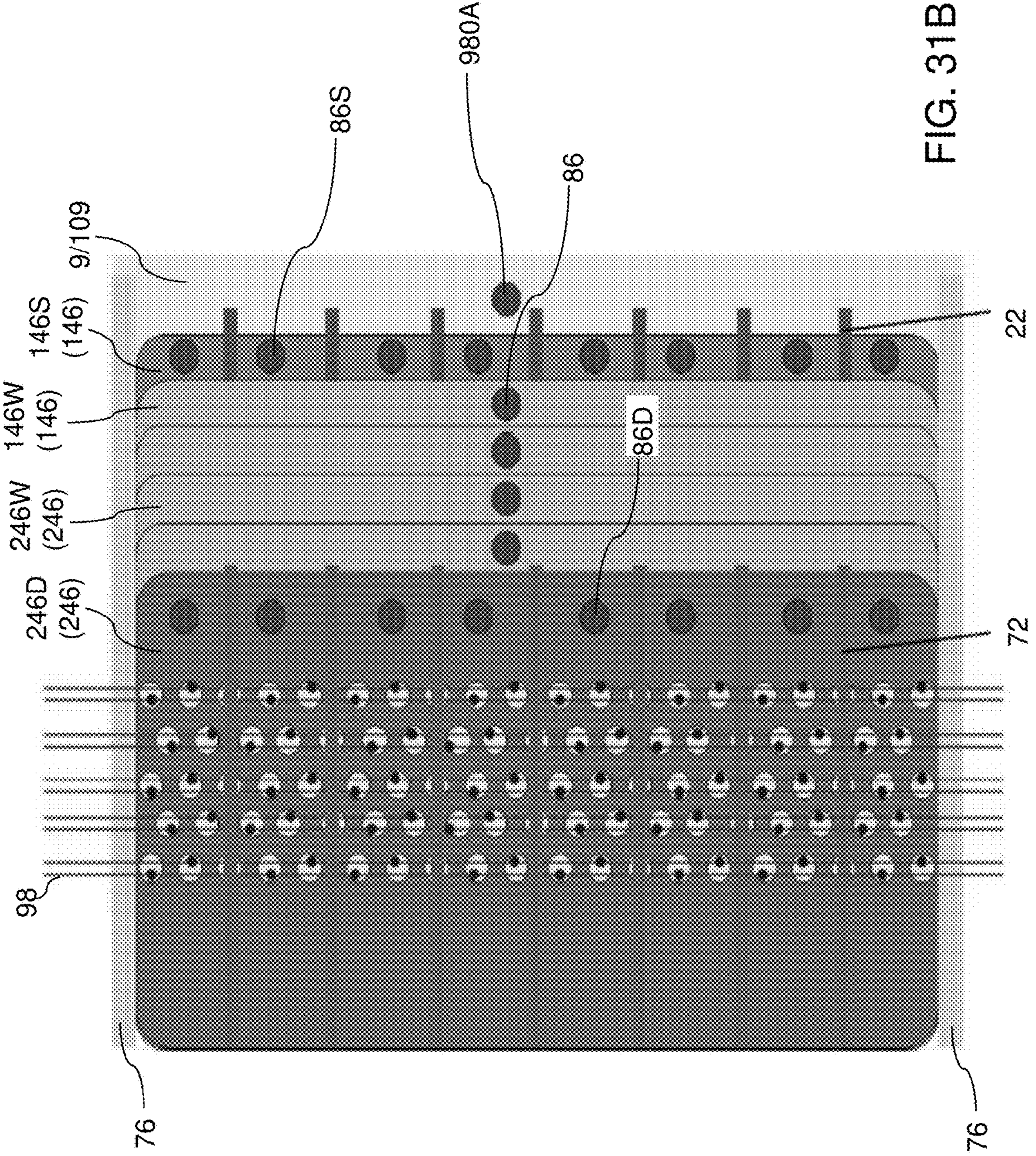
FIG. 31B is a schematic top view of the third exemplary structure.

Referring to FIG. 31B, a schematic top view diagram of the third exemplary structure is illustrated. A plurality of source-side select gate electrodes 146S that are located at a same vertical level are laterally spaced from each other by the source-select-level dielectric isolation structures 22 in the horizontal direction. The plurality of source-side select gate electrodes 146S are located between at least one source layer (9, 109) and the word lines (146W, 246W) in the vertical direction.

Figure 32:
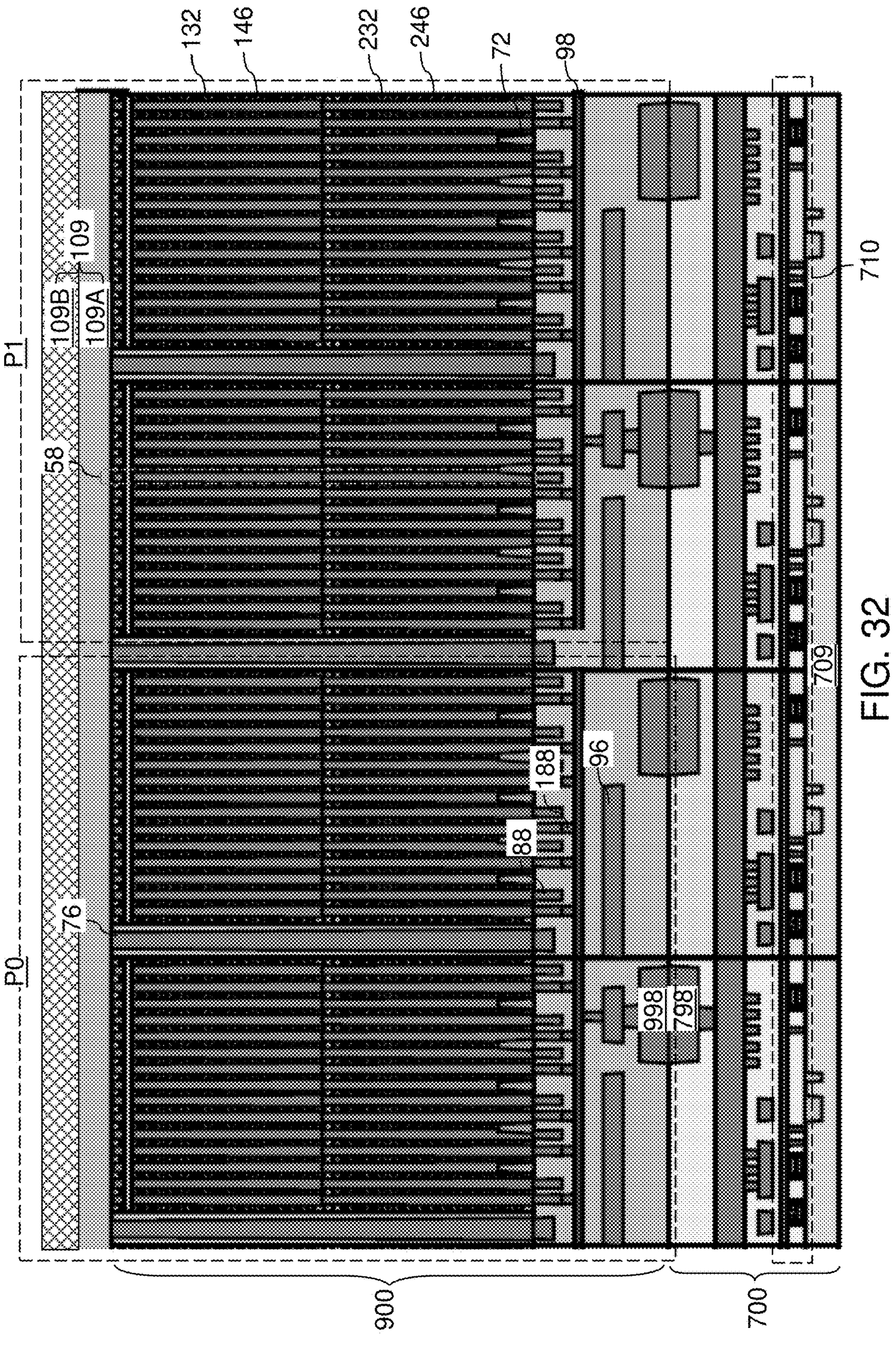
FIG. 32 is a vertical cross-sectional view of a fourth exemplary structure after formation of a source layer according to a fourth embodiment of the present disclosure.

Referring to FIG. 32, a fourth exemplary structure according to a fourth embodiment of the present disclosure is illustrated, which can be the same as the second exemplary structure of FIGS. 25A and 25B. The structure may include the split bit lines (981, 982) of FIG. 16C or the continuous bit line 98 of FIG. 16D.

Figure 33:
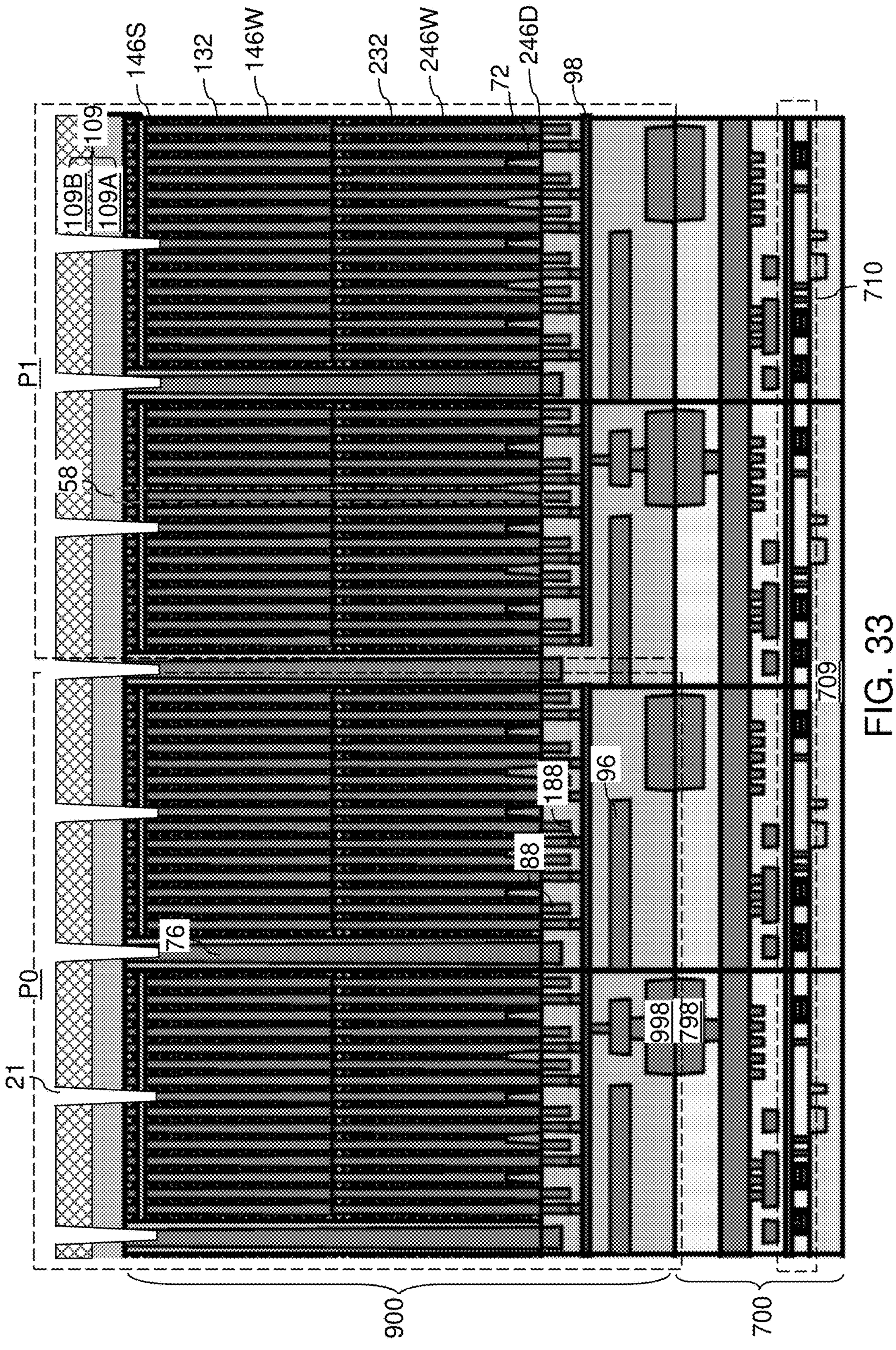
FIG. 33 is a vertical cross-sectional view of the fourth exemplary structure after formation of source-side trenches according to the fourth embodiment of the present disclosure.

Referring to FIG. 33, source-side trenches 21 can be formed through the source-level material layer 109 and through a first subset of the electrically conductive layers (such as a proximal subset of the first-tier electrically conductive layers 146). The pattern of the source-side trenches 21 can be the same as the pattern of the source-side trenches in the exemplary structure illustrated in FIGS. 26A and 26B. A plurality of source layers 109 are formed by patterning the source-level material layer 109. The plurality of source layers 109 can be laterally spaced apart, and can be electrically isolated from each other. Each string group of memory opening fill structures 58 contacts a respective one of the plurality of source layers 109.

Each patterned first-tier electrically conductive layer 146 within the first subset of the electrically conductive layers (146, 246) can be divided into a plurality of source-side select gate electrodes 146S by forming source-side trenches 21. The source-side trenches do not divide the word lines (146W, 246W) or the drain-side select gate electrodes 246D. A dielectric material may be deposited in the source-side trenches 21 and over the source layers 109 to form source-level dielectric isolation structures 23 located in the respective trenches 21.

A first subset of the source-side trenches 21 extends into a respective one of the backside trench fill structures 76. A second subset of the source-side trenches 21 extends into and divides a proximal subset of one or more electrically conductive layers 146 into a respective plurality of source-side select gate electrodes 146S.

Figure 34:
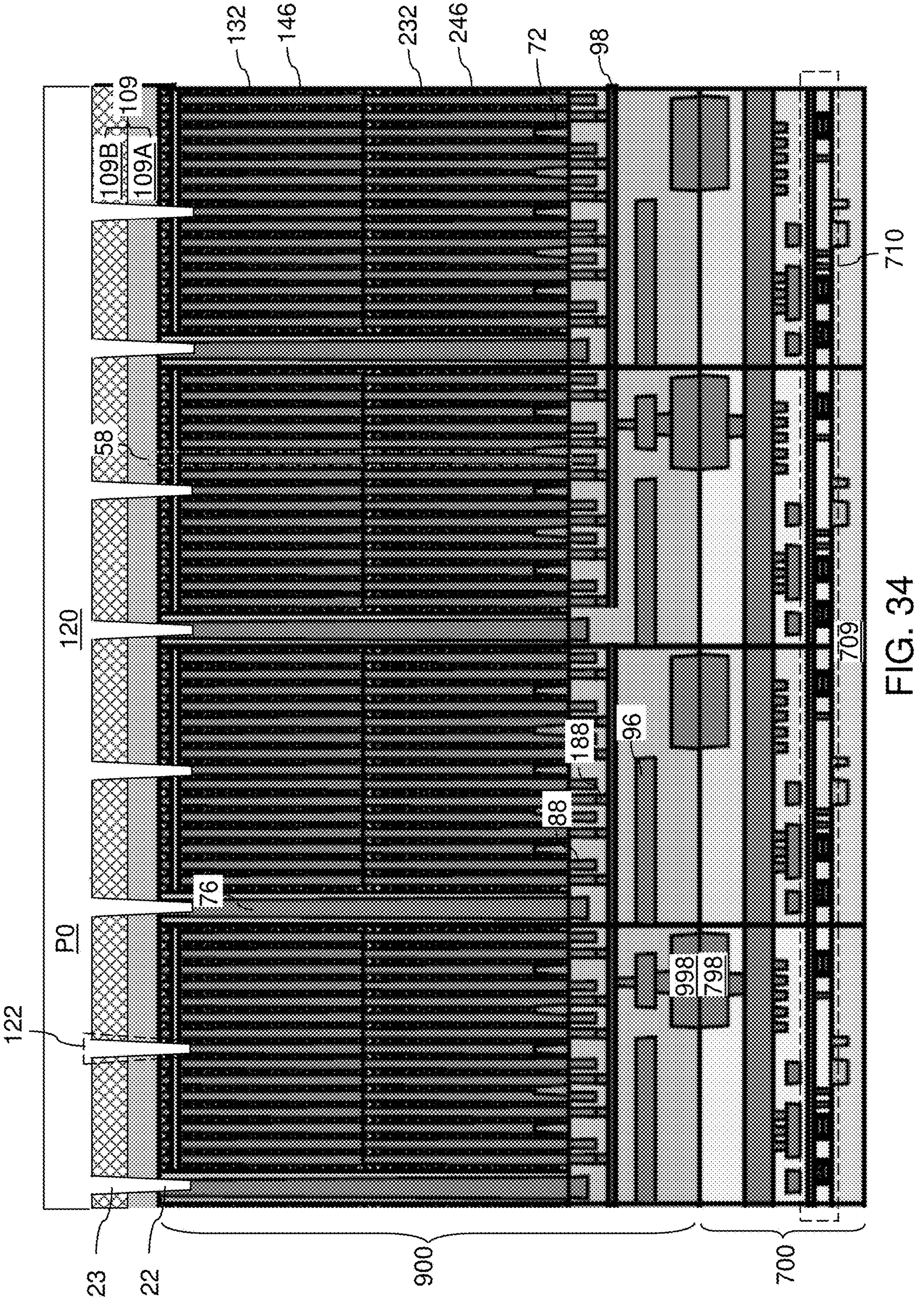
FIG. 34 is a vertical cross-sectional view of a first alternative configuration of the fourth exemplary structure after formation of a source-level dielectric isolation layer according to the fourth embodiment of the present disclosure.

Referring to FIG. 34, a first alternative configuration of the fourth exemplary structure according to the fourth embodiment of the present disclosure is illustrated. The first alternative configuration of the fourth exemplary structure can be derived from the fourth exemplary structure of FIG. 33 by depositing a dielectric material in the source-side trenches 21 and over the source layers 109 to form a source-level dielectric isolation layer 122, such that each portion of layer 122 that protrudes downward into the respective trench 21 comprises a combination of the source-level isolation structure 23 and the source-select-level isolation structure 22.

Figure 35:
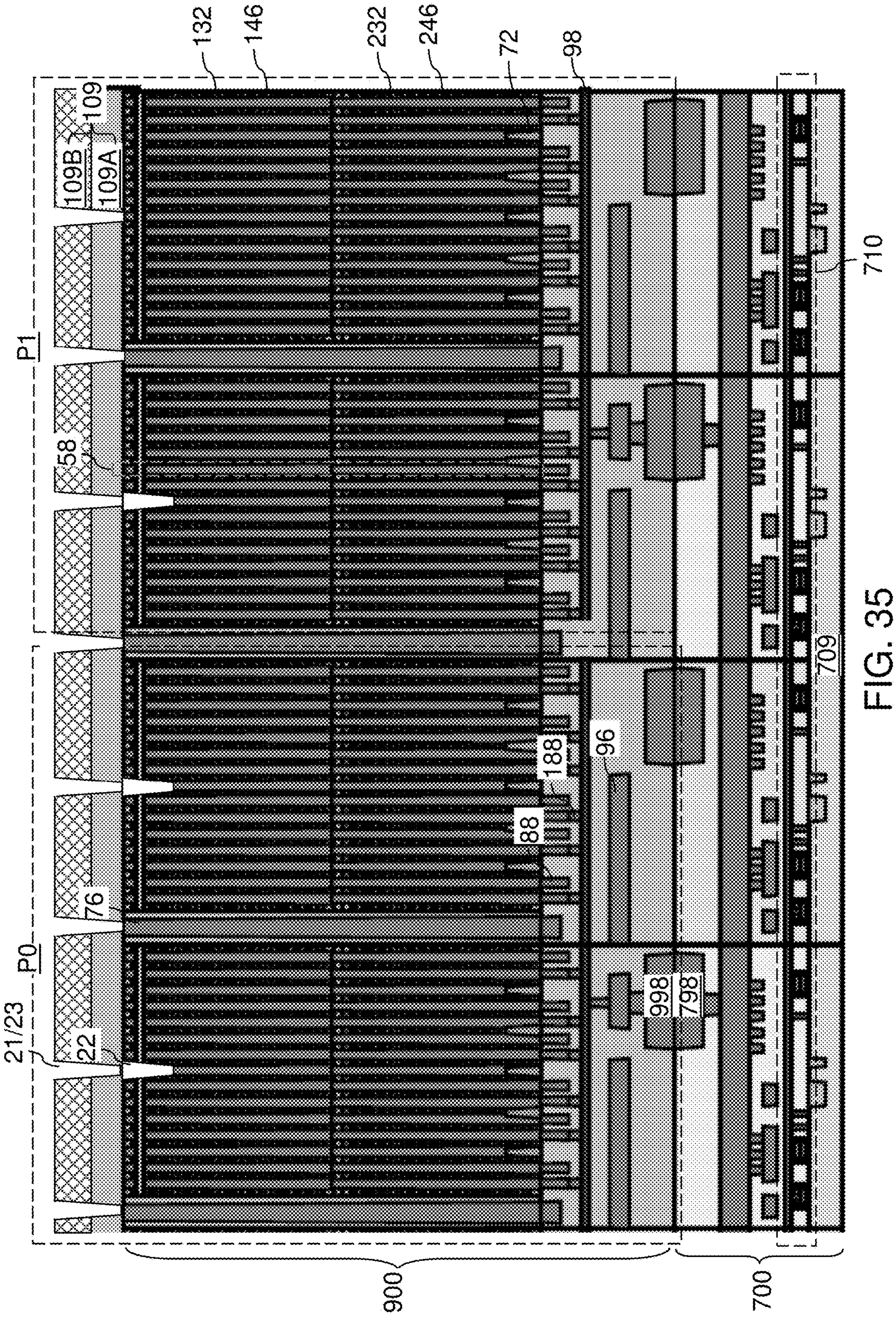
FIG. 35 is a vertical cross-sectional view of a second alternative configuration of the fourth exemplary structure after formation of a source-level dielectric isolation layer according to the fourth embodiment of the present disclosure.

Referring to FIG. 35, a second alternative configuration of the fourth exemplary structure according to the fourth embodiment of the present disclosure can be derived from the third exemplary structure of FIG. 30 by dividing the source-level material layer 109 and dividing the source-side select gate layer 146S in separate steps. For example, the source-select-level dielectric isolation structures 22 are formed in the source-side select gate layer 146S first as shown in FIG. 29. The source-level material layer 109 is then deposited over the source-select-level dielectric isolation structures 22 and the source-side select gate layer 146S, followed by forming the source-side trenches 21 in the source-level material layer 109 to divide layer 109 into the plurality of source layers 109, using the method shown in FIGS. 26A and 26B. A dielectric material may be deposited in the source-side trenches 21 and over the source layers 9 to form source-level dielectric isolation structures 23 located in the respective trenches 21.

Figure 36:
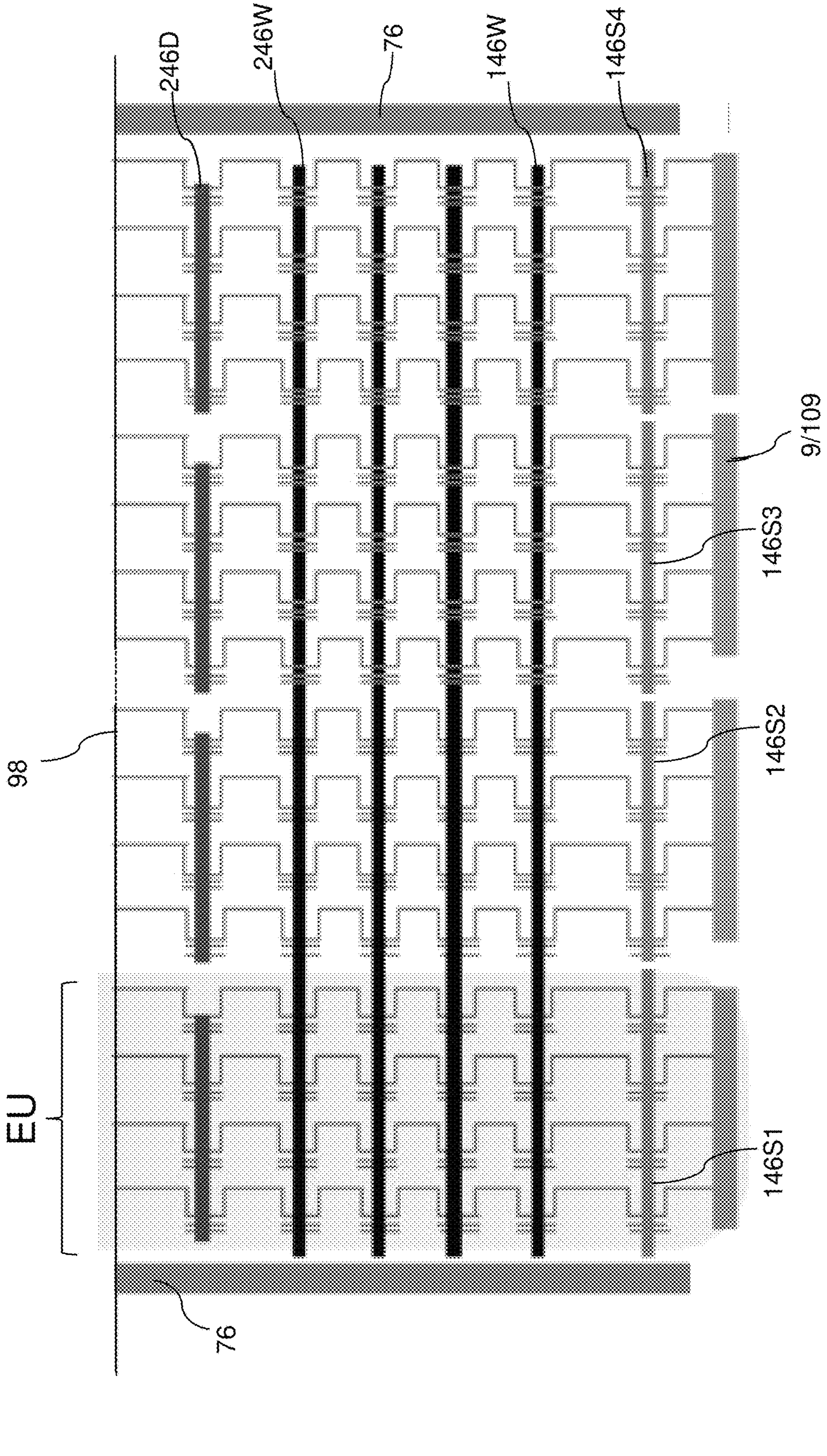
FIG. 36 is a circuit schematic of various configurations of the fourth exemplary structure of FIG. 35.

Referring to FIG. 36, a circuit schematic of various configurations of the fourth exemplary structure of FIGS. 32-35 is illustrated. A plurality of split source lines (SL1, SL2, SL3, SL4) and a plurality of split source-side select gate electrodes (146S1, 146S2, 146S3, 146S4) can be formed between a pair of backside trench fill structures 76. Each block of vertical NAND strings can be activated or deactivated by a source layer (9, 109), by a source-side select gate electrode 146S, or by a combination of a source layer and a source-side select gate electrode 146S.

Figure 37:
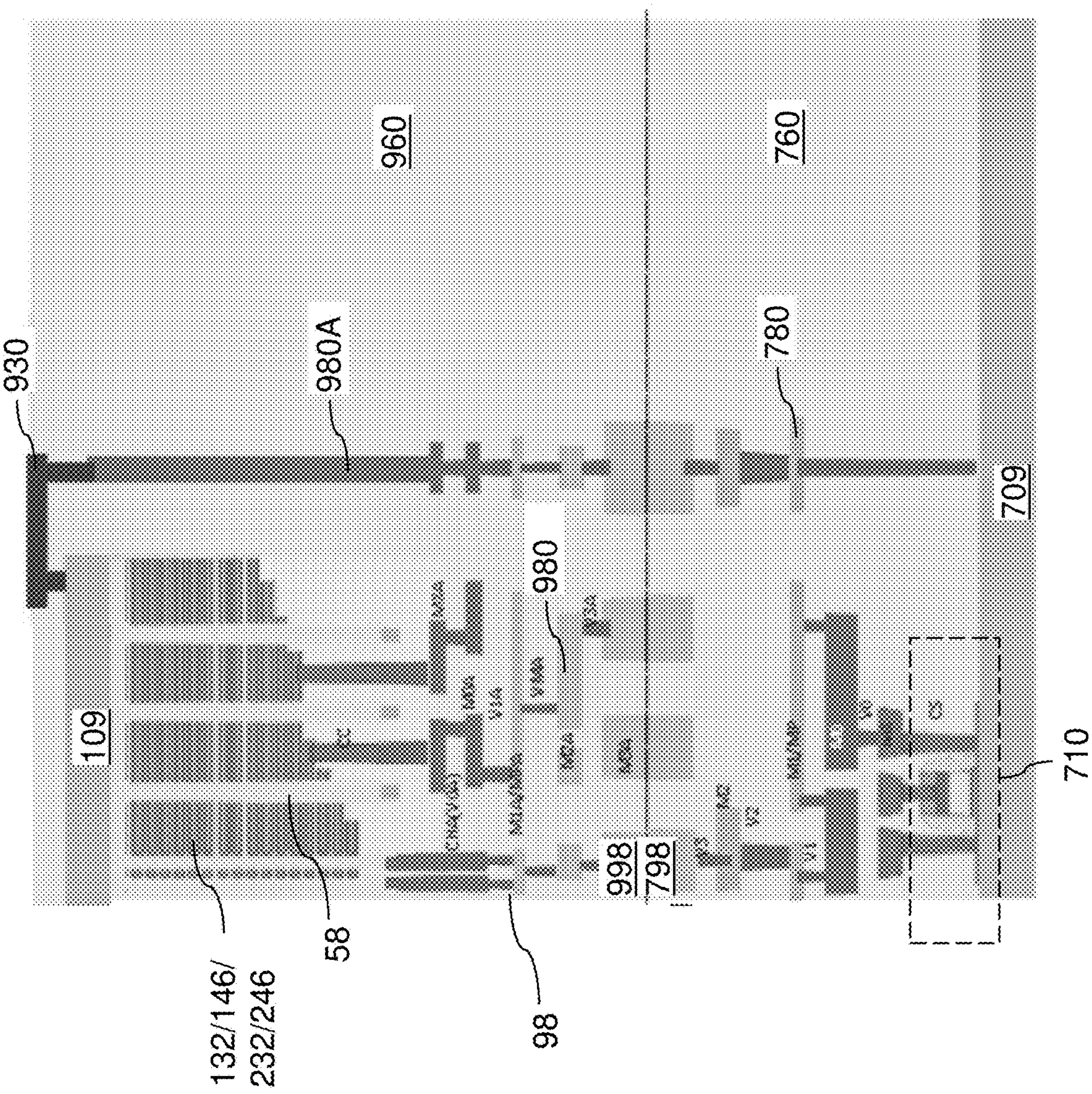
FIG. 37 is a vertical cross-sectional view of an exemplary structure for providing electrical connections to a source layer according to an embodiment of the present disclosure.

Referring to FIG. 37, an exemplary structure for providing electrical connections to a source layer (9 or 109) is illustrated according to an embodiment of the present disclosure. Specifically, backside metal interconnect structures 930, such as an aluminum strap, can be employed to provide electrical connection between metal interconnect structures 980A (that are a subset of structures 980 described above) and each source layer (9 or 109). A subset of the backside metal interconnect structures 930 can contact a backside surface of a respective one of the source layers (9 or 109).

Figure 38:
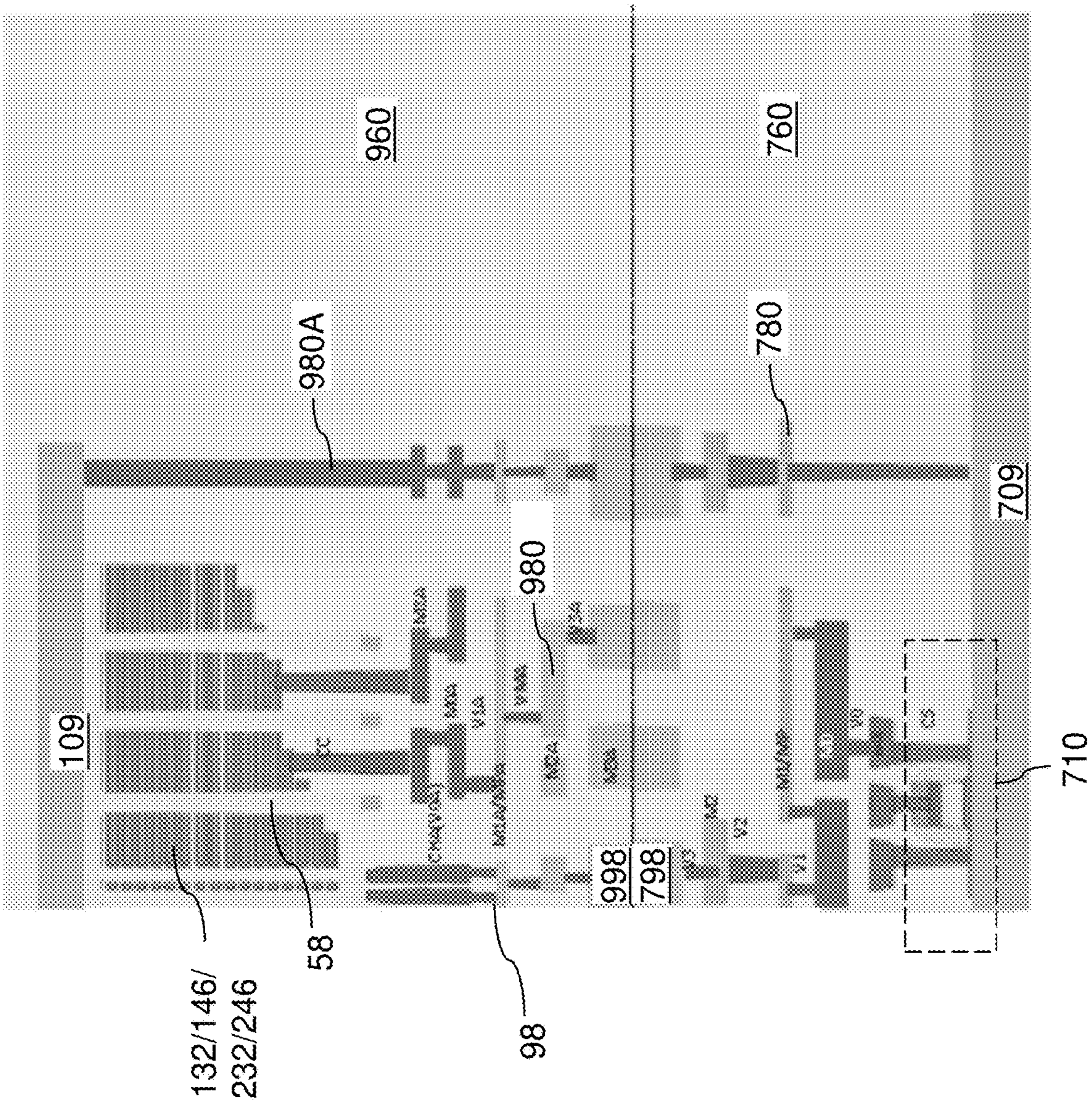
FIG. 38 is a vertical cross-sectional view of another exemplary structure for providing electrical connections to a source layer according to an embodiment of the present disclosure.

Referring to FIG. 38, another exemplary structure for providing electrical connections to a source layer (9 or 109) is illustrated according to an embodiment of the present disclosure. In this case, metal interconnect structures 980A may contact a front-side surface of a respective one of the source layers (9 or 109).

Figure 39A:
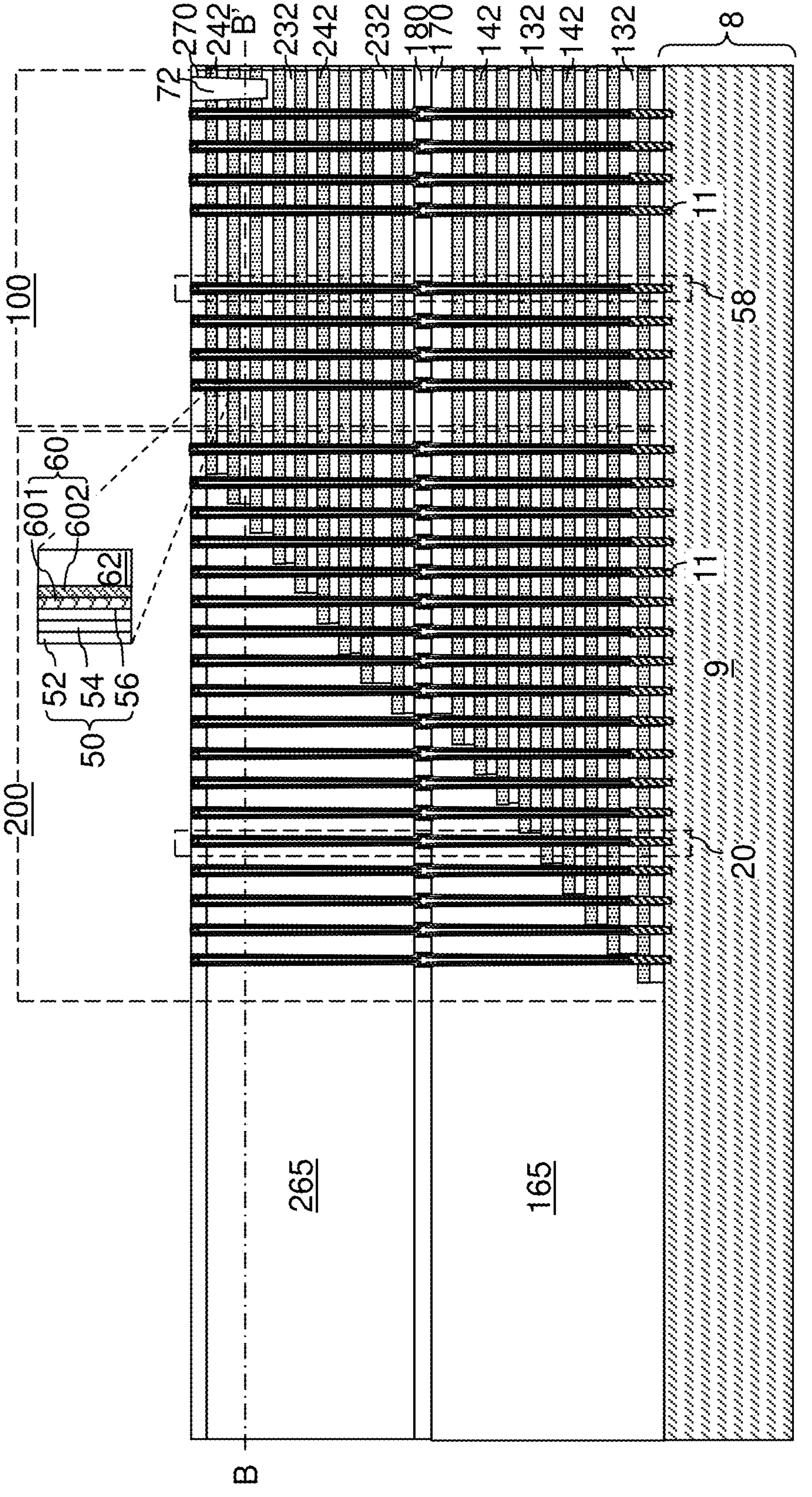
FIG. 39A is a vertical cross-sectional view of a fifth exemplary structure after formation of memory opening fill structures according to a fifth embodiment of the present disclosure.
Figure 39B:
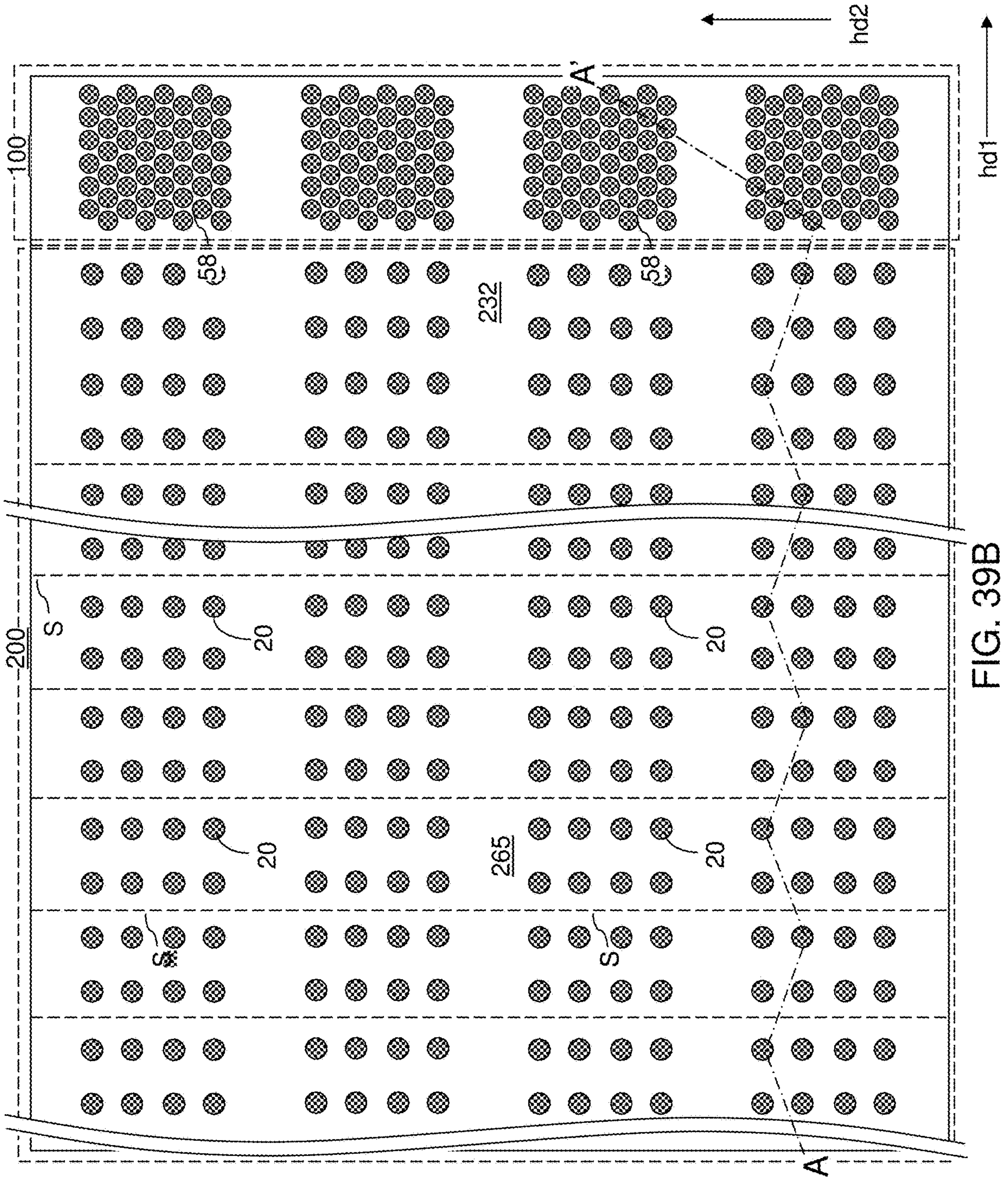
FIG. 39B is a horizontal cross-sectional view of the fifth exemplary structure along the horizontal plane B-B' of FIG. 39B.

Referring to FIGS. 39A and 39B, a fifth exemplary structure according to a fifth embodiment of the present disclosure can be derived from the first exemplary structure of FIGS. 10A and 10B by modifying the pattern of the memory opening fill structures 58. Specifically, the memory openings 49 and the memory opening fill structures 58 can be formed on-pitch so that all memory opening fill structures 58 remain active after formation of drain-select-level dielectric isolation structures 72. In contrast, in the first exemplary structure of FIGS. 10A and 10B, each fifth row of memory opening fill structures 58 acts as a dummy memory opening fill structure 58 because it is cut in half by the respective drain-select-level dielectric isolation structure 72.

Figure 40A:
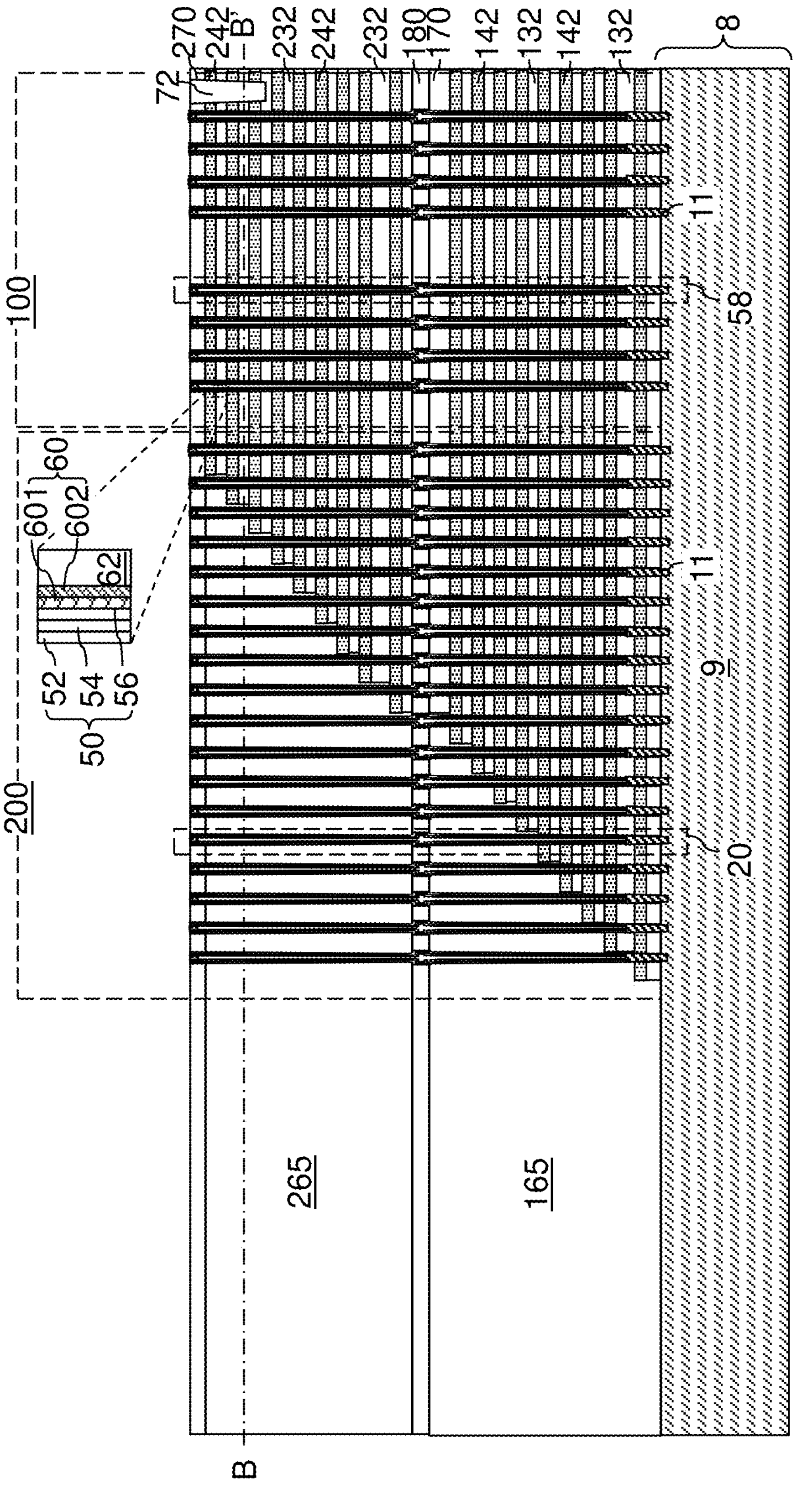
FIG. 40A is a vertical cross-sectional view of the fifth exemplary structure after formation of drain-select-level dielectric isolation structures according to the fifth embodiment of the present disclosure.
Figure 40B:
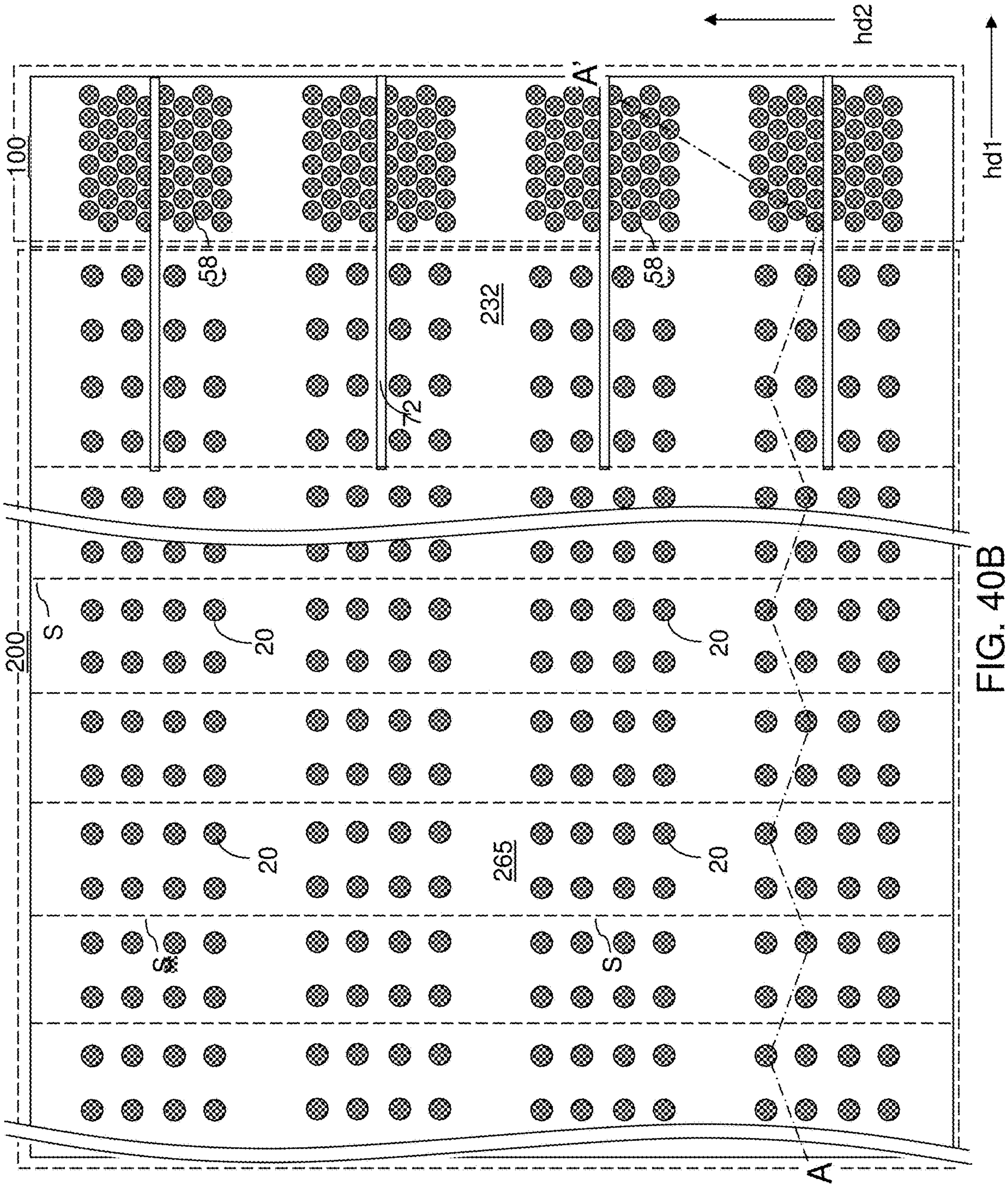
FIG. 40B is a horizontal cross-sectional view of the fifth exemplary structure along the horizontal plane B-B' of FIG. 40A.

Referring to FIGS. 40A and 40B, drain-select-level dielectric isolation structures 72 can be formed through a distal subset of the second-tier sacrificial material layers 242 that are distal from the substrate semiconductor layer 9. In this case, the drain-select-level dielectric isolation structures 72 can be formed between a pair of rows of memory openings fill structures 58, and can cut through edge portions each memory opening fill structures 58 within the pair of rows of memory opening fill structures 58. Each drain-select-level dielectric isolation structure 72 can laterally extend along the first horizontal direction hd1.

Figure 41:
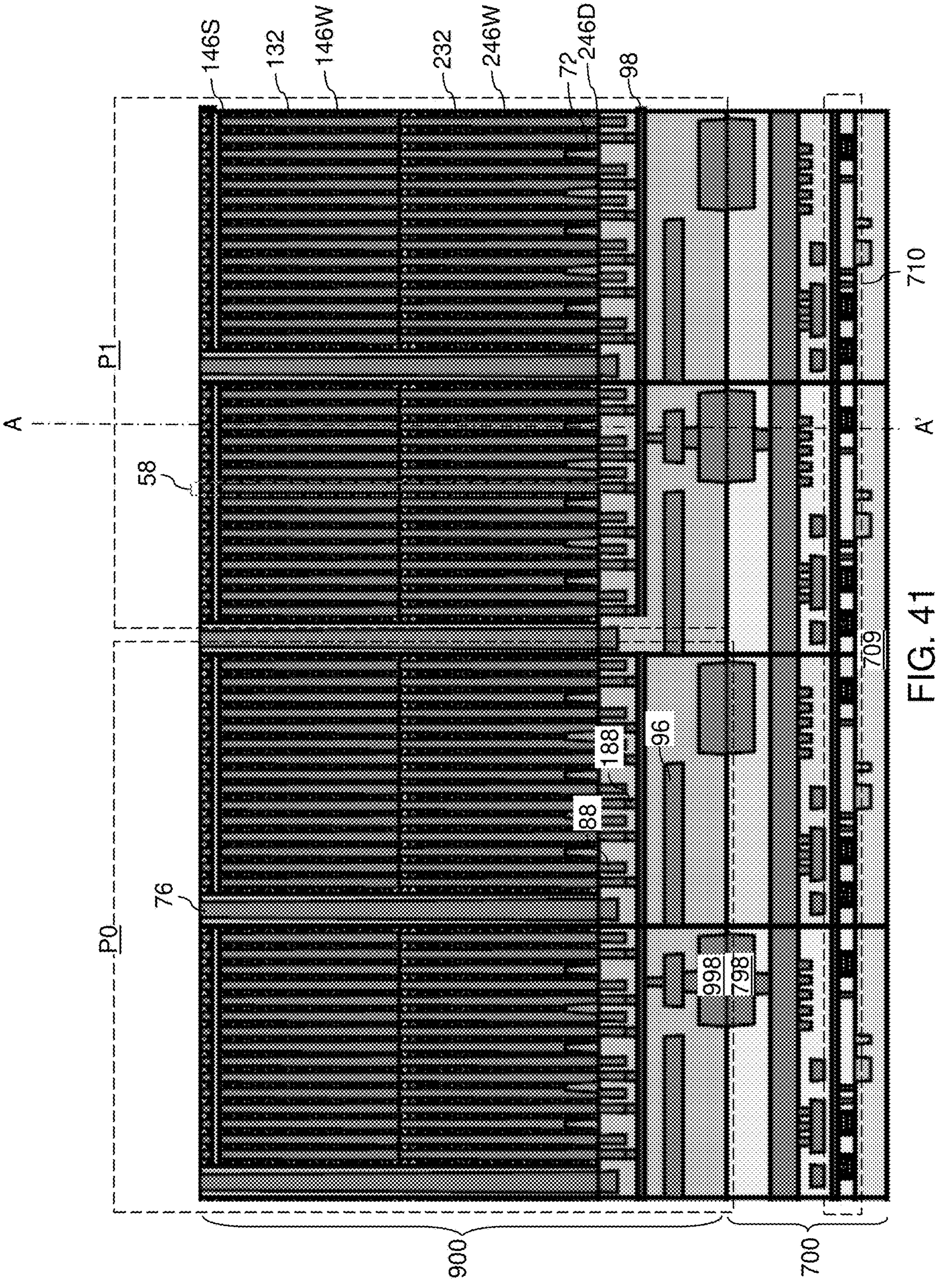
FIG. 41 is a vertical cross-sectional view of the fifth exemplary structure after removal of the substrate according to the fifth embodiment of the present disclosure.
Figure 42:
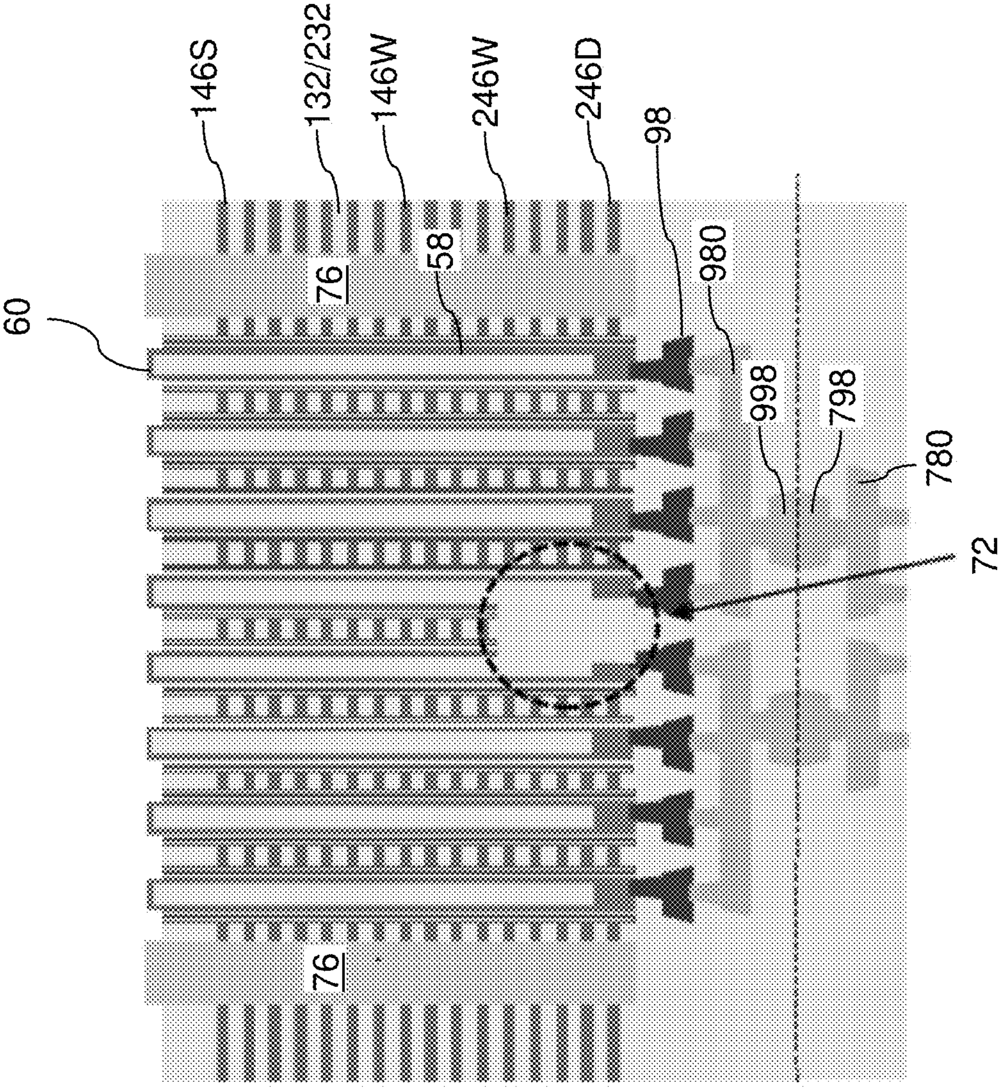
FIG. 42 is a vertical cross-sectional view of a region of the fifth exemplary structure of FIG. 41 along the vertical plane A-A'.

Referring to FIGS. 41 and 42, the processing steps of FIGS. 11-19 and the processing steps of FIG. 23 can be performed. In one embodiment, the processing steps of FIGS. 22A-22D may be employed to form each of the memory opening fill structures 58. In this case, a sequence of isotropic etch processes may be employed to remove proximal end portions of the memory films 50, and to physically expose proximal end portions of the vertical semiconductor channels 60.

Figure 43:
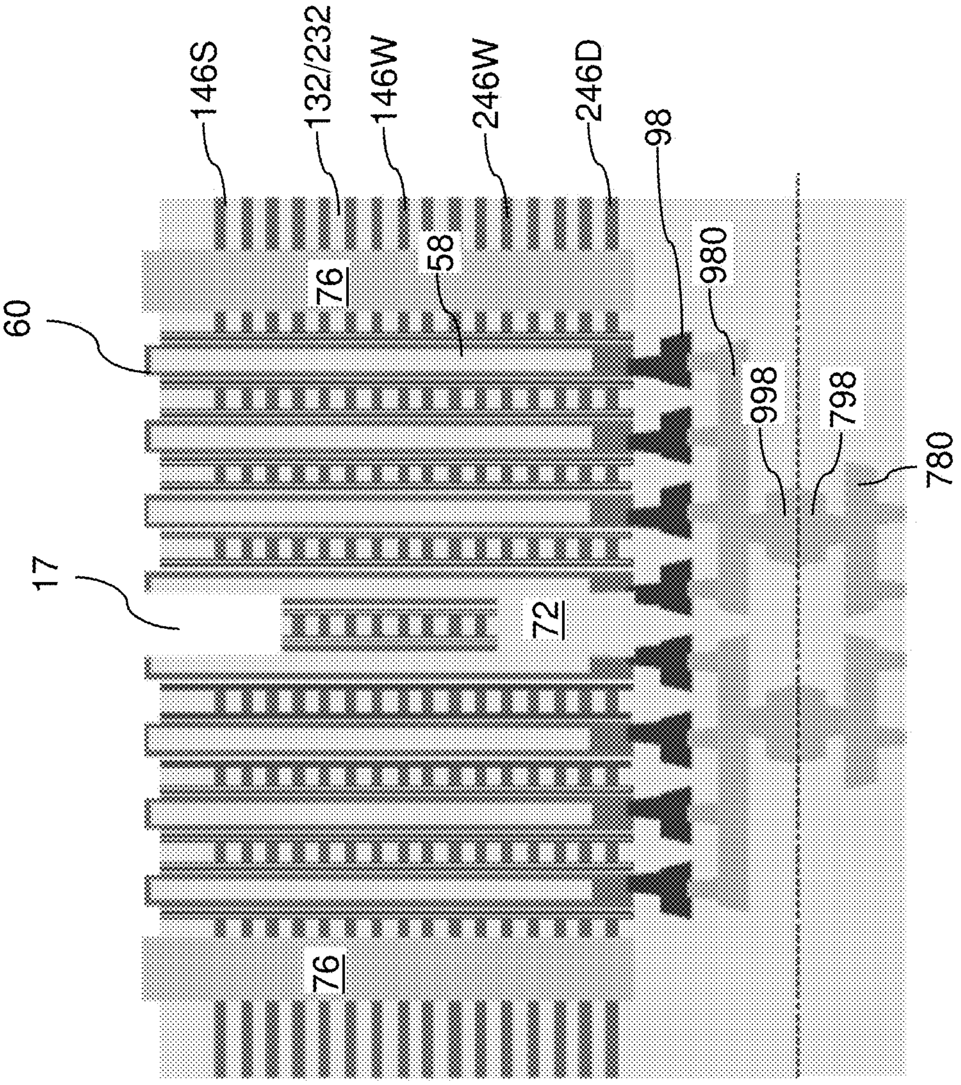
FIG. 43 is a vertical cross-sectional view of a region of the fifth exemplary structure after formation of source-select-level trenches according to the fifth embodiment of the present disclosure.

Referring to FIG. 43, a photoresist layer (not shown) can be applied over the physically exposed proximal surface of the alternating stacks {(132, 146), (232, 246)}, and can be lithographically patterned to form line-shaped openings within areas overlying the drain-select-level dielectric isolation structures 72. An anisotropic etch process can be performed to etch through a first subset of the electrically conductive layers (such as a proximal subset of the first-tier electrically conductive layers 146) to form source-side select gate electrodes 146S. Source-select-level trenches 17 can be formed through the first subset of the electrically conductive layers into the source-side select gate electrodes 146S.

Figure 44A:
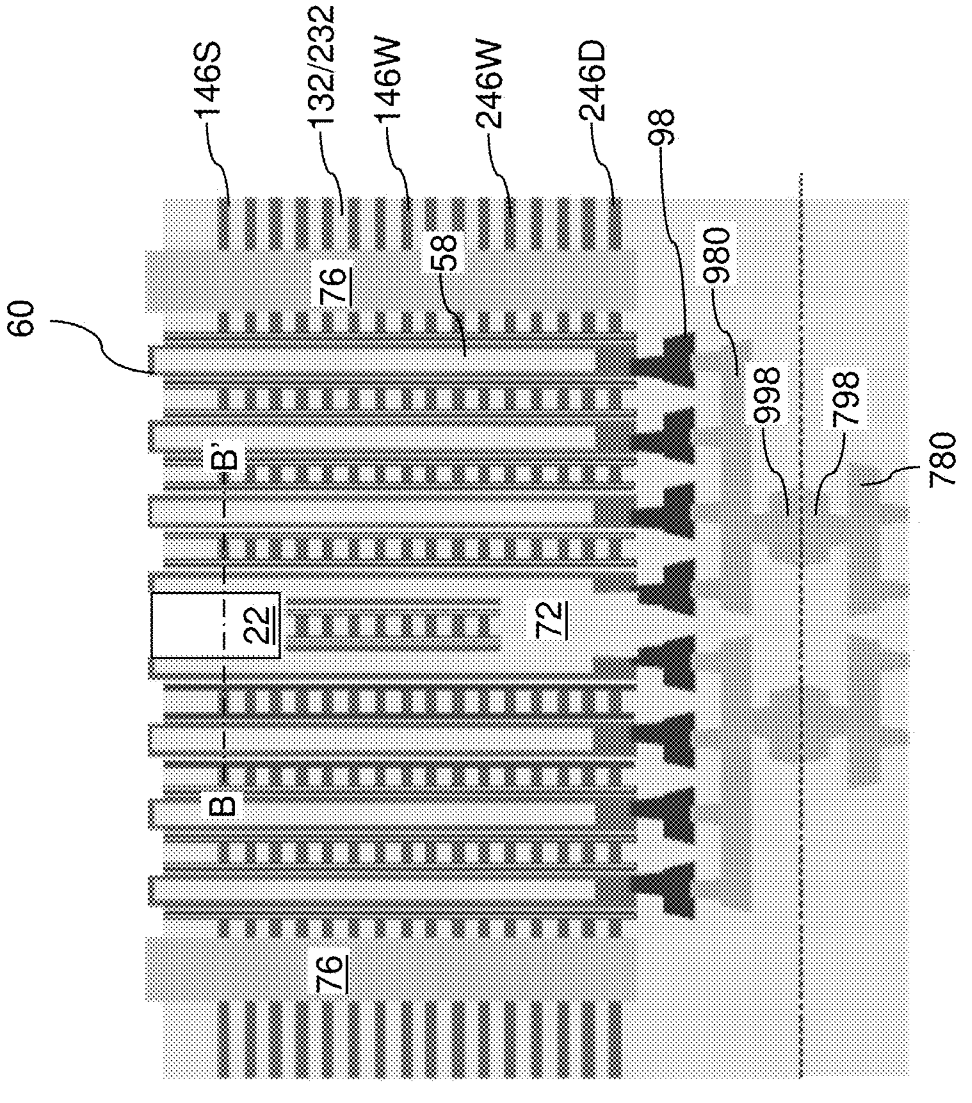
FIG. 44A is a vertical cross-sectional view of a region of the fifth exemplary structure after formation of source-select-level dielectric isolation structures according to the fifth embodiment of the present disclosure.
Figure 44B:
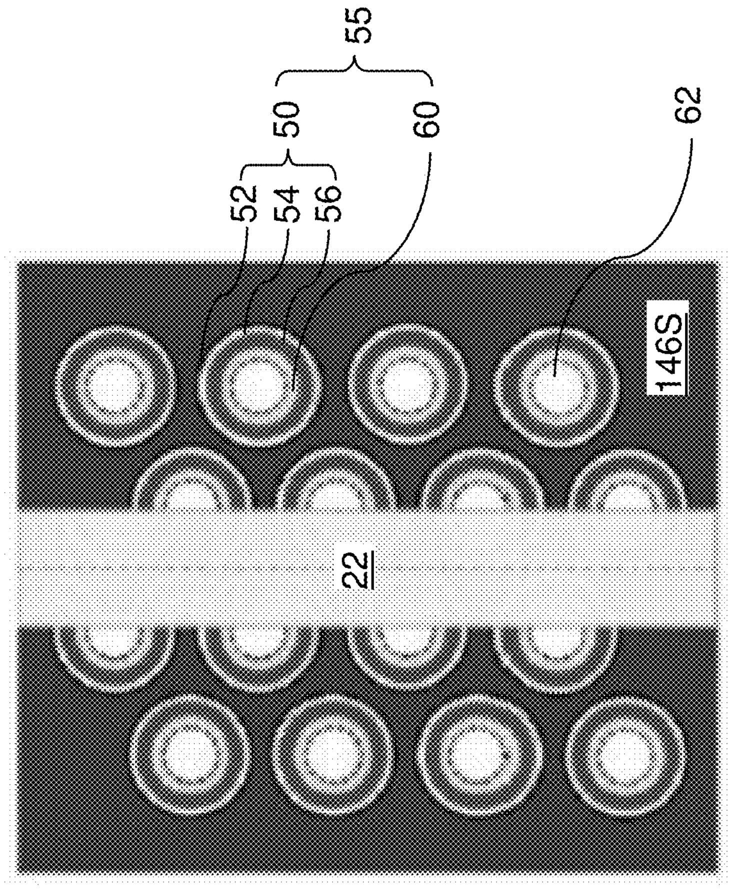
FIG. 44B is a horizontal cross-sectional view along the horizontal plane B-B' of the fifth exemplary structure of FIG. 44A.

Referring to FIGS. 44A and 44B, source-select-level dielectric isolation structures 22 can be formed in the source-select-level trenches 17 by depositing a dielectric material such as silicon oxide, and by removing excess portions of the dielectric material from above the alternating stack of insulating layers (132, 232) and electrically conductive layers (146, 246).

Figure 45:
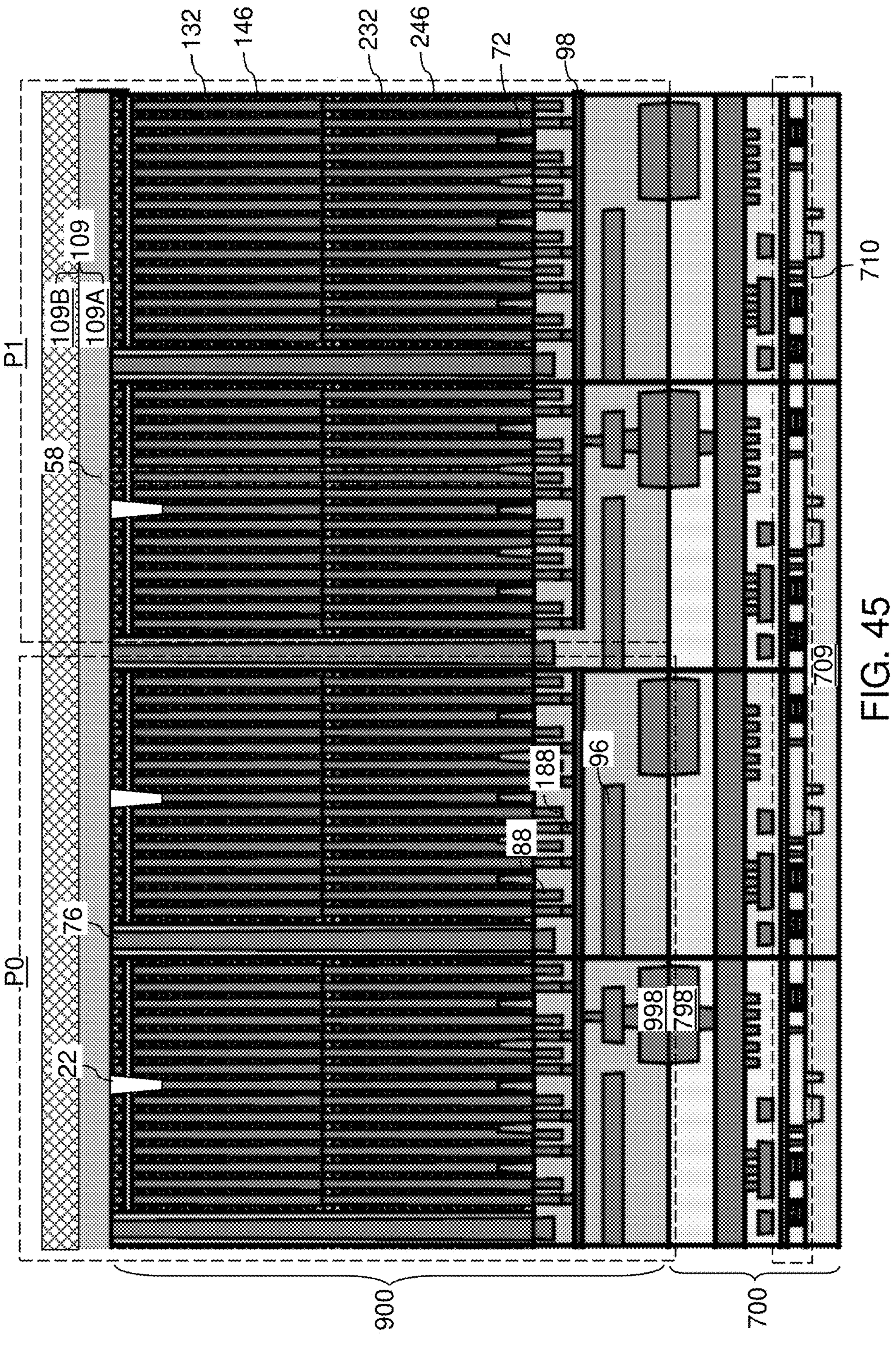
FIG. 45 is a vertical cross-sectional view of the fifth exemplary structure after formation of a source layer according to the fifth embodiment of the present disclosure.

Referring to FIG. 45, the processing steps of FIG. 32 can be performed to form a source-level material layer 109, which can function as a single source layer 109.

Figure 46:
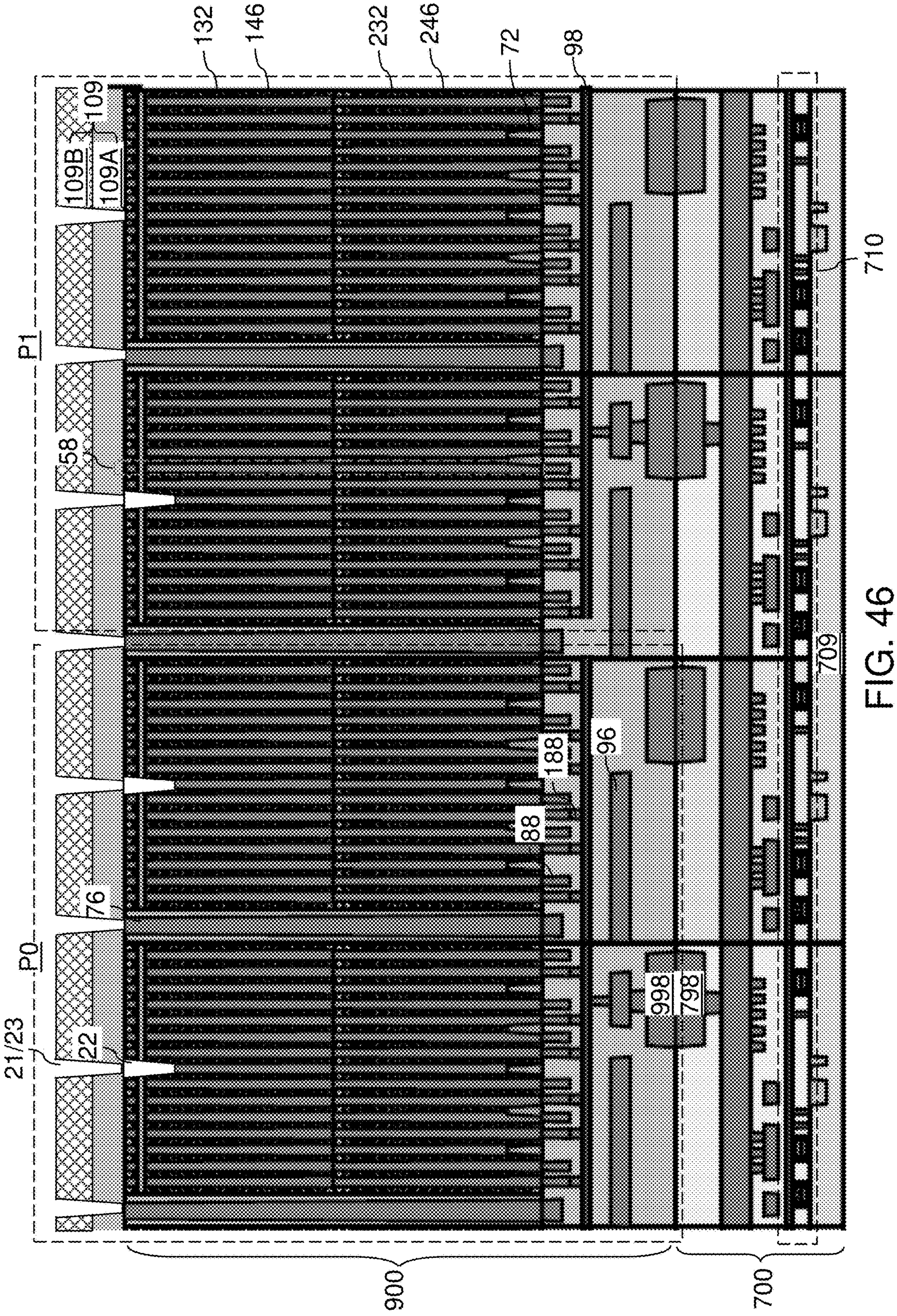
FIG. 46 is a vertical cross-sectional view of the fifth exemplary structure after dividing the source layer into a plurality of source layers according to the fifth embodiment of the present disclosure.

Referring to FIG. 46, the processing steps of FIG. 35 can be optionally performed to divide the source-level material layer 109 into a plurality of source layers 109. A dielectric material may be deposited in the source-side trenches 21 and over the source layers 109 to form source-level dielectric isolation structures 23 located in the respective trenches 21. Generally, the plurality of source layers 109 can be formed by patterning the source-level material layer. The plurality of source layers 109 are laterally spaced apart, and are electrically isolated from each other. Each group of memory opening fill structures 58 contacts a respective one of the plurality of source layers 109.

Referring to FIGS. 1-46 and according to various embodiments of the present disclosure, a three-dimensional memory device comprises: an alternating stack of insulating layers (132, 232) and electrically conductive layers (146, 246) located over a plurality of source layers (9, 109), wherein the alternating stack is located between a pair of backside trench fill structures 76; memory openings 49 vertically extending through the alternating stack {(132, 146), (232, 246)}; and groups of memory opening fill structures 58 located in the memory openings 49, wherein each of the memory opening fill structures 58 includes a respective vertical stack of memory elements (which can comprise portions of the charge storage layers 54 located at levels of the word lines (146W, 246W)), a respective vertical semiconductor channel 60 having a first end that contacts a respective one of the plurality of source layers (9, 109), and a respective drain region 63 contacting a second end of the respective vertical semiconductor channel 60, wherein: the plurality of source layers (9, 109) are laterally spaced apart and electrically isolated from each other; and each group of memory opening fill structures 58 contacts a respective one of the plurality of source layers.

In one embodiment, the plurality of source layers 9 comprises a plurality of single crystalline semiconductor material layers having a same crystallographic orientation. In one embodiment, each of the memory opening fill structures 58 comprises a pedestal channel portion 11 comprising a single crystalline semiconductor material having a doping of an opposite conductivity type relative to the plurality of single crystalline semiconductor material layers, and contacting a respective one of the plurality of single crystalline semiconductor material layers.

In one embodiment, the plurality of source layers 109 comprises a plurality of polycrystalline source semiconductor layers 109A; and each of the memory opening fill structures 58 contacts a respective one of the plurality of polycrystalline source semiconductor layers 109A. In one embodiment, each of the plurality of source layers 109 comprises a respective stack of a source semiconductor layer 109A and a metallic source layer 109B.

In one embodiment, the plurality of source layers (9, 109) are laterally spaced apart from each other by respective source-level dielectric isolation structures 23. In one embodiment, the electrically conductive layers comprise: word lines (146W, 246W) which continuously laterally extend between and contact each of the pair of the backside trench fill structures 76; and a plurality of source-side select gate electrodes 146S located between the plurality of source layers (9, 109) and the word lines (146W, 246W) in a vertical direction. The plurality of the source-side select gate electrodes 146S are laterally spaced apart by source-select-level dielectric isolation structures 23.

In one embodiment, each of the source-level dielectric isolation structures 23 contacts a respective one of the source-select-level isolation structures 22. In the configuration of FIG. 21, each of the source-level dielectric isolation structures 23 has vertically coincident sidewalls (i.e., continuous straight sidewalls having a continuous taper or no taper in the vertical direction) with the respective one of the source-select-level isolation structures. In the configuration of FIG. 35, a horizontal step exists between each of the source-level dielectric isolation structures 23 and a respective one of the source-select-level isolation structures 22. In the configuration of FIG. 34, a source-level isolation dielectric layer 120 contacts a backside of each of the plurality of source layers 109 and comprises vertically downward protruding portions 122 which include both the source-level dielectric isolation structures 23 and the source-select-level isolation structures 22.

In one embodiment, each of the plurality of source layers (9, 109) contacts only one of the pair of the backside trench fill structures 76 or does not contact any of the pair of the backside trench fill structures 76. In one embodiment, each of the plurality of source-side select gate electrodes 146S laterally surrounds a respective group of memory opening fill structures 58 and is laterally spaced from any other group of memory opening fill structures 58 of the group of memory opening fill structures 58.

In one embodiment, the three-dimensional memory device comprises bit lines 98 and drain contact via structures 88 contacting the drain regions 63. The electrically conductive layers (146, 246) comprise a plurality of drain-select-level electrically conductive layers 246D located between the word lines (146W, 246W) and the bit lines 98 in a vertical direction, and laterally spaced apart by drain-select-level dielectric isolation structures 72. In one embodiment, each of the pair of backside trench fill structures 76 comprises a dielectric structure or an electrically conductive local interconnect 75 surrounded by an insulating spacer 74, as shown in FIG. 18A.

According to another aspect of the present disclosure, a three-dimensional memory device comprises: an alternating stack of insulating layers (132, 232) and electrically conductive layers (146, 246) located over at least one source layer (9, 109) and located between a pair of backside trench fill structures 76; groups of memory openings 49 vertically extending through the alternating stack {(132, 146), (232, 246)}; and groups of memory opening fill structures 58 located in the groups of memory openings 49, wherein each of the memory opening fill structures 58 includes a respective vertical stack of memory elements (which comprise portions of the charge storage layers 54 located at levels of the word lines (146W, 246W), a respective vertical semiconductor channel 60 having a first end that contacts the at least one source layer (9, 109), and a respective drain region 63 contacting a second end of the respective vertical semiconductor channel 60. The electrically conductive layers (146, 246) comprise: word lines (146W, 246W) continuously laterally extending between, and contacting, each of the pair of the backside trench fill structures 76; and a plurality of source-side select gate electrodes 146S located between the at least one source layer (9, 109) and the word lines (146W, 246W) in a vertical direction, and located between the pair of backside trench fill structures 76 in a horizontal direction, wherein the plurality of source-side select gate electrodes 146S are laterally spaced apart by source-select-level dielectric isolation structures 22.

In one embodiment, the vertical semiconductor channels 60 comprise a semiconductor material having a doping of a first conductivity type; and the at least one source layer (9, 109) comprises a semiconductor material layer having a doping of a second conductivity type that is the opposite of the first conductivity type. In one embodiment, the at least one source layer (9, 109) comprises a continuous source layer that contacts each of the first end of each of the vertical semiconductor channels 60. In one embodiment, each of the source-select-level dielectric isolation structures 22 comprises a first horizontal surface that contacts one of the insulating layers (132, 232) and a second horizontal surface that contacts the at least one source layer (9, 109).

In another embodiment, the at least one source layer (9, 109) comprises a plurality of source layers that are laterally spaced apart from each other. Each group of memory opening fill structures 58 of the groups of memory opening fill structures 58 contacts a respective one of the plurality of source layers (9, 109) and is electrically isolated from all other source layers (9, 109) of the plurality of source layers (9, 109).

In one embodiment, the plurality of source layers (9, 109) are laterally spaced apart from each other by respective source-level dielectric isolation structures 23. In one embodiment, each of the source-level dielectric isolation structures 23 contacts a respective one of the source-select-level isolation structures 22. In the configuration of FIG. 21, each of the source-level dielectric isolation structures 23 has vertically coincident sidewalls (i.e., continuous straight sidewalls having a continuous taper or no taper in the vertical direction) with the respective one of the source-select-level isolation structures. In the configuration of FIG. 35, a horizontal step exists between each of the source-level dielectric isolation structures 23 and a respective one of the source-select-level isolation structures 22. In the configuration of FIG. 34, a source-level isolation dielectric layer 120 contacts a backside of each of the plurality of source layers 109 and comprises vertically downward protruding portions 122 which include both the source-level dielectric isolation structures 23 and the source-select-level isolation structures 22.

In one embodiment, each of the pair of backside trench fill structures 76 comprises a dielectric structure or an electrically conductive local interconnect 75 surrounded by an insulating spacer 74, as shown in FIG. 18A.

In one embodiment, the plurality of source layers 109 comprises a plurality of polycrystalline semiconductor layers 109A. In one embodiment, each of the plurality of source layers (9, 109) contacts only one of the pair of the backside trench fill structures 76 or does not contact any of the pair of the backside trench fill structures 76. In one embodiment, each of the plurality of source-side select gate electrodes 146S laterally surrounds a respective group of memory opening fill structures 58 and is laterally spaced from any other group of memory opening fill structures 58 of the group of memory opening fill structures 58.

In one embodiment, by performing an erase operation on a smaller memory string rather than the entire memory block, the number of reprogramming steps are reduced. This improves the programming speed. Furthermore, the select/unselect operation is operated with higher precision on the string unit. The disturbed memory cell area of the erase unit EU is reduced. Thus, the unselected NAND string stress is reduced and cell degradation is improved.

Figure 47:
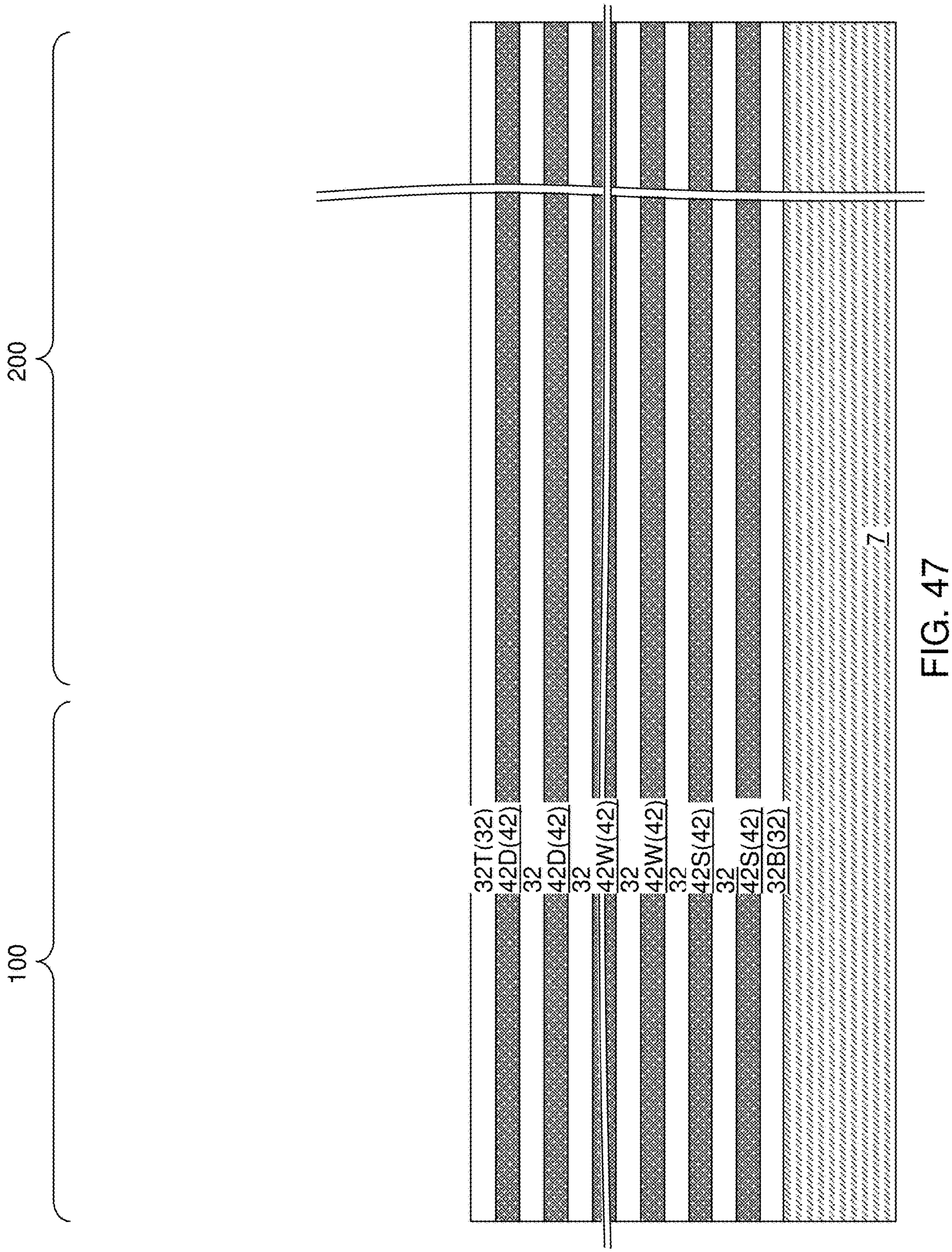
FIG. 47 is a schematic vertical cross-sectional view of a sixth exemplary structure after formation of an alternating stack of insulating layers and sacrificial material layers over a carrier substrate according to an embodiment of the present disclosure.

Referring to FIG. 47, a sixth exemplary structure according to a sixth embodiment of the present disclosure is illustrated. The sixth exemplary structure comprises a carrier substrate 7, which may be a semiconductor substrate, an insulating substrate, or a conductive substrate. For example, the carrier substrate 7 may comprise a commercially available silicon wafer. Alternatively, the carrier substrate 7 may comprise any material that may be removed selective the materials of insulating layers 32 and the electrically conductive layers to be subsequently formed.

An alternating stack of first material layers and second material layers can be formed over the carrier substrate 7. The first material layers may be insulating layers, and the second material layers may be spacer material layers. In one embodiment, the spacer material layers may comprise sacrificial material layers 42. In this case, an alternating stack (32, 42) of insulating layers 32 and sacrificial material layers 42 can be formed over the carrier substrate 7. The insulating layers 32 comprise an insulating material, such as undoped silicate glass (i.e., silicon oxide) or a doped silicate glass, and the sacrificial material layers 42 comprise a sacrificial material, such as silicon nitride. In one embodiment, the insulating layers 32 (i.e., the first material layers) may comprise silicon oxide layers, and the sacrificial material layers 42 (i.e., the second material layers) may comprise silicon nitride layers. The alternating stack (32, 42) may begin with a bottommost insulating layer 32B, and may terminate with a topmost insulating layer 32T. The sacrificial material layers 42 may comprise, in the order of proximity to the carrier substrate 7, at least one source-select-level sacrificial material layer 42S, word-line-level sacrificial material layers 42W, and at least one drain-select-level sacrificial material layer 42D. In one embodiment, a plurality of source-select-level sacrificial material layers 42S may be provided. In one embodiment, a plurality of drain-select-level sacrificial material layers 42D may be provided.

The alternating stack (32, 42) may comprise multiple repetitions of a unit layer stack including an insulating layer 32 and a sacrificial material layer 42. The total number of repetitions of the unit layer stack within the alternating stack (32, 42) may be, for example, in a range from 8 to 1,024, such as from 32 to 256, although lesser and greater number of repetitions may also be employed.

Each of the insulating layers 32 other than the topmost insulating layer 32 may have a thickness in a range from 20 nm to 100 nm, such as from 30 nm to 60 nm, although lesser and greater thicknesses may also be employed. Each of the sacrificial material layers 42 may have a thickness in a range from 20 nm to 100 nm, such as from 30 nm to 60 nm, although lesser and greater thicknesses may also be employed. In one embodiment, the topmost insulating layer 32T may have a thickness of about one half of the thickness of other insulating layers 32.

The sixth exemplary structure comprises a memory array region 100 in which a three-dimensional array of memory elements is to be subsequently formed, and a contact region 200 in which layer contact via structures contacting word lines are to be subsequently formed.

While an embodiment is described in which the spacer material layers are formed as sacrificial material layers 42, the spacer material layers may be formed as electrically conductive layers in an alternative embodiment. Generally, the spacer material layers may be formed as or may be subsequently replaced at least partly with electrically conductive layers.

Figure 48:
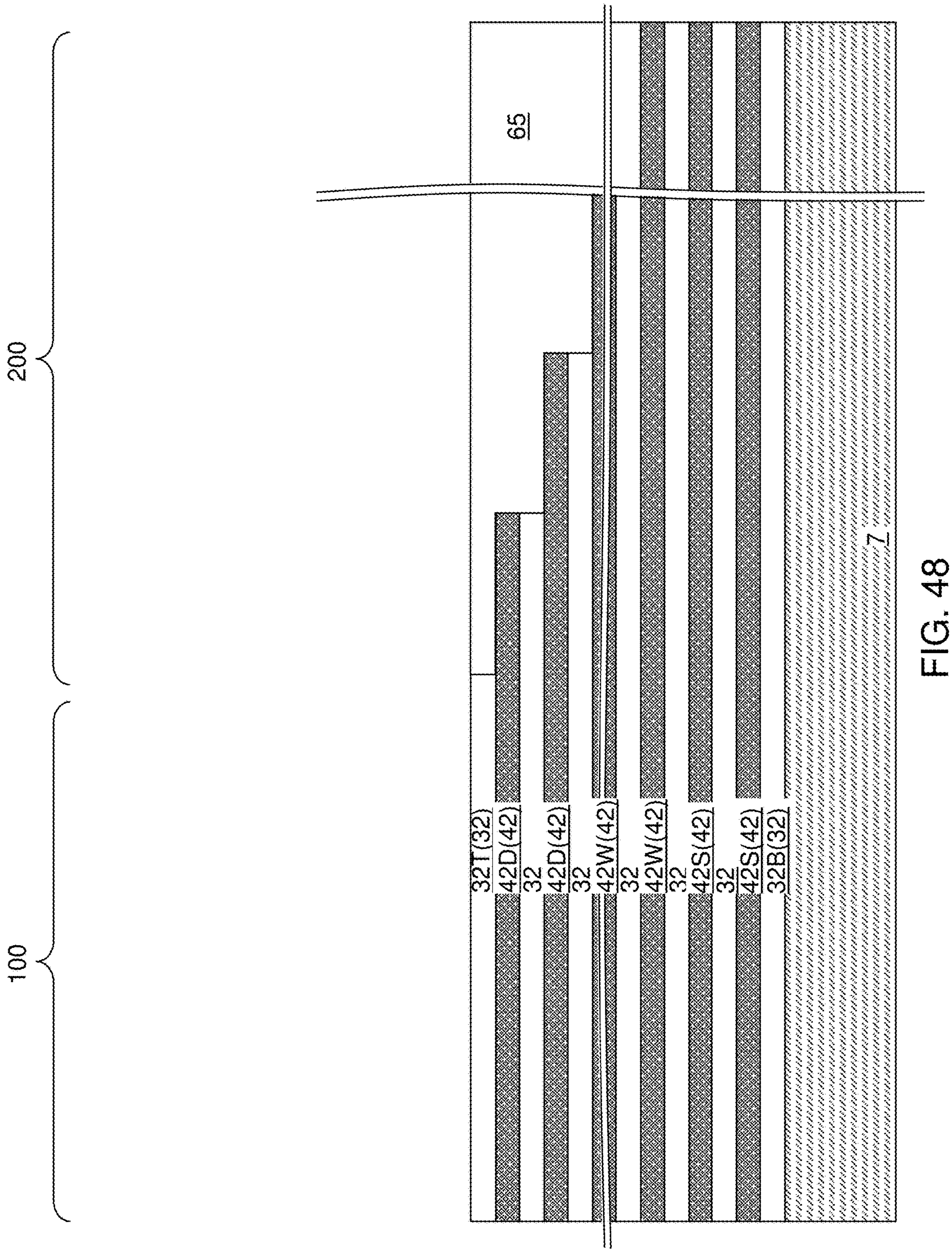
FIG. 48 is a schematic vertical cross-sectional view of the sixth exemplary structure after formation of stepped surfaces and a stepped dielectric material portion according to an embodiment of the present disclosure.

Referring to FIG. 48, stepped surfaces are formed in the contact region 200, as described above with respect to FIG. 2. A stepped cavity is formed within the volume from which portions of the alternating stack (32, 42) are removed through formation of the stepped surfaces. The stepped surfaces of the alternating stack (32, 42) continuously extend from a bottommost layer within the alternating stack (32, 42) (such as the bottommost insulating layer 32B) to a topmost layer within the alternating stack (32, 42) (such as the topmost insulating layer 32T). A retro-retro-stepped dielectric material portion 65 (i.e., an insulating fill material portion) can be formed in the stepped cavity by deposition of a dielectric material therein, similar to the method described above with respect to FIG. 2.

Figure 49A:
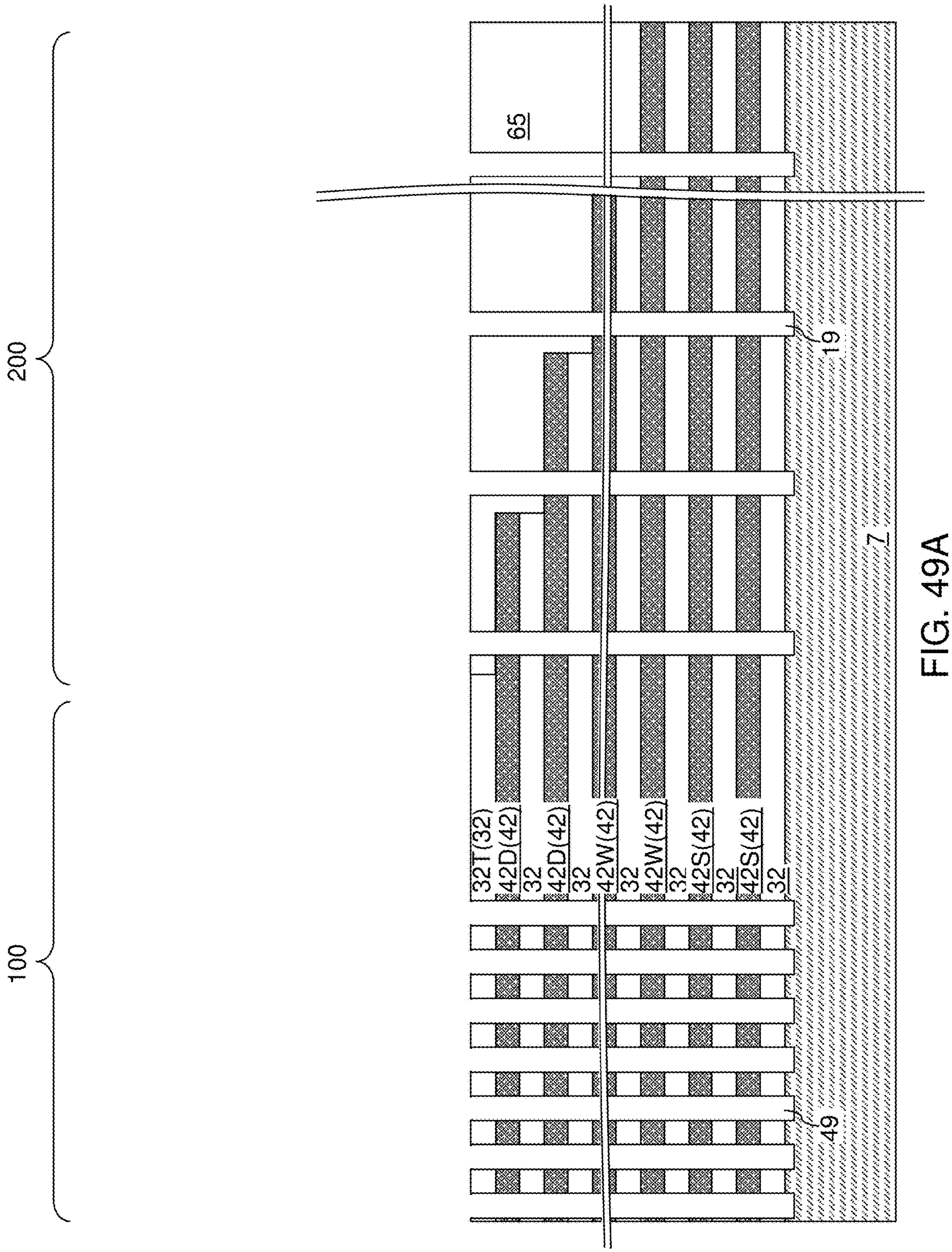
FIG. 49A is a schematic vertical cross-sectional view of the sixth exemplary structure after formation of memory openings and support openings according to an embodiment of the present disclosure.
Figure 49B:
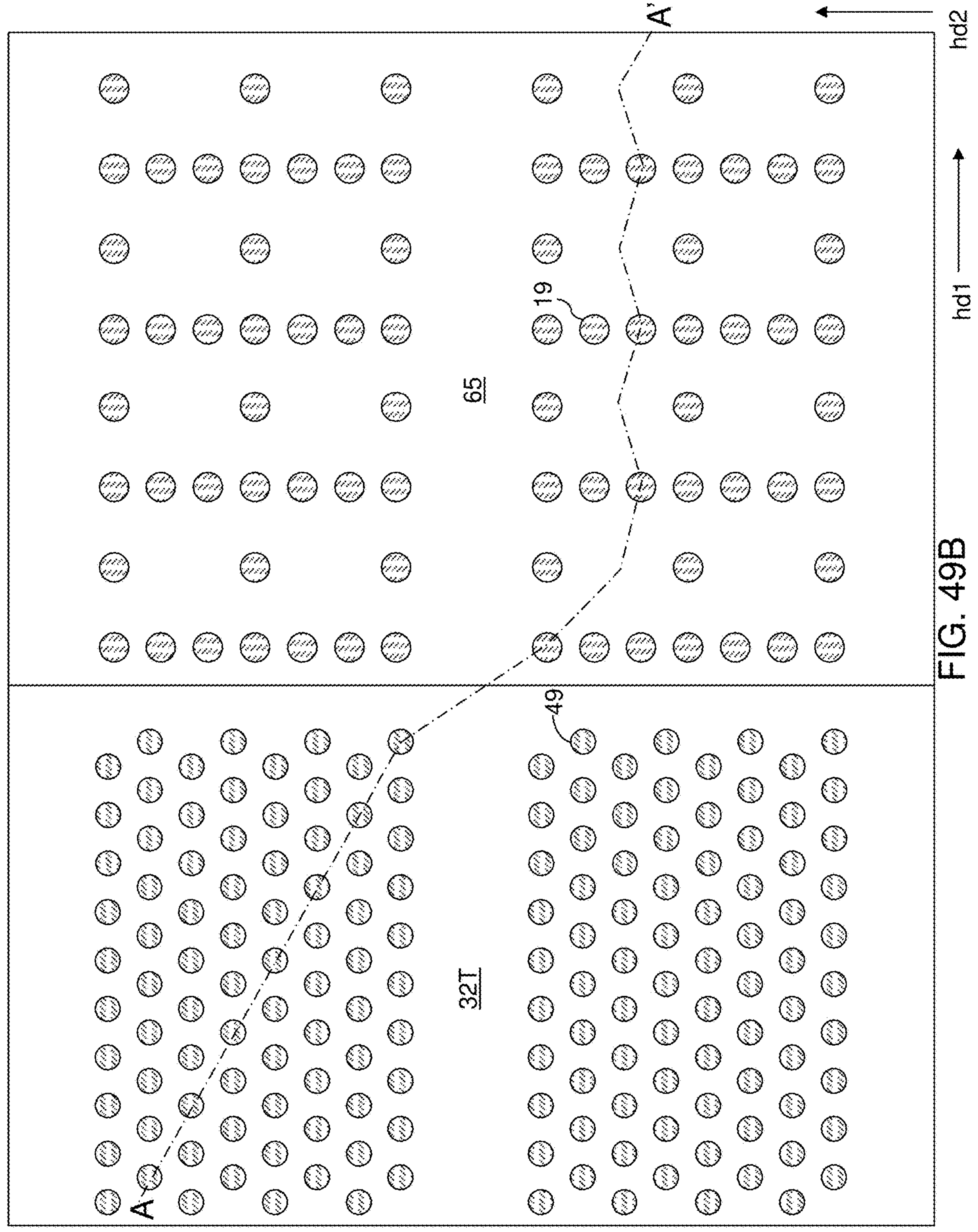
FIG. 49B is a top-down view of the sixth exemplary structure of FIG. 49A. The vertical plane A-A is the cut plane of the vertical cross-sectional view of FIG. 49A.

Referring to FIGS. 49A and 49B, an etch mask layer (such as a photoresist layer) can be formed over the alternating stack (32, 42), and can be lithographically patterned to form openings in the contact region 200 and in the memory array region 100. An anisotropic etch process can be performed to transfer the pattern of the openings in the etch mask layer through the retro-stepped dielectric material portion 65 and the alternating stack (32, 42). Memory openings 49 can be formed through the alternating stack (32, 42) in the memory array region 100. Support openings 19 can be formed through the retro-stepped dielectric material portion 65 and the alternating stack (32, 42) in the contact region 200, similar to the steps described above with respect to FIGS. 3A and 3B. Each of the memory openings 49 and the support openings 19 can vertically extend into the carrier substrate 7.

In one embodiment, the memory openings 49 may be formed in groups that are clustered in proximity to each other. In one embodiment, each group of memory openings 49 may comprise a respective set of neighboring rows of memory openings 49 in which each row of memory openings 49 is arranged along a first horizontal direction hd1, and the rows of memory openings 49 are laterally spaced among one another along a second horizontal direction hd2. In one embodiment, the number of rows of memory openings 49 within each group of memory openings 49 may be in a range from 2 to 8, such as from 4 to 6, although a greater number of rows of memory openings 49 may be employed per group of memory openings 49. Each group of memory openings 49 vertically extends through the alternating stack (32, 42).

Figure 50:
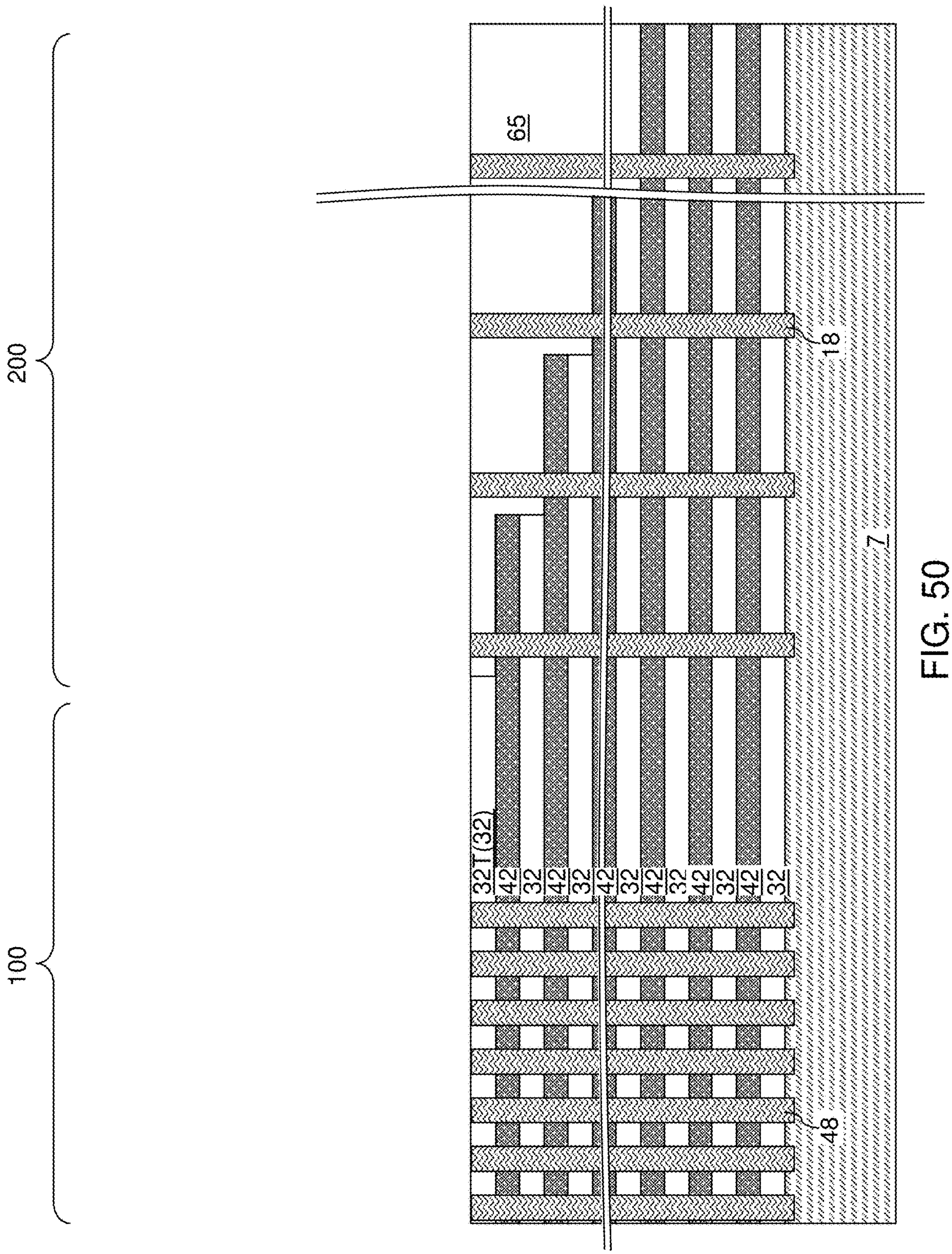
FIG. 50 is a vertical cross-sectional view of the sixth exemplary structure after formation of sacrificial opening fill structures according to an embodiment of the present disclosure.

Referring to FIG. 50, a sacrificial fill material can be deposited in the memory openings 49 and in the support openings 19, similar to the step described above with respect to FIGS. 5A and 5B. Excess portions of the sacrificial fill material may be removed from above the horizontal plane including the top surface of the topmost insulating layer 32T by performing a planarization process, which may employ a recess etch process or a chemical mechanical polishing process. Each remaining portion of the sacrificial fill material that fills a memory opening 49 constitutes a sacrificial memory opening fill structure 48. Each remaining portion of the sacrificial fill material that fills a support opening 19 constitutes a sacrificial support opening fill structure 18.

Figure 51:
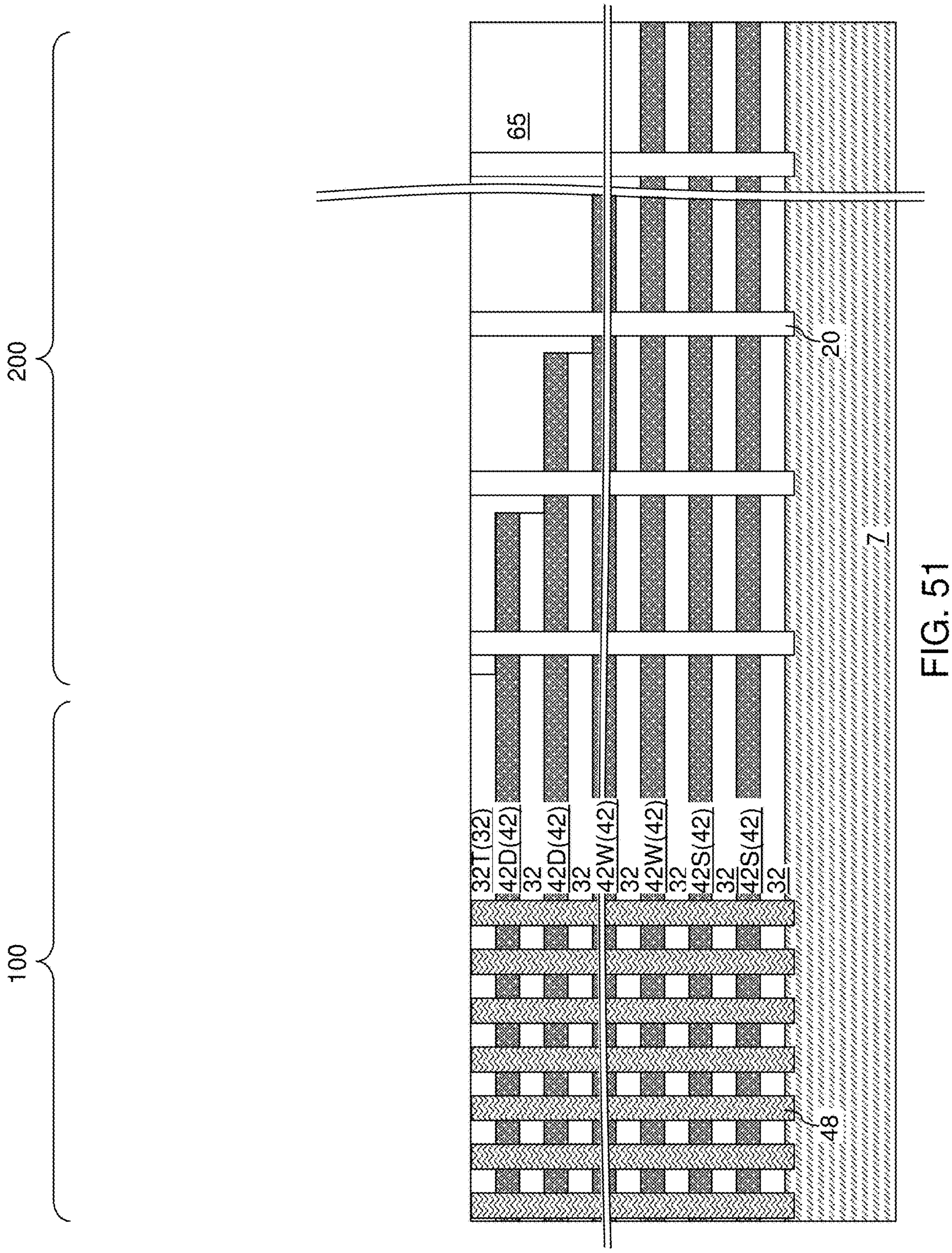
FIG. 51 is a vertical cross-sectional view of the sixth exemplary structure after formation of support pillar structures according to an embodiment of the present disclosure.

Referring to FIG. 51, an optional photoresist layer (not shown) can be applied over the top surface of the topmost insulating layer 32T and the retro-stepped dielectric material portion 65, and can be lithographically patterned to cover the memory array region 100 without covering the contact region 200. The sacrificial support opening fill structures 18 can be removed selective to the materials of the alternating stack (32, 42) and the carrier substrate 7 while the patterned photoresist layer covers the memory array region 100. Voids are formed in the volumes of the support openings 19. The photoresist layer can be subsequently removed without removing the sacrificial memory opening fill structures 48.

A dielectric fill material, such as silicon oxide, can be deposited in the volumes of the support openings 19 by a conformal deposition process. Excess portions of the dielectric fill material can be removed from above the top surface of the topmost insulating layer 32T, for example, by a recess etch process. Each portion of the dielectric fill material that fills a respective support opening 19 constitutes a support pillar structure 20, which can be employed to provide structural support to the insulating layers 32 and the retro-stepped dielectric material portion 65 during replacement of the sacrificial material layers 42 with electrically conductive layers.

Figure 52:
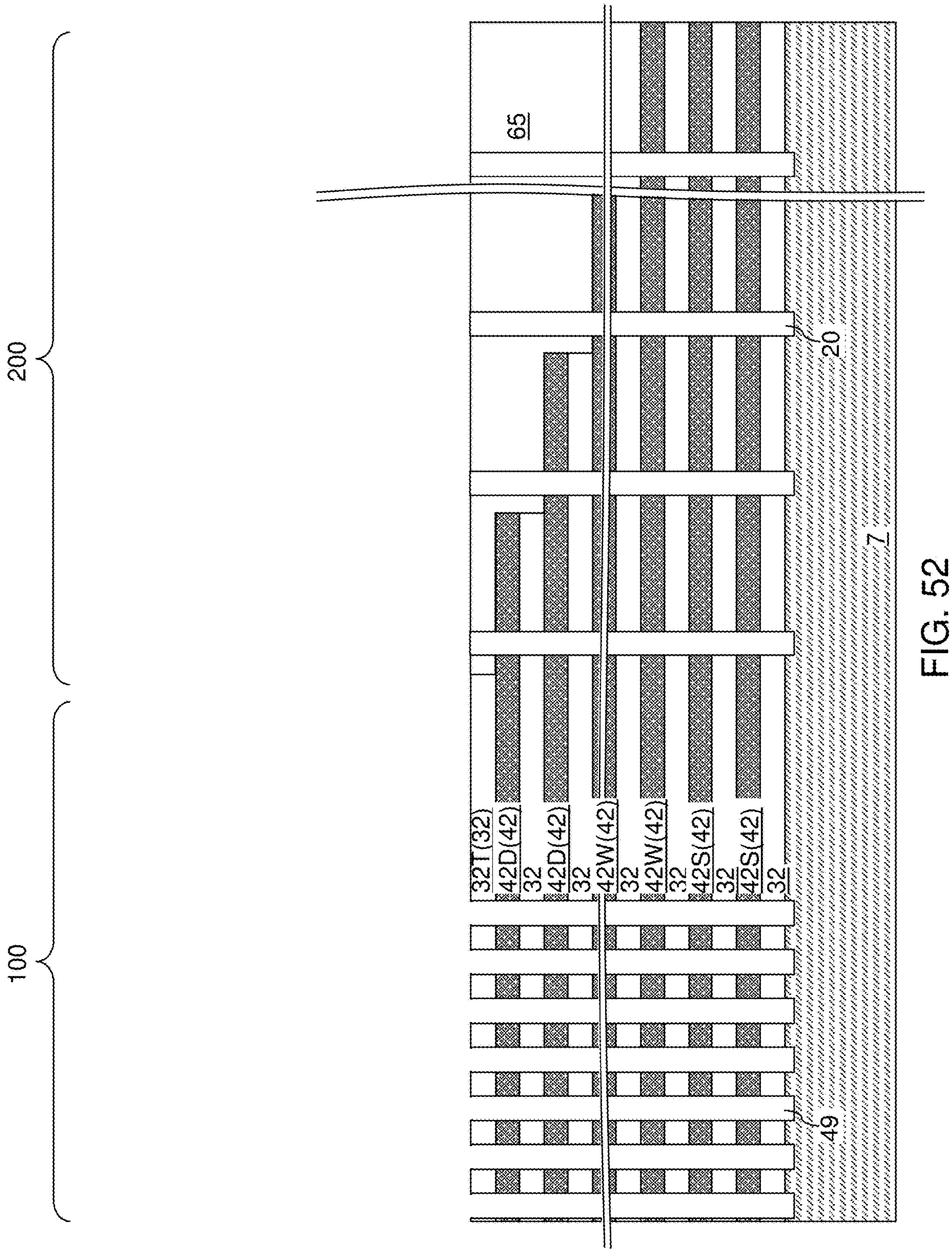
FIG. 52 is a schematic vertical cross-sectional view of the sixth exemplary structure after removal of sacrificial memory opening fill structures according to an embodiment of the present disclosure.

Referring to FIG. 52, the sacrificial memory opening fill structures 48 can be removed selective to the materials of the alternating stack (32, 42) and the carrier substrate 7 by performing an ashing process or a selective etch process. Voids are formed in the volumes of the memory openings 49.

FIGS. 53A-53F are sequential vertical cross-sectional views of a memory opening 49 during formation of a memory opening fill structure 58 according to an embodiments of the present disclosure.

Figure 53B:
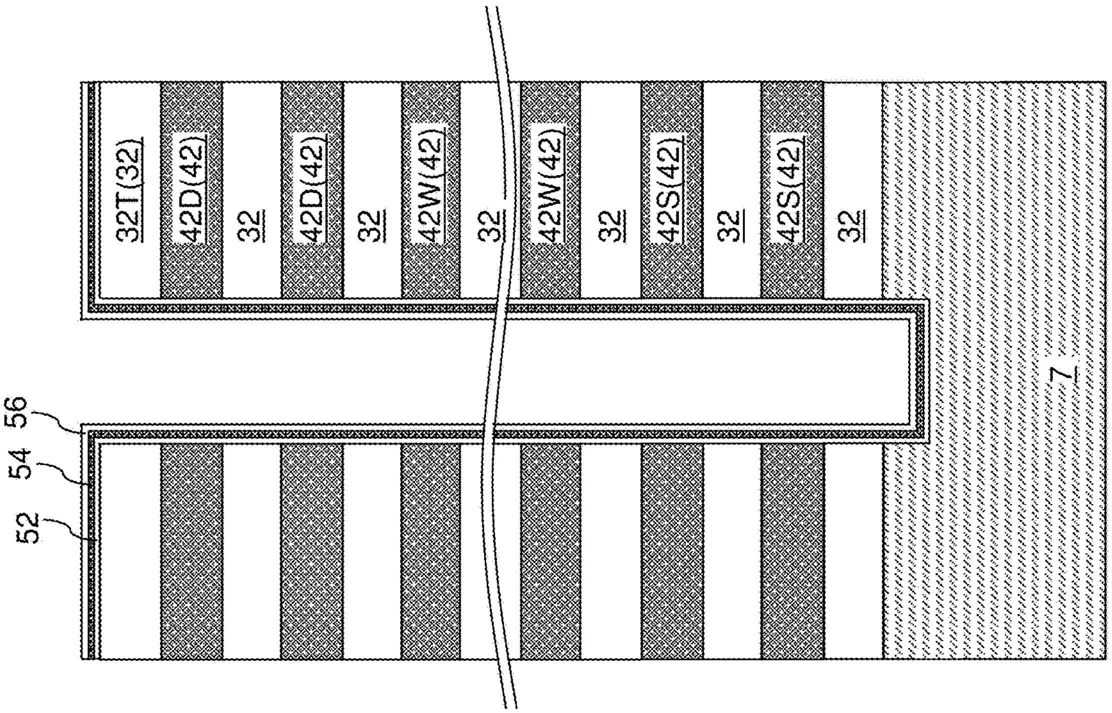
FIGS. 53A-53F are sequential vertical cross-sectional views of a memory opening during formation of a memory opening fill structure according to an embodiments of the present disclosure.
Figure 53A:
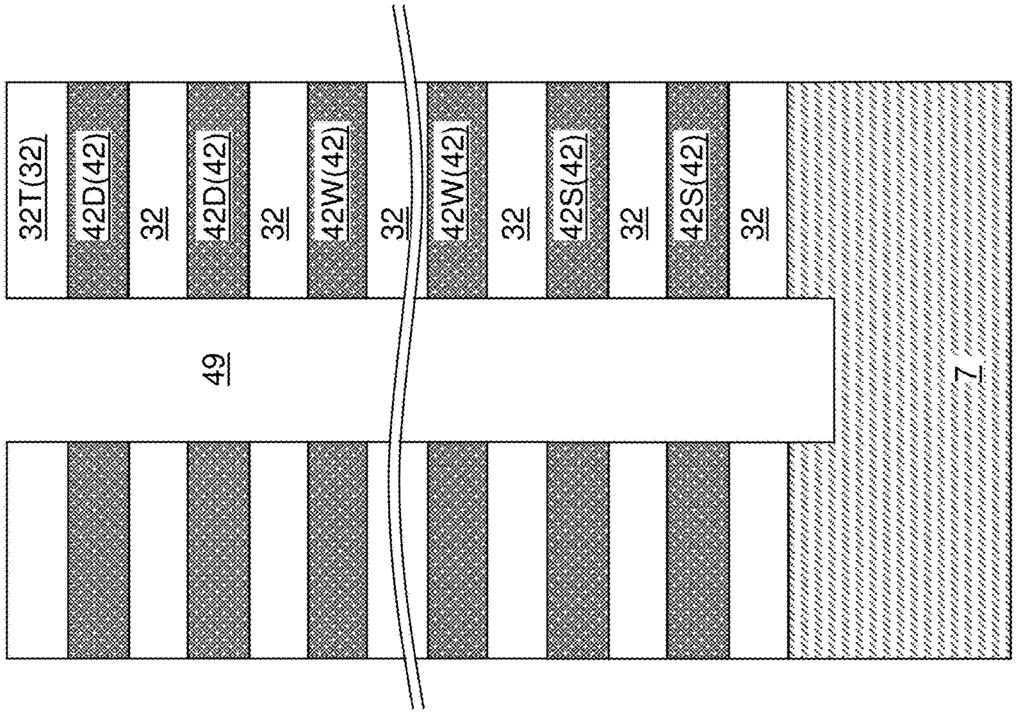

Referring to FIG. 53A, a memory opening 49 is shown after the processing steps of FIG. 52.

Referring to FIG. 53B, a layer stack including a memory material layer 54 can be conformally deposited, as described above with respect to FIG. 9B. In an illustrative example, the layer stack may comprise an optional blocking dielectric layer 52, the memory material layer 54, and an optional dielectric liner 56. The memory material layer 54 includes a memory material, i.e., a material that can store data bits therein. The memory material layer 54 may comprise a charge storage material (such as silicon nitride).

Figure 53D:
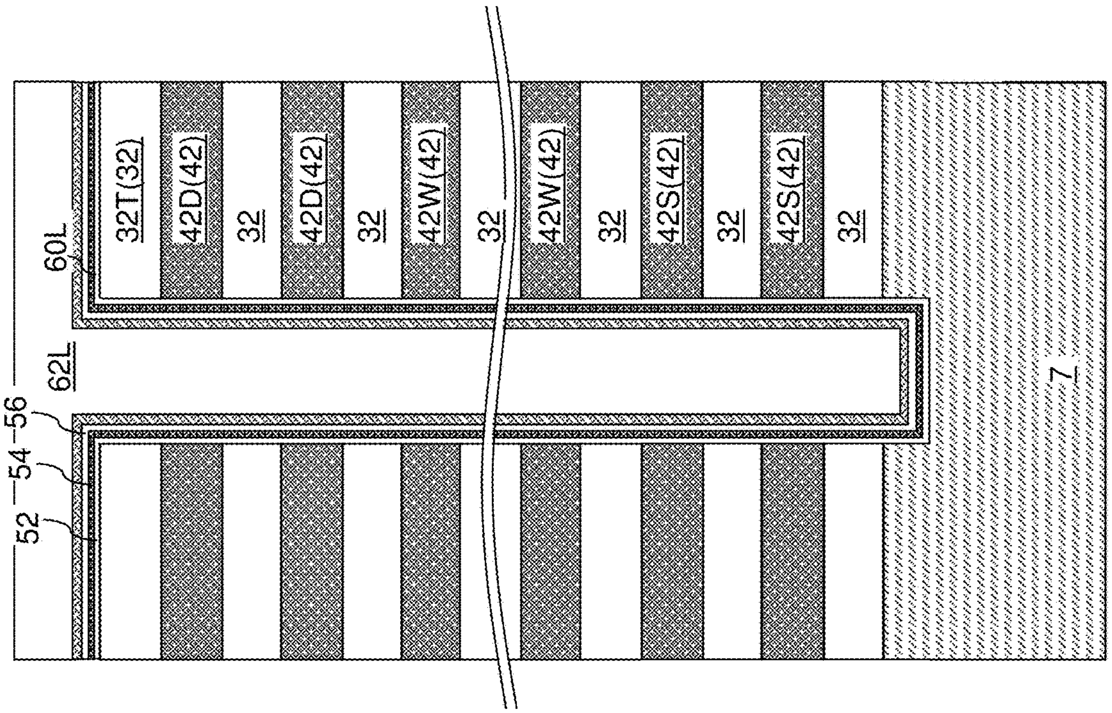
Figure 53C:
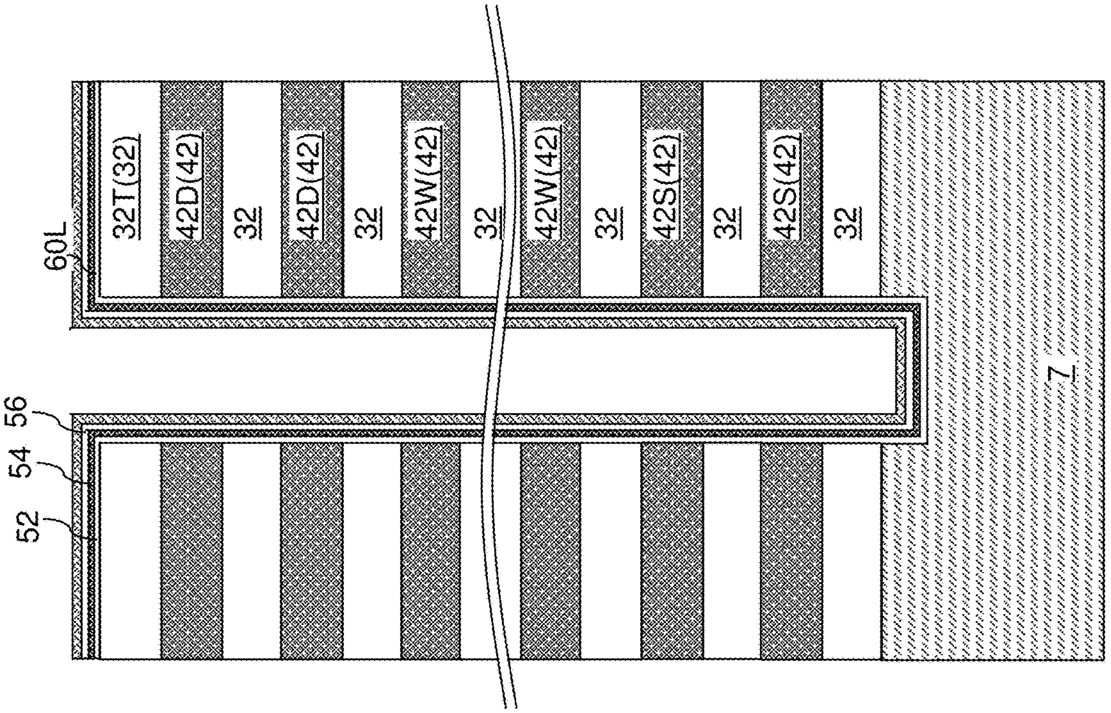

Referring to FIG. 53C, a semiconductor channel material layer 60L can be deposited over each memory film 50 by performing a conformal deposition process. If the semiconductor channel material layer 60L is doped, the semiconductor channel material layer 60L may have a doping of a first conductivity type, which may be p-type or n-type.

Referring to FIG. 53D, a dielectric core layer 62L comprising a dielectric fill material, such as silicon oxide, can be deposited in remaining volumes of the memory openings 49, as described above with respect to FIG. 9F.

Figure 53F:
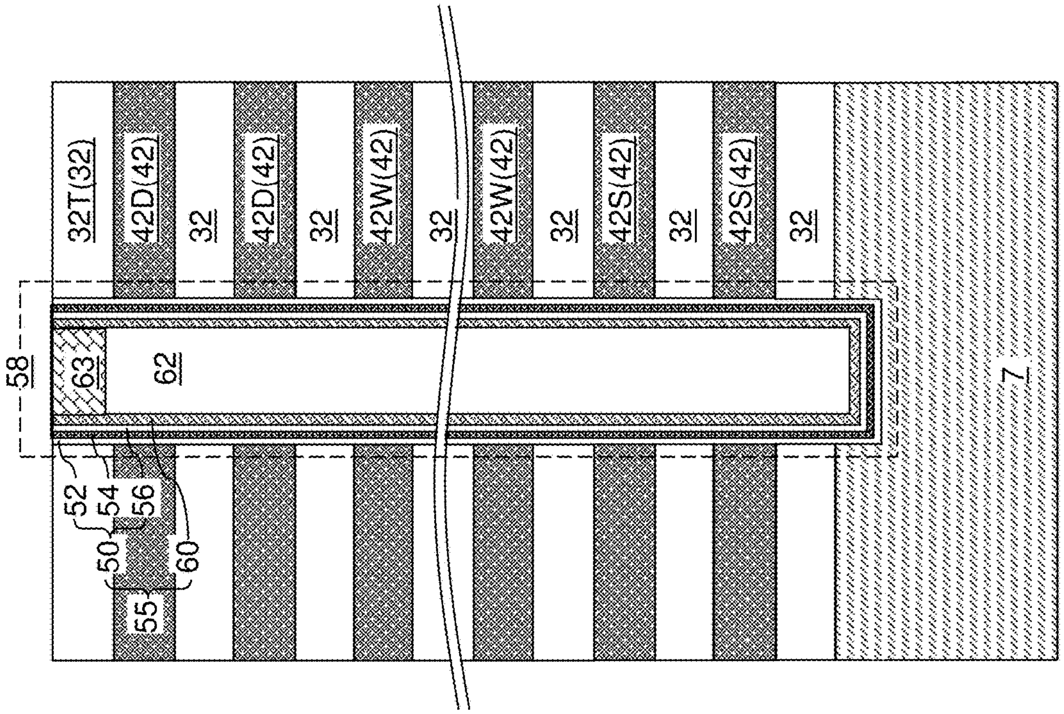
Figure 53E:
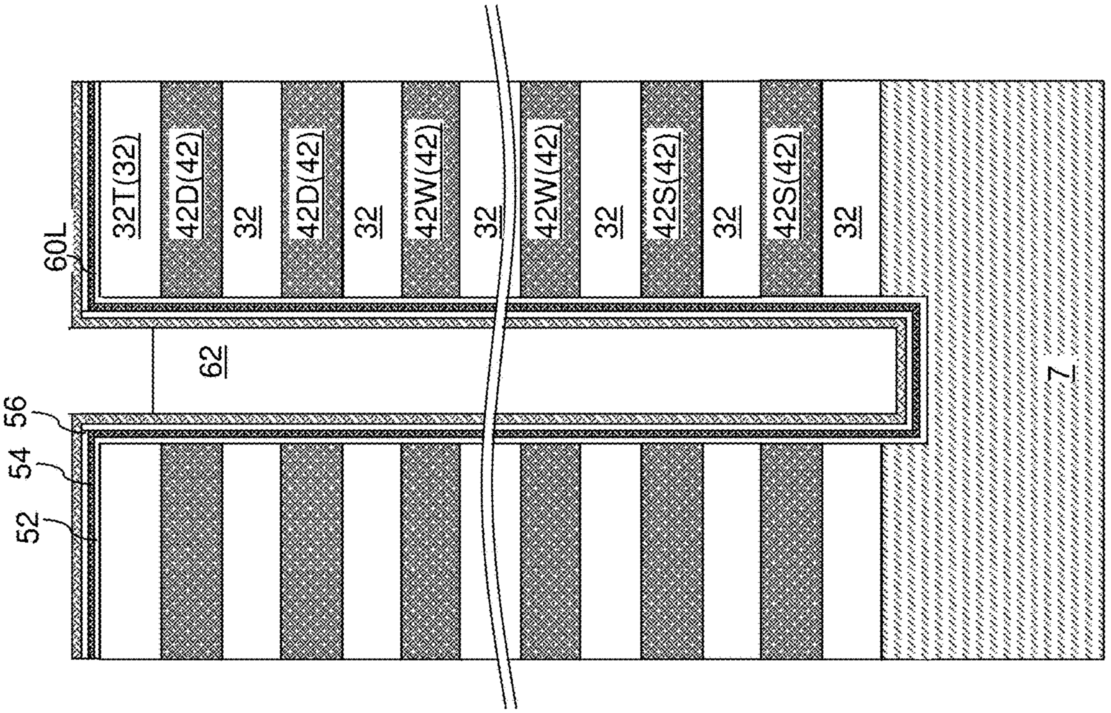

Referring to FIG. 53E, the dielectric core layer 62L can be vertically recessed such that each remaining portion of the dielectric core layer has a top surface at or about the horizontal plane including the bottom surface of the topmost insulating layers 32T. Each remaining portion of the dielectric core layer constitutes a dielectric core 62.

Referring to FIG. 53F, a doped semiconductor material having a doping of a second conductivity type can be deposited within each recessed region above the dielectric cores 62 to form the drain regions 63, as described above with respect to FIG. 9H.

Each portion of the layer stack including the memory material layer 54 that remains in a respective memory opening 49 constitutes a memory film 50. In one embodiment, a memory film 50 may comprise an optional blocking dielectric layer 52, a memory material layer 54, and an optional dielectric liner 56. Each contiguous combination of a memory film 50 and a vertical semiconductor channel 60 constitutes a memory stack structure 55. Each combination of a memory stack structure 55, a dielectric core 62, and a drain region 63 within a memory opening 49 constitutes a memory opening fill structure 58. Each memory opening fill structure 58 comprises a respective vertical stack of memory elements, which may comprise portions of the memory material layer 54 located at levels of the sacrificial material layers 42, or generally speaking, at levels of spacer material layers that may be formed as or may be subsequently replaced at least partly with electrically conductive layers.

Figure 54A:
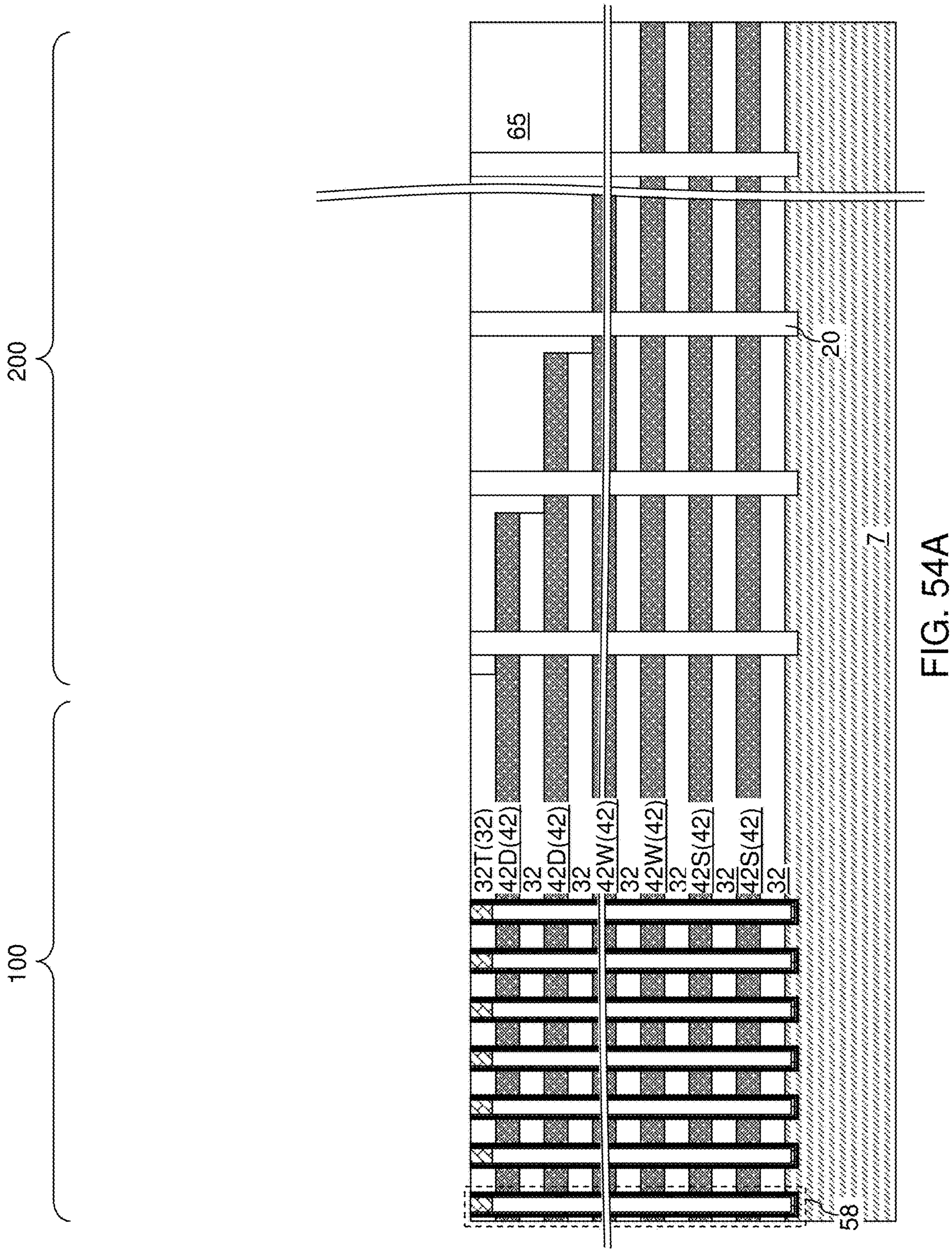
FIG. 54A is a schematic vertical cross-sectional view of the sixth exemplary structure after formation of memory opening fill structures according to an embodiment of the present disclosure.
Figure 54B:
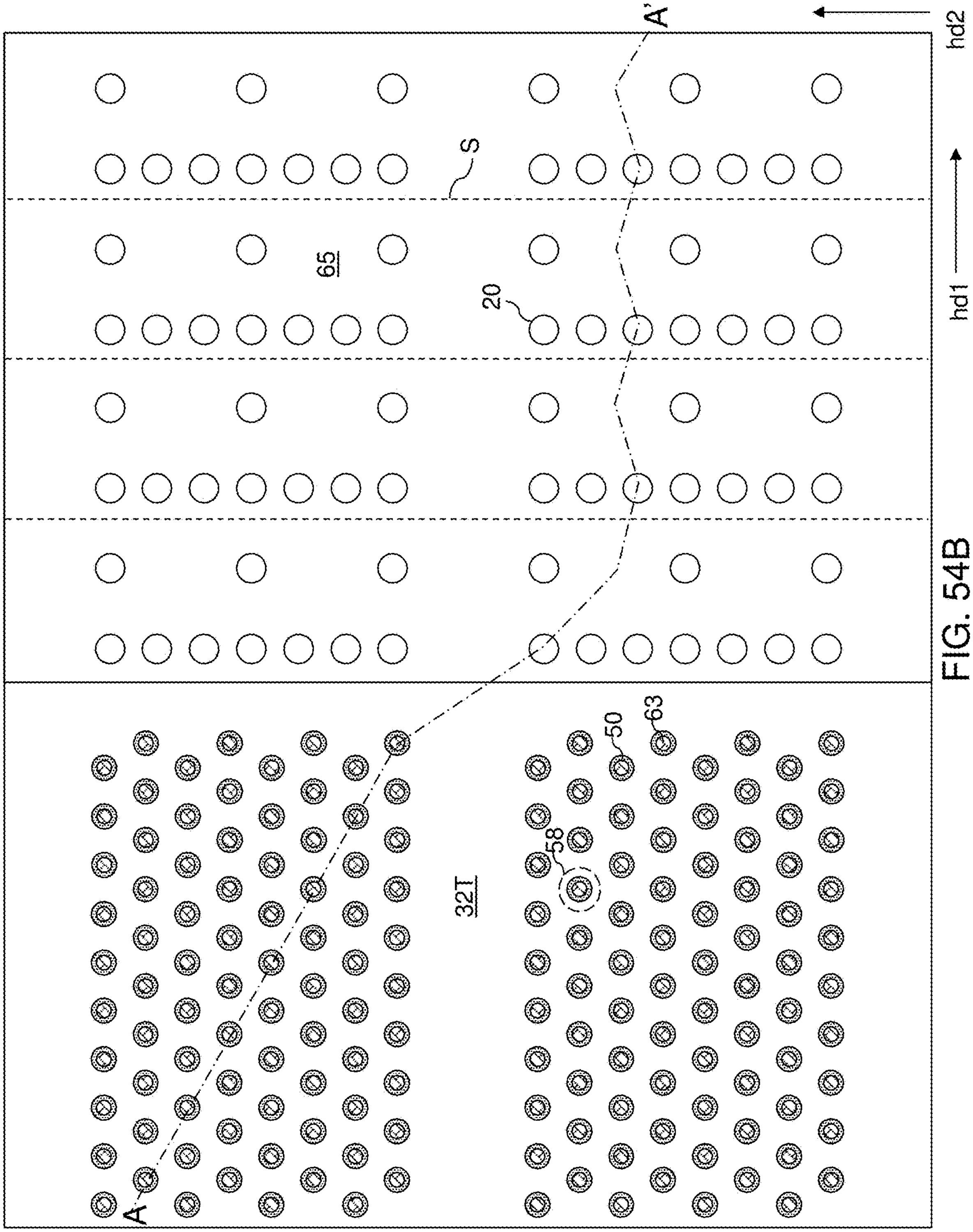
FIG. 54B is a top-down view of the sixth exemplary structure of FIG. 54A. The vertical plane A-A is the cut plane of the vertical cross-sectional view of FIG. 54A.

Referring to FIGS. 54A and 54B, the sixth exemplary structure is illustrated after formation of memory opening fill structures 58 within the memory openings 49. Each of the memory opening fill structures 58 comprises a vertical stack of memory elements (e.g., portions of the memory film 50 located at levels of the word-line-level sacrificial material layers 42W), a respective vertical semiconductor channel 60, and a respective drain region 63. Groups of memory opening fill structures 58 can be formed in the groups of memory openings 49. The drain regions 63 are more distal from the carrier substrate 7 along a vertical direction than the drain-select-level sacrificial material layers 42D are from the carrier substrate 7 along the vertical direction.

Figure 55A:
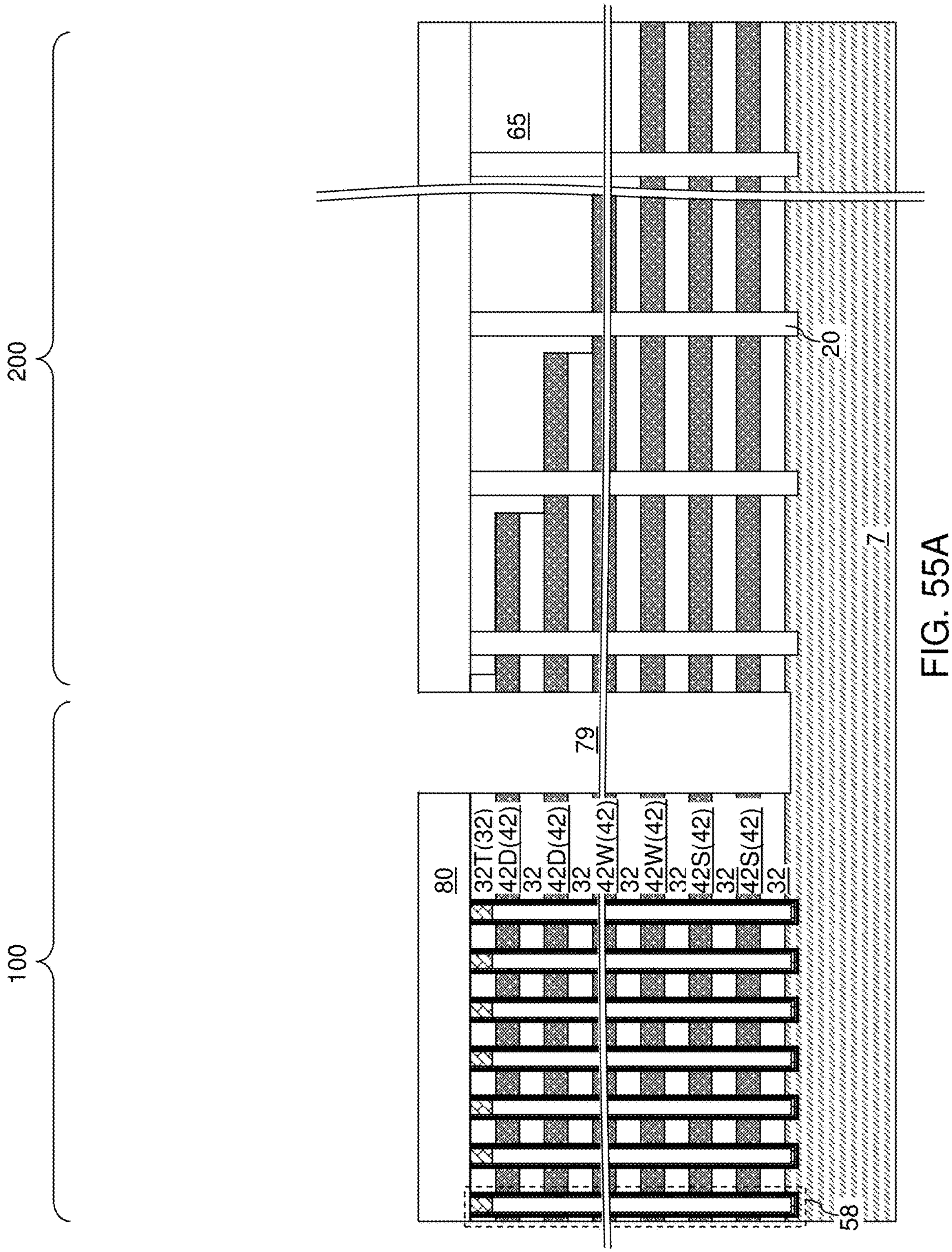
FIG. 55A is a vertical cross-sectional view of the sixth exemplary structure after formation of a contact-level dielectric layer and backside trenches according to an embodiment of the present disclosure.
Figure 55B:
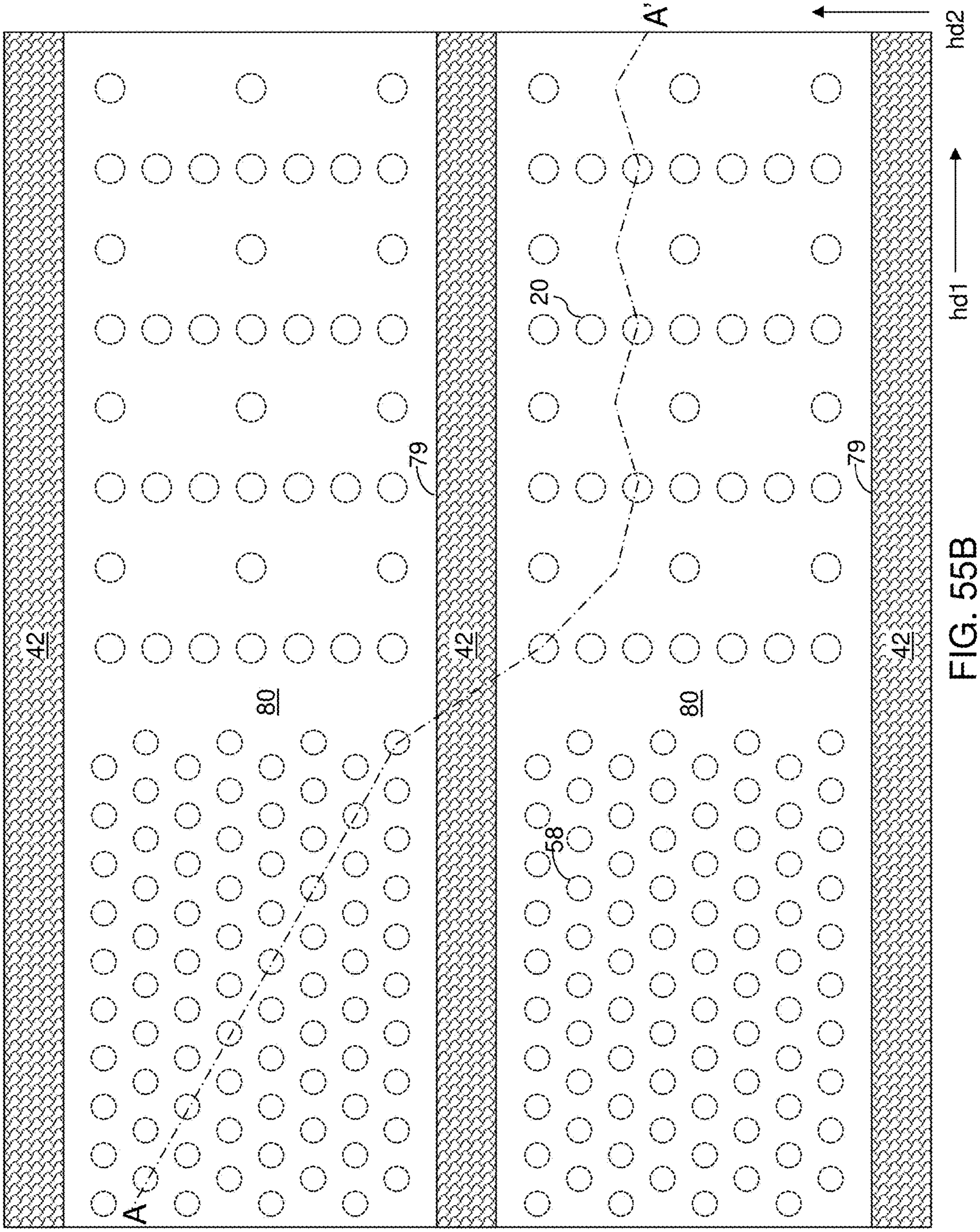
FIG. 55B is a top-down view of the sixth exemplary structure of FIG. 55A. The vertical plane A-A is the cut plane of the vertical cross-sectional view of FIG. 55A.

Referring to FIGS. 55A and 55B, a dielectric material such as undoped silicate glass or a doped silicate glass can be deposited over the alternating stack (32, 42) to form a contact-level dielectric layer 80. The thickness of the contact-level dielectric layer 80 may be in a range from 100 nm to 600 nm, such as from 200 nm to 400 nm, although lesser and greater thicknesses may also be employed.

An optional photoresist layer (not shown) can be applied over the contact-level dielectric layer 80, and can be lithographically patterned to form elongated openings that laterally extend along the first horizontal direction hd1 between neighboring clusters of memory opening fill structures 58. An optional anisotropic etch process can be performed to transfer the pattern of the openings in the photoresist layer through the contact-level dielectric layer 80, the alternating stack (32, 42), and the retro-stepped dielectric material portion 65, and at least to a top surface of the carrier substrate 7. Optional backside trenches 79 including a neighboring pair of a first trench and a second trench can be formed through the contact-level dielectric layer 80, the alternating stack (32, 42), and the retro-stepped dielectric material portion 65 as described above with respect to FIGS. 11A and 11B. Multiple groups of memory opening fill structures 58 are located between each neighboring pair of backside trenches 79. Each group of memory opening fill structures 58 may comprise 2 to 8 rows of memory opening fill structures 58, and the total number of groups of memory opening fill structures 58 between each neighboring pair of backside trenches 79 may be in a range from 2 to 8, such as from 2 to 4. The photoresist layer can be subsequently removed, for example, by ashing.

Figure 56:
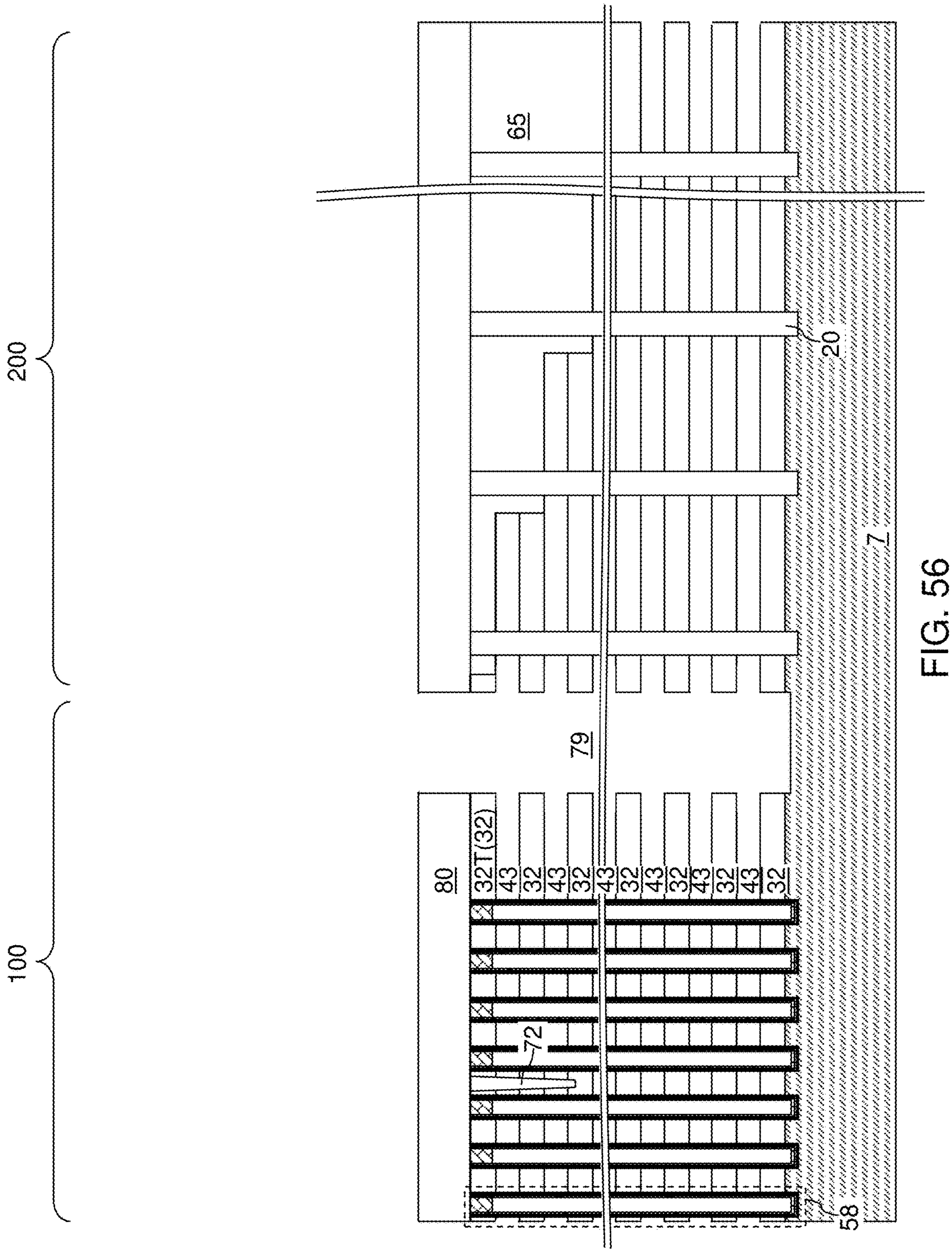
FIG. 56 is a vertical cross-sectional view of the sixth exemplary structure after formation of laterally-extending cavities according to an embodiment of the present disclosure.

Referring to FIG. 56, an etchant that selectively etches the material of the sacrificial material layers 42 with respect to the material of the insulating layers 32 can be introduced into the access trenches 79, for example, employing an isotropic etch process. Lateral recesses 43 are formed in volumes from which the sacrificial material layers 42 are removed, as described above with respect to FIGS. 12A and 12B.

Figure 57:
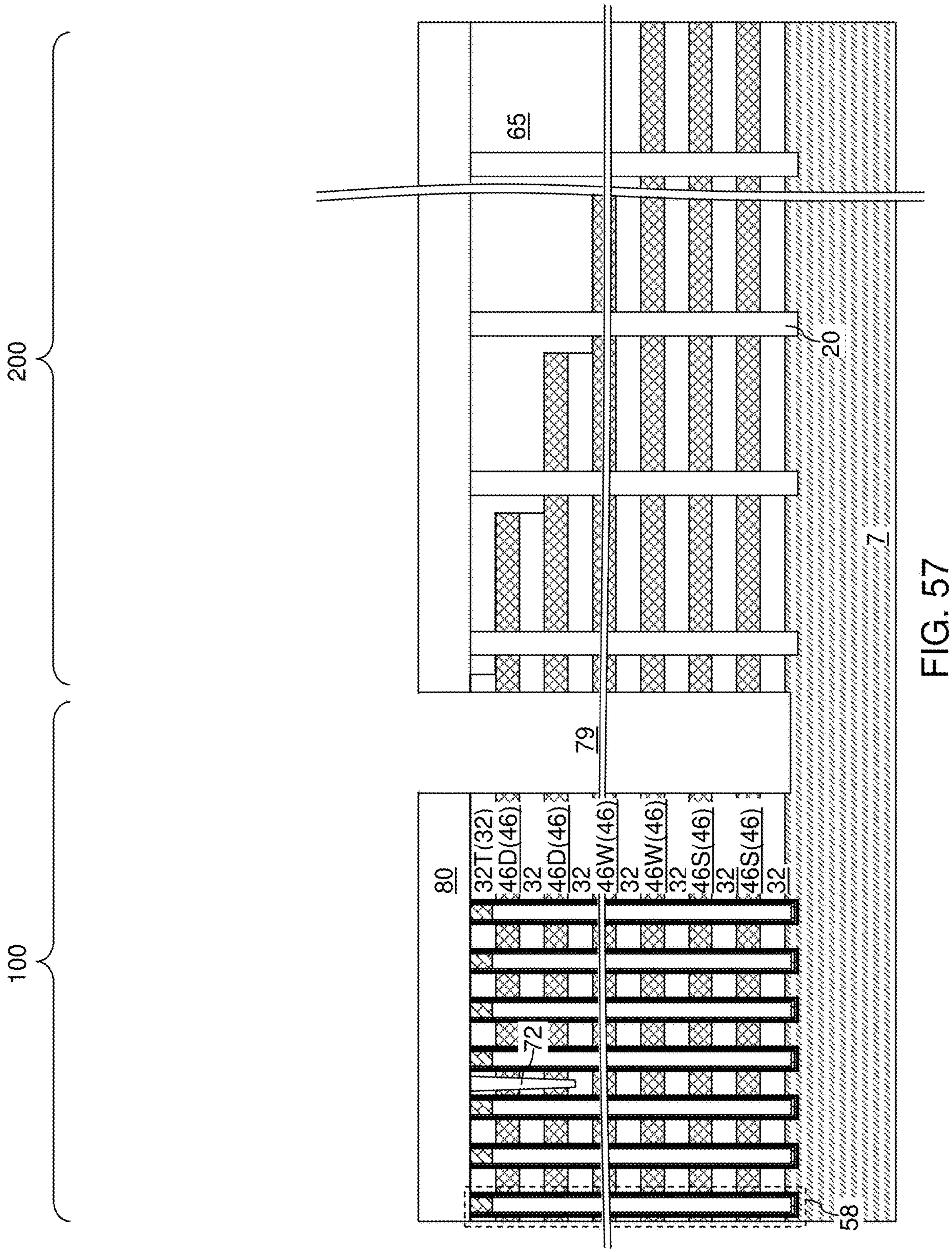
FIG. 57 is a schematic vertical cross-sectional view of the sixth exemplary structure after formation of electrically conductive layers according to an embodiment of the present disclosure.

Referring to FIG. 57, an optional outer blocking dielectric layer (not expressly illustrated in FIG. 57) can be optionally formed. The outer blocking dielectric layer, if present, comprises a dielectric material that functions as a control gate dielectric for the control gates to be subsequently formed in the lateral recesses 43. In case the blocking dielectric layer 52 is present within each memory opening, the outer blocking dielectric layer is optional. In case the blocking dielectric layer 52 is omitted, the outer blocking dielectric layer is present.

At least one conductive material can be deposited in the lateral recesses 43 by providing at least one reactant gas into the lateral recesses 43 through the access trenches 79 a plurality of electrically conductive layers 46 can be formed in the plurality of lateral recesses 43, as described above with respect to FIGS. 14A and 14B.

The electrically conductive layers 46 within each alternating stack (32, 46) comprise a plurality of word lines 46W that replace word-line-level sacrificial material layers 42W, at least one source-select-level electrically conductive layer 46S that replaces at least one source-select-level sacrificial material layer 42S, and at least one drain-select-level electrically conductive layer 46D that replaces at least one drain-select-level sacrificial material layer 42D. Each alternating stack (32, 46) is laterally bounded by and extends between a respective pair of backside trenches 79 (if present). Thus, each electrically conductive layer 46 and each insulating layer 32 within an alternating stack (32, 46) continuously extends between a respective pair of backside trenches 79. Alternatively, if the initial alternating stack comprises an alternating stack of insulating layers 32 and electrically conductive layers 46, then the sacrificial material layers 42 and the backside trenches 79 may be omitted.

Figure 58A:
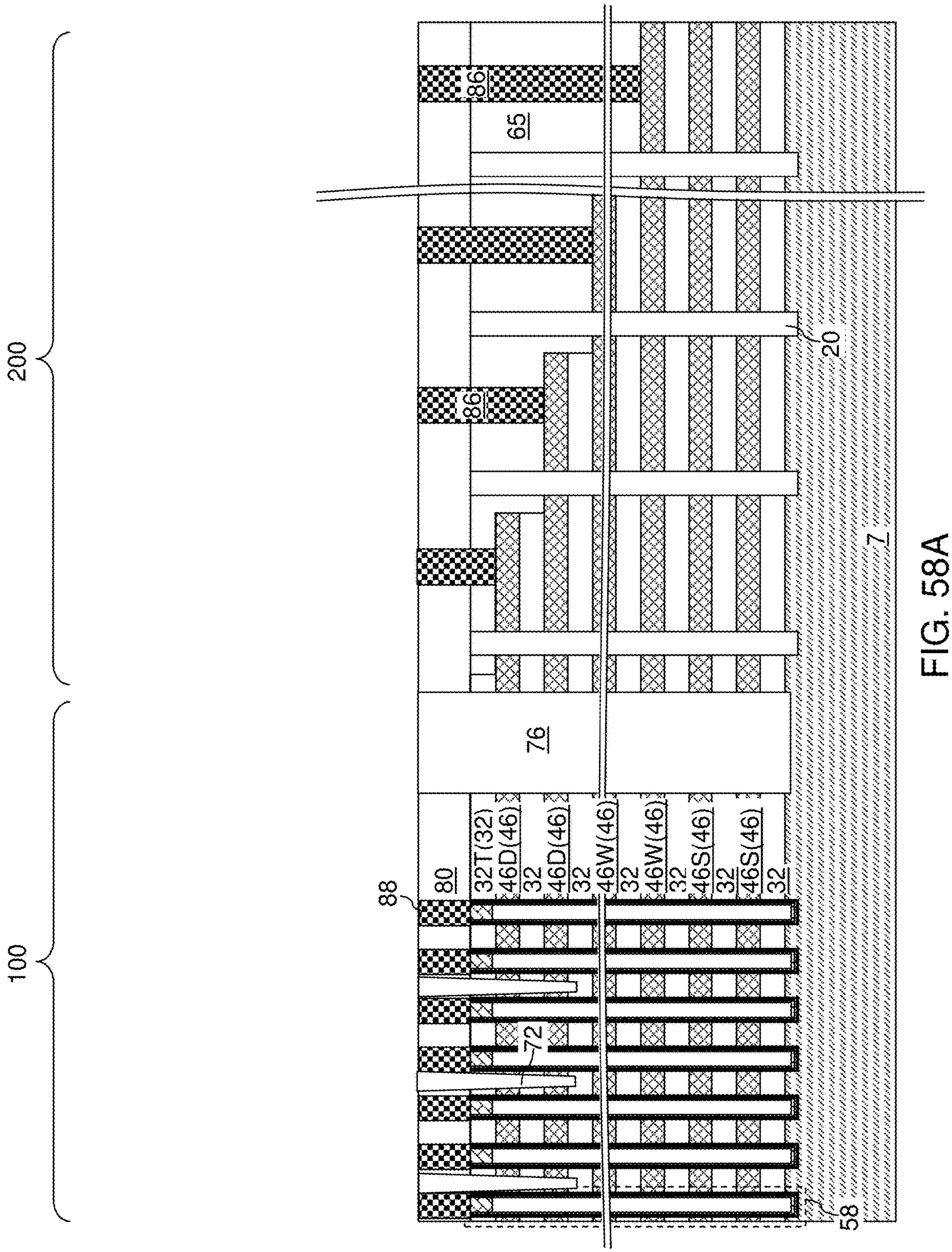
FIG. 58A is a vertical cross-sectional view of the sixth exemplary structure after formation of backside trench fill structures, layer contact via structures, and drain contact via structures according to an embodiment of the present disclosure.
Figure 58B:
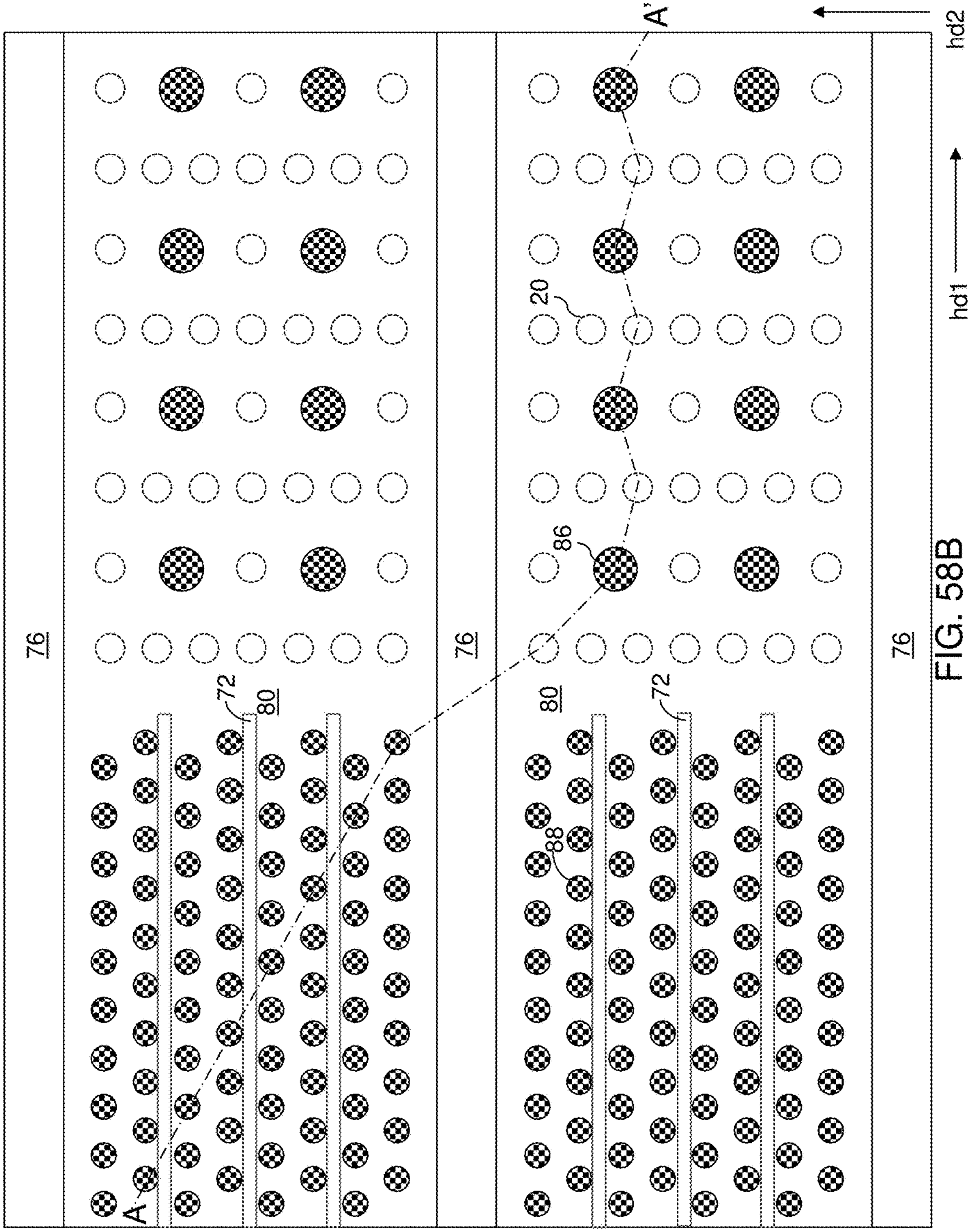
FIG. 58B is a top-down view of the sixth exemplary structure of FIG. 58A. The vertical plane A-A is the cut plane of the vertical cross-sectional view of FIG. 58A.

Referring to FIGS. 58A and 58B, a dielectric fill material such as silicon oxide can be deposited in the backside trenches 79. Excess portions of the dielectric fill material can be removed from above the contact-level dielectric layer 80. Each remaining portion of the dielectric fill material that fills a respective one of the backside trenches 79 constitutes a backside trench fill structure 76, as described above with respect to FIGS. 14A and 14B. In an alternative embodiment, an insulating spacer having a tubular configuration can be formed in peripheral portions of each of the backside trenches 79, and a through-stack conductive via structure may be formed within a respective one of the insulating spacers. In this case, each backside trench fill structure 76 may comprise a combination of a through-stack conductive via structure and an insulating spacer that laterally surrounds the through-stack conductive via structure.

For each alternating stack of insulating layers 32 and electrically conductive layers 46 that is laterally bound by a first backside trench 79 and a second backside trench 79, a first backside trench fill structure 76 and a second backside trench fill structure 76 are located in the first backside trench 79 and in the second backside trench 79, respectively. For each alternating stack of insulating layers 32 and electrically conductive layers 46, a plurality of drain-select-level dielectric isolation structures 72 can be formed through a subset of the electrically conductive layers 46 that is distal from the carrier substrate 7. The subset of the electrically conductive layers 46 through which the drain-select-level dielectric isolation structures 72 can be the drain-select-level electrically conductive layers 46D, and the discrete patterned strips of the drain-select-level electrically conductive layers 46D are herein referred to as drain-side select gate electrodes 46D. The plurality of drain-select-level dielectric isolation structures 72 and the backside trench fill structures 76 are herein collectively referred to as isolation structures (72, 76). The isolation structures (72, 76) laterally extend along the first horizontal direction hd1, and are laterally spaced from each other along the second horizontal direction hd2.

Within each alternating stack (32, 46), a plurality of drain-side select gate electrodes 46D can be laterally spaced apart from each other by the drain-select-level dielectric isolation structures 72. In one embodiment, each of the drain-side select gate electrodes 46D may be located between a respective neighboring pair of isolation structures (72, 76) that is selected from the plurality of drain-select-level dielectric isolation structures 72, the first backside trench fill structure 76, and the second backside trench fill structure 76. In one embodiment, each set of memory opening fill structures 58 laterally surrounded by a same drain-side select gate electrode 46D may constitute a block of memory opening fill structures 58. The total number of blocks of memory opening fill structures 58 between a neighboring pair of backside trench fill structures 76 may be in a range from 2 to 8, such as 4 to 6. The total number of rows of memory opening fill structures 58 per block may be in a range from 2 to 8, although a greater number of rows per bank may also be employed.

The first backside trench fill structure 76 and a second backside trench fill structure 76 laterally extend along the first horizontal direction hd1 and are laterally spaced from each other along the second horizontal direction hd2, and vertically extend from a bottommost surface of the alternating stack (32, 46) to a topmost surface of the alternating stack (32, 46). The first backside trench fill structure 76 comprises a first insulating sidewall and the second backside trench fill structure 76 comprises a second insulating sidewall. Each of the first insulating sidewall and the second insulating sidewall laterally extends along the first horizontal direction hd1 and contacts each layer within the alternating stack (32, 46). A plurality of drain-select-level dielectric isolation structures 72 laterally extends along the first horizontal direction hd1, are laterally spaced apart among one another along the second horizontal direction hd2, and are located between the first backside trench fill structure 76 and the second backside trench fill structure 76.

Contact via structures (88, 86) can be formed through the contact-level dielectric layer 80, and optionally through the retro-stepped dielectric material portion 65. For example, drain contact via structures 88 can be formed through the contact-level dielectric layer 80 on each drain region 63. Layer contact via structures 86 can be formed on the electrically conductive layers 46 through the contact-level dielectric layer 80, and through the retro-stepped dielectric material portion 65.

Figure 59A:
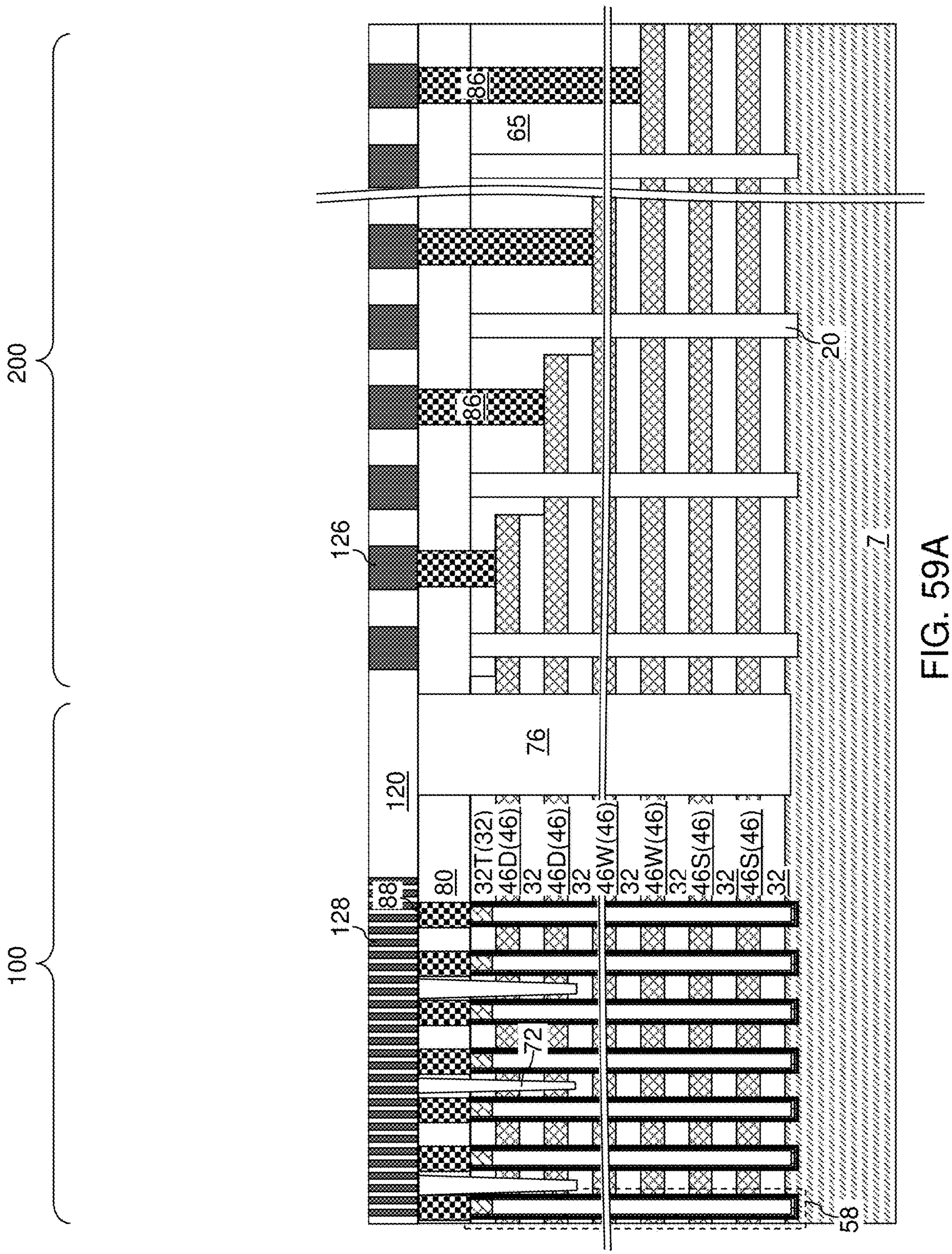
FIG. 59A is a vertical cross-sectional view of the sixth exemplary structure after formation of bit lines and bit-line-level metal interconnect structures according to an embodiment of the present disclosure.
Figure 59B:
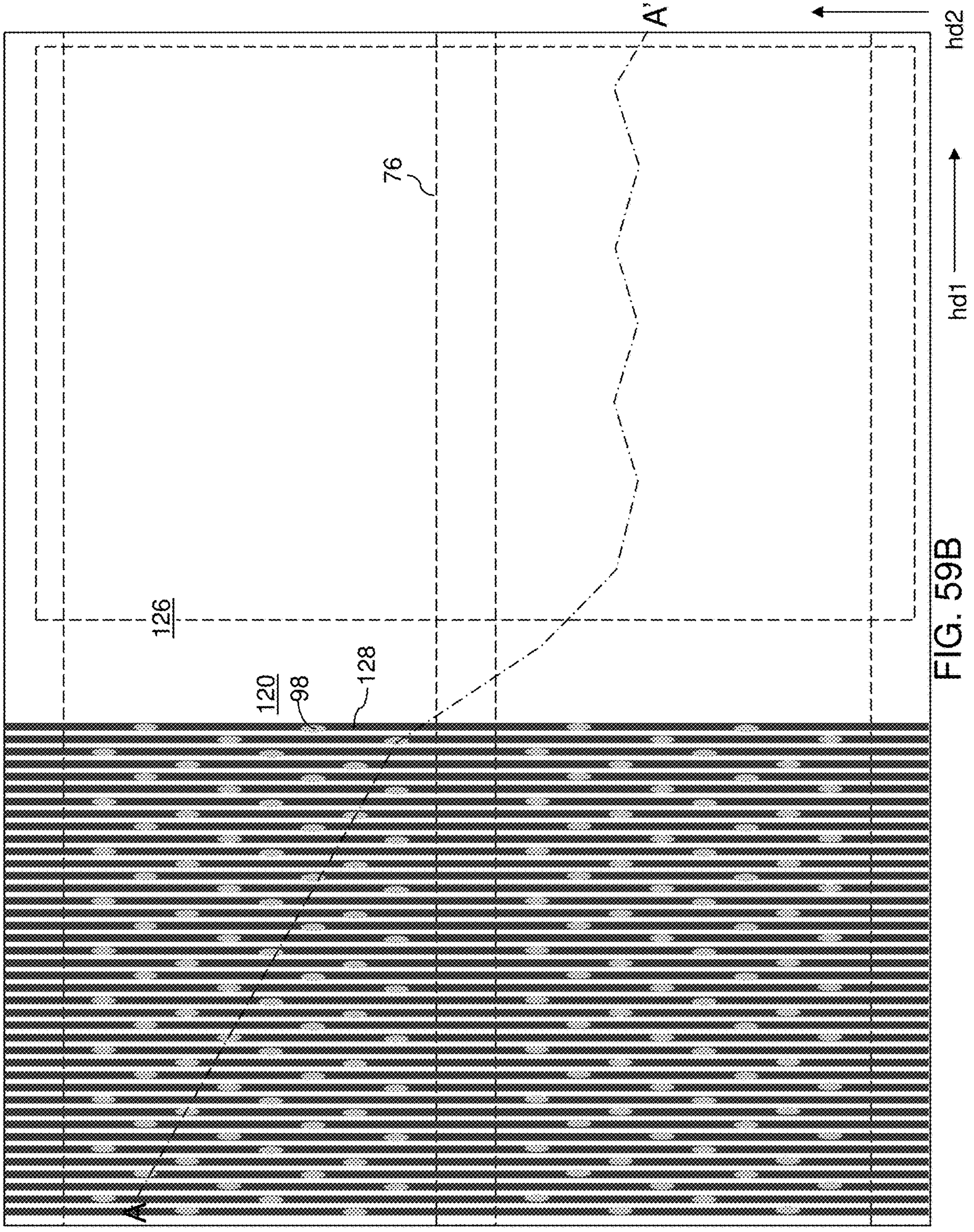
FIG. 59B is a top-down view of the sixth exemplary structure of FIG. 59A. The vertical plane A-A is the cut plane of the vertical cross-sectional view of FIG. 59A.

Referring to FIGS. 59A and 59B, a bit-line-level dielectric layer 120 can be formed above the contact-level dielectric layer 80. Bit-line-level line cavities can be formed through the bit-line-level dielectric layer 120, and can be filled with at least one conductive material (which may comprise at least one metallic material) to form bit-line-level metal lines (128, 126). The bit-line-level metal lines 128 may comprise bit lines that laterally extend along the second horizontal direction hd2, and bit-line-level interconnect metal lines 126 (not individually shown in FIG. 59B) that can be employed to provide electrical connection to the layer contact via structures 86.

Figure 60:
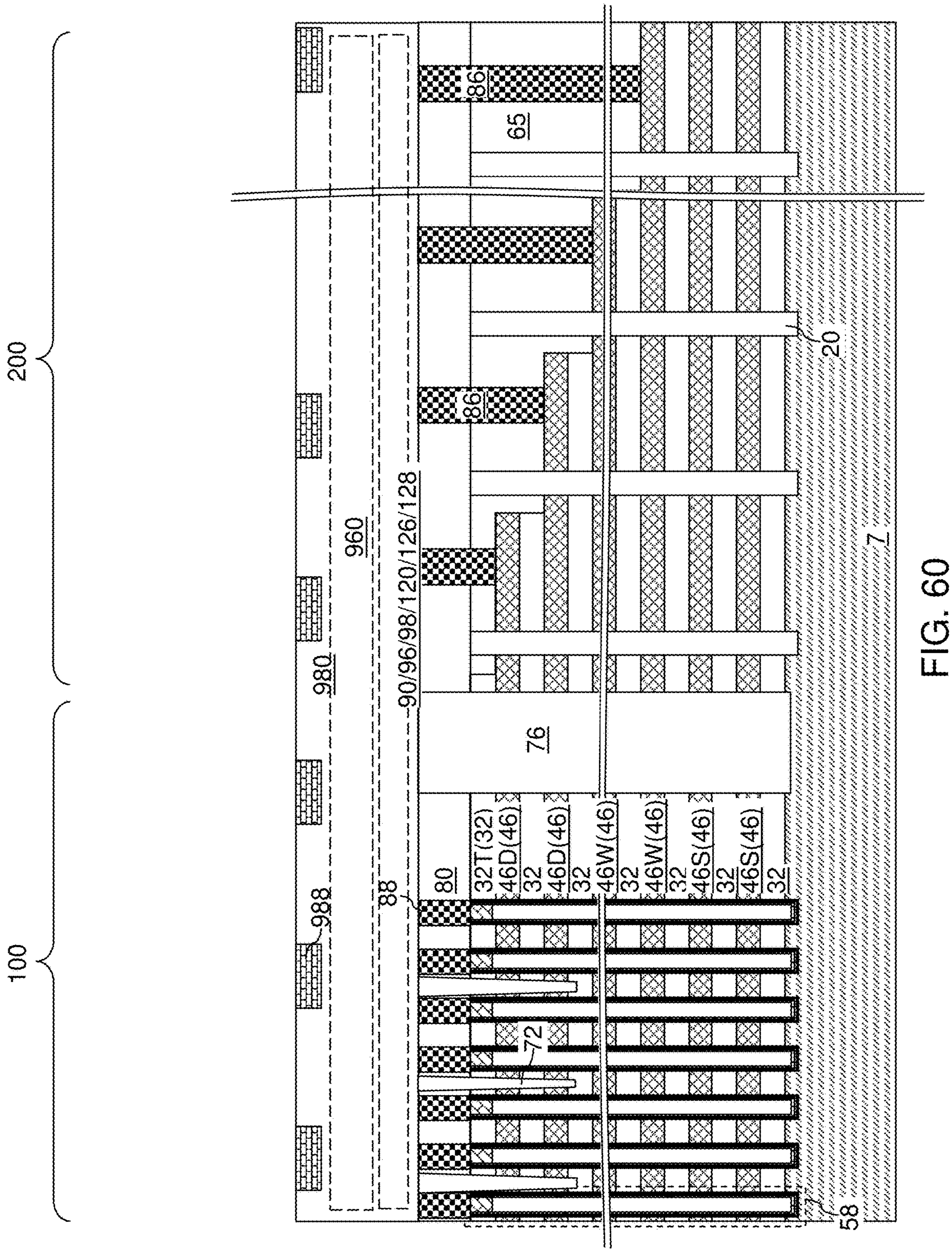
FIG. 60 is a vertical cross-sectional view of the sixth exemplary structure after formation of a memory die according to an embodiment of the present disclosure.

Referring to FIG. 60, additional dielectric material layers and additional metal interconnect structures can be formed over the bit-line-level dielectric layer 120. The additional dielectric material layers may include at least one via-level dielectric layer, at least one additional line-level dielectric layer, and/or at least one additional line-and-via-level dielectric layer. The additional metal interconnect structures may comprise metal via structures, metal line structures, and/or integrated metal line-and-via structures. The additional dielectric material layers that are formed above the contact-level dielectric layer 80 are herein referred to as memory-side dielectric material layers 960. The additional metal interconnect structures are collectively referred to as memory-side dielectric material layers 960. The memory-side dielectric material layers 960 comprise a bit-line-level dielectric material layer embedding bit lines, which are a subset of the memory-side metal interconnect structures 980.

Metal bonding pads, which are herein referred to as memory-side bonding pads 988, may be formed at the topmost level of the memory-side dielectric material layers 960. The memory-side bonding pads 988 may be electrically connected to the memory-side metal interconnect structures 980 and various nodes of the three-dimensional memory array including the alternating stacks of insulating layers 32 and electrically conductive layers 46 and the memory opening fill structures 58. A memory die 900 can thus be provided.

Figure 61:
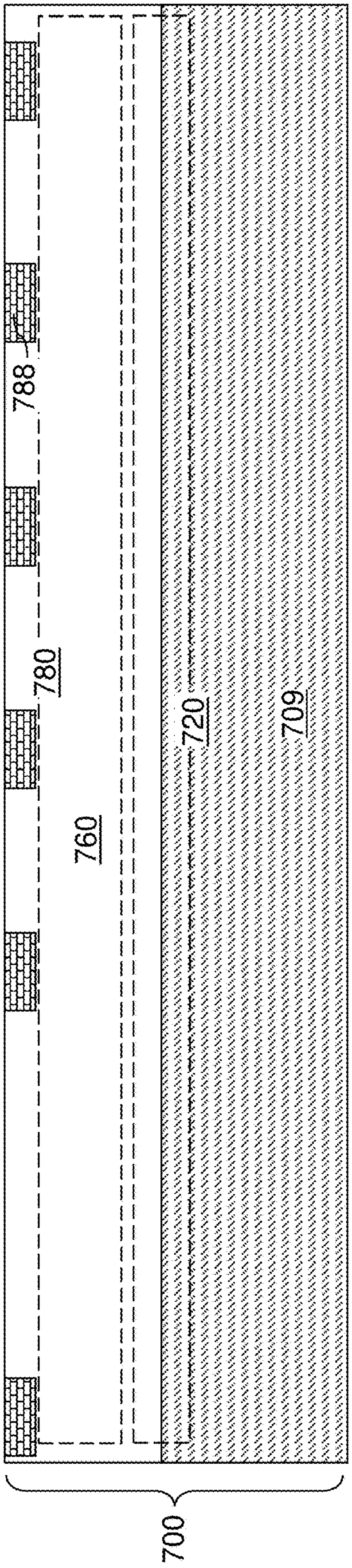
FIG. 61 is a vertical cross-sectional view of a logic die according to an embodiment of the present disclosure.

Referring to FIG. 61, a logic die 700 can be provided. The logic die 700 includes a logic-side substrate 709, a peripheral circuit 720 located on the logic-side substrate 709 and comprising logic-side semiconductor devices (such as field effect transistors), logic-side metal interconnect structures 780 embedded within logic-side dielectric material layers 760, and logic-side bonding pads 778. The peripheral circuit 720 can be configured to control operation of the memory array within the memory die 900. The peripheral circuit may be configured to operate the groups of memory opening fill structures 58 and the electrically conductive layers 46, and logic-side metal interconnect structures 780 and logic-side bonding pads 798 that are embedded in logic-side dielectric material layers 760. Specifically, the peripheral circuit 720 can be configured to drive various electrical components within the memory array including, but not limited to, the electrically conductive layers 46, the drain regions 63, and source layers to be subsequently formed. The peripheral circuit 720 can be configured to control operation of the vertical stack of memory elements in the memory array in the memory die 900.

Figure 62:
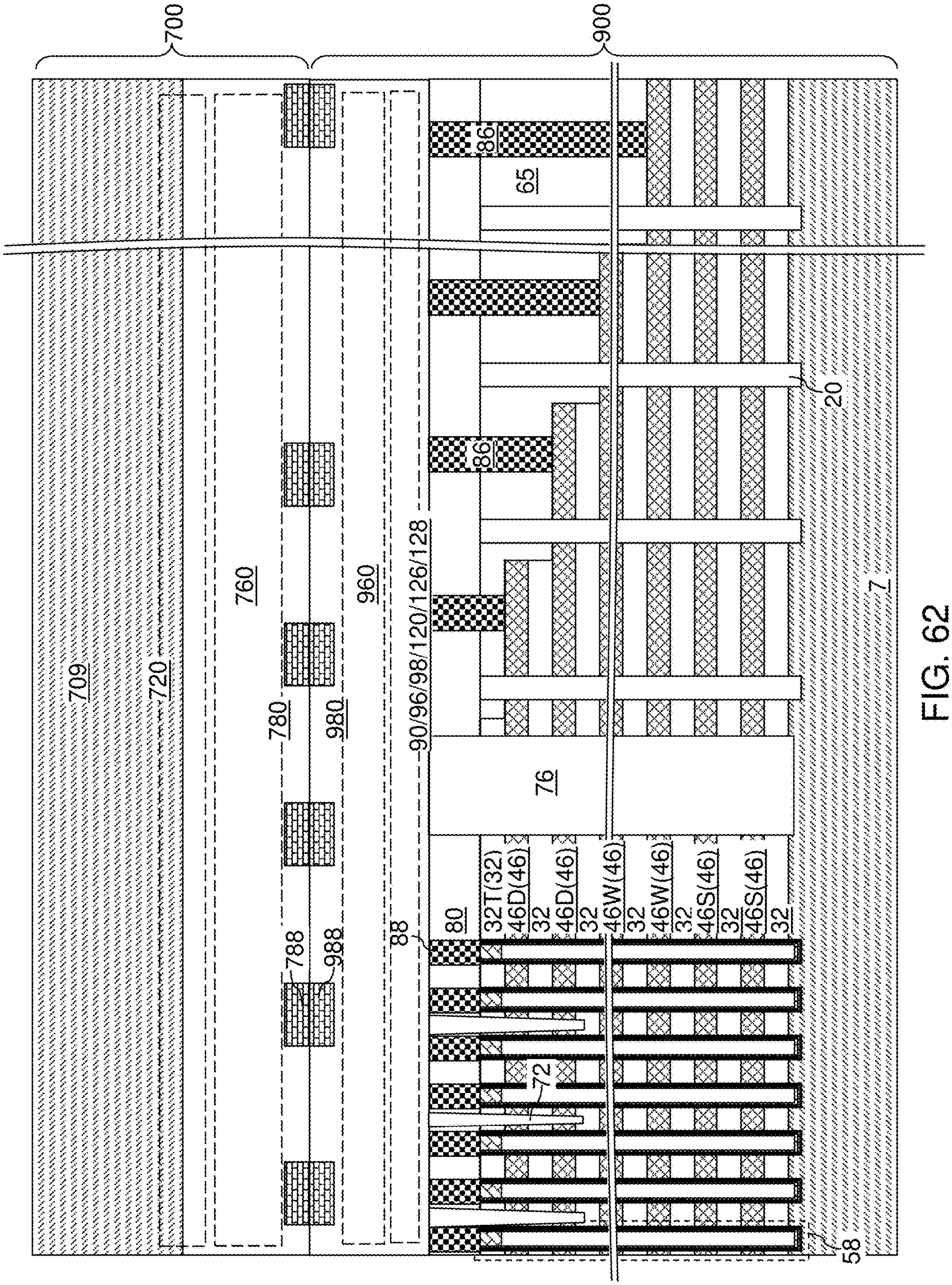
FIG. 62 is a vertical cross-sectional view of the sixth exemplary structure after attaching the logic die to the memory die according to an embodiment of the present disclosure.

Referring to FIG. 62, the logic die 700 can be bonded to the memory die 900, for example, by bonding the logic-side bonding pads 788 to the memory-side bonding pads 988. The bonding between the memory die 900 and the logic die 700 may be performed employing a wafer-to-wafer bonding process in which a two-dimensional array of memory dies 900 is bonded to a two-dimensional array of logic dies 700, by a die-to-bonding process, or by a die-to-die bonding process. The logic-side bonding pads 788 within each logic die 700 can be bonded to the memory-side bonding pads 988 within a respective memory die 900.

Figure 63:
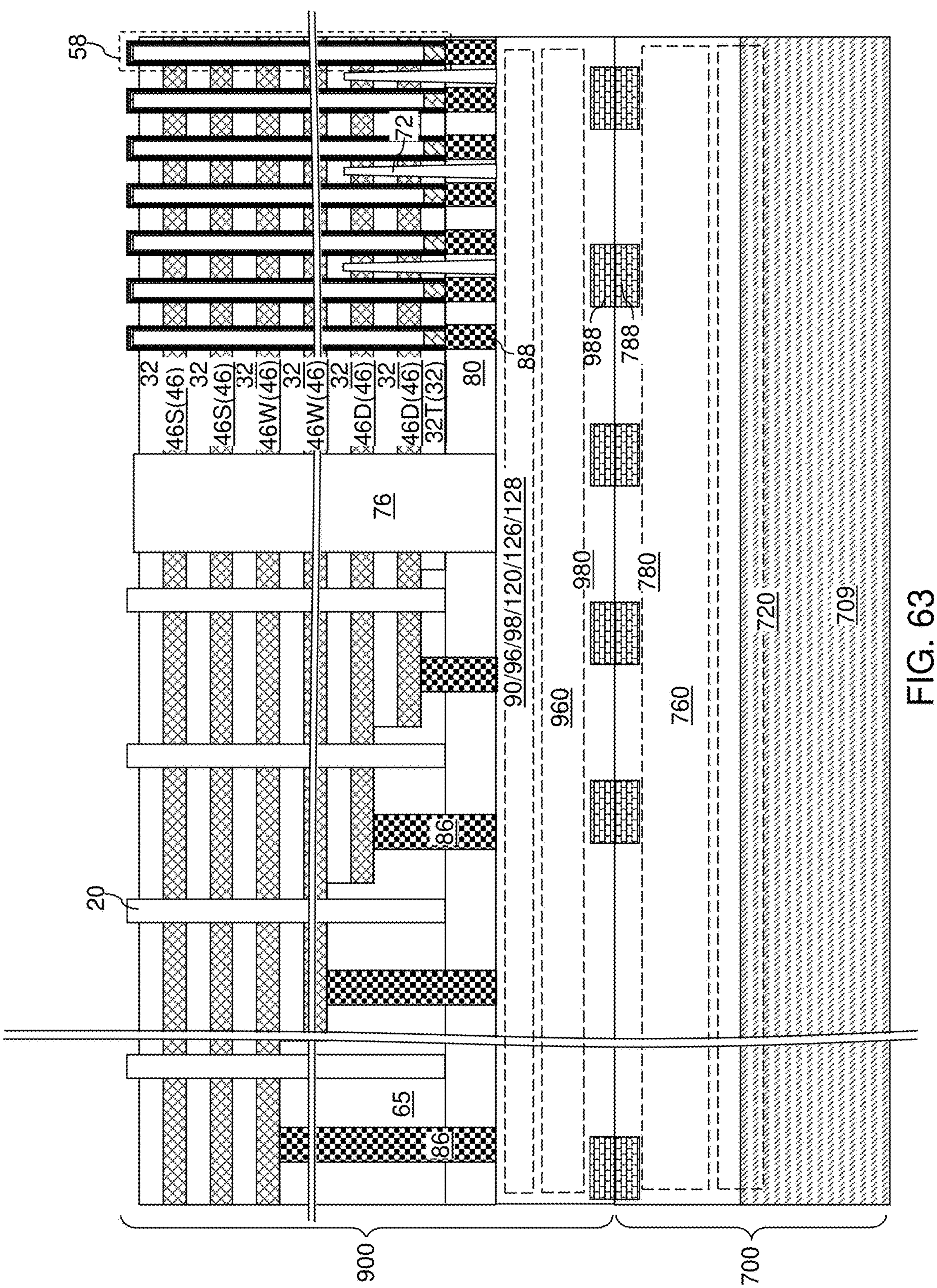
FIG. 63 is a vertical cross-sectional view of the sixth exemplary structure after removal of the carrier substrate according to an embodiment of the present disclosure.
Figure 64A:
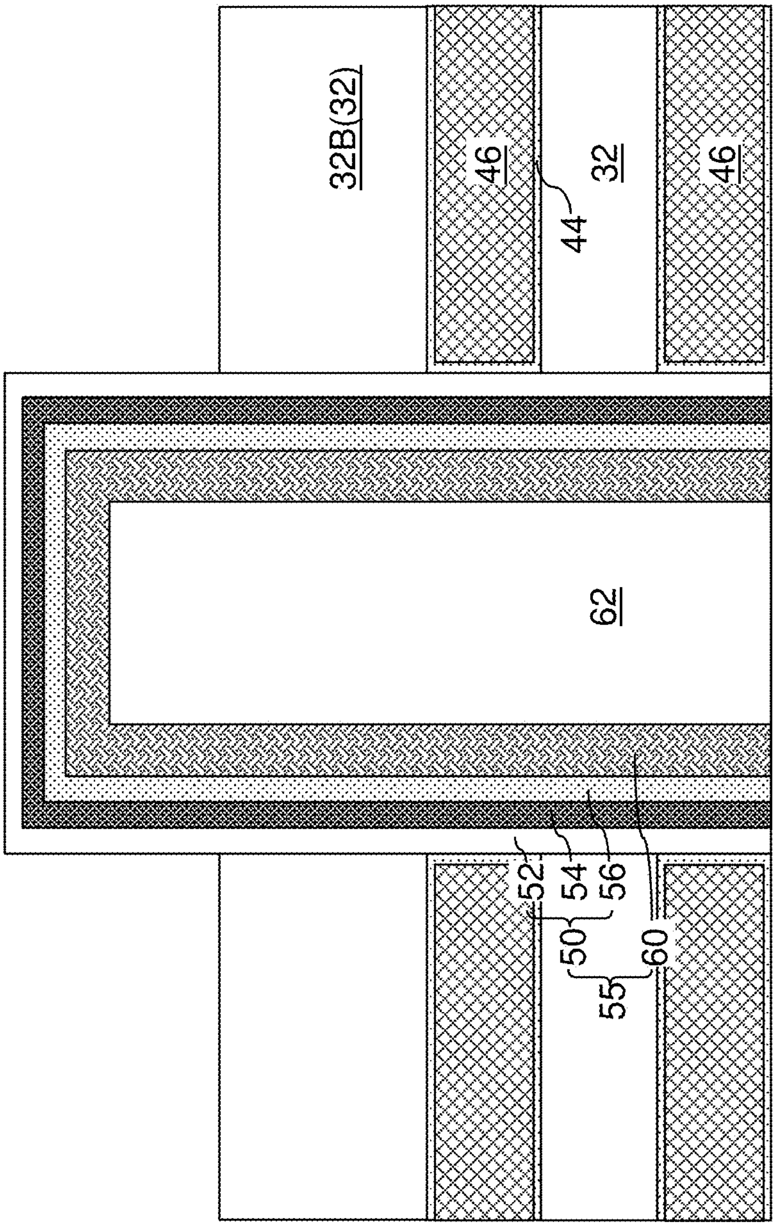
FIGS. 64A-64C are sequential vertical cross-sectional views of a region around an end portion of a memory opening fill structure during formation of a source layer according to an embodiment of the present disclosure.

Referring to FIGS. 63 and 64A, the carrier substrate 7 can be removed, for example, by grinding, polishing, cleaving, an isotropic etch process, and/or an anisotropic etch process. If a polishing process, such as a chemical mechanical polishing process, is employed to remove the carrier substrate 7, the bottommost insulating layer 32B may be employed as a polishing stopper material layer. If an etch process such as a wet etch process is employed to remove the carrier substrate 7, and the bottommost insulating layer 32B may be employed as an etch stop material layer.

In one embodiment, at least a terminal step of at least one removal process that is employed to remove the carrier substrate 7 may comprise a selective wet etch process that etches the semiconductor materials selective to dielectric materials of the memory films 50 and the dielectric cores 62. In an illustrative example, the terminal step of the at least one removal process may comprise a wet etch process using hot trimethyl-2 hydroxyethyl ammonium hydroxide ("hot TMY") or tetramethyl ammonium hydroxide (TMAH). The entirety of the carrier substrate 7 can be removed by the selective wet etch process. Backside end surfaces of the support pillar structures 20 can be physically exposed upon removal of the carrier substrate 7. A first end surface of the alternating stack (32, 46) and first end surfaces of the groups of memory opening fill structures 58 are exposed.

Figure 64B:
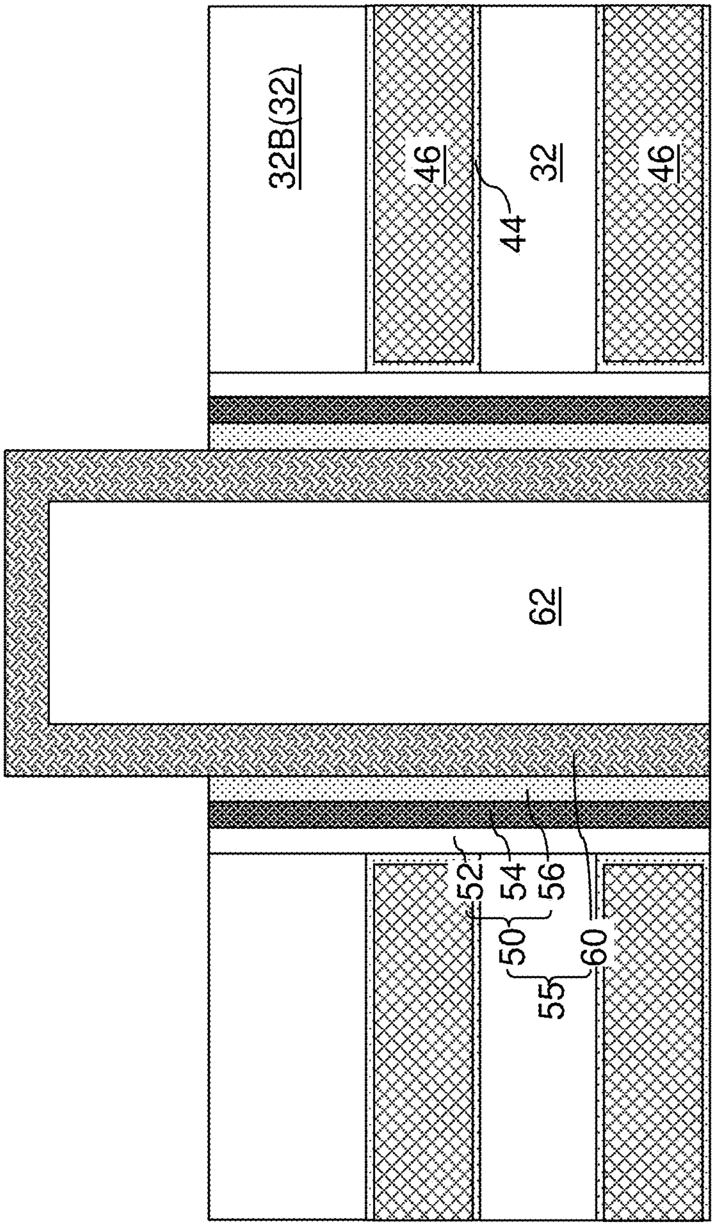

Referring to FIG. 64B, an end portion of each memory film 50 of each memory opening fill structure 58 can be removed by performing a series of etch processes. Specifically, an end portion of each memory film 50 can be removed, for example, by performing a first etch step that etches the material of the blocking dielectric layers 52, a second etch step that etches the material of the memory material layers 54, and a third etch step that etches the material of the dielectric liners 56 (which may comprise tunneling dielectric layers). In one embodiment, the series of etch processes may comprise a series of wet etch steps that sequentially etches the various layers of the memory films 50 from outside to inside. Proximal end portions of the vertical semiconductor channels 60 can be physically exposed.

Figure 64C:
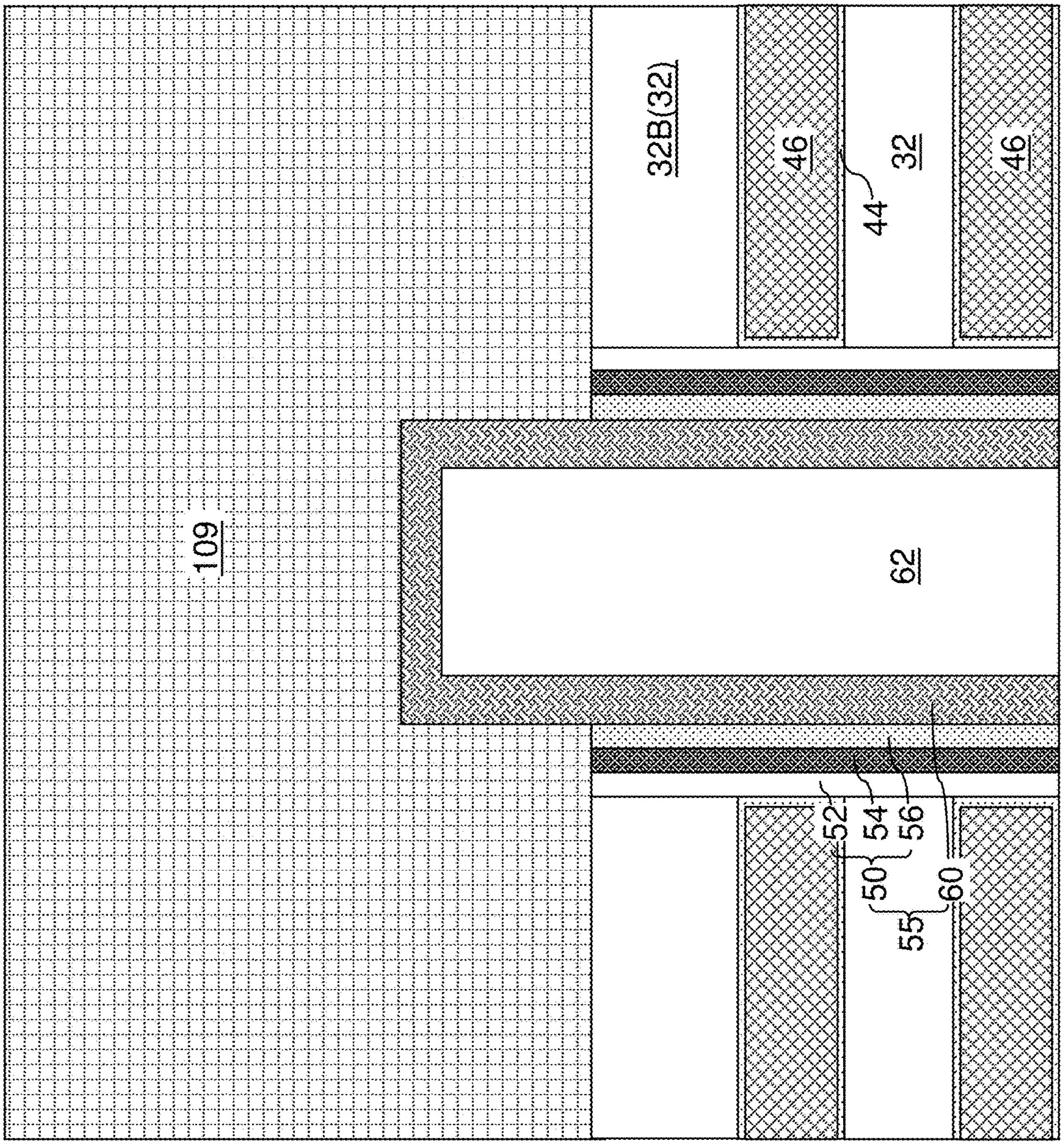
Figure 65:
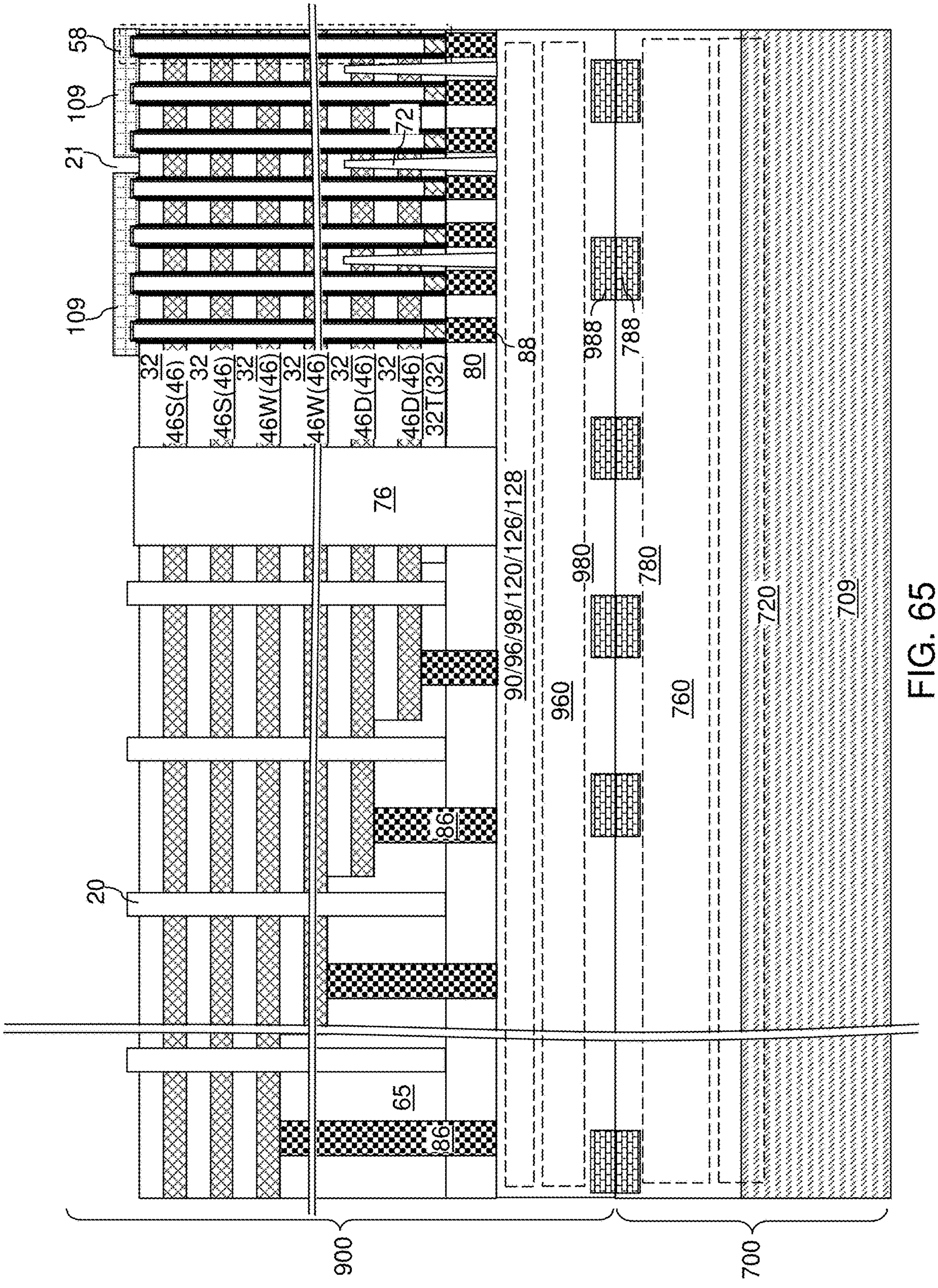
FIG. 65 is a vertical cross-sectional view of the sixth exemplary structure after formation of the source layers according to an embodiment of the present disclosure.

Referring to FIGS. 64C and 65, at least one conductive material can be deposited on physically exposed semiconductor surfaces of the vertical semiconductor channels 60, and can be subsequently patterned to form a plurality of source layers (which are also referred to as source lines) 109. The source layers 109 may comprise a heavily-doped semiconductor material and/or a metallic material. Generally, a source-level material layer is formed on the first end surface of the alternating stack (32, 46) and on the first end surfaces of the groups of memory opening fill structures 58. The source-level material layer may be patterned such that at least one cut (i.e., source-side trench 21) is formed though the source-level material layer within an area between each neighboring pair of a first backside trench fill structure 76 and a second backside trench fill structure 76. Various embodiments of the present disclosure provide various cut patterns for the source-level material layer, which are subsequently described with reference to accompanying circuit diagrams.

Figure 66:
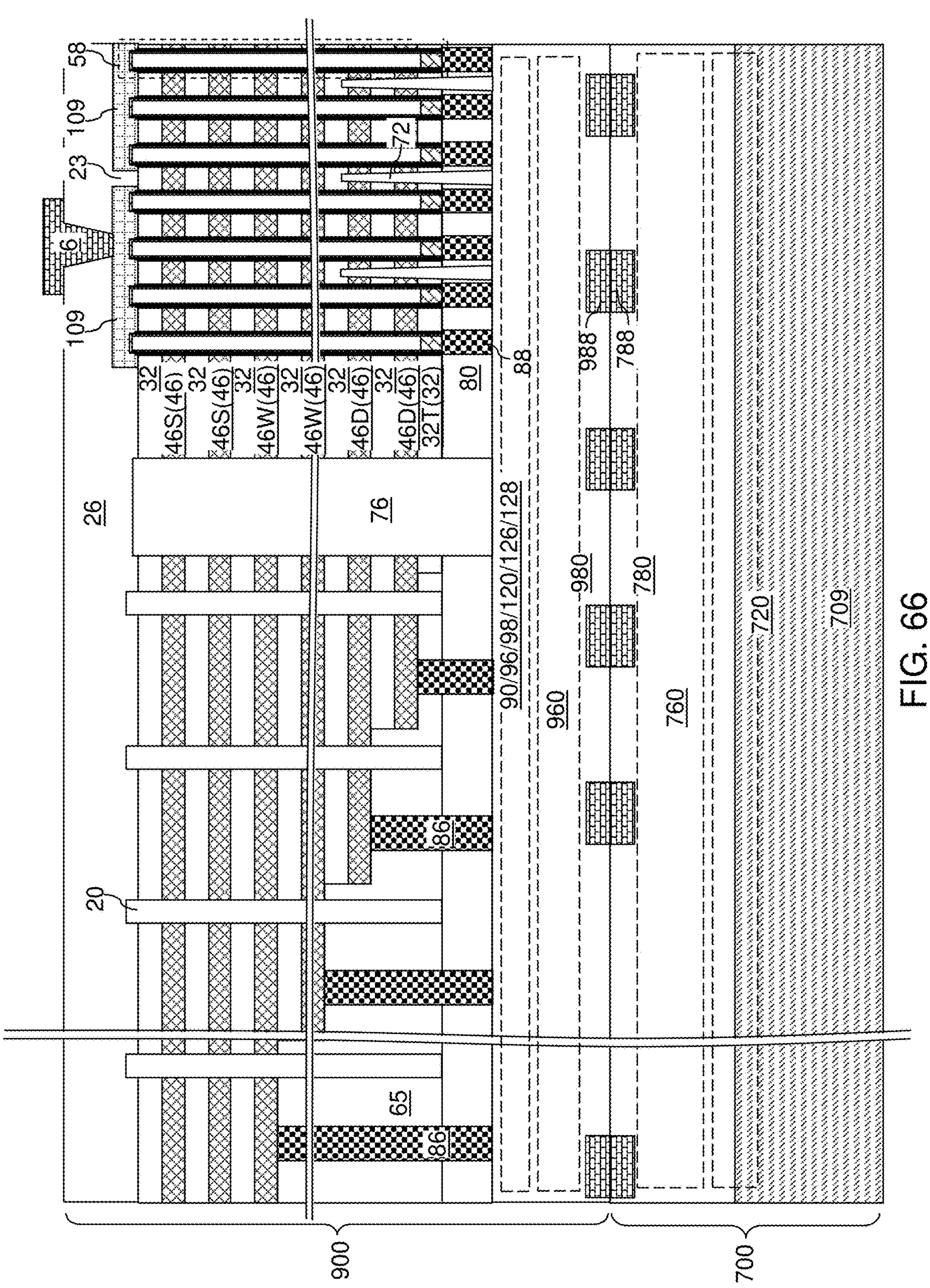
FIG. 66 is a vertical cross-sectional view of the sixth exemplary structure after formation of a backside dielectric layer and source contact structures to an embodiment of the present disclosure.

Referring to FIG. 66, a backside dielectric layer 26 and source contact structures 6 can be subsequently formed. The portions of the backside dielectric layer 26 which fills the cuts (e.g., the source-side trenches 21) comprise the source-level dielectric isolation structures 23. At least one source contact structure 6 can be formed on each source layer 109. Generally, the source layers 109 may comprise any material described with reference to previously described embodiments, such as a heavily-doped semiconductor material and/or at least one metallic material.

Figure 67A:
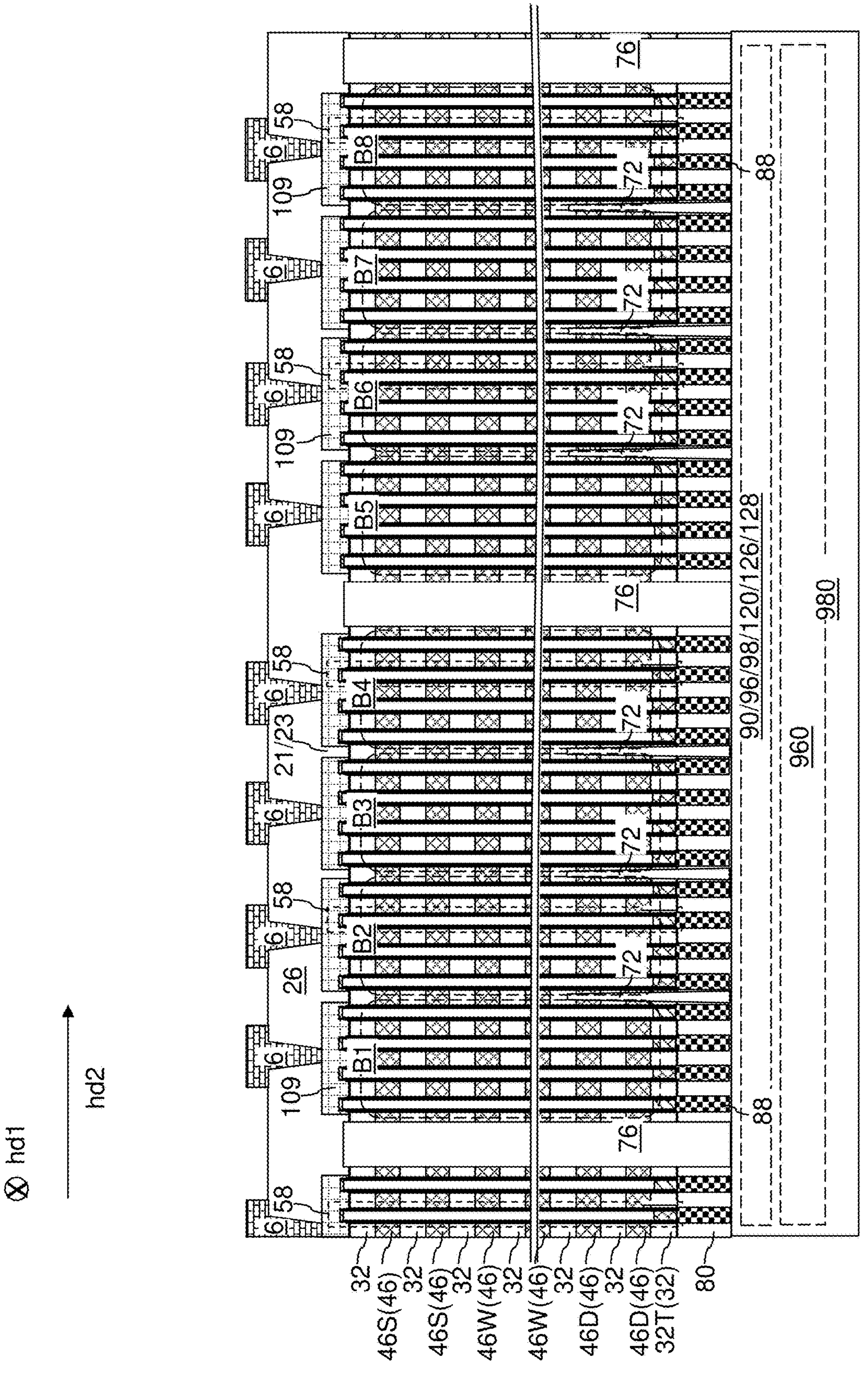
FIG. 67A is a schematic vertical cross-sectional view of a first configuration of the sixth exemplary structure according to an embodiment of the present disclosure.
Figure 67B:
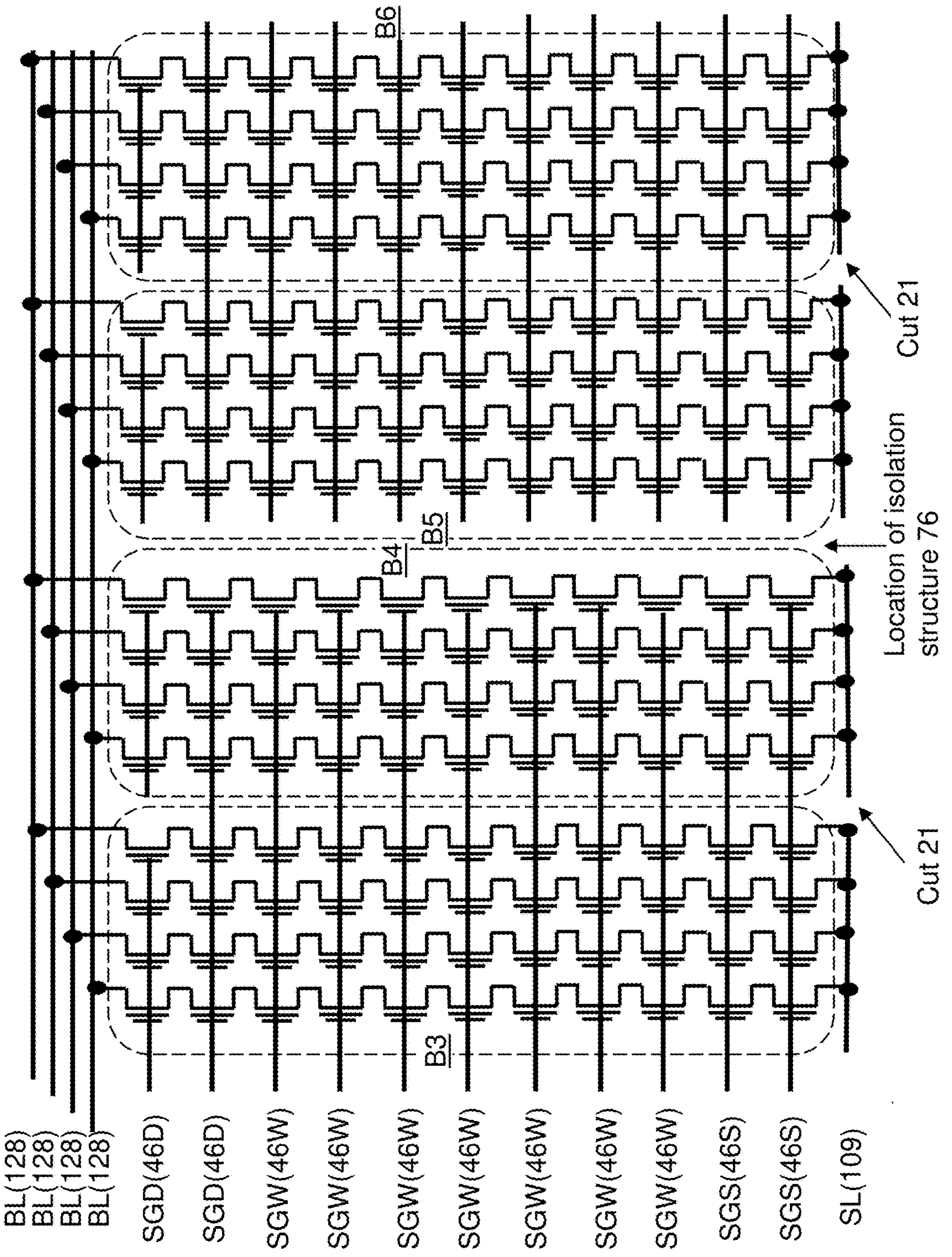
FIG. 67B is a circuit diagram of the semiconductor circuit which corresponds to the first configuration of the sixth exemplary structure of FIG. 67A.

Referring to FIGS. 67A and 67B, a schematic vertical cross-sectional view and a circuit diagram are shown for a first configuration of the sixth exemplary structure. The first configuration of the sixth exemplary structure includes string-by-string source line 109 separation.

Referring collectively to FIGS. 26A, 26B, 27, 67A, and 67B, a plurality of source lines 109 can be formed between a neighboring pair of backside trench fill structures 76. The source-select-level electrically conductive layers (146S, 46S) and the word lines (146W, 246W, 46W) are not patterned after bonding the memory die 900 to the logic die 700. Each source line 109 may have a respective uniform width along the second horizontal direction hd2. Each group of memory opening fill structures 58 controlled by a respective source line 109 constitutes a respective memory block (B1, B2, B3, B4, B5, B6, B7, B8) of memory opening fill structures 58.

For each alternating stack {(32, 46), (132, 146, 232, 246)} of insulating layers (32, 132, 232) and electrically conductive layers (46, 146, 246) located between a neighboring pair of backside trench fill structures 76, a plurality of source layers 109 laterally extend along the first horizontal direction hd1, are laterally spaced from each other along the second horizontal direction hd2, and contact the bottommost surface of the alternating stack {(32, 46), (132, 146, 232, 246)}. In one embodiment, each of the memory opening fill structures 58 comprises a respective vertical semiconductor channel 60; and each group of memory opening fill structures 58 comprises a respective group of vertical semiconductor channels 60 that contact a respective source layer 109 of the plurality of source layers 109 and does not contact any other source layer 109 among the plurality of source layers 109. The total number of the source layers 109 located on an alternating stack {(32, 46), (132, 146, 232, 246)} may be the same as or may be less than the total number of drain-side select gate electrodes (46D, 246D) located at a same level between the neighboring pair of backside trench fill structures 76.

For each alternating stack {(32, 46), (132, 146, 232, 246)} of insulating layers (32, 132, 232) and electrically conductive layers (46, 146, 246) located between a neighboring pair of backside trench fill structures 76, each group of memory opening fill structures 58 of the groups of memory opening fill structures 58 vertically extends through a respective drain-side select gate electrode (46D, 246D) of the plurality of drain-side select gate electrodes (46D, 246D) and does not extend through any other drain-side select gate electrode (46D, 246D) of the plurality of drain-side select gate electrodes (46D, 246D). In one embodiment, each source layer 109 of the plurality of source layers 109 contacts a respective group of memory openings fill structures 58 of the groups of memory opening fill structures 58 and does not contact any other group of memory opening fill structures 58 of the groups of memory opening fill structures 58. In one embodiment, the electrically conductive layers {46, (146, 246)} may comprise a source-side select gate electrode (46S, 146S) that is more proximal to the plurality of source layers 109 than any of the plurality of word lines (46W, 146W, 246W). The source-side select gate electrode (46S, 146S) continuously extends between the first backside trench fill structure 76 and the second backside trench fill structure 76.

While sixteen rows of memory opening fill structures 58 and four memory blocks (e.g., B1-B4) are shown between the first backside trench fill structure 76 and the second backside trench fill structure 76 in FIG. 67A, in other embodiments, there may be more or less than sixteen rows. For example, there may be thirty two rows of memory opening fill structures 58 located between the first backside trench fill structure 76 and the second backside trench fill structure 76. In this alternative embodiment, there may be eight memory blocks (e.g., B1-B8) located between the first backside trench fill structure 76 and the second backside trench fill structure 76. Each memory block (e.g., B1) may include four rows of memory opening fill structures 59. However, less and four or more than four rows of memory opening fill structures may be located in each memory block. Thus, the size of the memory blocks is reduced in this embodiment, and the blocks are operated by source line 109 bias adjustment.

FIG. 67C is table of voltages applied to bit lines 128 ("BL"), drain-side select gate electrodes (46D, 246D) ("SGD"), unselected word lines (46W, 146W, 246W) ("Un-Sel WL"), selected word lines (46W, 146W, 246W) ("Sel WL"), selected block source lines 109 ("Sel block SL"), and unselected block source lines 109 ("Un-Sel block SL") of the structure of FIG. 67A. Specifically, during reading, programming and erasing, the unselected block source lines 109 may be allowed to float.

Figure 68A:
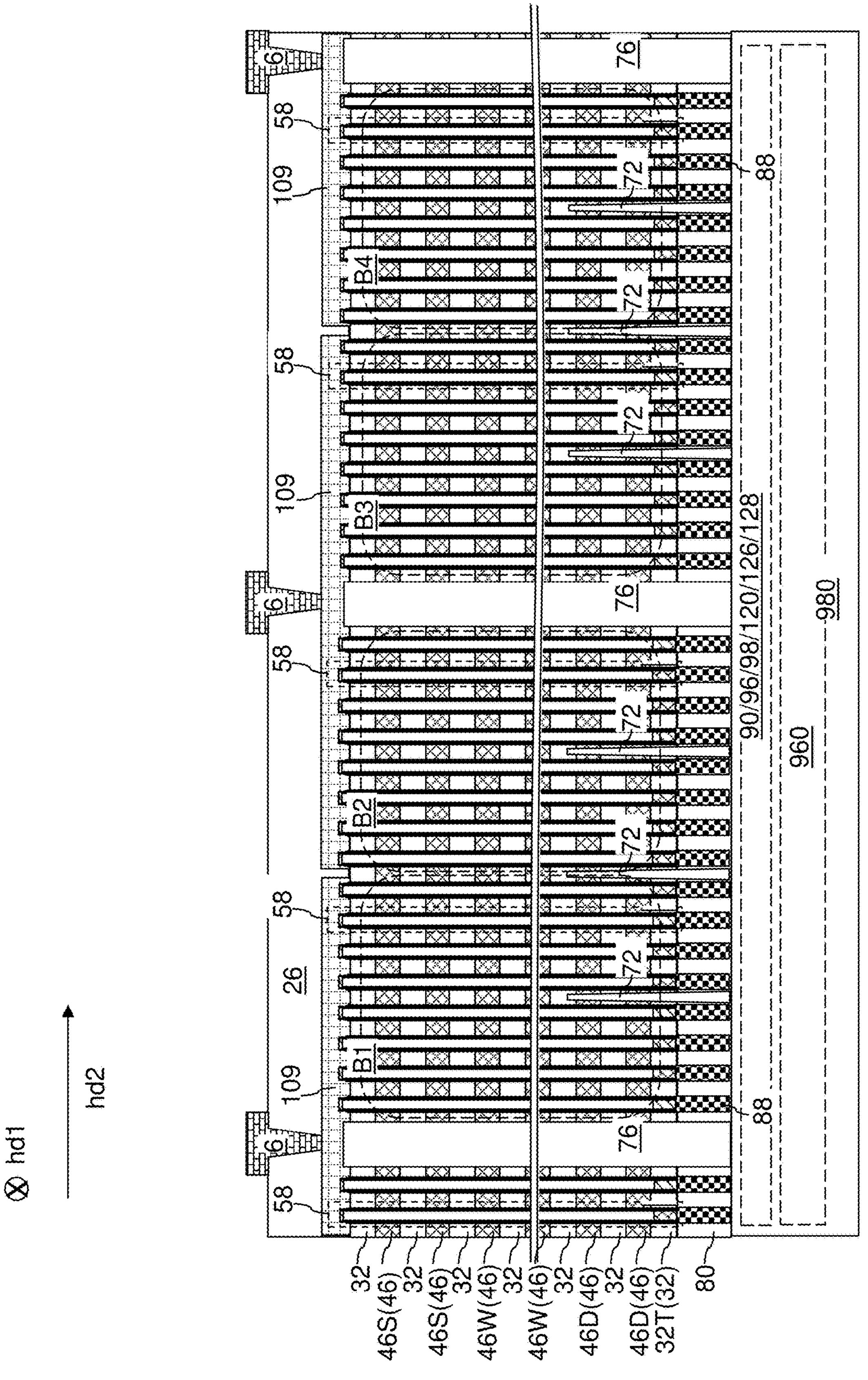
FIG. 68A is a schematic vertical cross-sectional view of a second configuration of the sixth exemplary structure according to an embodiment of the present disclosure.
Figure 68B:
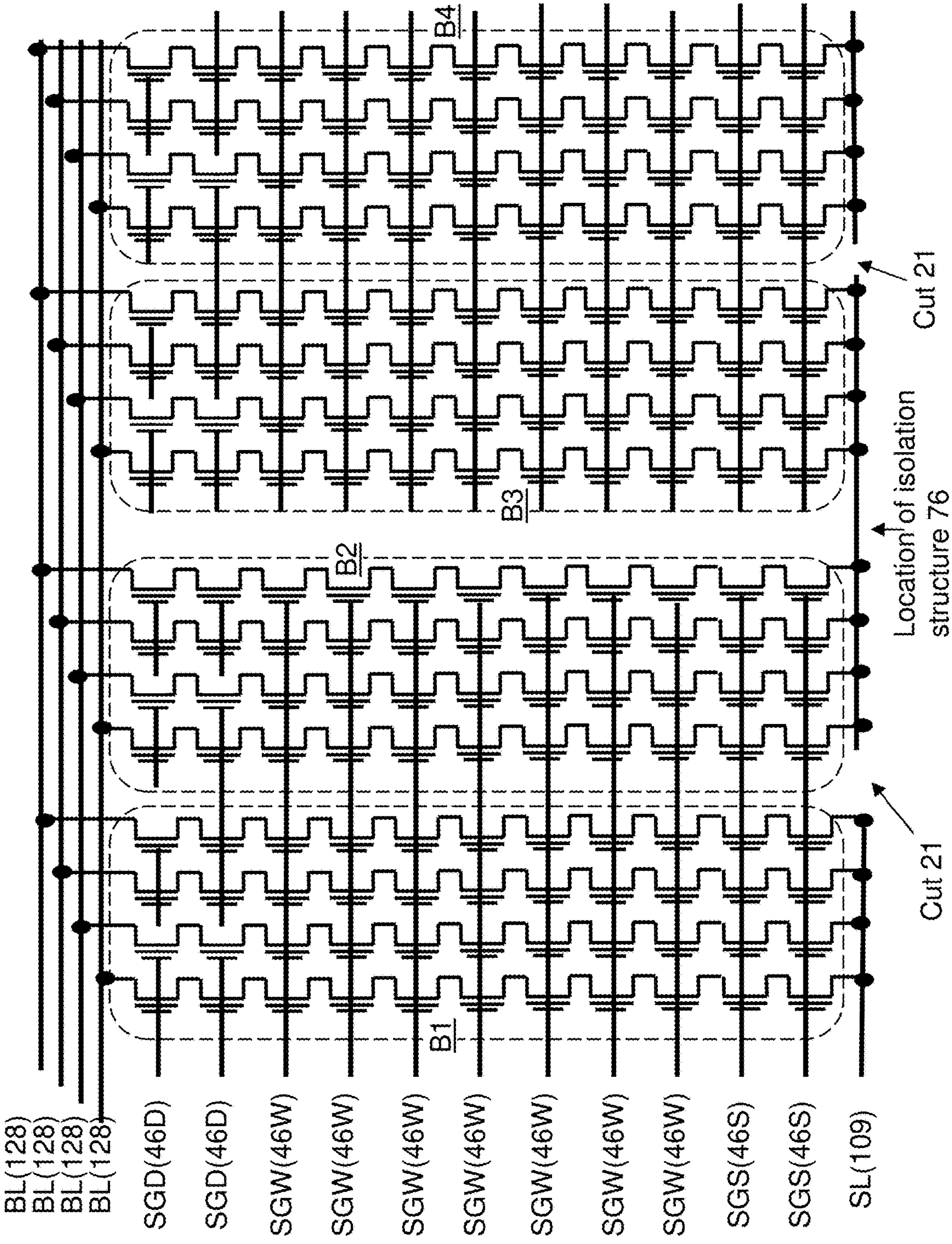
FIG. 68B is a circuit diagram of the semiconductor circuit which corresponds to the second configuration of the sixth exemplary structure of FIG. 68A.

Referring to FIGS. 68A and 68B, a schematic vertical cross-sectional view and a circuit diagram are shown for a second configuration of the sixth exemplary structure.

Referring collectively to FIGS. 20A, 20B, 68A, and 68B, for each alternating stack {(32, 46), (132, 146, 232, 246)} of insulating layers (32, 132, 232) and electrically conductive layers (46, 146, 246) located between a neighboring pair of backside trench fill structures 76, a plurality (e.g., two) of source layers 109 may be at least partly be present on a horizontal surface of the alternating stack {(32, 46), (132, 146, 232, 246)}. Each source layer 109 of the plurality of source layers 109 may contact a respective set of two or more groups of memory openings fill structures 58 of the groups of memory opening fill structures 58, where the respective set of two or more groups of memory opening fill structures 58 being less than an entirety of the groups of memory opening fill structures 58. Each group of memory opening fill structures 58 controlled by a respective source line 109 constitutes a respective memory block (B1, B2, B3, B4) of memory opening fill structures 58.

For an alternating stack {(32, 46), (132, 146, 232, 246)} of insulating layers (32, 132, 232) and electrically conductive layers (46, 146, 246) located between a neighboring pair of backside trench fill structures 76, an additional alternating stack {(32, 46), (132, 146, 232, 246)} of additional insulating layers {32, (132, 232)} and additional electrically conductive layers {46, (146, 246)} may be located laterally adjacent to the alternating stack {(32, 46), (132, 146, 232, 246)}. At least one of the source lines 109 partially overlaps two laterally alternating stacks, and is located above or below portions of two alternating stacks above or below the first or the second backside trench fill structure 76. Thus, each source line 109 controls memory blocks in adjacent alternating stacks separated by a backside trench fill structure.

The additional insulating layers {32, (132, 232)} and the additional electrically conductive layers {46, (146, 246)} are interlaced along a vertical direction within the additional alternating stack {(32, 46), (132, 146, 232, 246)}. The additional alternating stack {(32, 46), (132, 146, 232, 246)} is laterally spaced from the alternating stack {(32, 46), (132, 146, 232, 246)} along the second horizontal direction hd2 by the second backside trench fill structure 76. A source layer 109 of the plurality source layers 109 laterally extends over or under the second backside trench fill structure 76 and contacts a proximal surface of the additional alternating stack {(32, 46), (132, 146, 232, 246)}. An additional group of memory opening fill structures 58 vertically extends through the additional alternating stack {(32, 46), (132, 146, 232, 246)} and contacts the source layer 109.

FIG. 68C is table of voltages applied to bit lines 128 ("BL"), drain-side select gate electrodes (46D, 246D) ("SGD"), unselected word lines (46W, 146W, 246W) ("Un-Sel WL"), selected word lines (46W, 146W, 246W) ("Sel WL"), selected block source lines 109 ("Sel block SL"), and unselected block source lines 109 ("Un-Sel block SL") of the structure of FIG. 68A.

FIG. 69A-69D are sequential schematic vertical cross-sectional views of a third configuration of the sixth exemplary structure during formation according to an embodiment of the present disclosure.

Figure 69A:
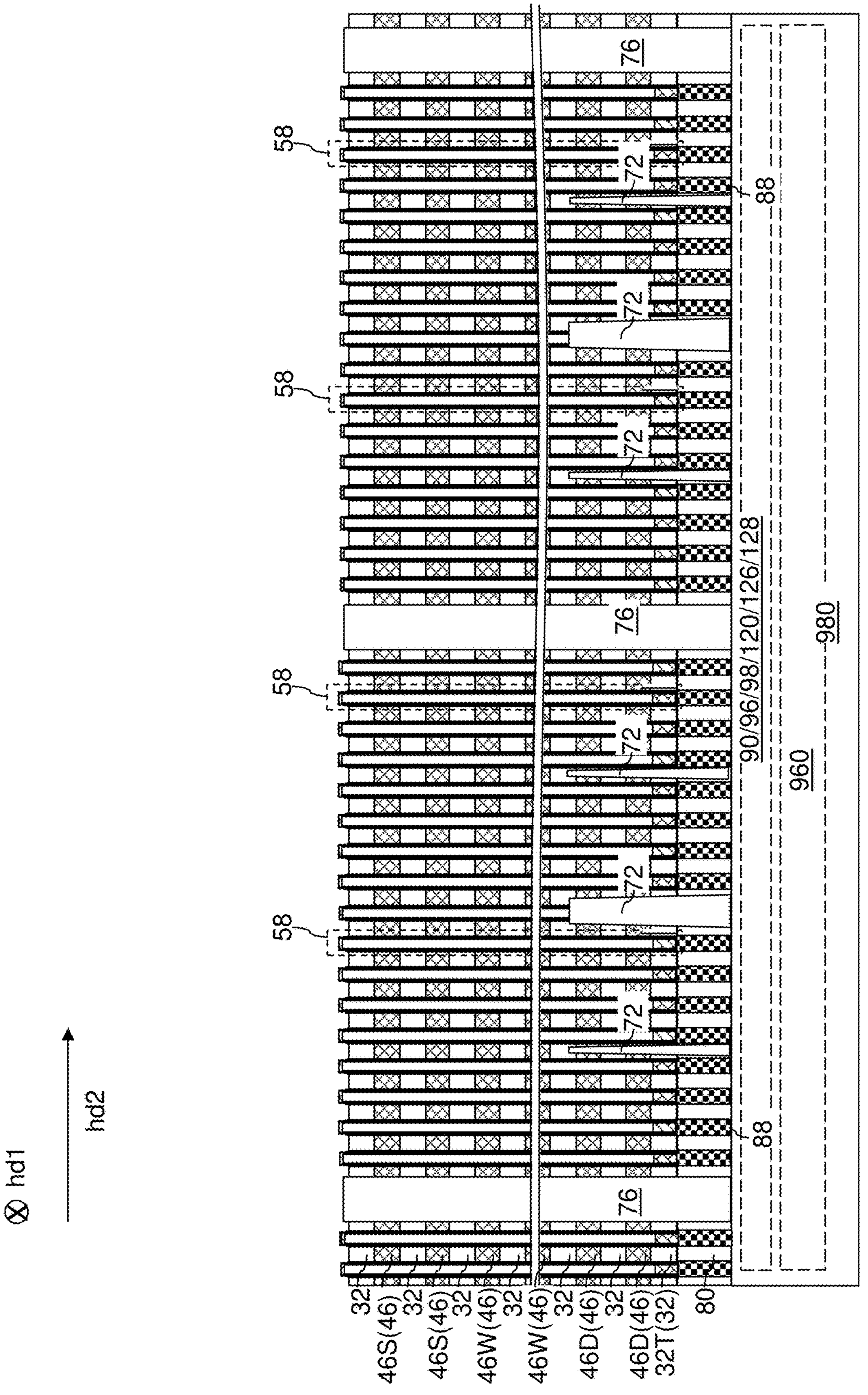
FIG. 69A-69D are sequential schematic vertical cross-sectional views of a third configuration of the sixth exemplary structure during formation according to an embodiment of the present disclosure.

Referring to FIG. 69A, the third configuration of the sixth exemplary structure is illustrated after removing the carrier substrate 7. In this embodiment, rows of dummy memory opening fill structures 58D may be provided. Dummy memory opening fill structures 58D are not used to store data. A subset of the drain-select-level dielectric isolation structures 72 may cut into a respective row of dummy memory opening fill structures 58D.

Figure 69B:
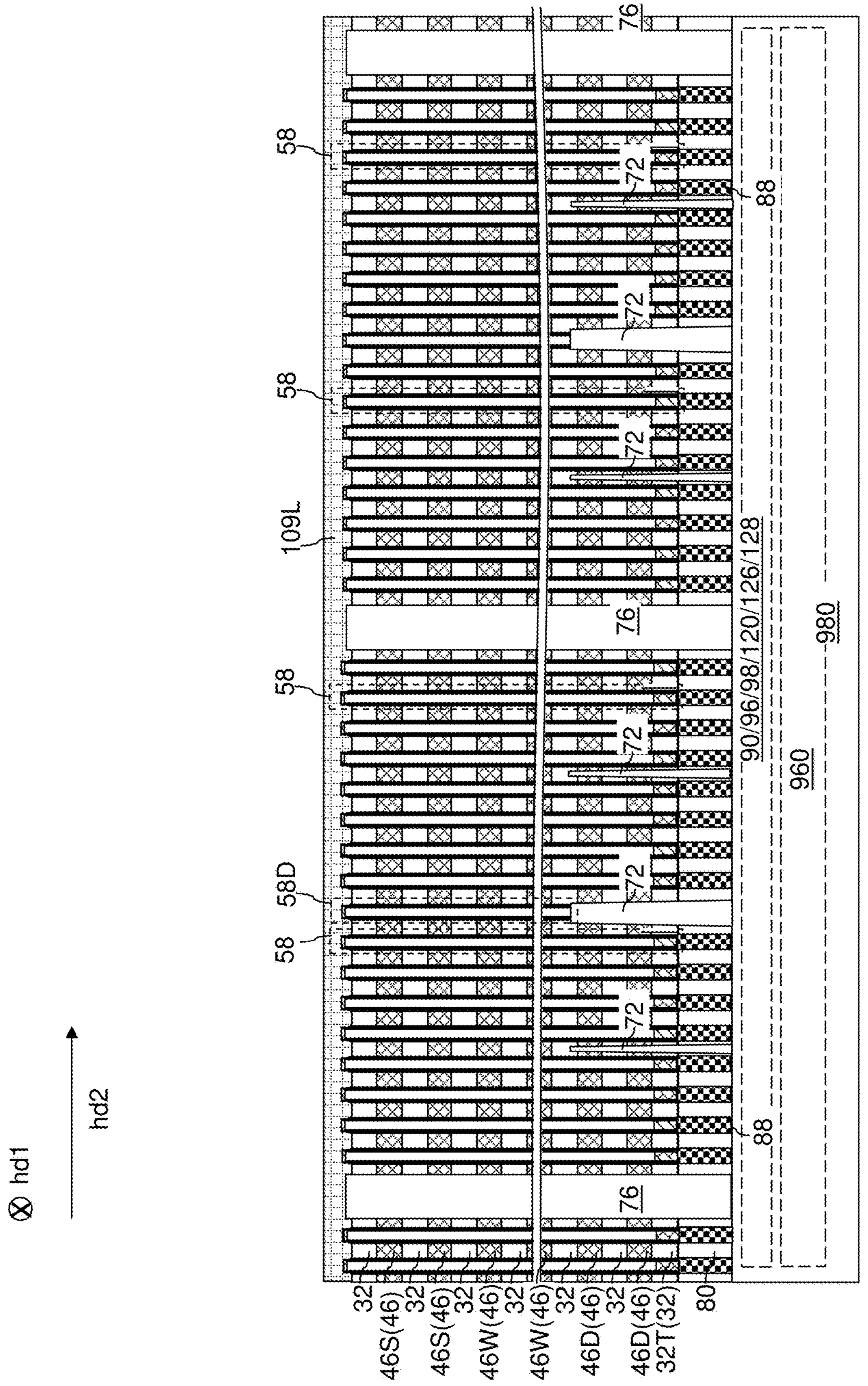

Referring to FIG. 69B, the processing steps described with reference to FIGS. 64B and 64C can be performed to form a source-level material layer 109L.

Figure 69C:
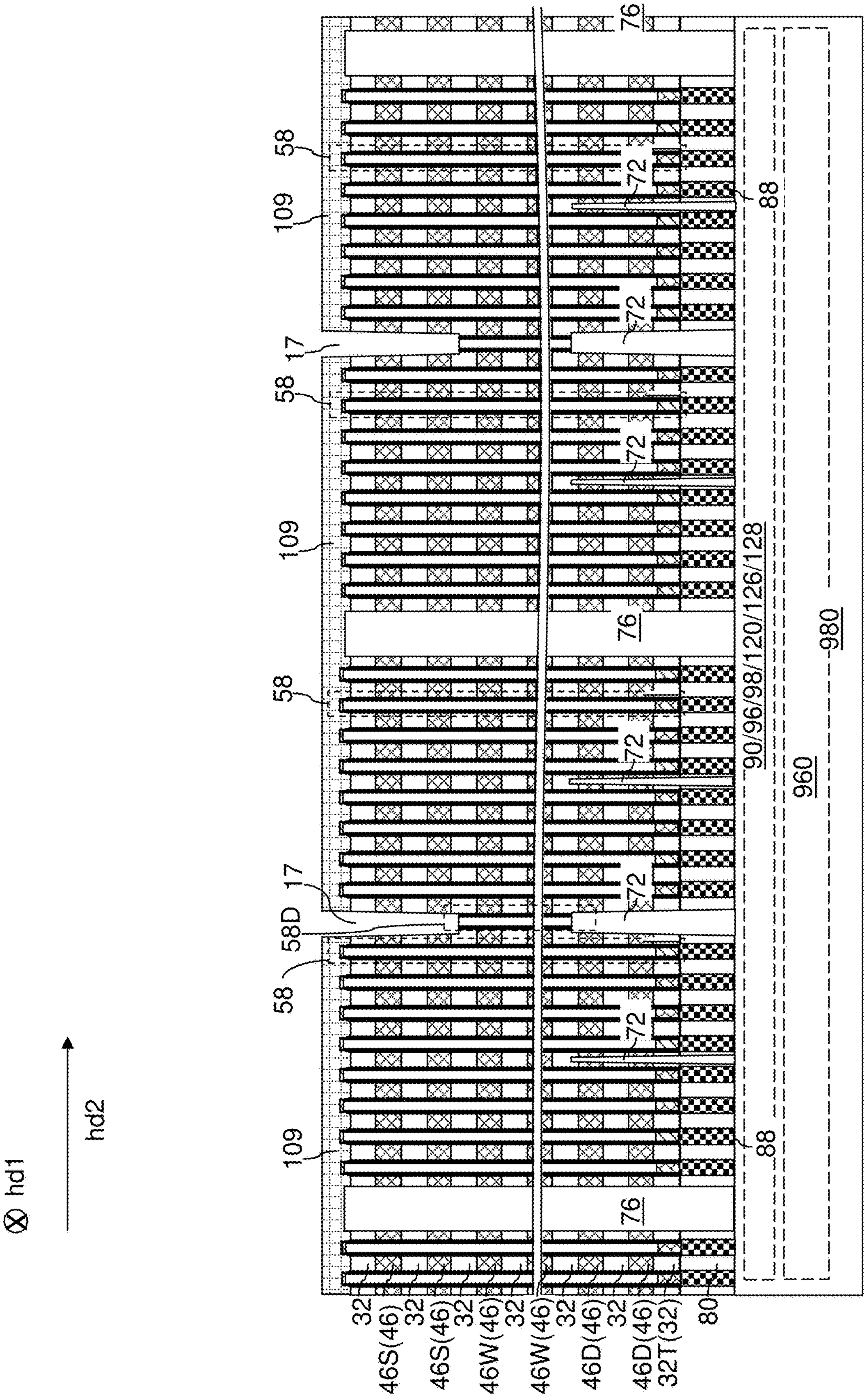

Referring to FIG. 69C, at least one of the electrically conductive layers {46, (146, 246)} can be cut into a respective plurality of source-side select gate electrodes (46S, 146S). Generally, patterning at least one of the electrically conductive layers {46, (146, 246)} into a respective plurality of source-side select gate electrodes (46S, 146S) may be performed after removal of the substrate and prior to or concurrently with patterning of the source-level material layer 109L while not patterning any word lines (46W, 146W, 246W). In the illustrated embodiment, the source-level material layer 109L and at least one of the electrically conductive layers {46, (146, 246)} (which includes at least one source-select-level electrically conductive layer (46S, 146S)) are concurrently patterned by forming cuts (e.g., source-select-level trenches 17) through the source-level material layer 109L and the at least one of the electrically conductive layers {46, (146, 246)} (i.e., the at least one source-select-level electrically conductive layer (46S, 146S)).

Figure 69D:
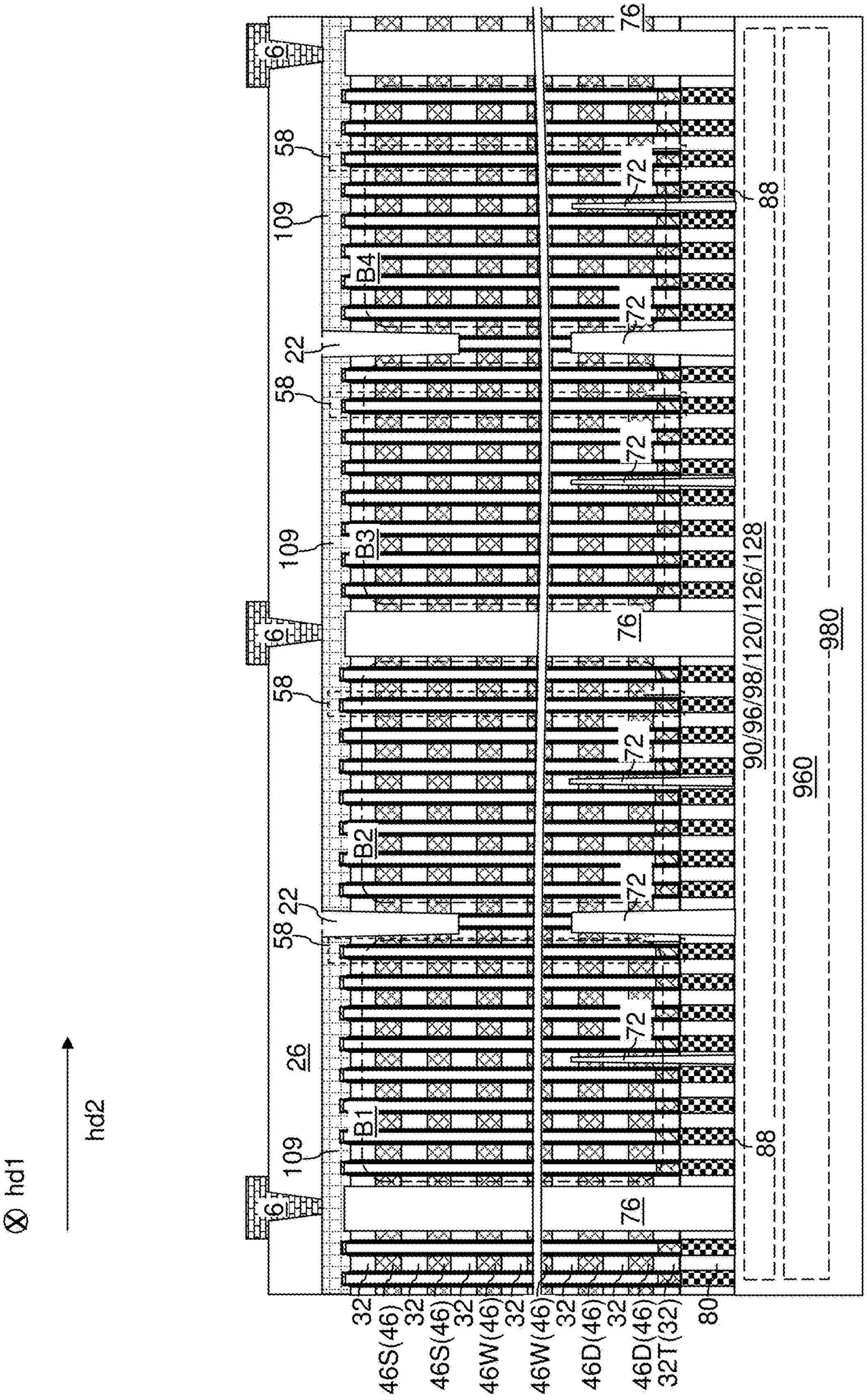

Referring to FIG. 69D, a dielectric fill material can be deposited in the source-select-level trenches 17 to form shallow trench isolation structures 22. A horizontally-extending portion of the deposited dielectric fill material forms a backside dielectric layer 26. A source contact structure 6 can be formed through the backside dielectric layer 26 on a backside surface of a respective one of the source layers 109. In this case, a shallow trench isolation structure 22 may be located between and may contact a neighboring pair of source layers 109 of the plurality of source layers 109 and may extend into the alternating stack {(32, 46), (132, 146, 232, 246)}. The electrically conductive layers {46, (146, 246)} comprise a pair of source-side select gate electrodes (46S, 146S) contacting the shallow trench isolation structure 22. The pair of source-side select gate electrodes (46S, 146S) are laterally spaced from each other by the shallow trench isolation structure 22. The row of dummy memory opening fill structures 58D is used for source line 109 and source-side select gate electrode 46S isolation from a laterally adjacent source line 109 and source-side select gate electrode 46S, respectively.

Figure 69E:
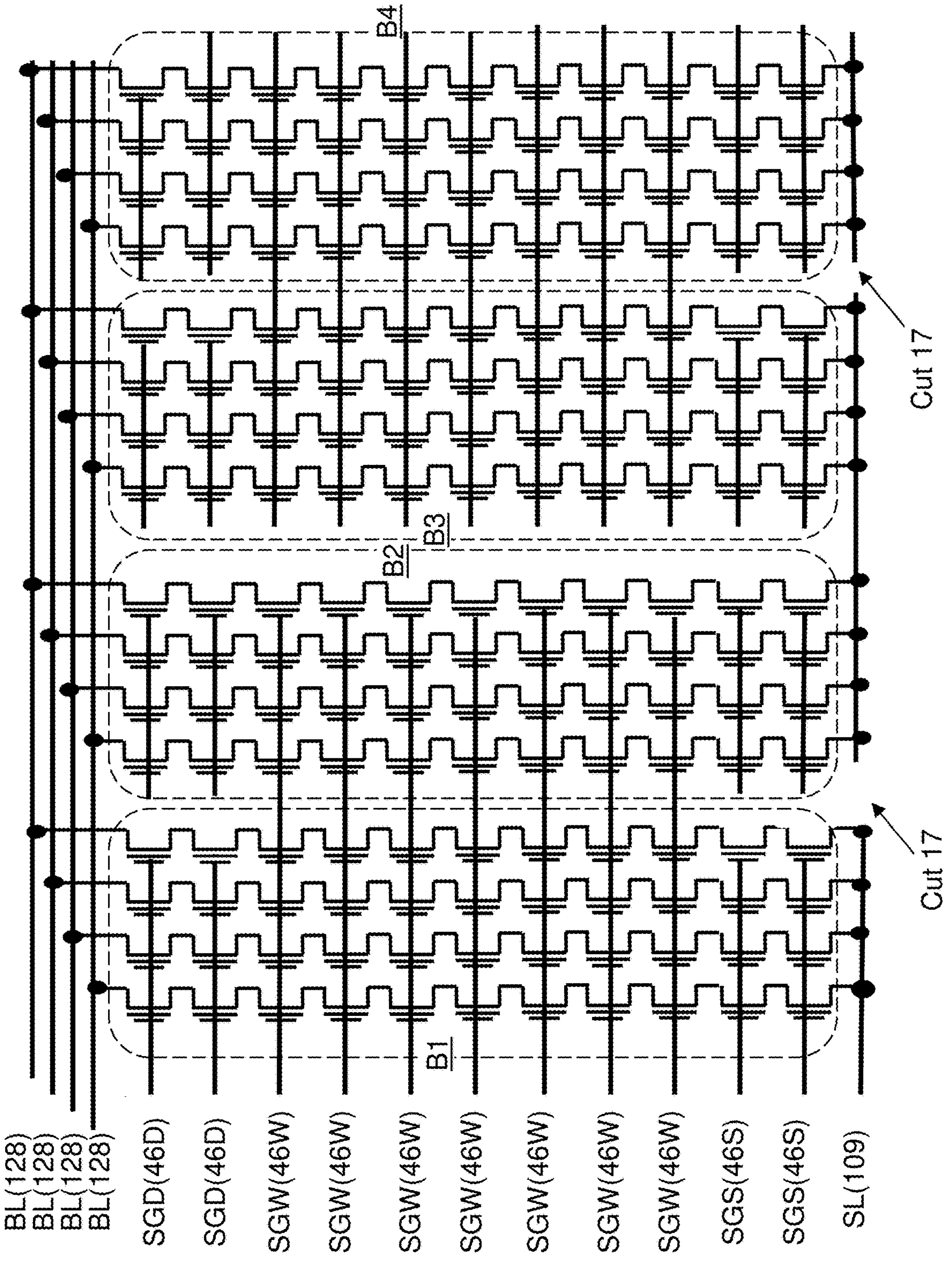
FIG. 69E is a circuit diagram of the semiconductor circuit which corresponds to the third configuration of the sixth exemplary structure of FIG. 69D.

FIG. 69E is a schematic circuit diagram of the third configuration of the sixth exemplary structure. FIG. 69F is table of voltages applied to bit lines 128 ("BL"), drain-side select gate electrodes (46D, 246D) ("SGD"), unselected word lines (46W, 146W, 246W) ("Un-Sel WL"), selected word lines (46W, 146W, 246W) ("Sel WL"), selected block source lines 109 ("Sel block SL"), and unselected block source lines 109 ("Un-Sel block SL") of the structure of FIG. 68A. In this embodiment, each memory block is operated by independent source-side select gate electrode 46S and source line 109 adjustment.

Referring collectively to FIGS. 21, 69D, and 69E, for each alternating stack {(32, 46), (132, 146, 232, 246)} of insulating layers (32, 132, 232) and electrically conductive layers (46, 146, 246) located between a neighboring pair of backside trench fill structures 76, two source layers 109 may contact a proximal surface of the alternating stack {(32, 46), (132, 146, 232, 246)}. In one embodiment, an entirety of the plurality of source layers 109 in contact with a proximal horizontal surface of an alternating stack {(32, 46), (132, 146, 232, 246)} may have a total lateral extent along the second horizontal direction hd2 that is greater than a lateral extent of combination of the alternating stack {(32, 46), (132, 146, 232, 246)}, the first backside trench fill structure 76, and the second backside trench fill structure 76. In one embodiment, two or more groups of memory opening fill structures 58 vertically extend through one of the plurality of source-side select gate electrodes (46S, 146S).

Figure 70A:
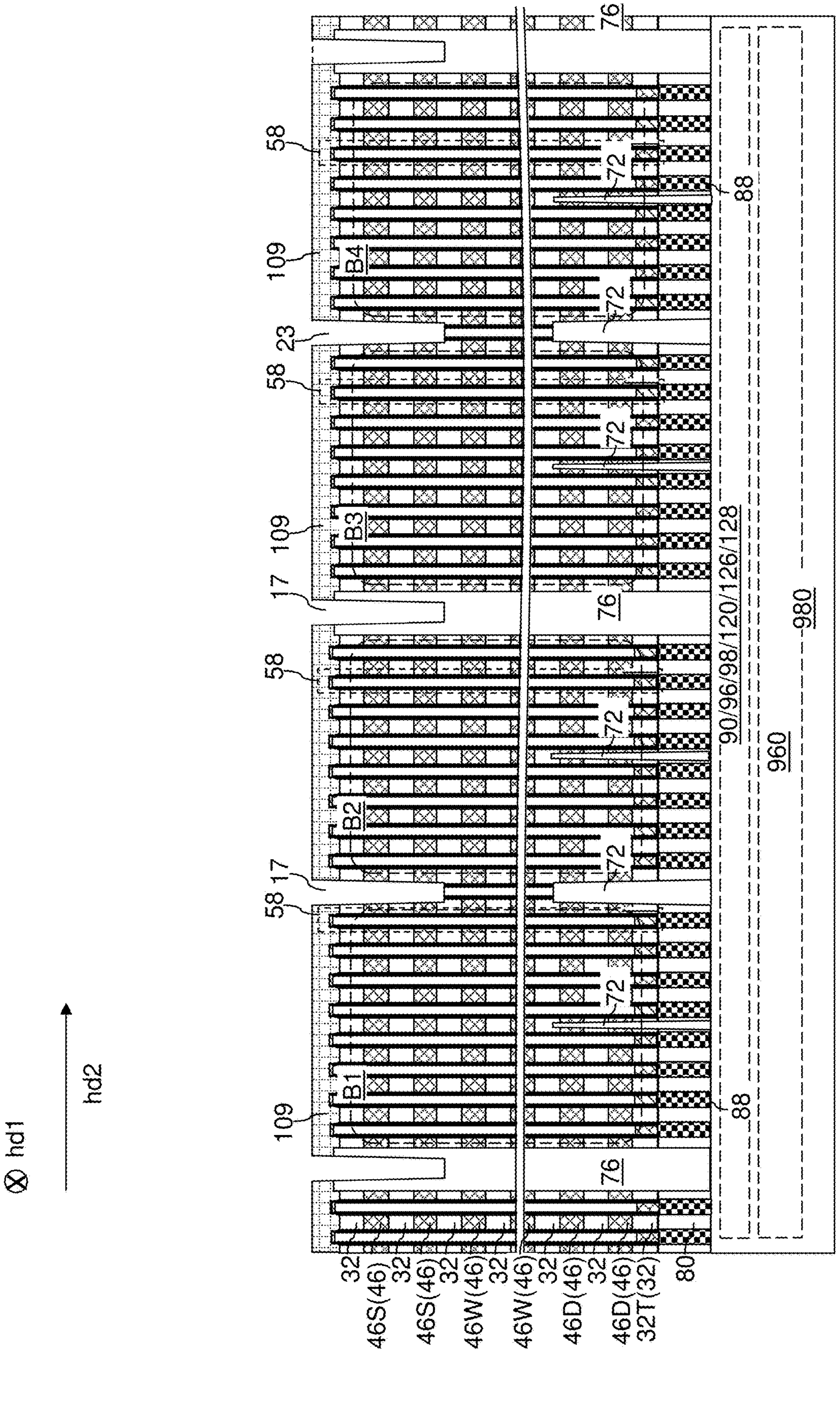
FIGS. 70A and 70B are sequential schematic vertical cross-sectional views of a fourth configuration of the sixth exemplary structure during formation according to an embodiment of the present disclosure.
Figure 70B:
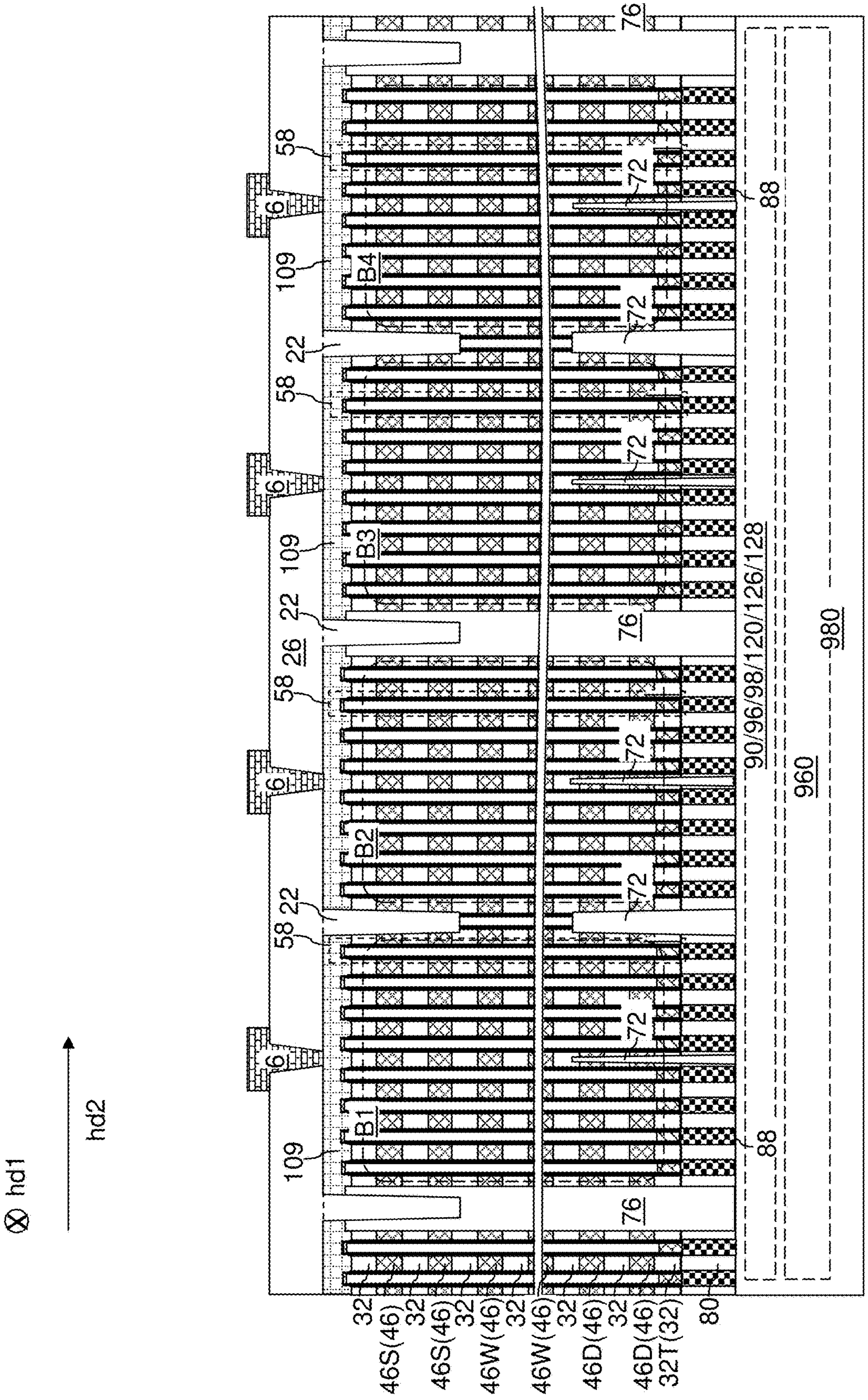

FIGS. 70A and 70B are sequential schematic vertical cross-sectional views of a fourth configuration of the sixth exemplary structure during formation according to an embodiment of the present disclosure.

Referring to FIG. 70A, a fourth configuration of the sixth exemplary structure may be derived from the third configuration of the sixth exemplary structure illustrated in FIG. 69C by forming additional source-select-level trenches over the areas of the backside trench fill structures 76.

Referring to FIG. 70B, the processing steps described with reference to FIG. 69D may be performed.

Figure 70C:
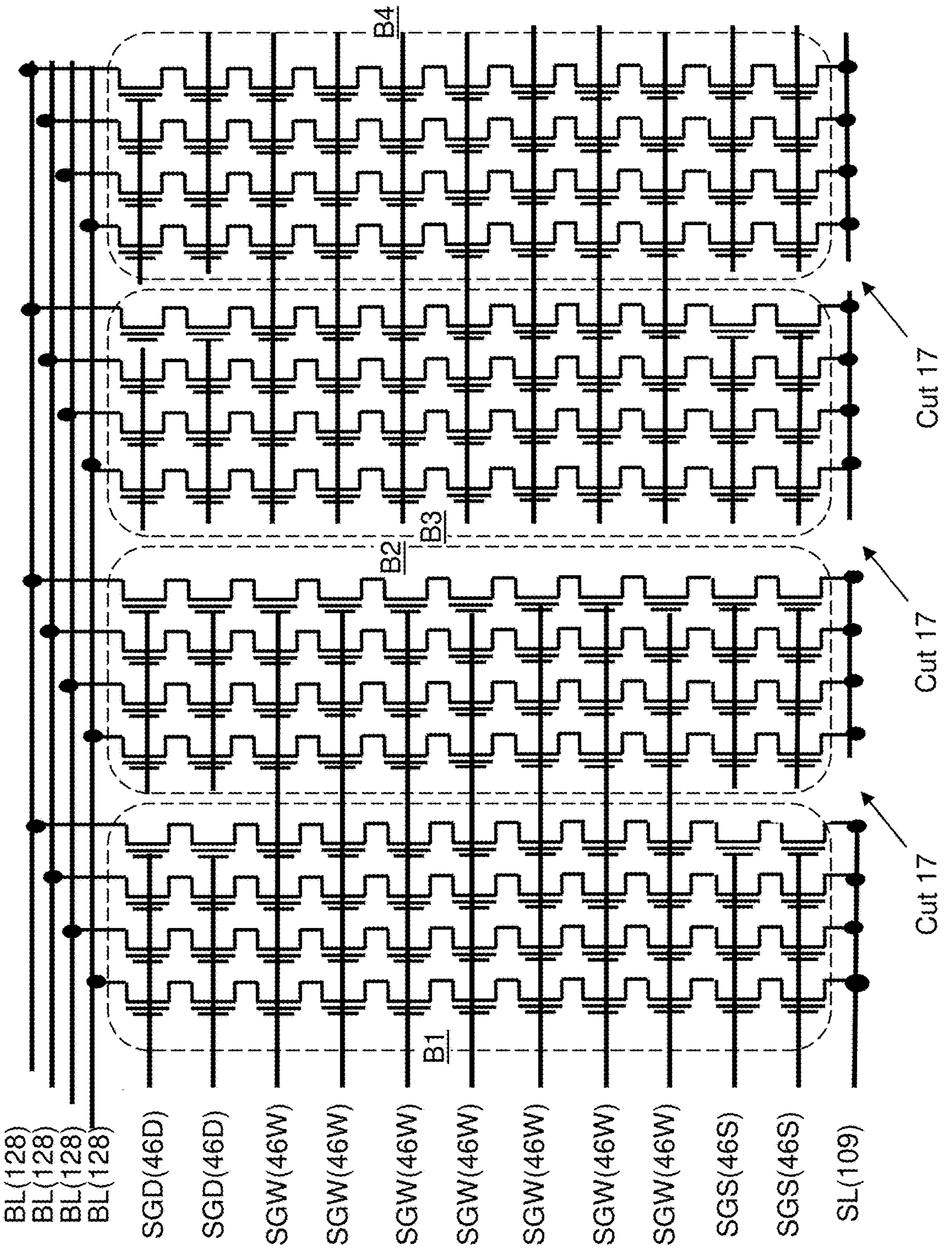
FIG. 70C is a circuit diagram of the semiconductor circuit which corresponds to the fourth configuration of the sixth exemplary structure of FIG. 70B.

FIG. 70C is a schematic circuit diagram of the fourth configuration of the sixth exemplary structure. FIG. 70D is table of voltages applied to bit lines 128 ("BL"), drain-side select gate electrodes (46D, 246D) ("SGD"), unselected word lines (46W, 146W, 246W) ("Un-Sel WL"), selected word lines (46W, 146W, 246W) ("Sel WL"), selected block source lines 109 ("Sel block SL"), and unselected block source lines 109 ("Un-Sel block SL") of the structure of FIG. 68A. In this embodiment, each memory block is also operated by independent source-side select gate electrode 46S and source line 109 adjustment.

Referring collectively to FIGS. 33-36, 70B, and 70C, for each alternating stack {(32, 46), (132, 146, 232, 246)} of insulating layers (32, 132, 232) and electrically conductive layers (46, 146, 246) located between a neighboring pair of backside trench fill structures 76, a plurality of source layers 109 may contact a proximal surface of the alternating stack {(32, 46), (132, 146, 232, 246)}. In one embodiment, an entirety of the plurality of source layers 109 has a total lateral extent along the second horizontal direction hd2 that is less than a lateral extent of combination of the alternating stack {(32, 46), (132, 146, 232, 246)}, the first backside trench fill structure 76, and the second backside trench fill structure 76.

In one embodiment, the electrically conductive layers {46, (146, 246)} comprise a plurality of source-side select gate electrodes (46S, 146S) that are located between the first backside trench fill structure 76 and the second backside trench fill structure 76 and laterally spaced apart from each other along the second horizontal direction hd2. In one embodiment, two or more groups of memory opening fill structures 58 vertically extend through one of the plurality of source-side select gate electrodes (46S, 146S).

Figure 71:
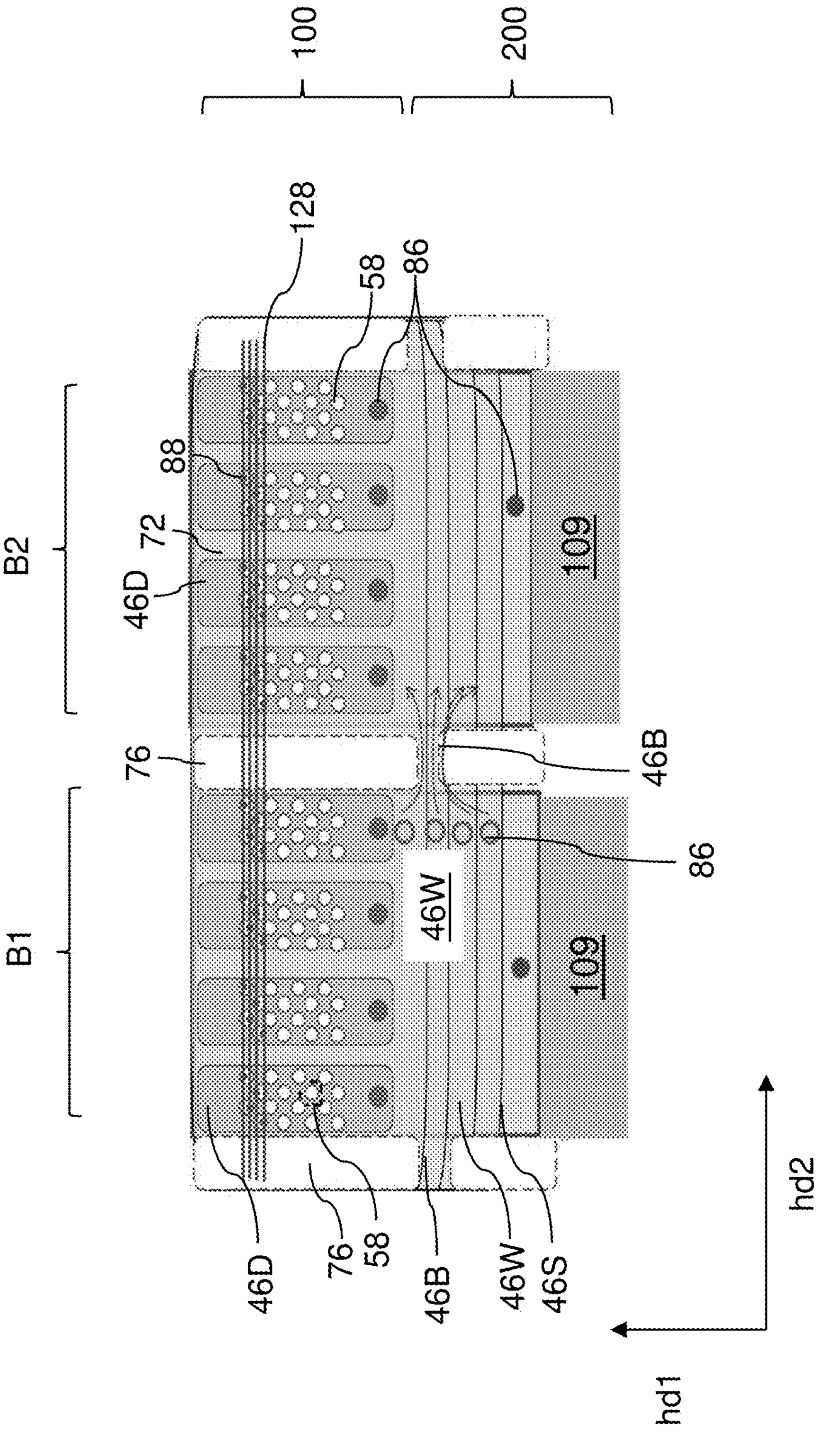
FIG. 71 is a top-down view of the fifth configuration of the sixth exemplary structure according to an embodiment of the present disclosure.

FIG. 71 is a top-down view of the fifth configuration of the sixth exemplary structure according to an embodiment of the present disclosure. The fifth configuration may be derived from the first, second, third or fourth configurations of the sixth exemplary structure by forming word line bridges 46B between laterally adjacent memory blocks (B1, B2). For example, FIG. 71 shows the word line bridges 46B provided in the fourth configuration of the sixth exemplary structure. In this embodiment, the conductive word line bridges 46B extend through the backside trench fill structures 76 and electrically connect laterally adjacent word lines 46W at the same vertical level in laterally adjacent memory blocks. For example, in this embodiment, the as-formed backside trenches 79 may be discontinuous to leave bridge portions of the sacrificial material layers 42 between adjacent memory block areas. The bridge portions of the sacrificial material layers 42 are subsequently replaced with the word lines bridges 46B at the step shown in FIGS. 56 and 57. The laterally separated source lines 109 permit the word lines 46W in adjacent memory blocks to be electrically connected by electrically conductive word line bridges 46B. Thus, a single layer contact via structure 86 may be electrically connected to plural word lines 46W in different memory blocks. In contrast, each source-side and drain-side select gate electrode (46S, 46D) is electrically contacted by a separate layer contact via structure 86 to permit independent reading, programming and erasing in each memory block. This configuration reduces the contact region 200 area by reducing the area of the staircase region because one common layer contact via structure 86 may be formed for plural word lines 46W connected by word line bridges 46B. Furthermore, the number of word line switching transistors may be reduced because of the reduction in the number of corresponding layer contact via structures 86 which are electrically connected to such transistors.

According to various embodiments of the present disclosure, a three-dimensional memory device includes an alternating stack of insulating layers 32 and electrically conductive layers 46 located over a plurality of source layers 109, where the electrically conductive layers 46 include word lines 46W and source-side select gate electrodes 46S which are located between the plurality of source layers 109 and the word lines 46W in a vertical direction, groups of memory openings 49 vertically extending through the alternating stack (32, 46), and groups of memory opening fill structures 58 located in the groups of memory openings 49. Each of the memory opening fill structures 58 includes a respective vertical stack of memory elements (e.g., portions of the memory film 50), a respective vertical semiconductor channel 60 having a first end that contacts a respective one of the plurality of source layers 109, and a respective drain region 63 contacting a second end of the respective vertical semiconductor channel 60. The plurality of source layers 109 are laterally spaced apart and electrically isolated from each other, and each respective one of the plurality of source layers 109 contacts at least one respective group of the groups of memory opening fill structures 58.

In one embodiment, the alternating stack (32, 46) is located between a pair of backside trench fill structures 76. The pair of backside trench fill structures comprises a first backside trench fill structure 76 and a second backside trench fill structure 76 that laterally extend along a first horizontal direction hd1 and are laterally spaced from each other along a second horizontal direction hd2, and vertically extend from a bottommost surface of the alternating stack to a topmost surface of the alternating stack. The first backside trench fill structure 76 comprises a first insulating sidewall; and the second backside trench fill structure 76 comprises a second insulating sidewall.

In one embodiment, the plurality of source layers 109 laterally extend along the first horizontal direction hd1, are laterally spaced from each other along the second horizontal direction hd2, and contact the bottommost surface of the alternating stack (32, 46); and the word lines 46W continuously extend from the first insulating sidewall to the second insulating sidewall.

In one embodiment, the three-dimensional memory further comprises a plurality of drain-select-level dielectric isolation structures 72 laterally extending along the first horizontal direction hd1, laterally spaced apart from each other along the second horizontal direction hd2, and located between the first backside trench fill structure 76 and the second backside trench fill structure 76; and a plurality of drain-side select gate electrodes 46D that are laterally spaced apart from each other by the drain-select-level dielectric isolation structures 72.

In some embodiments, each of the plurality of source layers 109 does not contact any other group of the memory opening fill structures 58 other than the respective group of the memory opening fill structures 58. In one embodiment, the source-side select gate electrode 46S continuously extends between the first backside trench fill structure 76 and the second backside trench fill structure 76. In other embodiments, each of the source layers 109 contacts two groups of the memory openings fill structures 58.

In one embodiment, the three-dimensional memory device further comprises source-side trenches 21 extending through both the source-side select gate electrodes 46S and the plurality of source layers 109, wherein the source-side trenches 21 do not extend through the word lines and do not divide the word lines 46W.

In one embodiment, the groups of the memory opening fill structures 58 are located in memory blocks (B1-B8), and each group of the memory opening fill structures 58 is located in a respective one of the memory blocks. In some embodiments, each of the memory blocks (B1-B8) is operated by a respective one of the plurality of the source layers 109. In other embodiments, the memory blocks comprise two laterally adjacent memory blocks (B2, B3) which are operated by a respective one of the plurality of the source layers 109.

In one embodiment, the three-dimensional memory device further comprises electrically conductive word line bridges 46B which extend through at least one of the backside trench fill structures 76 and electrically connect laterally adjacent word lines in laterally adjacent memory blocks (B1, B2).

In various embodiments, a memory block (B1-B8) is defined by cuts in the source line 109. This reduces the size of the memory blocks and decreases the short circuit current of the device.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:

an alternating stack of insulating layers and electrically conductive layers located over a plurality of source layers, wherein the electrically conductive layers comprise word lines and source-side select gate electrodes which are located between the plurality of source layers and the word lines in a vertical direction;

groups of memory openings vertically extending through the alternating stack; and groups of memory opening fill structures located in the groups of memory openings, wherein each of the memory opening fill structures includes a respective vertical stack of memory elements, a respective vertical semiconductor channel having a first end that contacts a respective one of the plurality of source layers, and a respective drain region contacting a second end of the respective vertical semiconductor channel, wherein:

the plurality of source layers are laterally spaced apart and electrically isolated from each other;

each respective one of the plurality of source layers contacts at least one respective group of the groups of memory opening fill structures;

the alternating stack is located between a pair of backside trench fill structures;

the pair of backside trench fill structures comprises a first backside trench fill structure and a second backside trench fill structure that laterally extend along a first horizontal direction and are laterally spaced from each other along a second horizontal direction, and vertically extend from a bottommost surface of the alternating stack to a topmost surface of the alternating stack;

the first backside trench fill structure comprises a first insulating sidewall; and the second backside trench fill structure comprises a second insulating sidewall;

the plurality of source layers laterally extend along the first horizontal direction, are laterally spaced from each other along the second horizontal direction, and contact the bottommost surface of the alternating stack; and the word lines continuously extend from the first insulating sidewall to the second insulating sidewall.

2. The three-dimensional memory device of claim 1, further comprising:

a plurality of drain-select-level dielectric isolation structures laterally extending along the first horizontal direction, laterally spaced apart from each other along the second horizontal direction, and located between the first backside trench fill structure and the second backside trench fill structure; and a plurality of drain-side select gate electrodes that are laterally spaced apart from each other by the drain-select-level dielectric isolation structures.

3. The three-dimensional memory device of claim 2, wherein each of the plurality of source layers does not contact any other group of the memory opening fill structures other than the respective group of the memory opening fill structures.

4. The three-dimensional memory device of claim 3, wherein the source-side select gate electrode continuously extends between the first backside trench fill structure and the second backside trench fill structure.

5. The three-dimensional memory device of claim 2, wherein each of the source layers contacts two groups of the memory openings fill structures.

6. The three-dimensional memory device of claim 2, further comprising source-side trenches extending through both the source-side select gate electrodes and the plurality of source layers, wherein the source-side trenches do not extend through the word lines and do not divide the word lines.

7. The three-dimensional memory device of claim 6, wherein each of the source layers contacts two groups of the memory openings fill structures.

8. The three-dimensional memory device of claim 6, wherein each of the plurality of source layers does not contact any other group of the memory opening fill structures other than the respective group of the memory opening fill structures.

9. A three-dimensional memory device, comprising:

an alternating stack of insulating layers and electrically conductive layers located over a plurality of source layers, wherein the electrically conductive layers comprise word lines and source-side select gate electrodes which are located between the plurality of source layers and the word lines in a vertical direction;

groups of memory openings vertically extending through the alternating stack; and groups of memory opening fill structures located in the groups of memory openings, wherein each of the memory opening fill structures includes a respective vertical stack of memory elements, a respective vertical semiconductor channel having a first end that contacts a respective one of the plurality of source layers, and a respective drain region contacting a second end of the respective vertical semiconductor channel, wherein:

the plurality of source layers are laterally spaced apart and electrically isolated from each other;

each respective one of the plurality of source layers contacts at least one respective group of the groups of memory opening fill structures;

the alternating stack is located between a pair of backside trench fill structures; and the groups of the memory opening fill structures are located in memory blocks, and each group of the memory opening fill structures is located in a respective one of the memory blocks; and further comprising electrically conductive word line bridges which extend through at least one of the backside trench fill structures and electrically connect laterally adjacent word lines in laterally adjacent memory blocks.

* * * * *